(12) United States Patent
Shiratori et al.

(10) Patent No.: US 10,654,967 B2
(45) Date of Patent: May 19, 2020

(54) POLYMER COMPOUND AND LIGHT-EMITTING ELEMENT USING SAME

(71) Applicant: Sumitomo Chemical Company, Limited, Tokyo (JP)

(72) Inventors: Mio Shiratori, Tsukuba (JP); Ken Sakakibara, Tsukuba (JP); Daisuke Fukushima, Tsukuba (JP); Tomoyasu Yoshida, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 144 days.

(21) Appl. No.: 15/752,272

(22) PCT Filed: Sep. 14, 2016

(86) PCT No.: PCT/JP2016/077118
§ 371 (c)(1),
(2) Date: Feb. 13, 2018

(87) PCT Pub. No.: WO2017/047644
PCT Pub. Date: Mar. 23, 2017

(65) Prior Publication Data
US 2018/0230264 A1    Aug. 16, 2018

(30) Foreign Application Priority Data

Sep. 18, 2015 (JP) ................. 2015-184779

(51) Int. Cl.
| C08G 61/12 | (2006.01) |
| C09K 11/06 | (2006.01) |
| H01L 51/50 | (2006.01) |
| C09K 11/02 | (2006.01) |
| H01L 51/00 | (2006.01) |

(52) U.S. Cl.
CPC ........... *C08G 61/122* (2013.01); *C08G 61/12* (2013.01); *C09K 11/02* (2013.01); *C09K 11/06* (2013.01); *H01L 51/0039* (2013.01); *H01L 51/0043* (2013.01); *H01L 51/50* (2013.01); *C08G 2261/124* (2013.01); *C08G 2261/148* (2013.01); *C08G 2261/1412* (2013.01); *C08G 2261/1414* (2013.01); *C08G 2261/18* (2013.01); *C08G 2261/228* (2013.01); *C08G 2261/312* (2013.01); *C08G 2261/3142* (2013.01); *C08G 2261/3162* (2013.01); *C08G 2261/3245* (2013.01); *C08G 2261/41* (2013.01); *C08G 2261/512* (2013.01); *C08G 2261/76* (2013.01); *C08G 2261/95* (2013.01); *C09K 2211/1007* (2013.01); *C09K 2211/1029* (2013.01); *C09K 2211/1033* (2013.01); *C09K 2211/1044* (2013.01); *C09K 2211/1059* (2013.01); *C09K 2211/1092* (2013.01); *C09K 2211/185* (2013.01); *H01L 51/5012* (2013.01); *H01L 51/5056* (2013.01)

(58) Field of Classification Search
None
See application file for complete search history.

(56) References Cited

U.S. PATENT DOCUMENTS 6,169,163 B1 *  1/2001  Woo ............... C07C 17/2637
                                              427/407.1
6,605,373 B2 *  8/2003  Woo ............... C07C 25/22
                                              257/40

(Continued)

FOREIGN PATENT DOCUMENTS

EP    2308910 A1    4/2011
EP    2314639 A1    4/2011

(Continued)

OTHER PUBLICATIONS

Extended European Search Report dated May 6, 2019 in EP Application No. 16846515.1.

*Primary Examiner* — Robert S Loewe

(74) *Attorney, Agent, or Firm* — Panitch Schwarze Belisario & Nadel LLP

(57) ABSTRACT

A polymer compound having a constitutional unit represented by formula (1A) or formula (1B) and a constitutional unit represented by formula (2A) or formula (2B) is provided, wherein each of $X^M$ and $X^N$ is a crosslinkable group; and $R^{Am}$, $R^{Bm}$, $Ar^{1m}$ to $Ar^{5m}$, $L^M$, $Ar^M$, m1 to m6, $R^{An}$, $R^{Bn}$, $Ar^{1n}$ to $Ar^{5n}$, $Ar^{Ln}$, $L^N$, $Ar^N$, n1 to n6, and Ln are as defined in the specification. The polymer compound is excellent in crosslinkability and hole transportability.

(1A)

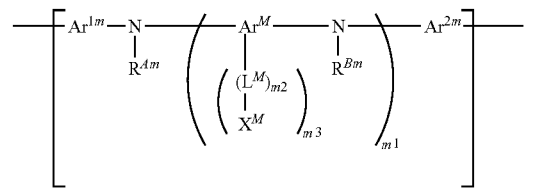

(1B)

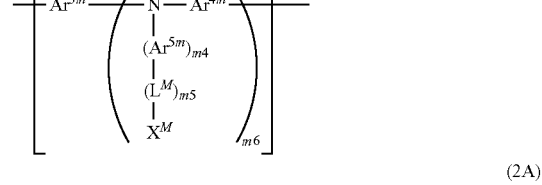

(2A)

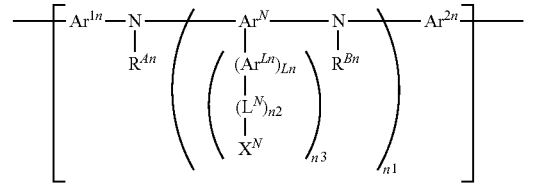

(2B)

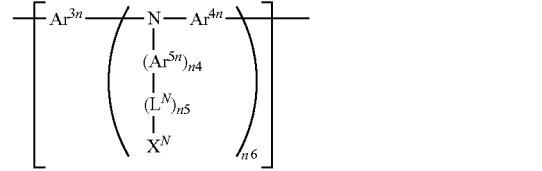

10 Claims, No Drawings

(56) References Cited

U.S. PATENT DOCUMENTS

| | | | |
|---|---|---|---|
| 8,581,241 B2* | 11/2013 | Iida | C08G 61/12 |
| | | | 257/40 |
| 2007/0096082 A1* | 5/2007 | Gaynor | C07C 211/60 |
| | | | 257/40 |
| 2007/0102695 A1* | 5/2007 | Inbasekaran | C07C 25/22 |
| | | | 257/40 |
| 2007/0172978 A1* | 7/2007 | Chua | C07C 247/16 |
| | | | 438/99 |
| 2009/0227765 A1* | 9/2009 | Towns | C08G 73/02 |
| | | | 528/422 |
| 2011/0042661 A1* | 2/2011 | Endo | C08G 61/12 |
| | | | 257/40 |
| 2011/0108814 A1 | 5/2011 | Iida et al. | |
| 2011/0127516 A1 | 6/2011 | Nakatani et al. | |
| 2011/0198573 A1 | 8/2011 | Iida et al. | |
| 2012/0306358 A1* | 12/2012 | Hirano | C08G 61/12 |
| | | | 313/504 |
| 2015/0108408 A1 | 4/2015 | Eckes et al. | |
| 2015/0115204 A1* | 4/2015 | Sekine | C07C 25/24 |
| | | | 252/500 |
| 2017/0092864 A1 | 3/2017 | Yoshida et al. | |

FOREIGN PATENT DOCUMENTS

| | | |
|---|---|---|
| JP | 2010155985 A | 7/2010 |
| JP | 2010-215886 A | 9/2010 |
| JP | 201152229 A | 3/2011 |
| JP | 2012-15539 A | 1/2012 |
| JP | 2012-111719 A | 6/2012 |
| JP | 2012-177029 A | 9/2012 |
| JP | 2015-17231 A | 1/2015 |
| JP | 2015511215 A | 4/2015 |
| JP | 2015-519424 A | 7/2015 |
| JP | 2016-44228 A | 4/2016 |
| WO | 9733193 A2 | 9/1997 |
| WO | 2010013723 A1 | 2/2010 |
| WO | 2013/098175 A1 | 7/2013 |
| WO | WO-2013146806 A1 * | 10/2013 ............... C07F 3/02 |
| WO | 2013180036 A1 | 12/2013 |
| WO | 2015145871 A1 | 10/2015 |

* cited by examiner

POLYMER COMPOUND AND LIGHT-EMITTING ELEMENT USING SAME

CROSS-REFERENCE TO RELATED APPLICATION

This application is a Section 371 International Application No. PCT/JP2016/077118, filed Sep. 14, 2016, which was published in the Japanese language on Mar. 23, 2017 under International Publication No. WO 2017/047644 A1, which claims priority under 35 U.S.C. § 119(b) to Japanese Application No. 2015-184779, filed Sep. 18, 2015, the disclosures of which are incorporated herein by reference in their entirety.

TECHNICAL FIELD

The present invention relates to a polymer compound and a light emitting device using the same.

BACKGROUND ART

Light emitting devices such as an organic electroluminescent device can be produced, for example, by laminating organic layers by an application method. As materials used for formation of a hole transporting layer which is one of the organic layers, for example, a polymer compound comprising a non-crosslinkable constitutional unit derived from an arylamine, a crosslinkable constitutional unit derived from a fluorene having a benzocyclobutene structure and a crosslinkable constitutional unit derived from a fluorene having an olefin structure (Patent Document 1) and a polymer compound comprising a non-crosslinkable constitutional unit derived from an arylamine and a crosslinkable constitutional unit derived from an arylamine having a benzocyclobutene structure (Patent Document 2) are known.

PRIOR ART DOCUMENT

Patent Document (Patent Document 1) JP-A No. 2010-215886
(Patent Document 2) JP-A No. 2011-52229

SUMMARY OF THE INVENTION

Problem to be Solved by the Invention

However, crosslinkability and hole transportability of the above-described polymer compound are not sufficient. Then, the present invention has an object of providing a polymer compound excellent in crosslinkability and hole transportability.

Means for Solving the Problem

The present invention provides the following [1] to [11].
[1] A polymer compound comprising a constitutional unit represented by the formula (1A) or the formula (1B) and a constitutional unit represented by the formula (2A) or the formula (2B):

(Chemical Formula 1)

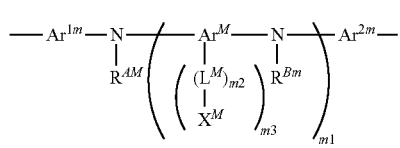
(1A)

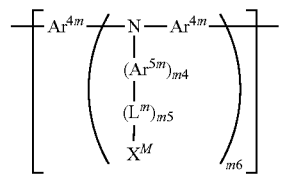
(1B)

[wherein,
$R^{Am}$ and $R^{Bm}$ each independently represent a hydrogen atom, an alkyl group, a cycloalkyl group, an aryl group or a monovalent heterocyclic group, and these groups each optionally have a substituent. When a plurality of $R^{Bm}$ are present, they may be the same or different.
$Ar^{1m}$, $Ar^{2m}$, $Ar^{3m}$, $Ar^{4m}$ and $Ar^{5m}$ each independently represent an arylene group or a divalent heterocyclic group, and these groups each optionally have a substituent. $Ar^{1m}$ and $R^{Am}$ may be combined together to form a ring together with the nitrogen atom to which they are attached. $Ar^{2m}$ and $R^{Bm}$ may be combined together to form a ring together with the nitrogen atom to which they are attached. $Ar^{3m}$ and $Ar^{5m}$ may be combined together to form a ring together with the nitrogen atom to which they are attached. $Ar^{4m}$ and $Ar^{5m}$ may be combined together to form a ring together with the nitrogen atom to which they are attached. $Ar^{3m}$ and $Ar^{4m}$ may be combined together to form a ring together with the nitrogen atom to which they are attached. When a plurality of $Ar^{4m}$ and $Ar^{5m}$ are present, they may be the same or different at each occurrence.
$Ar^{M}$ represents an aromatic hydrocarbon group or a heterocyclic group, and these groups each optionally have a substituent. When a plurality of $Ar^{M}$ are present, they may be the same or different.
m1, m3 and m6 each independently represent an integer of 1 to 4.
m2 and m5 each independently represent an integer of 0 to 5.
m4 represents an integer of 0 to 4.
When a plurality of m2, m3, m4 and m5 are present, they may be the same or different at each occurrence.
$L^{M}$ represents an alkylene group, a cycloalkylene group, an arylene group, a divalent heterocyclic group, a group represented by —N(R')—, an oxygen atom or a sulfur atom, and these groups each optionally have a substituent. R' represents a hydrogen atom, an alkyl group, a cycloalkyl group, an aryl group or a monovalent heterocyclic group, and these groups each optionally have a substituent. When a plurality of $L^{M}$ are present, they may be the same or different.
$X^{M}$ represents a monovalent group containing a crosslinkable group represented by the formula (XL-9), the formula (XL-10), the formula (XL-11), the formula (XL-12), the formula (XL-13) or the formula (XL-16), and these groups each optionally have a substituent. When a plurality of $X^{M}$ are present, they may be the same or different.]

(Chemical Formula 2)

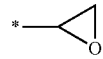
(XL-9)

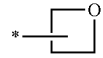
(XL-10)

-continued

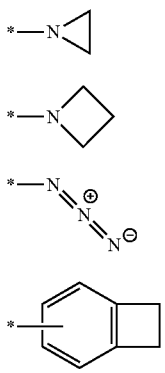

(XL-11)

(XL-12)

(XL-13)

(XL-16)

[wherein, * represents a binding site.]

(Chemical Formula 3)

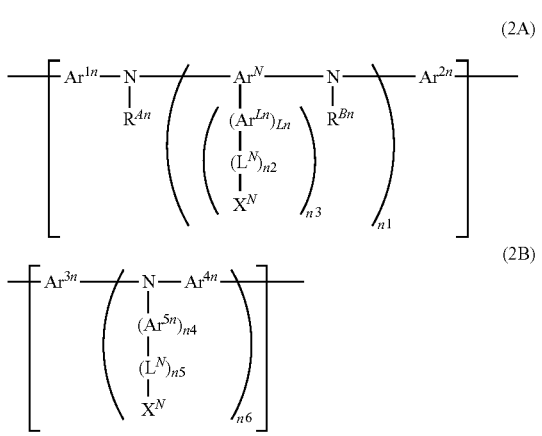

[wherein, $R^{An}$ and $R^{Bn}$ each independently represent a hydrogen atom, an alkyl group, a cycloalkyl group, an aryl group or a monovalent heterocyclic group, and these groups each optionally have a substituent. When a plurality of $R^{Bn}$ are present, they may be the same or different.

$Ar^{1n}$, $Ar^{2n}$, $Ar^{3n}$, $Ar^{4n}$, $Ar^{5n}$ and $Ar^{Ln}$ each independently represent an arylene group or a divalent heterocyclic group, and these groups each optionally have a substituent. $Ar^{1n}$ and $R^{An}$ may be combined together to form a ring together with the nitrogen atom to which they are attached. $Ar^{2n}$ and $R^{Bn}$ may be combined together to form a ring together with the nitrogen atom to which they are attached. $Ar^{3n}$ and $Ar^{5n}$ may be combined together to form a ring together with the nitrogen atom to which they are attached. $Ar^{4n}$ and $Ar^{5n}$ may be combined together to form a ring together with the nitrogen atom to which they are attached. $Ar^{3n}$ and $Ar^{4n}$ may be combined together to form a ring together with the nitrogen atom to which they are attached. When a plurality of $Ar^{4n}$, $Ar^{5n}$ and $Ar^{Ln}$ are present, they may be the same or different at each occurrence.

$Ar^N$ represents an aromatic hydrocarbon group or a heterocyclic group, and these groups each optionally have a substituent. When a plurality of $Ar^N$ are present, they may be the same or different.

n1, n3 and n6 each independently represent an integer of 1 to 4.

n2 and n5 each independently represent 1 or 2.

n4 and Ln each independently represent an integer of 0 to 4.

$L^N$ represents an alkylene group, a cycloalkylene group, a divalent heterocyclic group, a group represented by —N(R')—, an oxygen atom or a sulfur atom, and these groups each optionally have a substituent. R' represents the same meaning as described above. When a plurality of $L^N$ are present, they may be the same or different.

$X^N$ represents a monovalent group containing a crosslinkable group represented by the formula (XL-1), the formula (XL-2), the formula (XL-3), the formula (XL-4), the formula (XL-5), the formula (XL-6), the formula (XL-7), the formula (XL-8), the formula (XL-14) or the formula (XL-15), and these groups each optionally have a substituent. When a plurality of $X^N$ are present, they may be the same or different.]

(Chemical Formula 4)

(XL-1)

(XL-2)

(XL-3)

(XL-4)

(XL-5)

(XL-6)

(XL-7)

(XL-8)

-continued (XL-14)

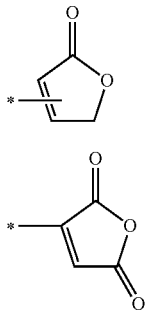

(XL-15)

[wherein, $n^{XL}$ represents an integer of 0 to 5. When a plurality of $n^{XL}$ are present, they may be the same or different.

$R^{XL}$ represents a methylene group, an oxygen atom or a sulfur atom. When a plurality of $R^{XL}$ are present, they may be the same or different.

* represents the same meaning as described above.].

[2] The polymer compound according to [1], comprising a constitutional unit represented by the formula (1A) and a constitutional unit represented by the formula (2A).

[3] The polymer compound according to [1] or [2], wherein $X^M$ is a monovalent group containing a crosslinkable group represented by the formula (XL-16) optionally having a substituent.

[4] The polymer compound according to any one of [1] to [3], wherein -$(L^M)_2$-$X^M$ is a group represented by the formula (A):

(Chemical Formula 5)

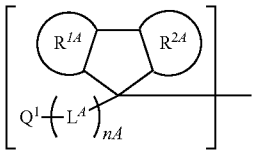

(A)

[wherein, the ring $R^{1A}$ and the ring $R^{2A}$ each independently represent an aromatic hydrocarbon ring or a heterocyclic ring, and these rings each optionally have a substituent.

nA represents an integer of 0 to 3.

$L^A$ represents an alkylene group, a cycloalkylene group, an arylene group, a divalent heterocyclic group, a group represented by —N(R")—, an oxygen atom or a sulfur atom, and these groups each optionally have a substituent. R" represents a hydrogen atom, an alkyl group, a cycloalkyl group, an aryl group or a monovalent heterocyclic group, and these groups each optionally have a substituent. When a plurality of $L^A$ are present, they may be the same or different.

$Q^1$ represents a crosslinkable group represented by the formula (XL-16) optionally having a substituent.]

[5] The polymer compound according to any one of [1] to [4], wherein $X^N$ is a monovalent group containing a crosslinkable group represented by the formula (XL-1) optionally having a substituent.

[6] The polymer compound according to any one of [1] to [5], further comprising a constitutional unit represented by the formula (X):

(Chemical Formula 6)

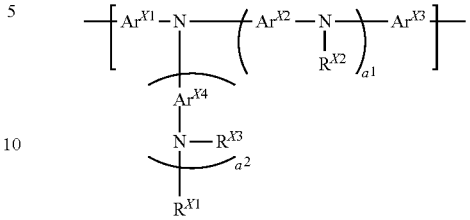

(X)

[wherein, $a^1$ and $a^2$ each independently represent an integer of 0 or more.

$Ar^{X1}$ and $Ar^{X3}$ each independently represent an arylene group or a divalent heterocyclic group, and these groups each optionally have a substituent.

$Ar^{X2}$ and $Ar^{X4}$ each independently represent an arylene group, a divalent heterocyclic group or a divalent group in which at least one arylene group and at least one divalent heterocyclic group are bonded directly to each other, and these groups each optionally have a substituent. When a plurality of $Ar^{X2}$ and $Ar^{X4}$ are present, they may be the same or different at each occurrence.

$R^{X1}$, $R^{X2}$ and $R^{X3}$ each independently represent a hydrogen atom, an alkyl group, a cycloalkyl group, an aryl group or a monovalent heterocyclic group, and these groups each optionally have a substituent. When a plurality of $R^{X2}$ and $R^{X3}$ are present, they may be the same or different at each occurrence.].

[7] The polymer compound according to any one of [1] to [6], further comprising a constitutional unit represented by the formula (Y):

(Chemical Formula 7)

(Y)

[wherein, $Ar^{Y1}$ represents an arylene group, a divalent heterocyclic group or a divalent group in which at least one arylene group and at least one divalent heterocyclic group are bonded directly to each other, and these groups each optionally have a substituent.].

[8] The polymer compound according to [7], wherein the constitutional unit represented by the formula (Y) is a constitutional unit represented by the formula (Y-1) or a constitutional unit represented by the formula (Y-2):

(Chemical Formula 8)

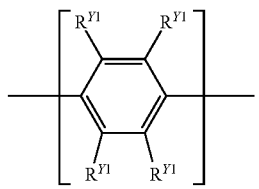

(Y-1)

-continued

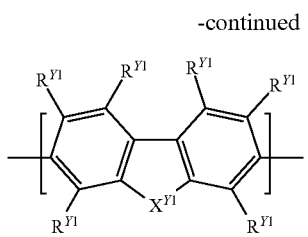

(Y-2)

[wherein, $R^{Y1}$ represents a hydrogen atom, an alkyl group, a cycloalkyl group, an alkoxy group, a cycloalkoxy group, an aryl group or a monovalent heterocyclic group, and these groups each optionally have a substituent. The plurality of $R^{Y1}$ may be the same or different, and adjacent groups $R^{Y1}$ may be combined together to form a ring together with the carbon atoms to which they are attached.

$X^{Y1}$ represents a group represented by —C($R^{Y2}$)$_2$—, —C($R^{Y2}$)=C($R^{Y2}$)— or C($R^{Y2}$)$_2$—C($R^{Y2}$)$_2$—. $R^{Y2}$ represents a hydrogen atom, an alkyl group, a cycloalkyl group, an alkoxy group, a cycloalkoxy group, an aryl group or a monovalent heterocyclic group, and these groups each optionally have a substituent. The plurality of $R^{Y2}$ may be the same or different, and groups $R^{Y2}$ may be combined together to form a ring together with each carbon atom to which they are attached.].

[9] The polymer compound according to any one of [1] to [8], wherein the total amount of $X^M$ and $X^N$ is 10 mol % or more with respect to the total amount of constitutional units contained in the polymer compound.

[10] A composition comprising
the polymer compound according to any one of [1] to [9],
and at least one material selected from the group consisting of a hole transporting material, a hole injection material, an electron transporting material, an electron injection material, a light emitting material, an antioxidant and a solvent.

[11] A light emitting device comprising a crosslinked body of the polymer compound according to any one of [1] to [9].

Effect of the Invention

According to the present invention, a polymer compound excellent in crosslinkability and hole transportability can be provided. Further, the present invention can provide a composition comprising the polymer compound and a light emitting device comprising a crosslinked body of the polymer compound.

MODES FOR CARRYING OUT THE INVENTION

Suitable embodiments of the present invention will be illustrated in detail below.
<Explanation of Common Term>
Terms commonly used in the present specification have the following meanings unless otherwise stated.
Me represents a methyl group, Et represents an ethyl group, Bu represents a butyl group, i-Pr represents an isopropyl group, and t-Bu represents a tert-butyl group.
A hydrogen atom may be a heavy hydrogen atom or a light hydrogen atom.
A solid line representing a bond to a central metal in a formula representing a metal complex denotes a covalent bond or a coordinate bond.

"Polymer compound" denotes a polymer having molecular weight distribution and having a polystyrene-equivalent number average molecular weight of $1 \times 10^3$ to $1 \times 10^8$.

"Low molecular weight compound" denotes a compound having no molecular weight distribution and having a molecular weight of $1 \times 10^4$ or less.

"Constitutional unit" denotes a unit structure found once or more in a polymer compound.

"Alkyl group" may be any of linear or branched. The number of carbon atoms of the linear alkyl group is, not including the number of carbon atoms of a substituent, usually 1 to 50, preferably 3 to 30, more preferably 4 to 20. The number of carbon atoms of the branched alkyl groups is, not including the number of carbon atoms of a substituent, usually 3 to 50, preferably 3 to 30, more preferably 4 to 20.

The alkyl group optionally has a substituent, and examples thereof include a methyl group, an ethyl group, a propyl group, an isopropyl group, a butyl group, a 2-butyl group, an isobutyl group, a tert-butyl group, a pentyl group, an isoamyl group, a 2-ethylbutyl group, a hexyl group, a heptyl group, an octyl group, a 2-ethylhexyl group, a 3-propylheptyl group, a decyl group, a 3,7-dimethyloctyl group, a 2-ethyloctyl group, a 2-hexyldecyl group and a dodecyl group, and groups obtained by substituting a hydrogen atom in these groups with a cycloalkyl group, an alkoxy group, a cycloalkoxy group, an aryl group, a fluorine atom or the like, and the alkyl group having a substituent includes a trifluoromethyl group, a pentafluoroethyl group, a perfluorobutyl group, a perfluorohexyl group, a perfluorooctyl group, a 3-phenylpropyl group, a 3-(4-methylphenyl)propyl group, a 3-(3,5-di-hexylphenyl) propyl group and a 6-ethyloxyhexyl group.

The number of carbon atoms of "Cycloalkyl group" is, not including the number of carbon atoms of a substituent, usually 3 to 50, preferably 3 to 30, more preferably 4 to 20.

The cycloalkyl group optionally has a substituent, and examples thereof include a cyclohexyl group, a cyclohexylmethyl group and a cyclohexylethyl group.

"Aryl group" denotes an atomic group remaining after removing from an aromatic hydrocarbon one hydrogen atom linked directly to a carbon atom constituting the ring. The number of carbon atoms of the aryl group is, not including the number of carbon atoms of a substituent, usually 6 to 60, preferably 6 to 20, more preferably 6 to 10.

The aryl group optionally has a substituent, and examples thereof include a phenyl group, a 1-naphthyl group, a 2-naphthyl group, a 1-anthracenyl group, a 2-anthracenyl group, a 9-anthracenyl group, a 1-pyrenyl group, a 2-pyrenyl group, a 4-pyrenyl group, a 2-fluorenyl group, a 3-fluorenyl group, a 4-fluorenyl group, a 2-phenylphenyl group, a 3-phenylphenyl group, a 4-phenylphenyl group, and groups obtained by substituting a hydrogen atom in these groups with an alkyl group, a cycloalkyl group, an alkoxy group, a cycloalkoxy group, an aryl group, a fluorine atom or the like.

"Alkoxy group" may be any of linear or branched. The number of carbon atoms of the linear alkoxy group is, not including the number of carbon atoms of a substituent, usually 1 to 40, preferably 4 to 10. The number of carbon atoms of the branched alkoxy group is, not including the number of carbon atoms of a substituent, usually 3 to 40, preferably 4 to 10.

The alkoxy group optionally has a substituent, and examples thereof include a methoxy group, an ethoxy group, a propyloxy group, an isopropyloxy group, a butyloxy group, an isobutyloxy group, a tert-butyloxy group, a pentyloxy group, a hexyloxy group, a heptyloxy group, an octyloxy group, a 2-ethylhexyloxy group, a nonyloxy group, a decyloxy group, a 3,7-dimethyloctyloxy group and a lauryloxy group, and groups obtained by substituting a hydrogen atom in these groups with a cycloalkyl group, an alkoxy group, a cycloalkoxy group, an aryl group, a fluorine atom or the like.

The number of carbon atoms of "Cycloalkoxy group" is, not including the number of carbon atoms of a substituent, usually 3 to 40, preferably 4 to 10.

The cycloalkoxy group optionally has a substituent, and examples thereof include a cyclohexyloxy group.

The number of carbon atoms of "Aryloxy group" is, not including the number of carbon atoms of a substituent, usually 6 to 60, preferably 6 to 48.

The aryloxy group optionally has a substituent, and examples thereof include a phenoxy group, a 1-naphthyloxy group, a 2-naphthyloxy group, a 1-anthracenyloxy group, a 9-anthracenyloxy group, a 1-pyrenyloxy group, and groups obtained by substituting a hydrogen atom in these groups with an alkyl group, a cycloalkyl group, an alkoxy group, a cycloalkoxy group, a fluorine atom or the like.

"p-Valent heterocyclic group" (p represents an integer of 1 or more) denotes an atomic group remaining after removing from a heterocyclic compound p hydrogen atoms among hydrogen atoms directly linked to a carbon atom or a hetero atom constituting the ring. Of p-valent heterocyclic groups, "p-valent aromatic heterocyclic groups" as an atomic group remaining after removing from an aromatic heterocyclic compound p hydrogen atoms among hydrogen atoms directly linked to a carbon atom or a hetero atom constituting the ring are preferable.

"Aromatic heterocyclic compound" denotes a compound in which the heterocyclic ring itself shows aromaticity such as oxadiazole, thiadiazole, thiazole, oxazole, thiophene, pyrrole, phosphole, furan, pyridine, pyrazine, pyrimidine, triazine, pyridazine, quinoline, isoquinoline, carbazole and dibenzophosphole, and a compound in which an aromatic ring is condensed to the heterocyclic ring even if the heterocyclic ring itself shows no aromaticity such as phenoxazine, phenothiazine, dibenzoborole, dibenzosilole and benzopyran.

The number of carbon atoms of the monovalent heterocyclic group is, not including the number of carbon atoms of a substituent, usually 2 to 60, preferably 4 to 20.

The monovalent heterocyclic group optionally has a substituent, and examples thereof include a thienyl group, a pyrrolyl group, a furyl group, a pyridyl group, a piperidinyl group, a quinolinyl group, an isoquinolinyl group, a pyrimidinyl group, a triazinyl group, and groups obtained by substituting a hydrogen atom in these groups with an alkyl group, a cycloalkyl group, an alkoxy group, a cycloalkoxy group or the like.

"Halogen atom" denotes a fluorine atom, a chlorine atom, a bromine atom or an iodine atom.

"Amino group" optionally has a substituent, and a substituted amino group is preferable. The substituent which an amino group has is preferably an alkyl group, a cycloalkyl group, an aryl group or a monovalent heterocyclic group.

The substituted amino group includes, for example, a dialkylamino group, a dicycloalkylamino group and a diarylamino group.

The amino group includes, for example, a dimethylamino group, a diethylamino group, a diphenylamino group, a bis(4-methylphenyl)amino group, a bis(4-tert-butylphenyl) amino group and a bis(3,5-di-tert-butylphenyl)amino group.

"Alkenyl group" may be any of linear or branched. The number of carbon atoms of the linear alkenyl group, not including the number of carbon atoms of the substituent, is usually 2 to 30, preferably 3 to 20. The number of carbon atoms of the branched alkenyl group, not including the number of carbon atoms of the substituent, is usually 3 to 30, preferably 4 to 20.

The number of carbon atoms of "Cycloalkenyl group", not including the number of carbon atoms of the substituent, is usually 3 to 30, preferably 4 to 20.

The alkenyl group and cycloalkenyl group each optionally have a substituent, and examples thereof include a vinyl group, a 1-propenyl group, a 2-propenyl group, a 2-butenyl group, a 3-butenyl group, a 3-pentenyl group, a 4-pentenyl group, a 1-hexenyl group, a 5-hexenyl group, a 7-octenyl group, and these groups having a substituent.

"Alkynyl group" may be any of linear or branched. The number of carbon atoms of the alkynyl group, not including the number of carbon atoms of the substituent, is usually 2 to 20, preferably 3 to 20. The number of carbon atoms of the branched alkynyl group, not including the number of carbon atoms of the substituent, is usually 4 to 30, preferably 4 to 20.

The number of carbon atoms of "Cycloalkynyl group", not including the number of carbon atoms of the substituent, is usually 4 to 30, preferably 4 to 20.

The alkynyl group and cycloalkynyl group each optionally have a substituent, and examples thereof include an ethynyl group, a 1-propynyl group, a 2-propynyl group, a 2-butynyl group, a 3-butynyl group, a 3-pentynyl group, a 4-pentynyl group, a 1-hexynyl group, a 5-hexynyl group, and these groups having a substituent.

"Arylene group" denotes an atomic group remaining after removing from an aromatic hydrocarbon two hydrogen atoms linked directly to carbon atoms constituting the ring. The number of carbon atoms of the arylene group is, not including the number of carbon atoms of a substituent, usually 6 to 60, preferably 6 to 30, more preferably 6 to 18.

The arylene group optionally has a substituent, and examples thereof include a phenylene group, a naphthalenediyl group, an anthracenediyl group, a phenanthrenediyl group, a dihydrophenanthrenediyl group, a naphthacenediyl group, a fluorenediyl group, a pyrenediyl group, a perylenediyl group, a chrysenediyl group, and these groups having a substituent, preferably, groups represented by the formulae (A-1) to (A-20). The arylene group includes groups obtained by linking a plurality of these groups.

(Chemical Formula 9)

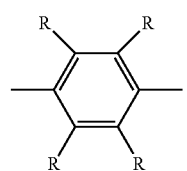

(A-1)

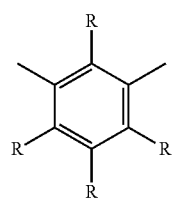

(A-2)

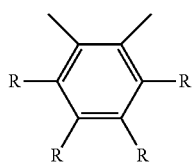 (A-3)
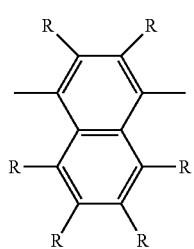 (A-4)
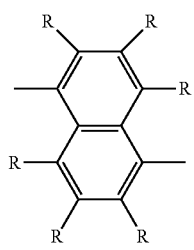 (A-5)
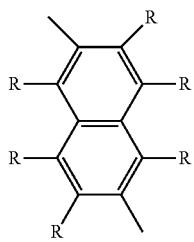 (A-6)
(Chemical Formula 10)
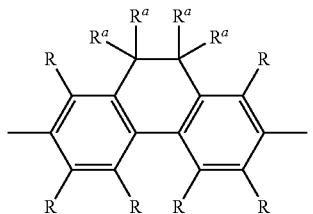 (A-7)
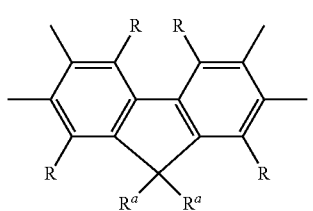 (A-8)
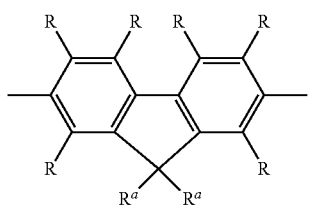 (A-9)
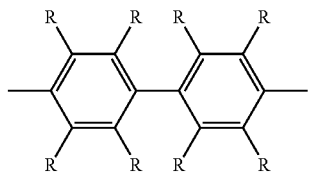 (A-10)
(Chemical Formula 11)
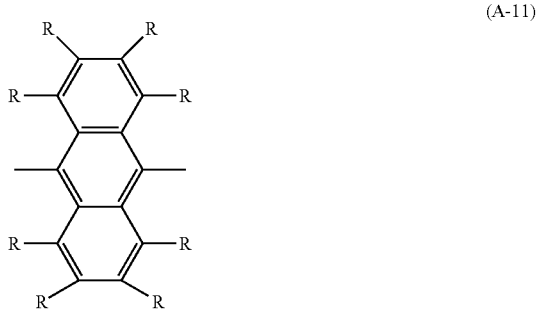 (A-11)
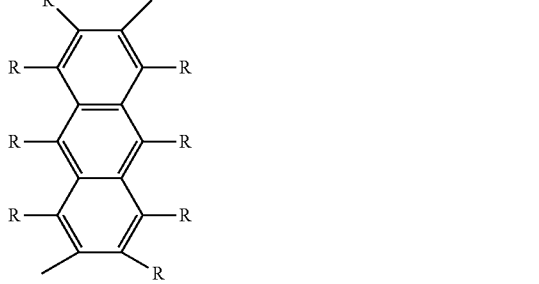 (A-12)
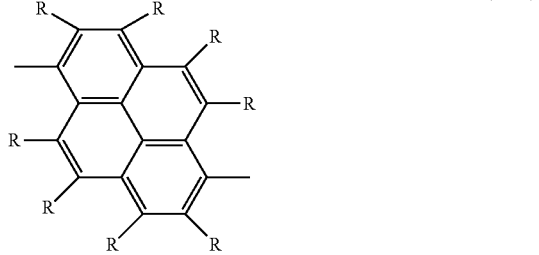 (A-13)
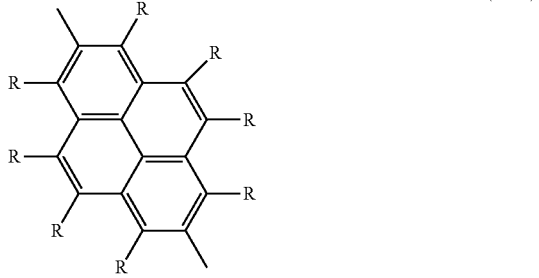 (A-14)
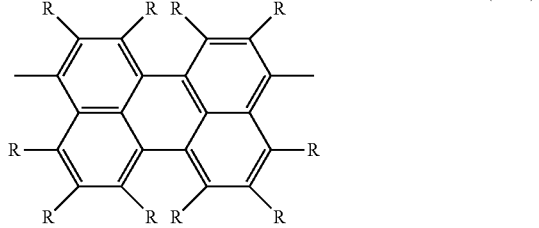 (A-15)

(Chemical Formula 12)

(A-16)
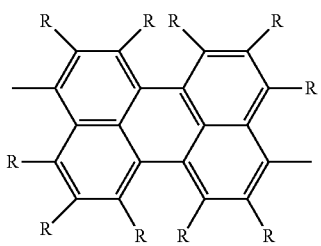

(A-17)
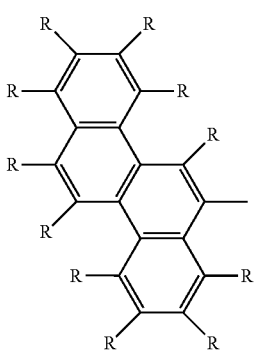

(A-18)
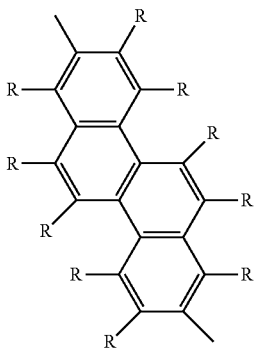

(A-19)
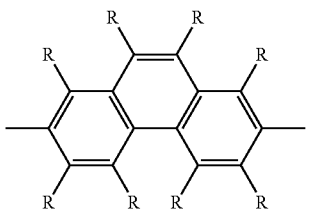

(A-20)
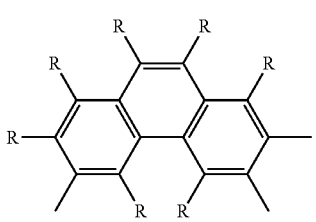

[wherein, R and $R^a$ each independently represent a hydrogen atom, an alkyl group, a cycloalkyl group, an aryl group or a monovalent heterocyclic group. The plurality of R and $R^a$ each may be the same or different, and groups $R^a$ may be combined together to form a ring together with the atoms to which they are attached.]

The number of carbon atoms of the divalent heterocyclic group is, not including the number of carbon atoms of a substituent, usually 2 to 60, preferably 3 to 20, more preferably 4 to 15.

The divalent heterocyclic group optionally has a substituent, and examples thereof include divalent groups obtained by removing from pyridine, diazabenzene, triazine, azanaphthalene, diazanaphthalene, carbazole, dibenzofuran, dibenzothiophene, dibenzosilole, phenoxazine, phenothiazine, acridine, dihydroacridine, furan, thiophene, azole, diazole and triazole two hydrogen atoms among hydrogen atoms linking directly to a carbon atom or a hetero atom constituting the ring, preferably groups represented by the formulae (AA-1) to (AA-34). The divalent heterocyclic group includes groups obtained by linking a plurality of these groups.

(Chemical Formula 13)

(AA-1)
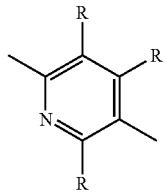

(AA-2)
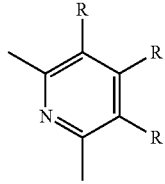

(AA-3)
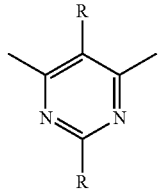

(AA-4)
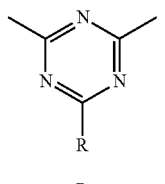

(AA-5)
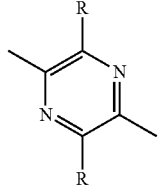

(AA-6)
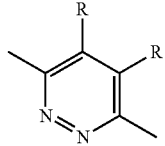

(AA-7) 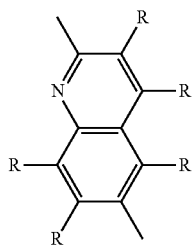
(Chemical Formula 14)
(AA-8) 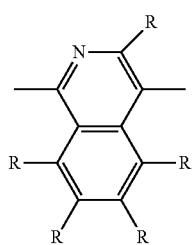
(AA-9) 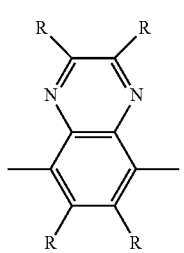
(AA-10) 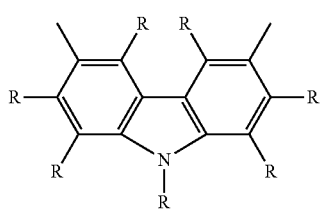
(AA-11) 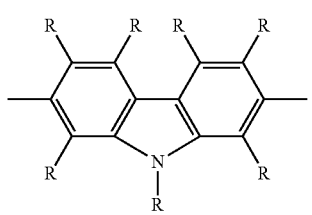
(AA-12) 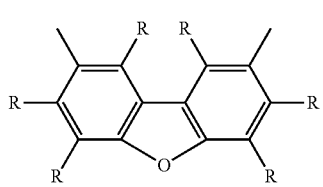
(Chemical Formula 15)
(AA-13) 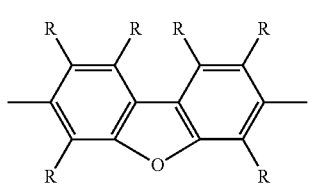
(AA-14) 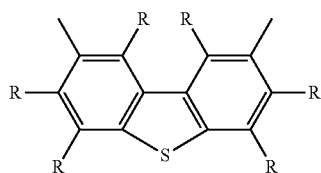
(AA-15) 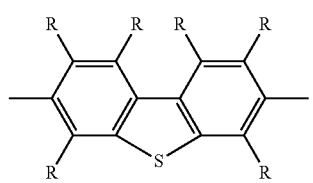
(AA-16) 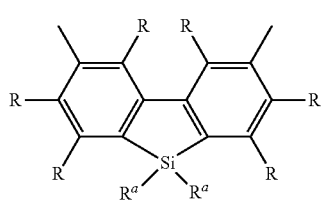
(Chemical Formula 16)
(AA-17) 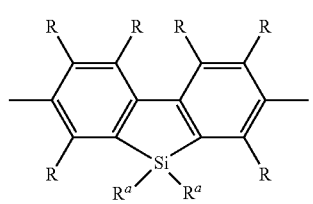
(AA-18) 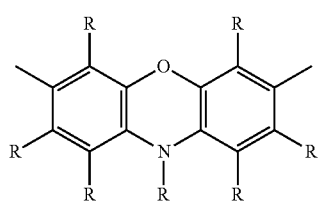
(AA-19) 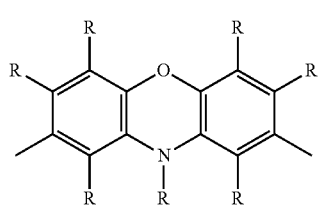
(AA-20) 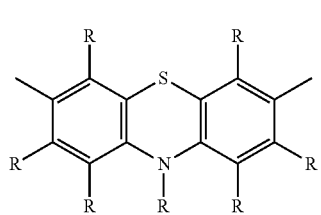

(Chemical Formula 17)

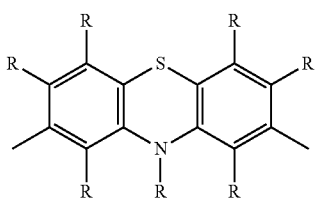
(AA-21)

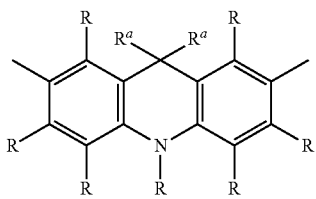
(AA-22)

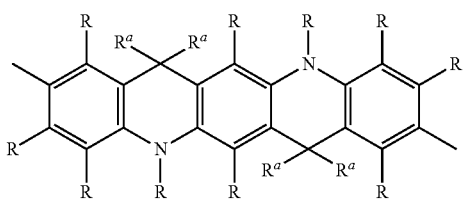
(AA-23)

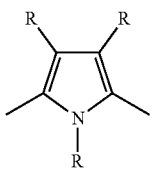
(AA-24)

(Chemical Formula 18)

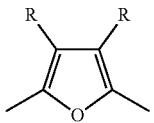
(AA-25)

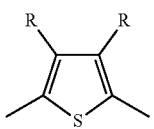
(AA-26)

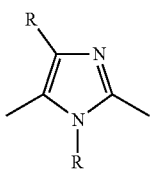
(AA-27)

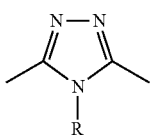
(AA-28)

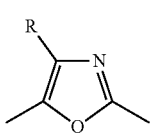
(AA-29)

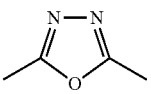
(AA-30)

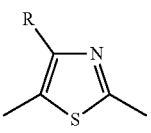
(AA-31)

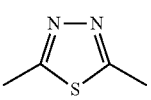
(AA-32)

(Chemical Formula 19)

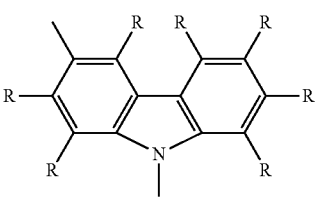
(AA-33)

(AA-34)

[wherein, R and $R^a$ represent the same meaning as described above.]

"Crosslinkable group" is a group capable of forming a new bond by being subjected to heating, ultraviolet irradiation, near ultraviolet irradiation, visible light irradiation, infrared irradiation, a radical reaction and the like, and the crosslinkable groups are preferably crosslinkable groups represented by the formulae (XL-1) to (XL-16).

"Substituent" represents a halogen atom, a cyano group, an alkyl group, a cycloalkyl group, an aryl group, a monovalent heterocyclic group, an alkoxy group, a cycloalkoxy group, an aryloxy group, an amino group, a substituted amino group, an alkenyl group, a cycloalkenyl group, an alkynyl group or a cycloalkynyl group. The substituent may be a crosslinkable group.

<Polymer Compound>

The polymer compound of the present invention is a polymer compound comprising a constitutional unit represented by the formula (1A) or the formula (1B) and a constitutional unit represented by the formula (2A) or the formula (2B).

[Constitutional Unit Represented by Formula (1A)]

(Chemical Formula 20)

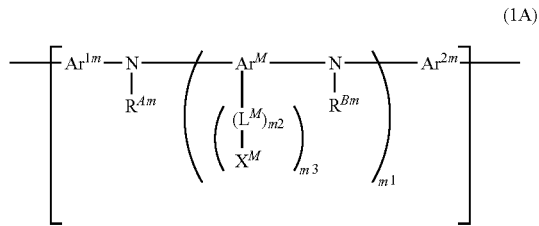

(1A)

$R^{Am}$ and $R^{Bm}$ are each preferably a hydrogen atom, an alkyl group, a cycloalkyl group, an aryl group or a monovalent heterocyclic group, more preferably an aryl group or a monovalent heterocyclic group, further preferably an aryl group.

The alkyl group represented by $R^{Am}$ and $R^{Bm}$ is preferably a methyl group, an ethyl group, a propyl group, an isopropyl group, a butyl group, an isobutyl group, a tert-butyl group, a pentyl group, an isoamyl group, a 2-ethylbutyl group, a hexyl group, a heptyl group, an octyl group or a 2-ethylhexyl group, more preferably a methyl group, an ethyl group, a butyl group, a tert-butyl group, a pentyl group, a hexyl group, an octyl group or a 2-ethylhexyl group, and these groups each optionally have a substituent.

The aryl group represented by $R^{Am}$ and $R^{Bm}$ is preferably a phenyl group, a 1-naphthyl group, a 2-naphthyl group, a 1-anthracenyl group, a 2-anthracenyl group, a 9-anthracenyl group, a 2-fluorenyl group, a 3-fluorenyl group, a 4-fluorenyl group, a 2-phenylphenyl group, a 3-phenylphenyl group or 4-phenylphenyl group, more preferably a phenyl group, a 1-naphthyl group, a 2-naphthyl group, a 2-fluorenyl group, a 3-fluorenyl group or a 4-fluorenyl group, further preferably a phenyl group, and these groups each optionally have a substituent.

When a plurality of $R^{Bm}$ are present, it is preferable that they are the same, because synthesis of the polymer compound of the present invention is easy.

$Ar^{1m}$ and $Ar^{2m}$ are each preferably an aryl group optionally having a substituent.

The arylene group represented by $Ar^{1m}$ and $Ar^{2m}$ is preferably a group represented by the formula (A-1), the formula (A-6), the formula (A-7), the formula (A-9) to the formula (A-11), the formula (A-13) or the formula (A-19), more preferably a group represented by the formula (A-1), the formula (A-7), the formula (A-9) or the formula (A-19), further preferably a group represented by the formula (A-1), and these groups each optionally have a substituent, because synthesis of the polymer compound of the present invention is easy.

The divalent heterocyclic group represented by $Ar^{1m}$ and $Ar^{2m}$ is preferably a group represented by the formula (AA-4), the formula (AA-10), the formula (AA-13), the formula (AA-15), the formula (AA-18) or the formula (AA-26), more preferably a group represented by the formula (AA-4), the formula (AA-10), the formula (AA-18) or the formula (AA-26), and these groups each optionally have a substituent, because synthesis of the polymer compound of the present invention is easy.

$Ar^M$ is preferably an aromatic hydrocarbon group optionally having a substituent, because synthesis of the polymer compound of the present invention is easy.

The number of carbon atoms of the aromatic hydrocarbon group represented by $Ar^M$ is usually 6 to 60, preferably 6 to 30, more preferably 6 to 18, not including the number of carbon atoms of a substituent.

The aromatic hydrocarbon group optionally having a substituent represented by $Ar^M$ is preferably a group obtained by removing from a benzene ring optionally having a substituent, a fluorene ring optionally having a substituent, a naphthalene ring optionally having a substituent, a phenanthrene ring optionally having a substituent or a dihydrophenanthrene ring optionally having a substituent (m3+2) hydrogen atoms bonding directly to carbon atoms constituting the ring, because the polymer compound of the present invention is more excellent in crosslinkability.

The substituent which the aromatic hydrocarbon group and the heterocyclic group represented by $Ar^M$ can have is preferably an alkyl group, a cycloalkyl group, an alkoxy group, a cycloalkoxy group, an aryl group, an aryloxy group, a halogen atom, a monovalent heterocyclic group or a cyano group.

When a plurality of $Ar^M$ are present, it is preferable that they are the same, because synthesis of the polymer compound of the present invention is easy.

m1 and m3 are each preferably an integer of 1 to 3, more preferably 1 or 2, further preferably 1, because synthesis of the polymer compound of the present invention is easy.

m2 is preferably 1 or 2, further preferably 1, because the polymer compound of the present invention is more excellent in crosslinkability.

$L^M$ is preferably an alkylene group, a cycloalkylene group, an arylene group or a divalent heterocyclic group, more preferably an alkylene group or an arylene group, further preferably an alkylene group, and these groups each optionally have a substituent, because the polymer compound of the present invention is more excellent in crosslinkability.

The alkylene group represented by $L^M$ usually has 1 to 10, preferably 1 to 8, more preferably 1 to 6, not including the number of carbon atoms of a substituent. The alkylene group optionally has a substituent, and examples thereof include a methylene group, an ethylene group, a propylene group, a butylene group, a hexylene group and an octylene group, preferably a hexylene group or an octylene group.

The number of carbon atoms of the cycloalkylene group represented by $L^M$ is usually 3 to 10, not including the number of carbon atoms of a substituent. The cycloalkylene group optionally has a substituent, and examples thereof include a cyclohexylene group and a cyclopentylene group.

The substituent which the group represented by $L^M$ can have is preferably an alkyl group, a cycloalkyl group or an aryl group.

The preferable range of the arylene group and the divalent heterocyclic group represented by $L^M$ is the same as the preferable range of the arylene group and the divalent heterocyclic group represented by $Ar^{1m}$.

When a plurality of $L^M$ are present, it is preferable that groups represented by —N(R')— are not mutually adjacent to each other, oxygen atoms are not mutually adjacent to each other, sulfur atoms are not mutually adjacent to each other and an oxygen atom and a sulfur atom are not adjacent to each other.

$X^M$ is preferably a crosslinkable group represented by the formula (XL-9), the formula (XL-10), the formula (XL-11), the formula (XL-12), the formula (XL-13) or the formula (XL-16), because synthesis of the polymer compound of the present invention is easy.

$X^M$ is preferably a monovalent group containing a crosslinkable group represented by the formula (XL-11) to the formula (XL-13) or the formula (XL-16), more preferably a monovalent group containing a crosslinkable group represented by the formula (XL-13) or the formula (XL-16), further preferably a monovalent group containing a crosslinkable group represented by the formula (XL-16), because the polymer compound of the present invention is more excellent in crosslinkability.

The substituent which the crosslinkable group represented by $X^M$ can have is preferably an alkyl group, a cycloalkyl group or an aryl group, more preferably an alkyl group, because synthesis of the polymer compound of the present invention is easy.

When a plurality of $X^M$ are present, it is preferable that they are the same, because synthesis of the polymer compound of the present invention is easy.

$-(L^M)_{m2}-X^M$ is preferably a monovalent group represented by the formula (A).

(Chemical Formula 21)

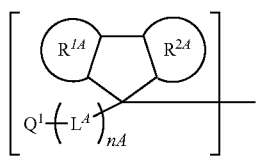

(A)

The ring $R^{1A}$ and the ring $R^{2A}$ are each preferably an aromatic hydrocarbon ring optionally having a substituent, because a light emitting device using the polymer compound of the present invention is excellent in light emission efficiency.

The aromatic hydrocarbon ring represented by the ring $R^{1A}$ and the ring $R^{2A}$ is, for example, an aromatic hydrocarbon ring containing a 6-membered ring, preferably a benzene ring, a naphthalene ring, a phenanthrene ring, a dihydrophenanthrene ring or a fluorene ring, more preferably a benzene ring, a naphthalene ring or a fluorene ring, further preferably a benzene ring, and these rings each optionally have a substituent.

The heterocyclic ring represented by the ring $R^{1A}$ and the ring $R^{2A}$ is, for example, a 5-membered or 6-membered aromatic heterocyclic ring, preferably a thiophene ring, a furan ring, a pyrrole ring, a dibenzothiophene ring, a dibenzofuran ring, a carbazole ring, a pyridine ring, a triazine ring or a pyrimidine ring, more preferably a thiophene ring, a carbazole ring, a pyridine ring or a triazine ring, and these rings each optionally have a substituent.

The substituent which the ring represented by the ring $R^{1A}$ and the ring $R^{2A}$ optionally have is preferably an alkyl group, a cycloalkyl group or an aryl group.

It is preferable that the ring $R^{1A}$ and the ring $R^{2A}$ are the same, because production of the polymer compound of the present invention is easy.

nA is preferably 0 or 1, more preferably 0, because a light emitting device using the polymer compound of the present invention is excellent in light emission efficiency.

$L^A$ is preferably an alkylene group, a cycloalkylene group, an arylene group or a divalent heterocyclic group, more preferably an alkylene group or an arylene group, further preferably an alkylene group, and these groups each optionally have a substituent, because a light emitting device using the polymer compound of the present invention is excellent in light emission efficiency.

The alkylene group and the cycloalkylene group represented by $L^A$ represent the same meaning as that of the alkylene group and the cycloalkylene group represented by $L^M$.

The substituent which the group represented by $L^A$ can have is preferably an alkyl group, a cycloalkyl group or an aryl group.

When a plurality of $L^A$ are present, it is preferable that they are the same, because production of the polymer compound of the present invention is easy.

When a plurality of $L^A$ are present, it is preferable that groups represented by —N(R")— are not mutually adjacent to each other, oxygen atoms are not mutually adjacent to each other, sulfur atoms are not mutually adjacent to each other and an oxygen atom and a sulfur atom are not adjacent to each other.

The group represented by the formula (A) includes, for example, groups represented by the formula (A-1) to the formula (A-18), preferably groups represented by the formula (A-1) to the formula (A-5), the formula (A-13), the formula (A-14) or the formula (A-16), more preferably groups represented by the formula (A-1) to the formula (A-3), the formula (A-13) or the formula (A-16), further preferably groups represented by the formula (A-1) to the formula (A-3).

TABLE 1

| formula | | $Q^1$ | $(L^A)_{nA}$ |
|---|---|---|---|
| (A-1) | | | none |

TABLE 1-continued
| formula | 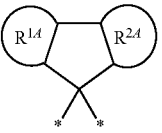 $Q^1$ | $(L^A)_{nA}$ |
|---|---|---|
| (A-2) | 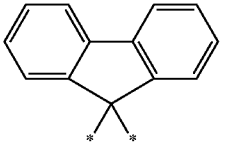 [SMILES: *C1(*)c2ccccc2-c2ccccc21] 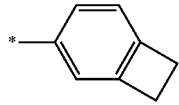 [SMILES: *c1ccc2c(c1)CC2] | 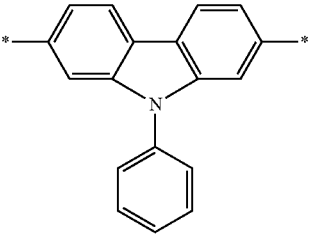 [SMILES: *c1ccc2c3ccc(*)cc3n(-c3ccccc3)c2c1] |
| (A-3) | 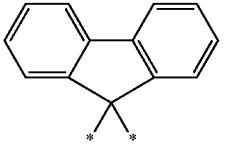 [SMILES: *C1(*)c2ccccc2-c2ccccc21] 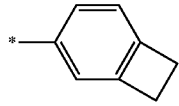 [SMILES: *c1ccc2c(c1)CC2] | 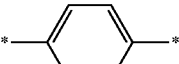 |
| (A-4) | 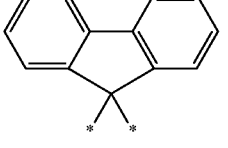 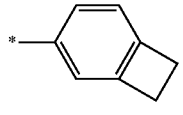 [SMILES: *c1ccc2c(c1)CC2] | 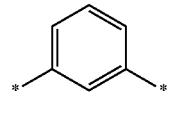 [SMILES: *c1cccc(*)c1] |
| (A-5) | 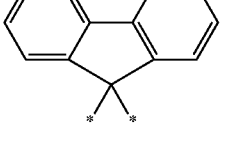 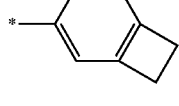 | 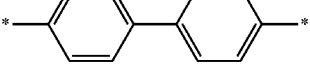 |
| (A-6) | 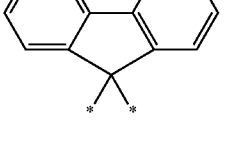 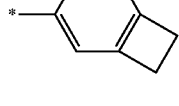 | 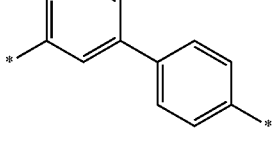 |
| (A-7) | 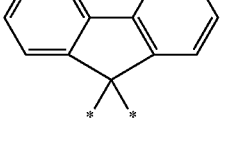 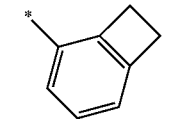 [SMILES: *c1cccc2c1CC2] | *—(CH$_2$)$_4$—* |
| (A-8) | 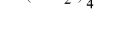 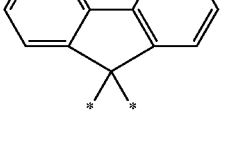 | 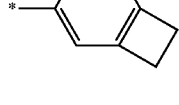 |
| (A-9) | 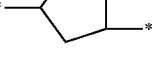 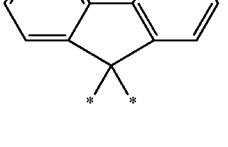 | 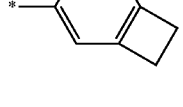 |

TABLE 1-continued

| formula | ![R1A R2A structure with *] | Q1 | (LA)nA |
|---|---|---|---|
| (A-10) | 9,9-fluorenyl | benzocyclobutenyl | 4,4'-diphenyl ether |

TABLE 2

| formula | ![R1A R2A structure with *] | Q1 | (LA)nA |
|---|---|---|---|
| (A-11) | 9,9-fluorenyl | benzocyclobutenyl | tri(4-methylphenyl-)amine with Me on top aryl |
| (A-12) | 9,9-fluorenyl | benzocyclobutenyl | *—(CH2)2—* |
| (A-13) | 2,7-di-t-Bu-9,9-fluorenyl | benzocyclobutenyl | none |
| (A-14) | 2,7-bis(2,4,6-trimethylphenyl)-9,9-fluorenyl | benzocyclobutenyl | *—(CH2)2—* |
| (A-15) | benzo-fused 9,9-fluorenyl | benzocyclobutenyl | *—(CH2–N(Me))3—* |
| (A-16) | benzo-fused 9,9-fluorenyl | benzocyclobutenyl | none |

TABLE 2-continued

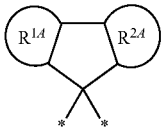

[wherein, * represents a binding site.]

The content of the constitutional unit represented by the formula (1A) is preferably 1 to 50 mol %, more preferably 2 to 25 mol %, further preferably 3 to 15 mol % with respect to the total amount of constitutional units contained in the polymer compound, because the polymer compound of the present invention is excellent in stability.

The constitutional unit represented by the formula (1A) includes, for example, constitutional units represented by the formula (1A-1) to the formula (1A-33), and these constitutional units each optionally have a substituent. Of them, preferable are constitutional units represented by the formula (1A-1) to the formula (1A-15) or the formula (1A-22) to the formula (1A-24), more preferable are constitutional units represented by the formula (1A-1) to the formula (1A-15), further preferable are constitutional units represented by the formula (1A-1) to the formula (1A-6), particularly preferable are constitutional units represented by the formula (1A-2), the formula (1A-3), the formula (1A-5) or the formula (1A-6), because the polymer compound of the present invention is more excellent in crosslinkability.

(Chemical Formula 22)

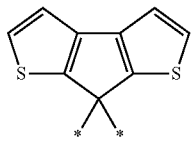 [SMILES: *C1(*)c2sccc2-c2ccsc21]
(1A-1)

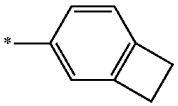
(1A-2)

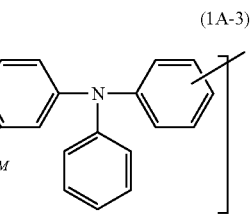
(1A-3)

(Chemical Formula 23)

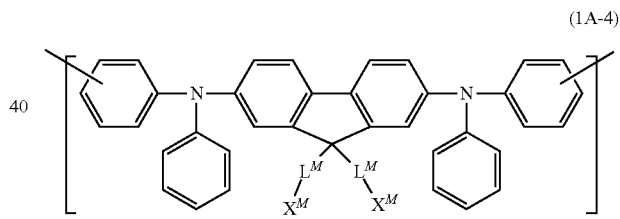
(1A-4)

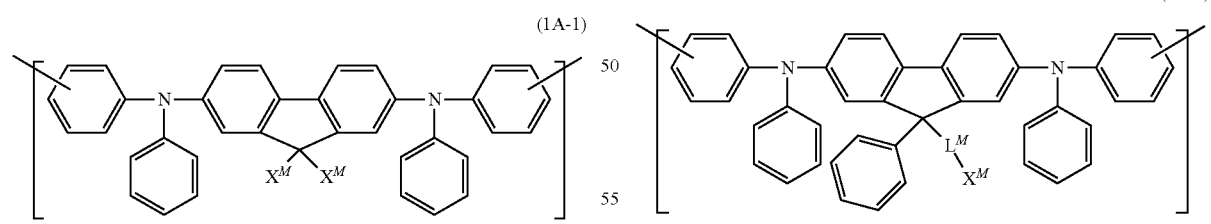
(1A-5)

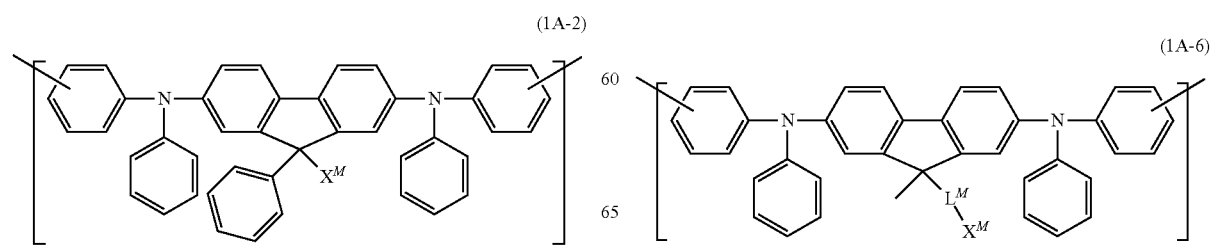
(1A-6)

(Chemical Formula 24)
(1A-7)
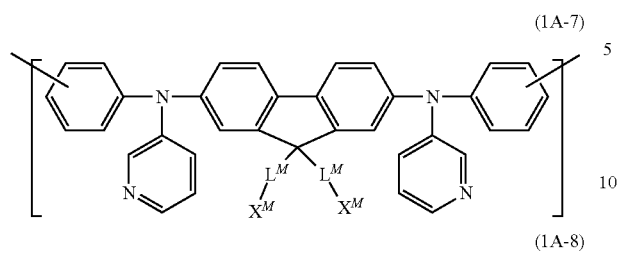
(1A-8)
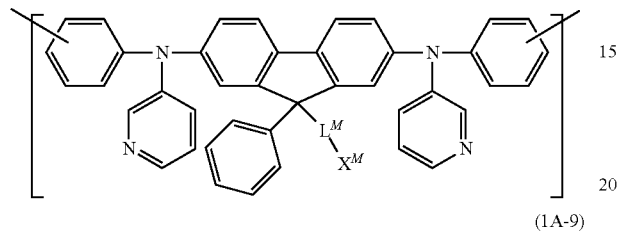
(1A-9)
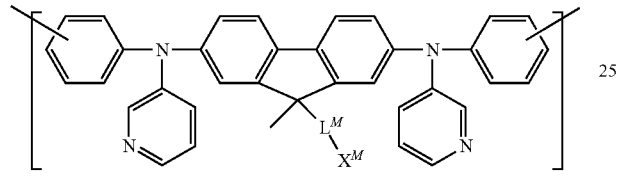
(Chemical Formula 25)
(1A-10)
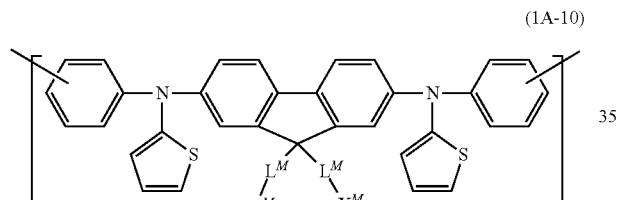
(1A-11)
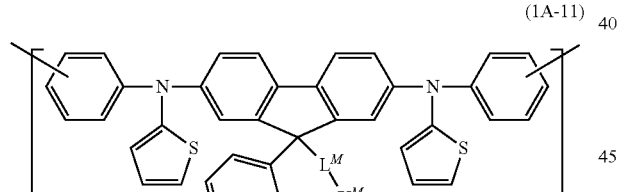
(1A-12)
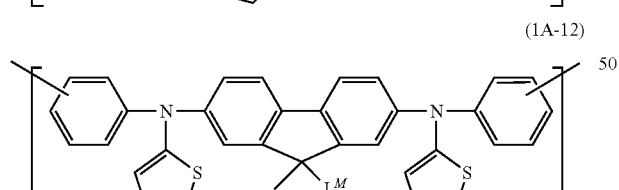
(Chemical Formula 26)
(1A-13)
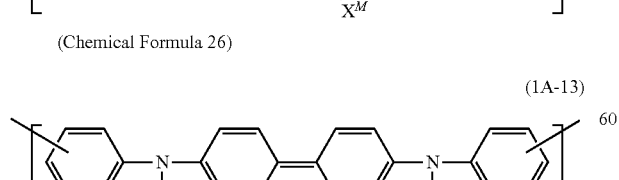
(1A-14)
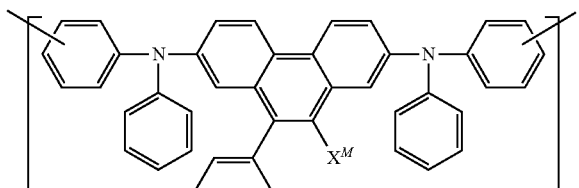
(1A-15)
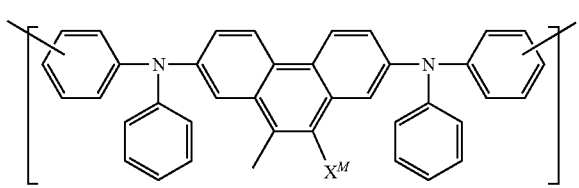
(1A-16)
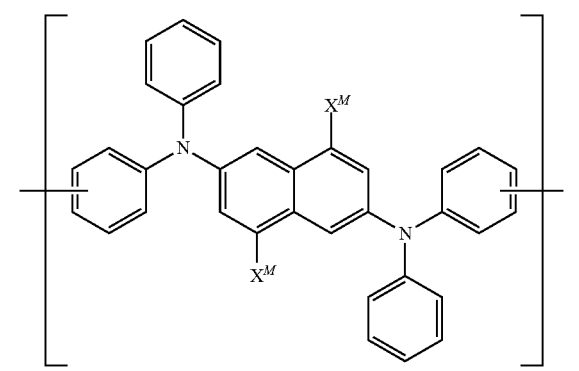
(1A-17)
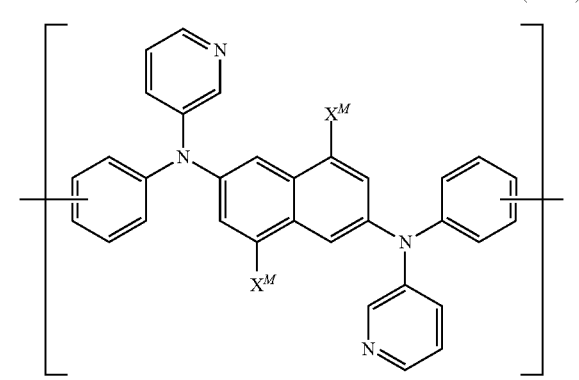
(1A-18)
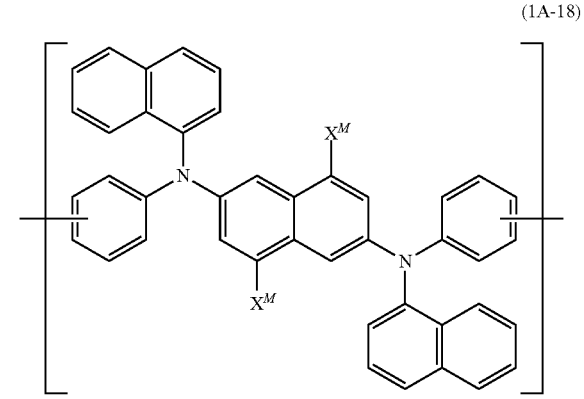

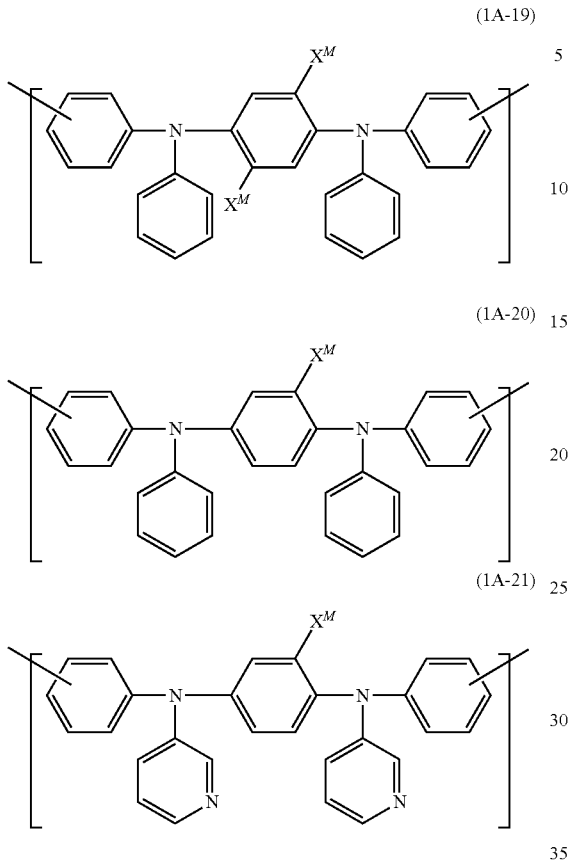
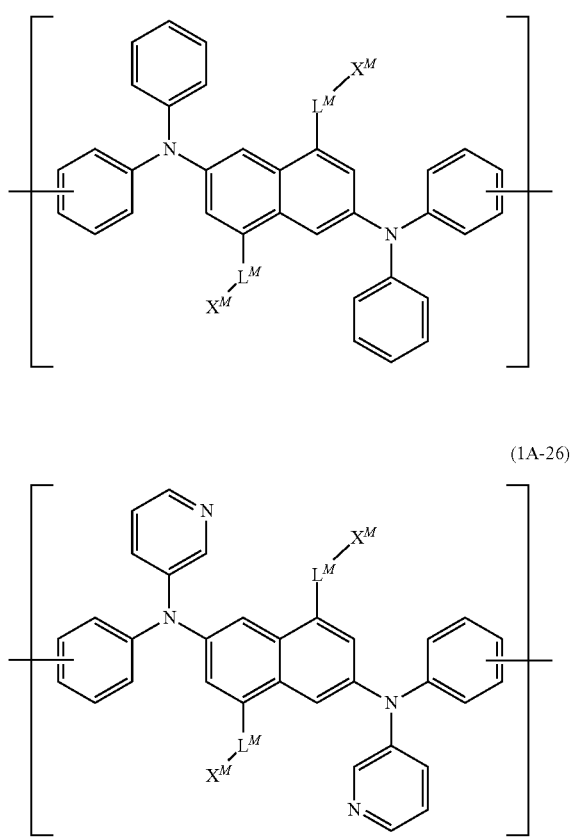
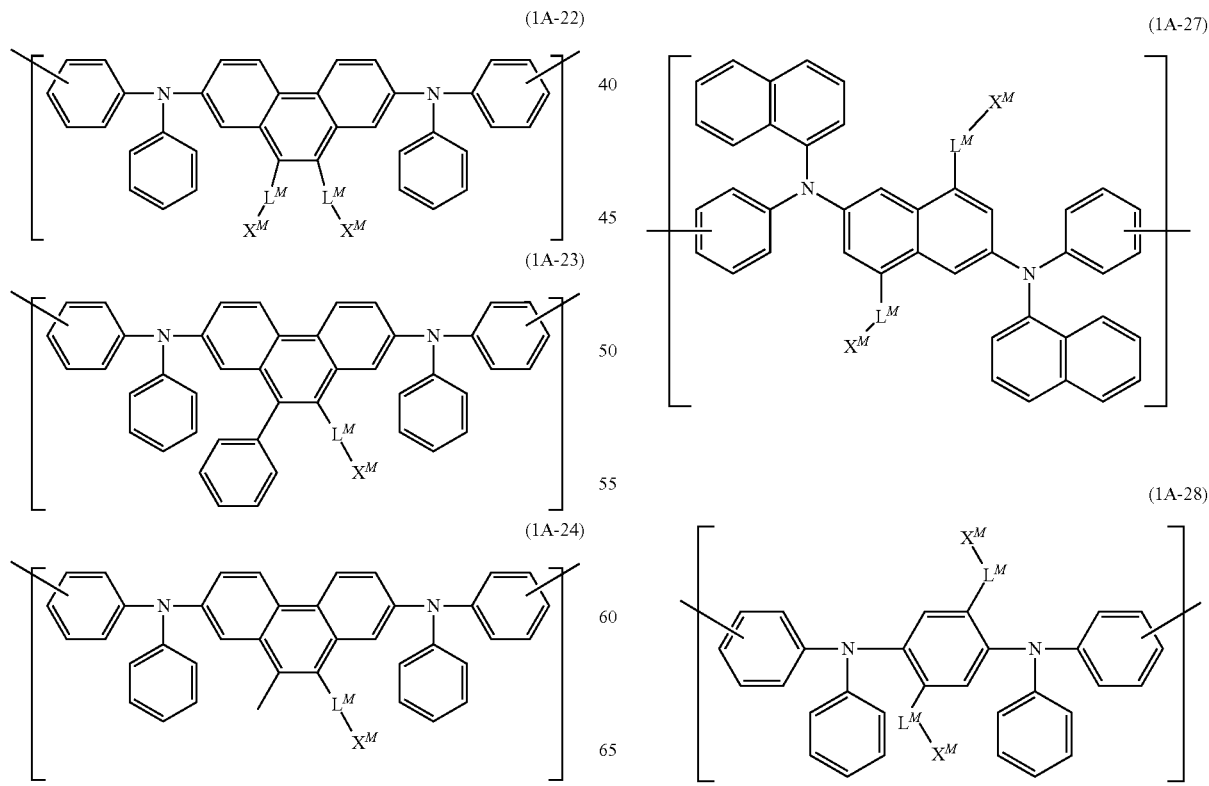

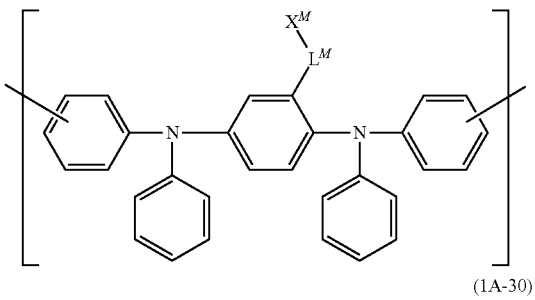
(1A-29)

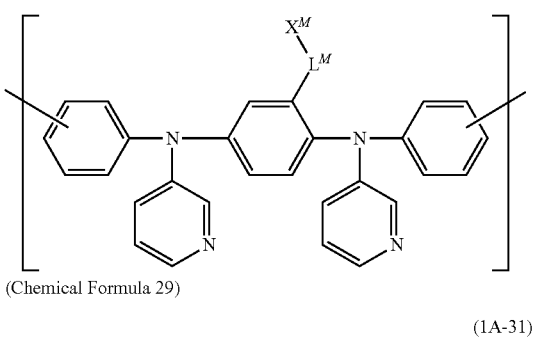
(1A-30)

(Chemical Formula 29)

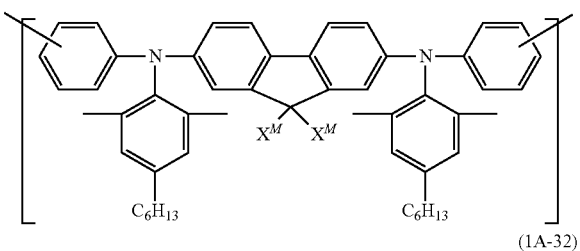
(1A-31)

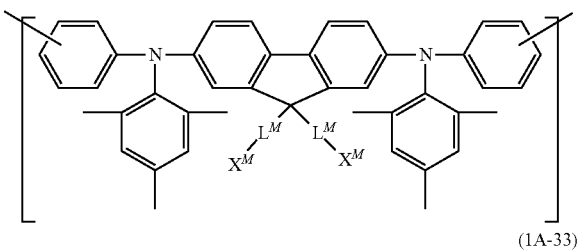
(1A-32)

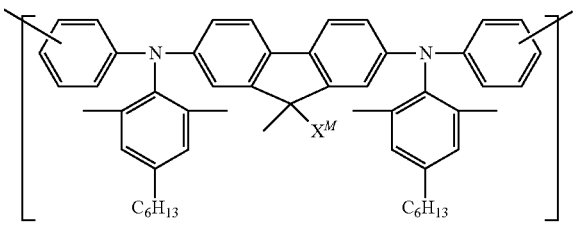
(1A-33)

[wherein, $L^M$ and $X^M$ represent the same meaning as described above. When a plurality of $L^M$ and $X^M$ are present, they may be the same or different at each occurrence.]

The constitutional unit represented by the formula (1A) specifically includes, for example, constitutional units represented by the formula (1A-101) to the formula (1A-151), and these constitutional units each optionally have a substituent. Of them, preferable are constitutional units represented by the formula (1A-101) to the formula (1A-124), the formula (1A-131) to the formula (1A-133), the formula (1A-137) or the formula (1A-138), more preferable are constitutional units represented by the formula (1A-101) to the formula (1A-109), the formula (1A-111), the formula (1A-112), the formula (1A-115), the formula (1A-117) or the formula (1A-119), further preferable are constitutional units represented by the formula (1A-105), the formula (1A-106), the formula (1A-108), the formula (1A-109), the formula (1A-111), the formula (1A-112) or the formula (1A-117), particularly preferable are constitutional units represented by the formula (1A-108), the formula (1A-109) or the formula (1A-117), because the polymer compound of the present invention is more excellent in crosslinkability.

(Chemical Formula 30)

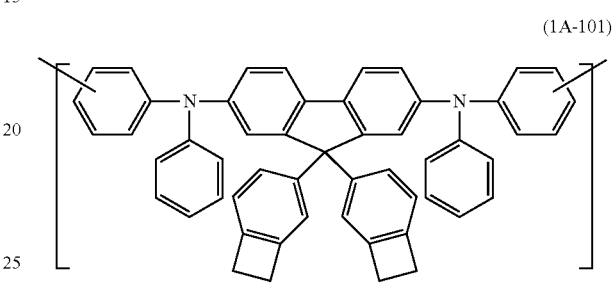
(1A-101)

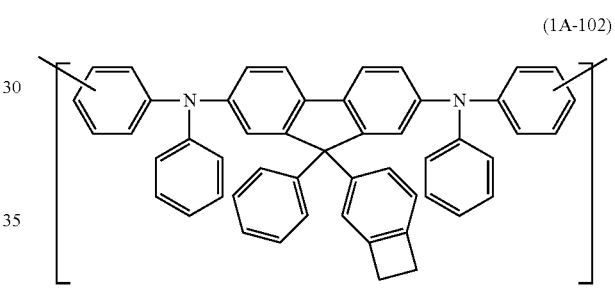
(1A-102)

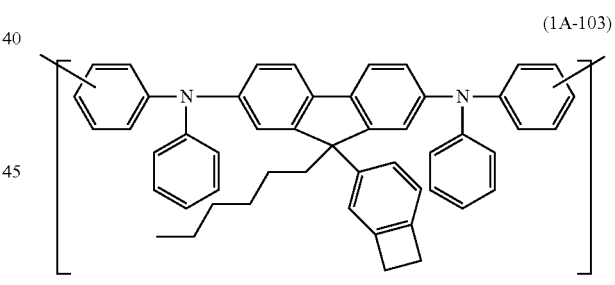
(1A-103)

(Chemical Formula 31)

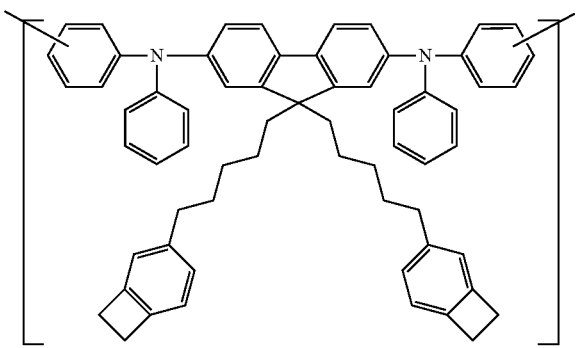
(1A-104)

-continued
(1A-105)
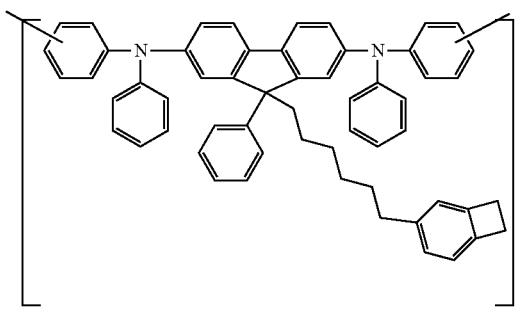
(1A-106)
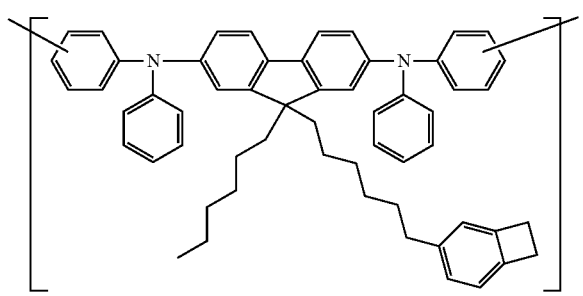
(Chemical Formula 32)
(1A-107)
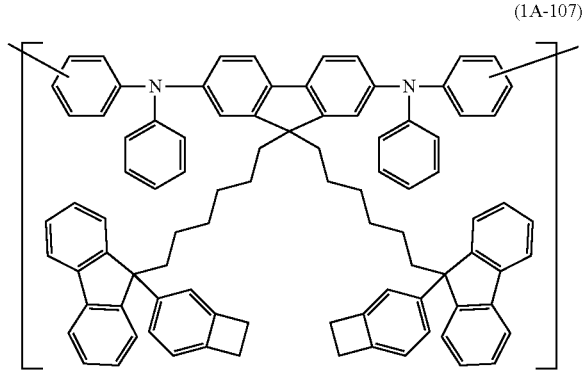
(1A-108)
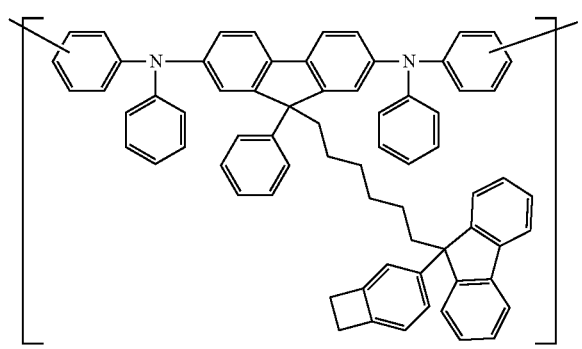
(1A-109)
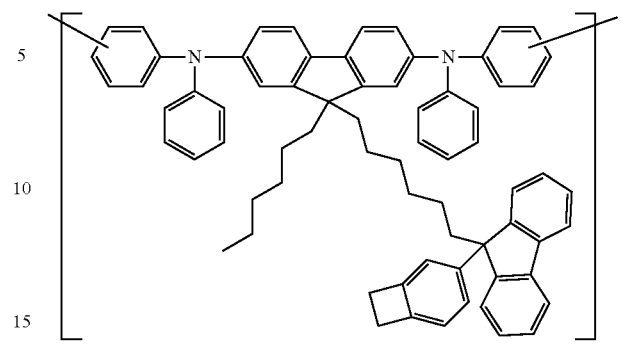
(Chemical Formula 33)
(1A-110)
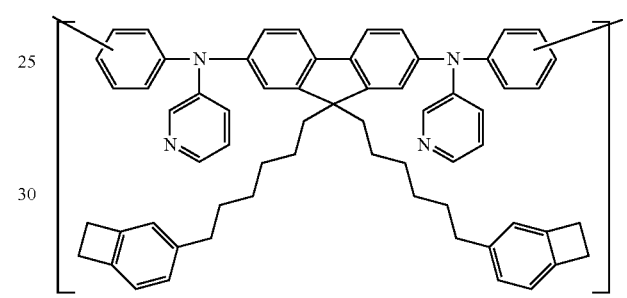
(1A-111)
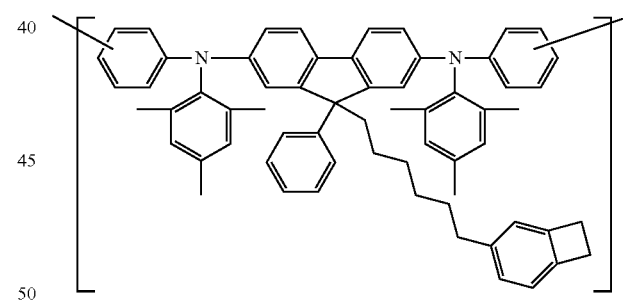
(1A-112)
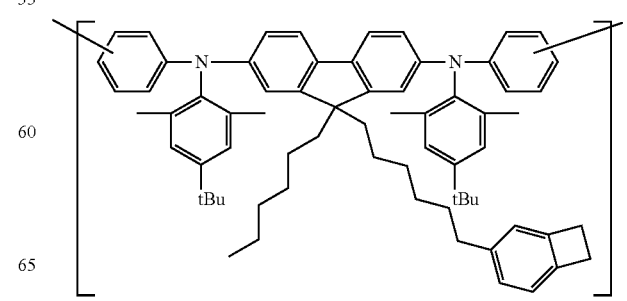

(Chemical Formula 34)
(1A-113)
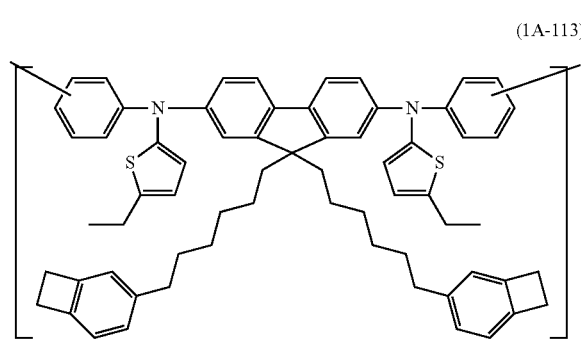
(1A-114)
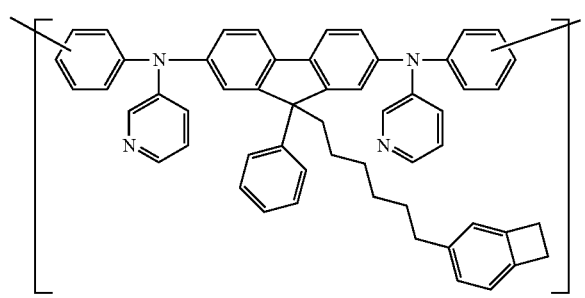
(1A-115)
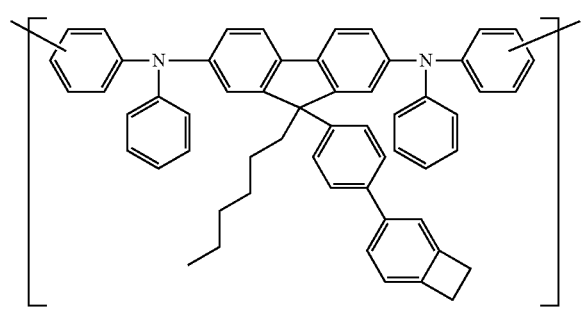
(Chemical Formula 35)
(1A-116)
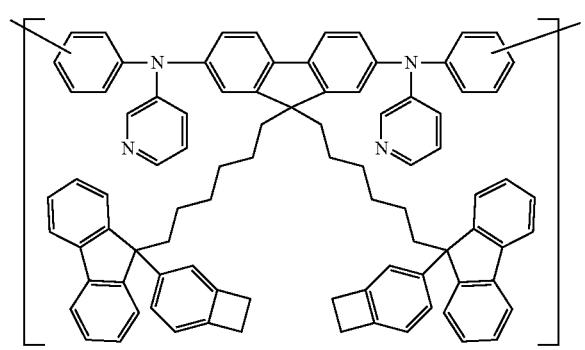
(1A-117)
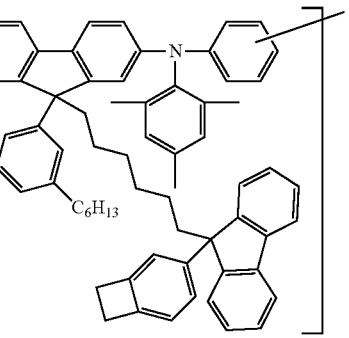
(1A-118)
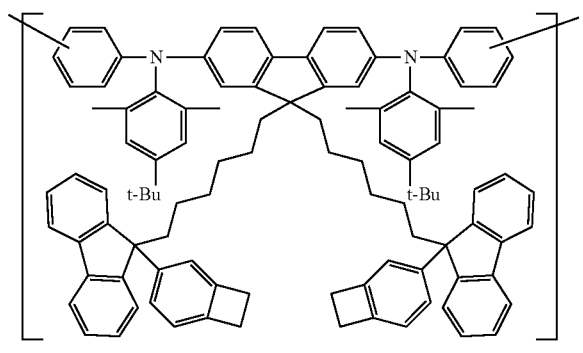
(Chemical Formula 36)
(1A-119)
(1A-120)
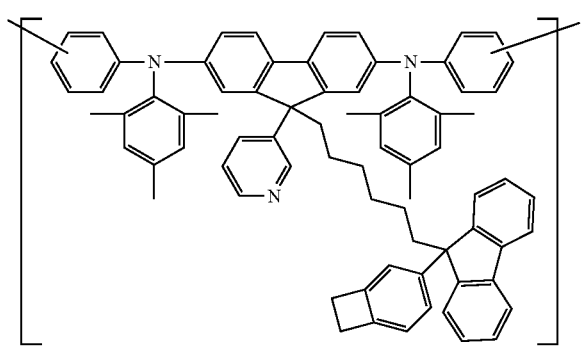

(1A-121)
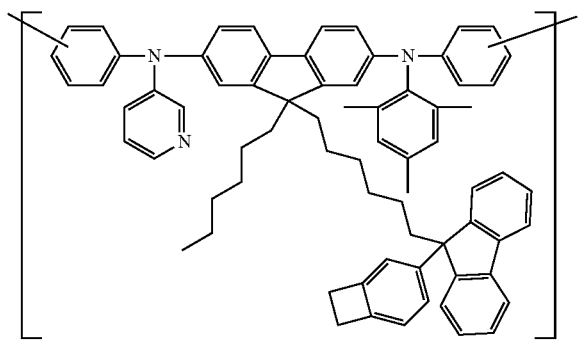
(Chemical Formula 37)
(1A-122)
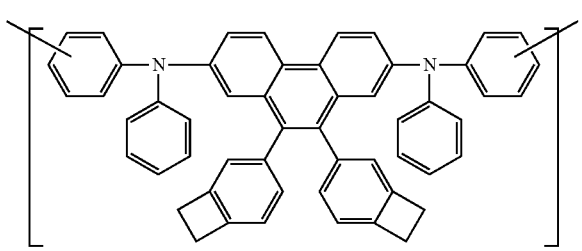
(1A-123)
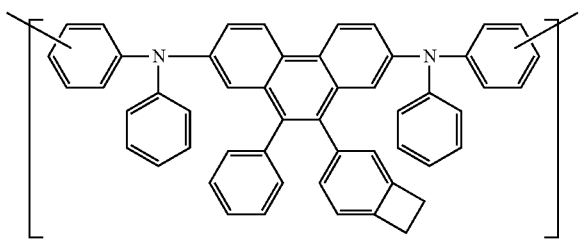
(1A-124)
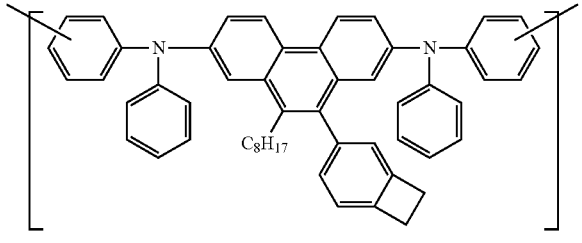
(1A-125)
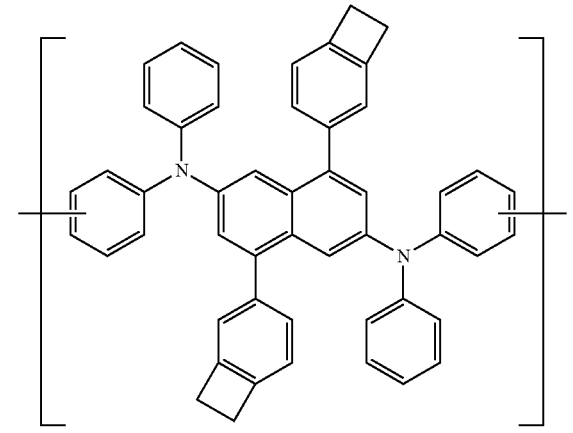
(1A-126)
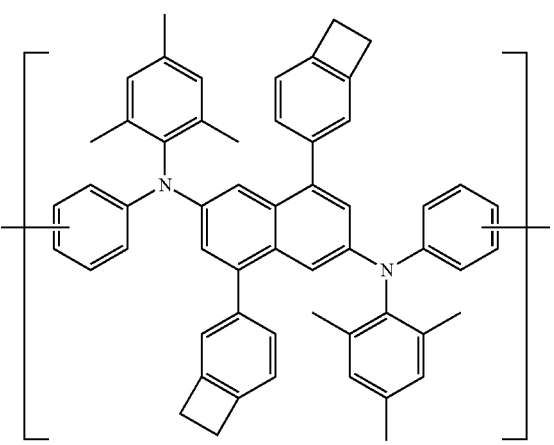
(1A-127)
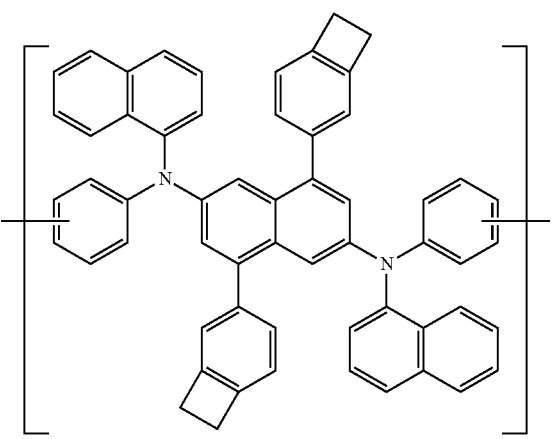
(Chemical Formula 38)
(1A-128)
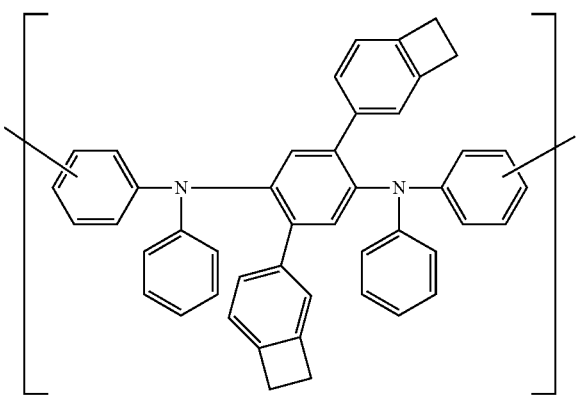

(1A-129)
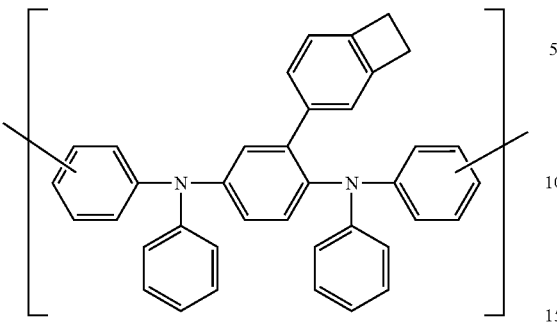
(1A-133)
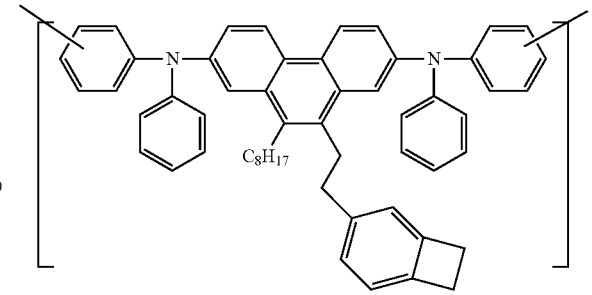
(1A-130)
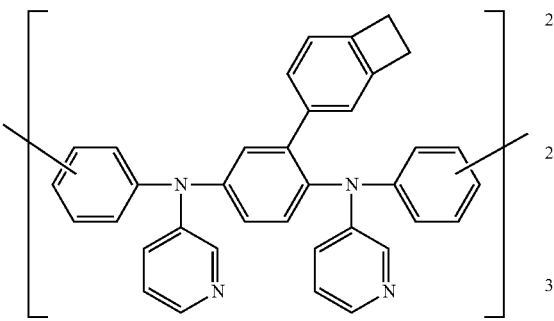
(Chemical Formula 40)
(1A-134)
(Chemical Formula 39)
(1A-131)
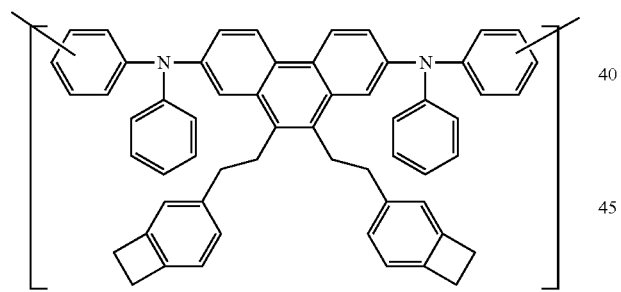
(1A-132)
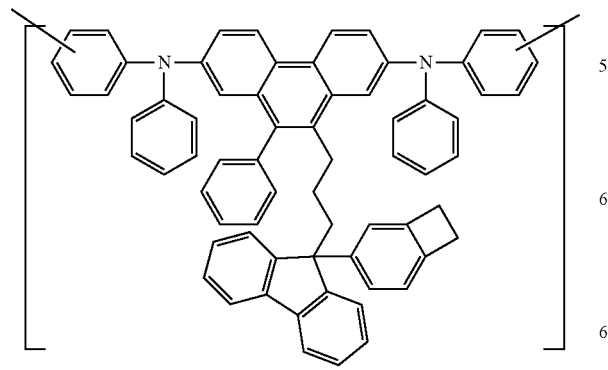
(1A-135)
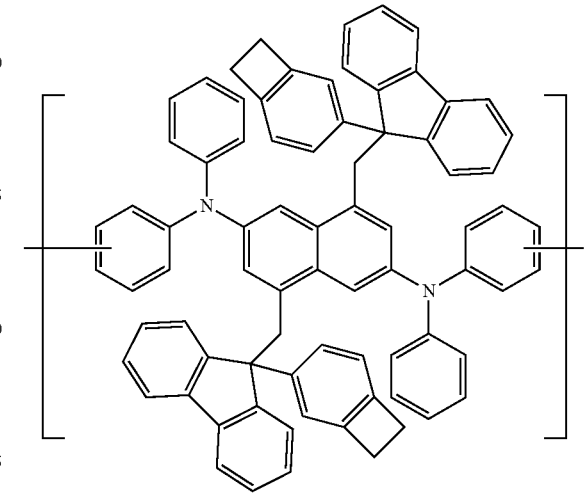

-continued
(1A-136)
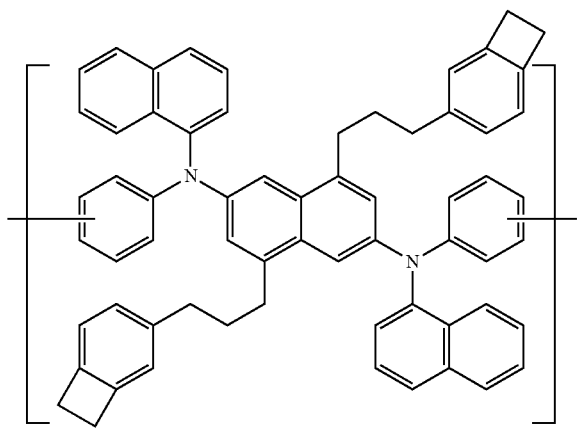
(Chemical Formula 41)
(1A-137)
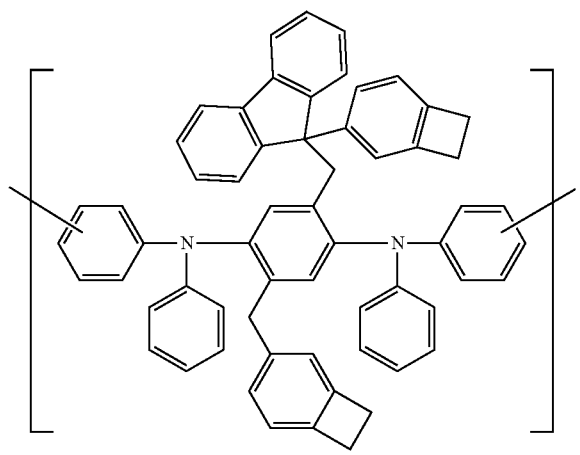
(1A-138)
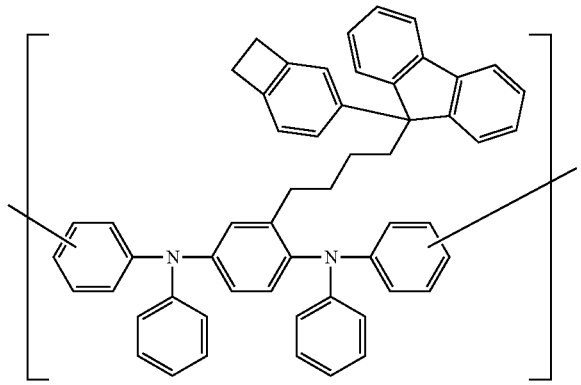
-continued
(1A-139)
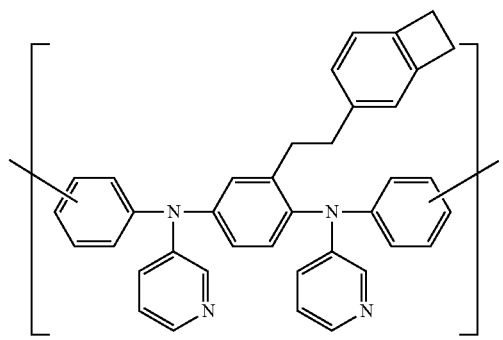
(Chemical Formula 42)
(1A-140)
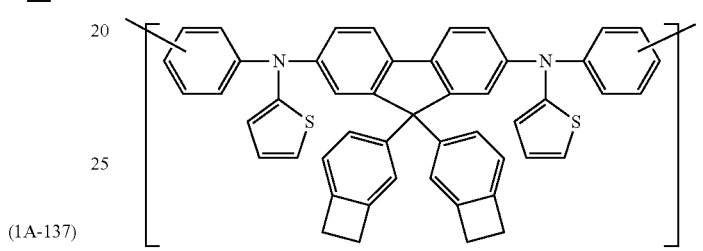
(1A-141)
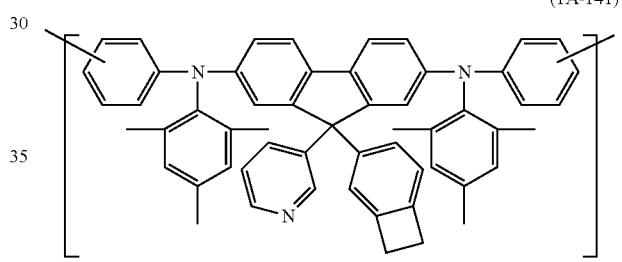
(1A-142)
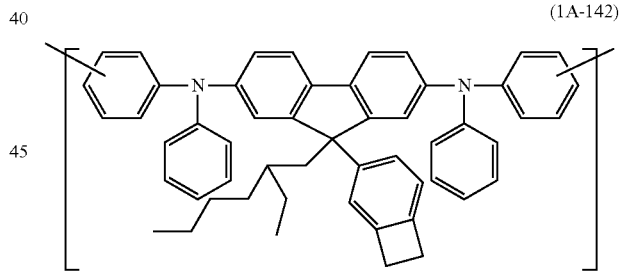
(Chemical Formula 43)
(1A-143)
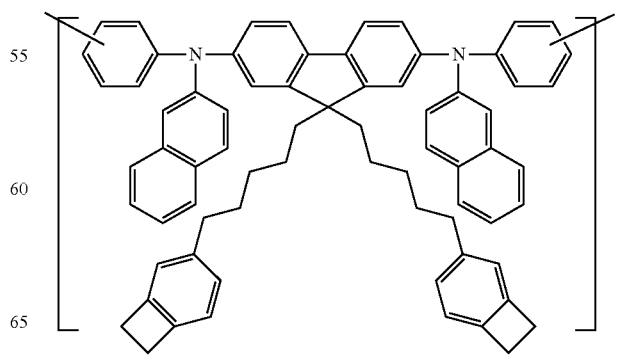

(1A-144)
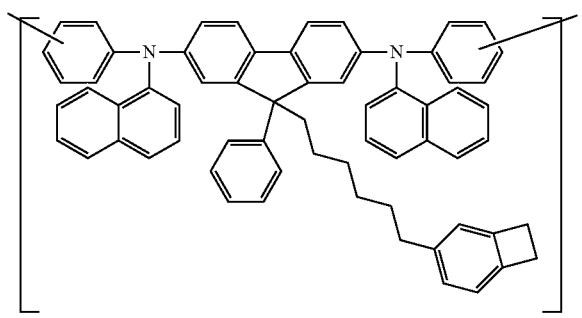
(1A-148)
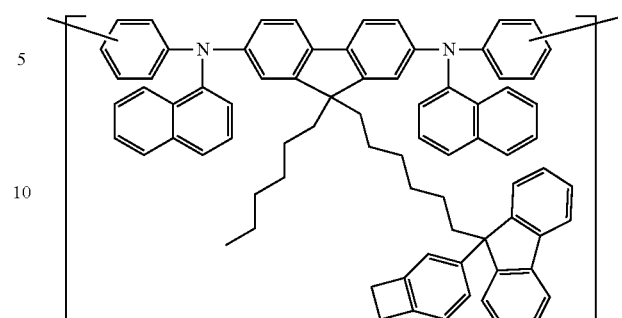
(1A-145)
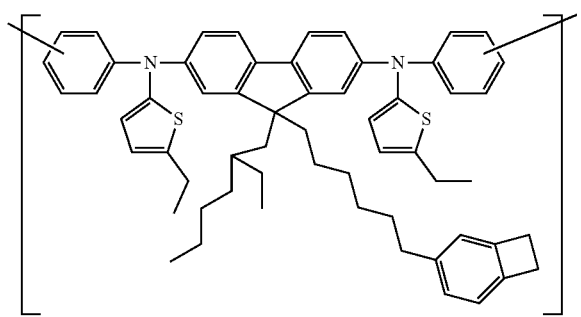
(Chemical Formula 45)
(1A-149)
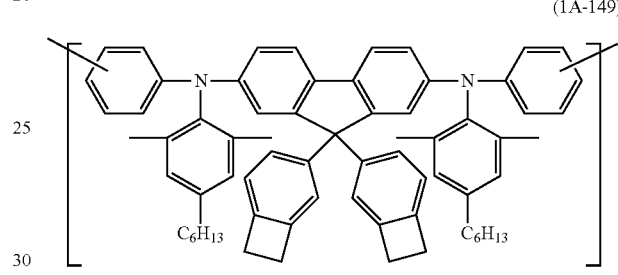
(Chemical Formula 44)
(1A-146)
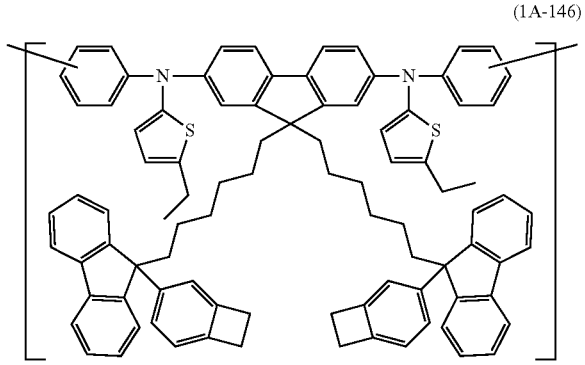
(1A-150)
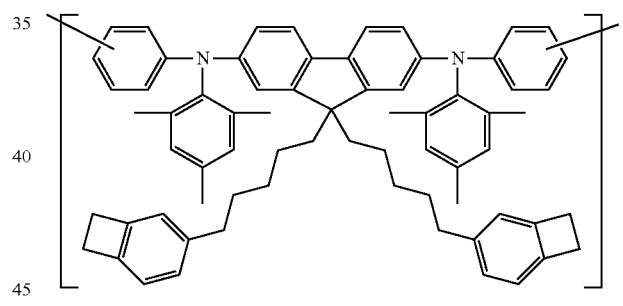
(1A-147)
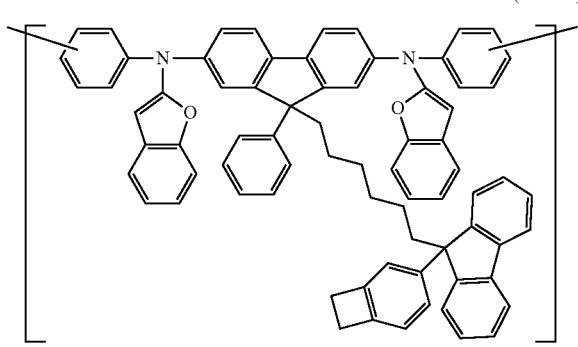
(1A-151)
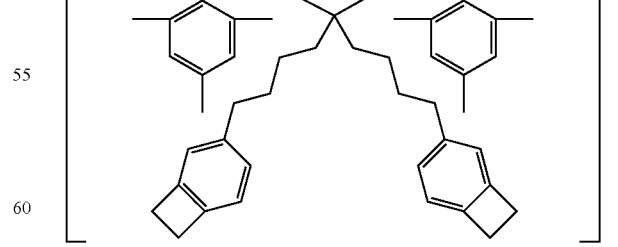
In the polymer compound of the present invention, the constitutional units represented by the formula (1A) may be each contained singly or two or more of them may be contained.

[Constitutional Unit Represented by Formula (1B)]

(Chemical Formula 46)

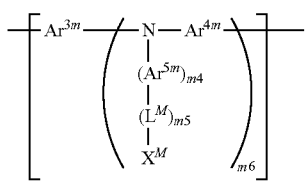

(1B)

$Ar^{3m}$, $Ar^{4m}$ and $Ar^{5m}$ are each preferably an arylene group optionally having a substituent.

The preferable range of the arylene group and the divalent heterocyclic group represented by $Ar^{3m}$, $Ar^{4m}$ and $Ar^{5m}$ is the same as the preferable range of the arylene group and the divalent heterocyclic group represented by $Ar^{1m}$.

When a plurality of $Ar^{4m}$ and $Ar^{5m}$ are present, it is preferable that they are the same at each occurrence, because synthesis of the polymer compound of the present invention is easy.

$Ar^{3m}$ and $Ar^{4m}$ may be combined together to form a ring together with the nitrogen atom to which they are attached, but it is preferable that $Ar^{3m}$ and $Ar^{4m}$ are not combined together, because the polymer compound of the present invention is excellent in stability.

m4 is preferably an integer of 0 to 2, more preferably 0 or 1, because synthesis of the polymer compound of the present invention is easy.

m5 is preferably 1, because the polymer compound of the present invention is more excellent in crosslinkability.

m6 is preferably an integer of 1 to 3, more preferably 1 or 2, further preferably 1, because synthesis of the polymer compound of the present invention is easy.

The definition and the preferable range of $L^M$ and $X^M$ are as described above.

The content of the constitutional unit represented by the formula (1B) is preferably 1 to 50 mol %, more preferably 2 to 25 mol %, further preferably 3 to 15 mol % with respect to the total amount of constitutional units contained in the polymer compound, because the polymer compound of the present invention is excellent in stability.

The constitutional unit represented by the formula (1B) includes, for example, constitutional units represented by the formula (1B-1) to the formula (1B-20), and these constitutional units each optionally have a substituent. Of them, preferable are constitutional units represented by the formula (1B-1), the formula (1B-2) or the formula (1B-6) to the formula (1B-20), more preferable are constitutional units represented by the formula (1B-2), the formula (1B-6) to the formula (1B-12), the formula (1B-15), the formula (1B-19) or the formula (18B-20), further preferable are constitutional units represented by the formula (1B-2) or the formula (1B-6) to the formula (1B-12), particularly preferable are constitutional units represented by the formula (1B-2), the formula (18B-6) or the formula (1B-7), because the polymer compound of the present invention is more excellent in crosslinkability.

(Chemical Formula 47)

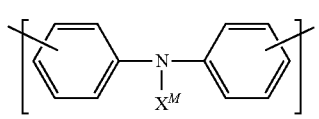

(1B-1)

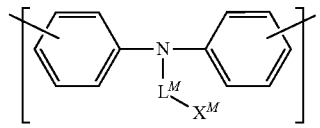

(1B-2)

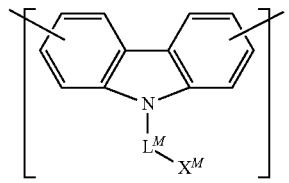

(1B-3)

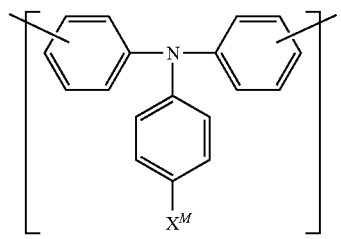

(1B-4)

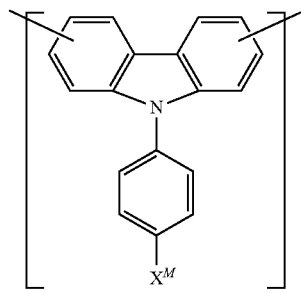

(1B-5)

(Chemical Formula 48)

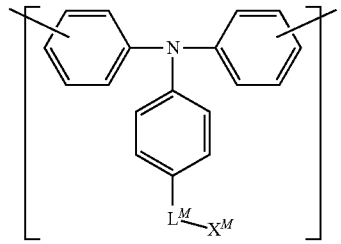

(1B-6)

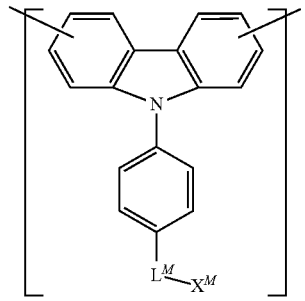

(1B-7)

(1B-8)
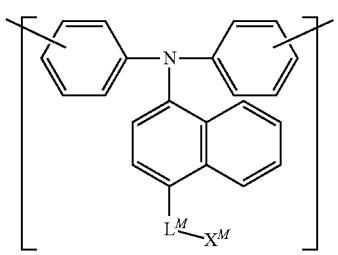
(1B-9)
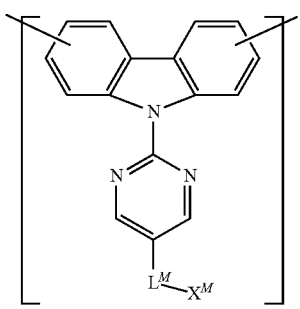
(1B-10)
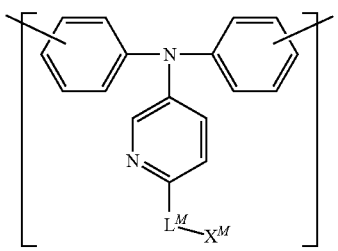
(1B-11)
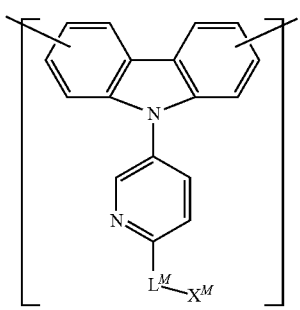
(Chemical Formula 49)
(1B-12)
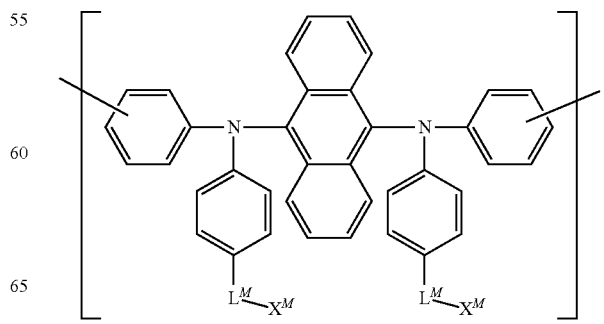
(1B-13)
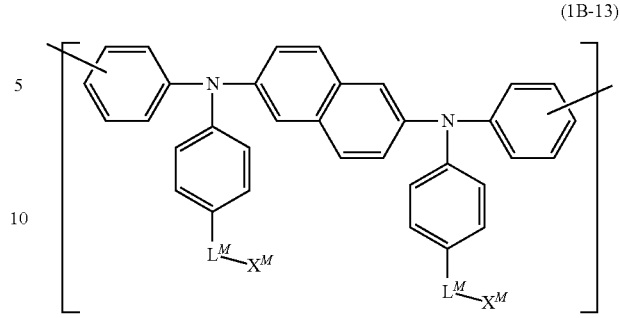
(1B-14)
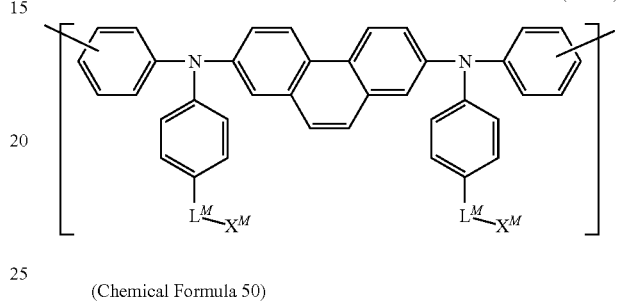
(Chemical Formula 50)
(1B-15)
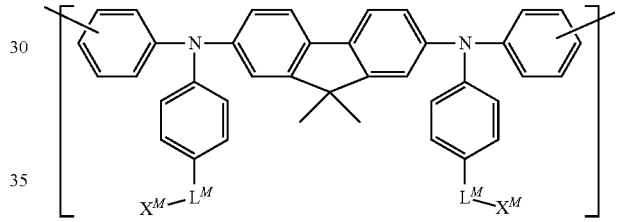
(1B-16)
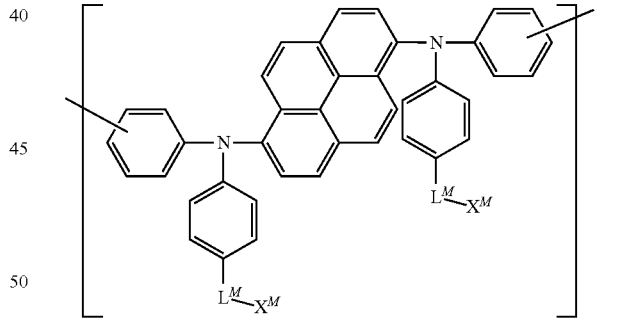
(1B-17)

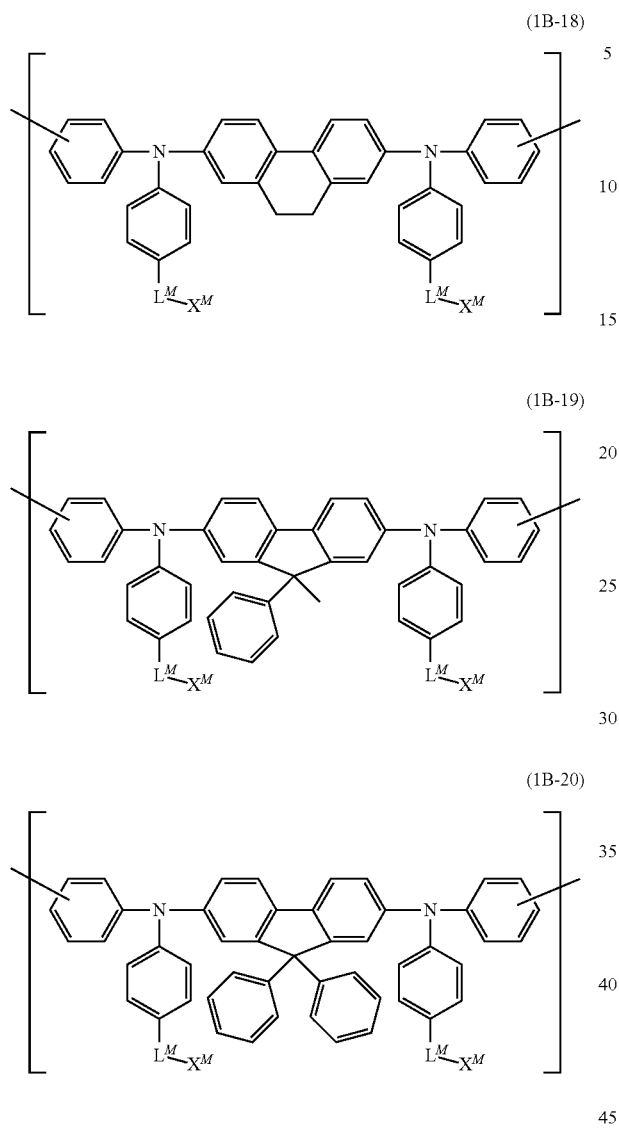

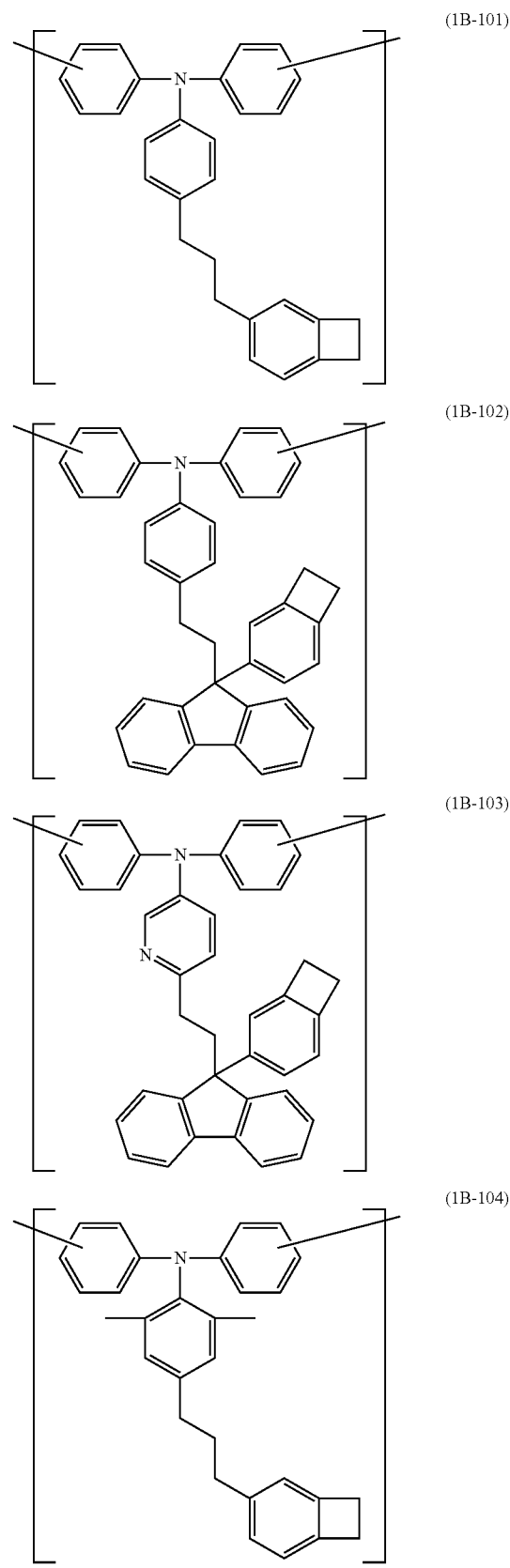

[wherein, $L^M$ and $X^M$ represent the same meaning as described above. When a plurality of $L^M$ and $X^M$ are present, they may be the same or different at each occurrence.]

The constitutional unit represented by the formula (1B) specifically includes, for example, constitutional units represented by the formula (1B-101) to the formula (1B-128), and these constitutional units each optionally have a substituent. Of them, preferable are constitutional units represented by the formula (1B-101), the formula (1B-102), the formula (1B-104), the formula (1B-105), the formula (1B-107), the formula (1B-109) to the formula (1B-112) or the formula (1B-120), more preferable are constitutional units represented by the formula (1B-101), the formula (1B-102), the formula (1B-105), the formula (18B-107), the formula (1B-109), the formula (1B-111) or the formula (18B-120), further preferable are constitutional units represented by the formula (1B-101), the formula (1B-102) or the formula (1B-111), because the polymer compound of the present invention is more excellent in crosslinkability.

-continued
(1B-105)
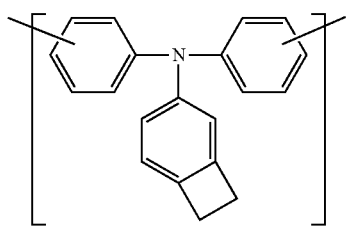
(Chemical Formula 53)
(1B-106)
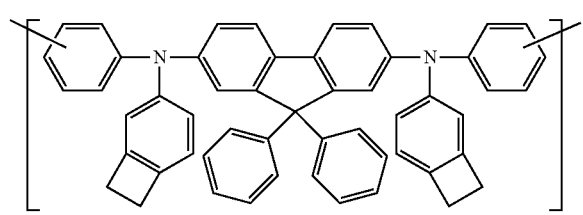
(1B-107)
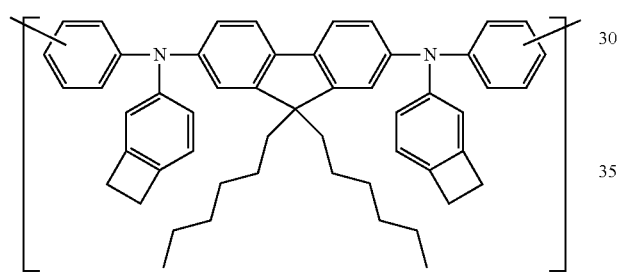
(Chemical Formula 54)
(1B-109)
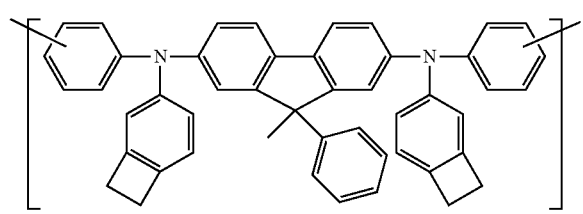
-continued
(1B-110)
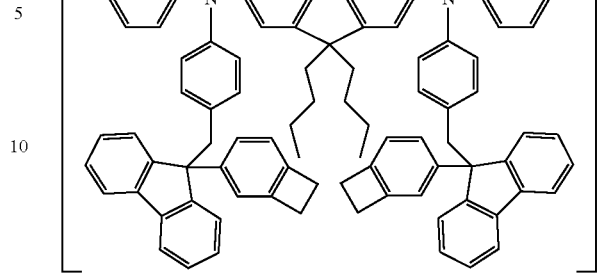
(1B-111)
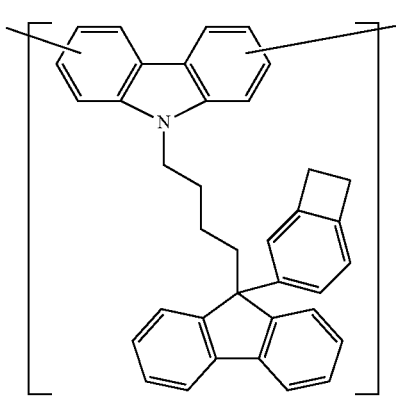
(Chemical Formula 55)
(1B-112)
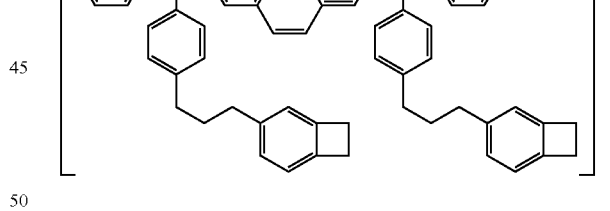
(1B-113)
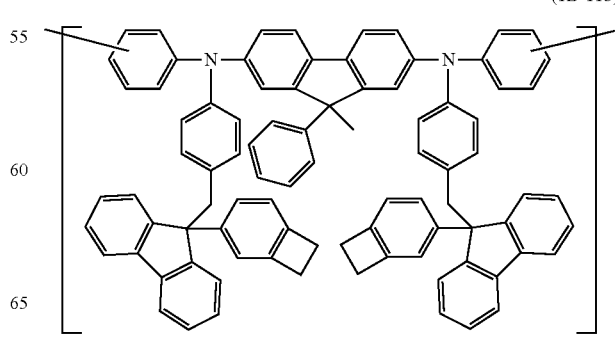

(1B-114)
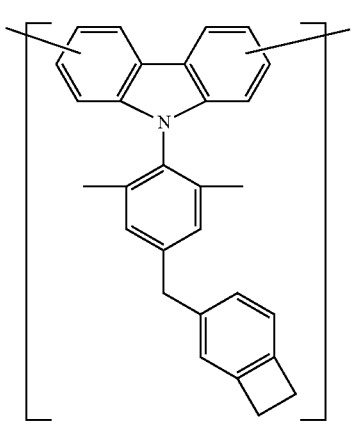
(Chemical Formula 56)
(1B-115)
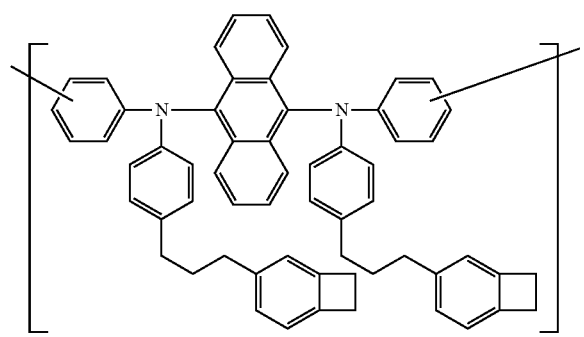
(1B-116)
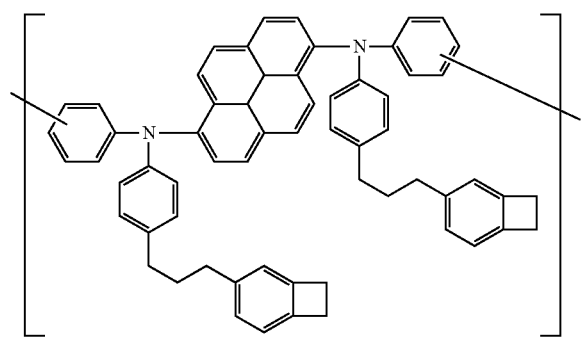
(1B-117)
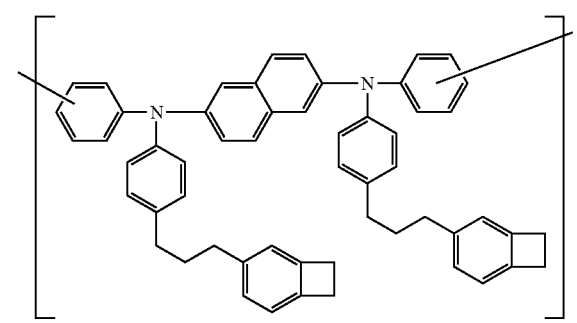
(Chemical Formula 57)
(1B-118)
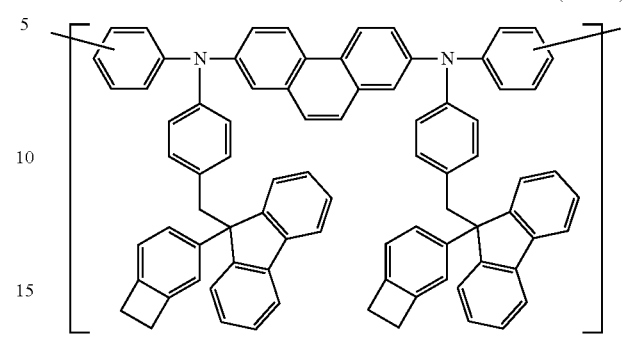
(1B-119)
(1B-120)
(Chemical Formula)
(1B-121)
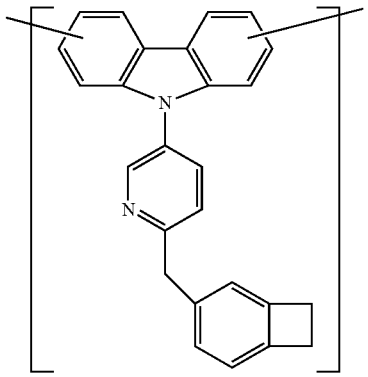

(1B-122)
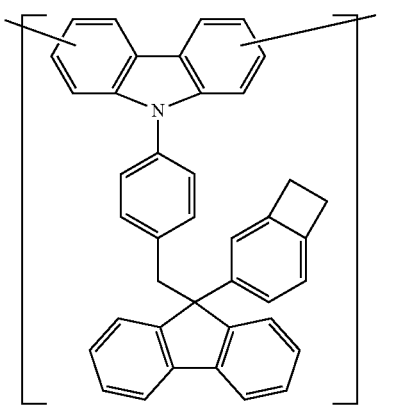

(1B-123)
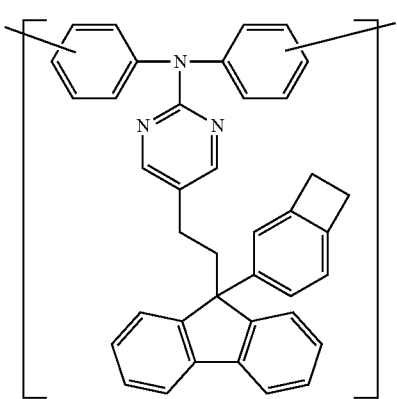

(1B-124)
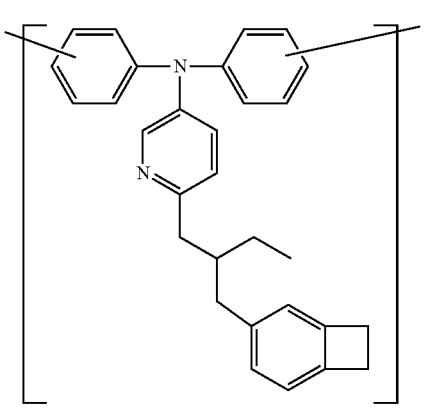

(1B-125)
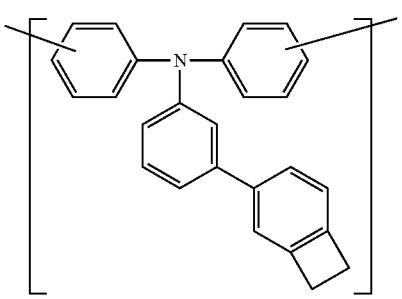

(Chemical Formula 59)

(1B-126)
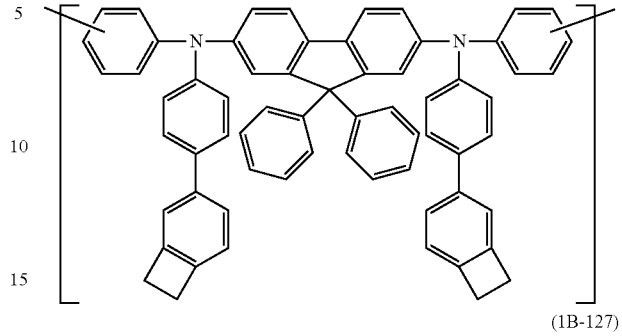

(1B-127)
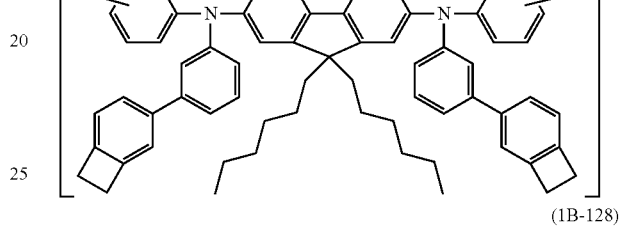

(1B-128)
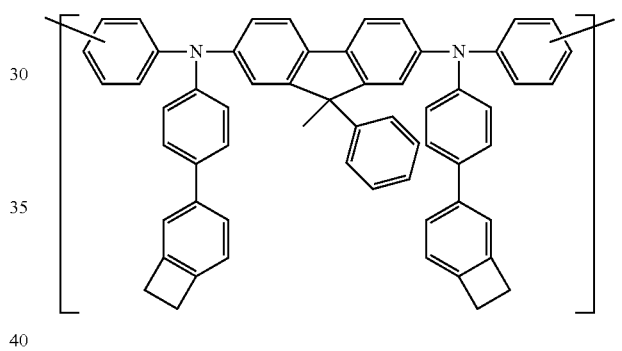

In the polymer compound of the present invention, the constitutional units represented by the formula (1B) may be each contained singly or two or more of them may be contained.

[Constitutional Unit Represented by Formula (2A)]

(Chemical Formula 60)

(2A)
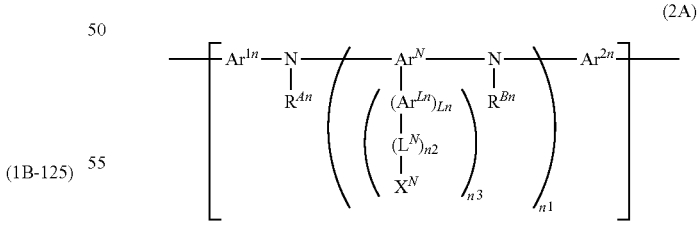

The preferable range of $R^{An}$ and $R^{Bn}$ is the same as the preferable range of $R^{Am}$.

The preferable range of the alkyl group and the aryl group represented by $R^{An}$ and $R^{Bn}$ is the same as the preferable range of the alkyl group and the aryl group represented by $R^{Am}$.

When a plurality of $R^{Bn}$ are present, it is preferable that they are the same, because synthesis of the polymer compound of the present invention is easy.

$Ar^{1n}$ and $Ar^{2n}$ are each preferably an arylene group optionally having a substituent.

The preferable range of the arylene group and the divalent heterocyclic group represented by $Ar^{1n}$ and $Ar^{2n}$ is the same as the preferable range of the arylene group and the divalent heterocyclic group represented by $Ar^{1m}$.

$Ar^N$ is preferably an aromatic hydrocarbon group optionally having a substituent, because synthesis of the polymer compound of the present invention is easy.

The definition and the preferable range of the aromatic hydrocarbon group and the heterocyclic group represented by $Ar^N$ are the same as the definition and the preferable range of the aromatic hydrocarbon group and the heterocyclic group represented by $Ar^M$. The preferable range of the substituent which the aromatic hydrocarbon group and the heterocyclic group represented by $Ar^N$ can have is the same as the preferable range of the substituent which the aromatic hydrocarbon group and the heterocyclic group represented by $Ar^M$ can have.

When a plurality of $Ar^N$ are present, it is preferable that they are the same, because synthesis of the polymer compound of the present invention is simple.

$Ar^{Ln}$ is preferably an arylene group optionally having a substituent, because synthesis of the polymer compound of the present invention is easy.

The preferable range of the arylene group and the divalent heterocyclic group represented by $Ar^{Ln}$ is the same as the preferable range of the arylene group and the divalent heterocyclic group represented by $Ar^{1m}$.

When a plurality of $Ar^{Ln}$ are present, it is preferable that they are the same, because synthesis of the polymer compound of the present invention is easy.

n1 and n3 are each preferably an integer of 1 to 3, more preferably 1 or 2, further preferably 1, because synthesis of the polymer compound of the present invention is easy.

n2 is preferably 1, because the polymer compound of the present invention is more excellent in crosslinkability.

Ln is preferably an integer of 0 to 2, more preferably 0 or 1, further preferably 0, because synthesis of the polymer compound of the present invention is easy.

$L^N$ is preferably an alkylene group or a cycloalkylene group, more preferably an alkylene group, and these groups each optionally have a substituent, because the polymer compound of the present invention is more excellent in crosslinkability.

The definition and the preferable range of the alkylene group and the cycloalkylene group represented by $L^N$ are the same as the definition and the preferable range of the alkylene group and the cycloalkylene group represented by $L^M$.

The preferable range of the substituent which the group represented by $L^N$ can have is the same as the preferable range of the substituent which the group represented by $L^M$ can have.

When a plurality of $L^N$ are present, it is preferable that they are the same, because synthesis of the polymer compound of the present invention is easy.

When a plurality of $L^N$ are present, it is preferable that groups represented by —N(R')— are not mutually adjacent to each other, oxygen atoms are not mutually adjacent to each other, sulfur atoms are not mutually adjacent to each other and an oxygen atom and a sulfur atom are not adjacent to each other.

$X^N$ is preferably a crosslinkable group represented by the formula (XL-1), the formula (XL-2), the formula (XL-3), the formula (XL-4), the formula (XL-5), the formula (XL-6), the formula (XL-7), the formula (XL-8), the formula (XL-14) or the formula (XL-15), because synthesis of the polymer compound of the present invention is easy.

$X^N$ is preferably a monovalent group containing a crosslinkable group represented by the formula (XL-1) to the formula (XL-8), the formula (XL-14) or the formula (XL-15), more preferably a monovalent group containing a crosslinkable group represented by the formula (XL-1) to the formula (XL-4) or the formula (XL-7), further preferably a monovalent group containing a crosslinkable group represented by the formula (XL-1) or the formula (XL-7), particularly preferably a monovalent group containing a group represented by the formula (XL-1), since the polymer compound of the present invention is more excellent in crosslinkability.

The preferable range of the substituent which the crosslinkable group represented by $X^N$ can have is the same as the preferable range of the substituent which the crosslinkable group represented by $X^M$ can have.

The content of the constitutional unit represented by the formula (2A) is preferably 1 to 50 mol %, more preferably 2 to 25 mol %, further preferably 3 to 15 mol % with respect to the total amount of constitutional units contained in the polymer compound, because the polymer compound of the present invention is excellent in stability.

The constitutional unit represented by the formula (2A) includes, for example, constitutional units represented by the formula (2A-1) to the formula (2A-21), and these constitutional units each optionally have a substituent. Of them, preferable are constitutional units represented by the formula (2A-1) to the formula (2A-3), the formula (2A-5) to the formula (2A-8), the formula (2A-10) to the formula (2A-13) or the formula (2A-17), more preferable are constitutional units represented by the formula (2A-1), the formula (2A-2), the formula (2A-3), the formula (2A-5), the formula (2A-6), the formula (2A-11) or the formula (2A-12), further preferable are constitutional units represented by the formula (2A-2), the formula (2A-3), the formula (2A-5) or the formula (2A-6), because the polymer compound of the present invention is more excellent in crosslinkability.

(Chemical Formula 61)

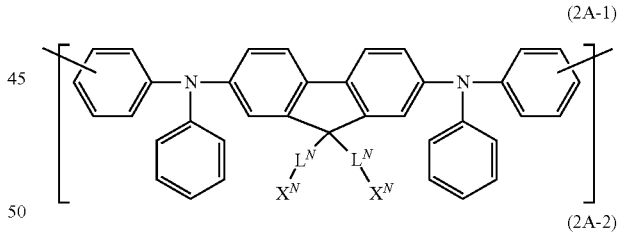

(2A-1)

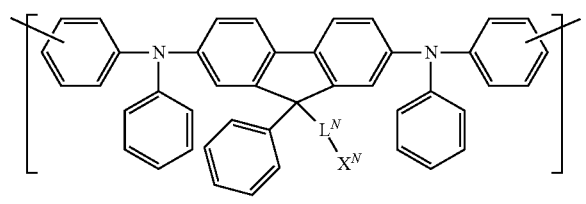

(2A-2)

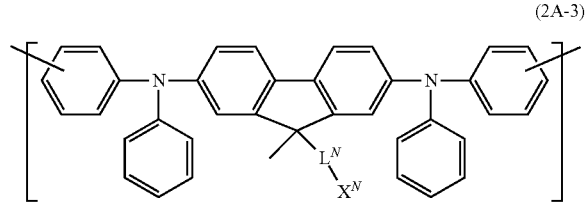

(2A-3)

-continued
(Chemical Formula 62)
(2A-4)
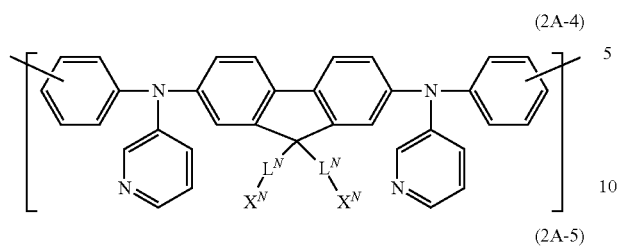
(2A-5)
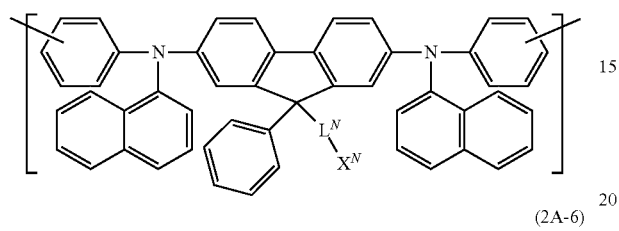
(2A-6)
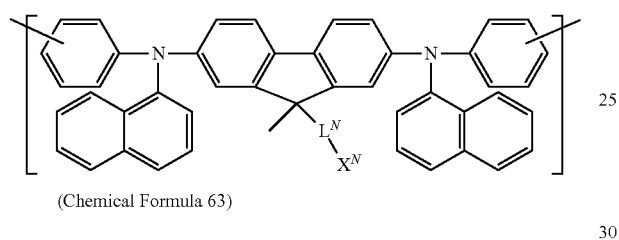
(Chemical Formula 63)
(2A-7)
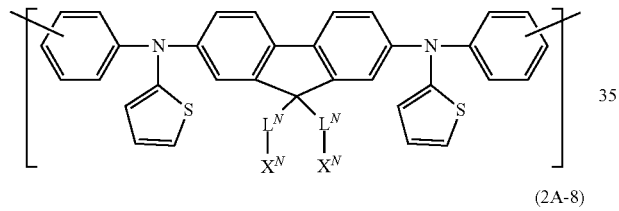
(2A-8)
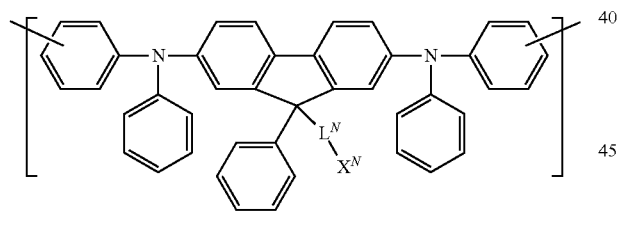
(2A-9)
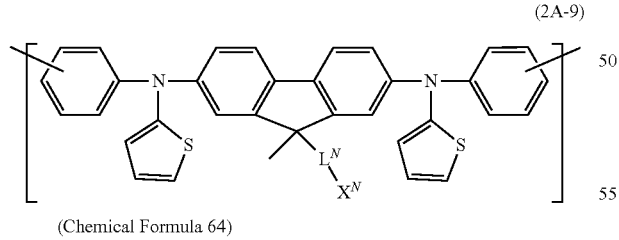
(Chemical Formula 64)
(2A-10)
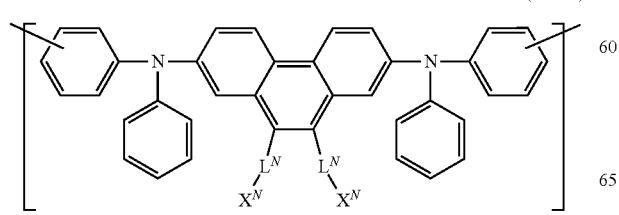
-continued
(2A-11)
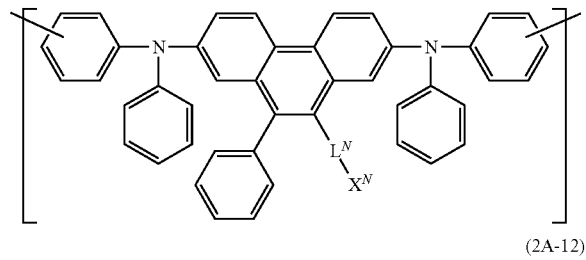
(2A-12)
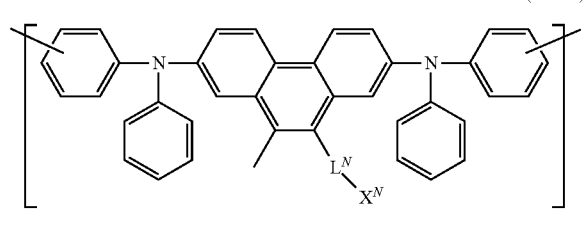
(2A-13)
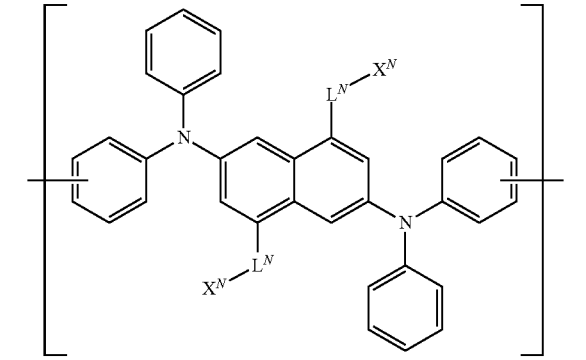
(2A-14)
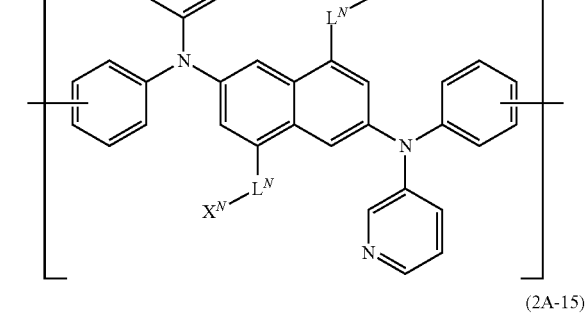
(2A-15)
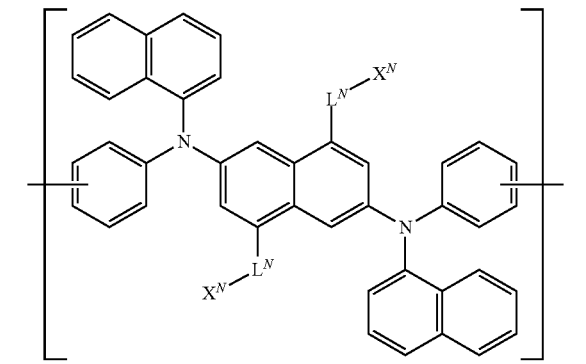

(2A-16)

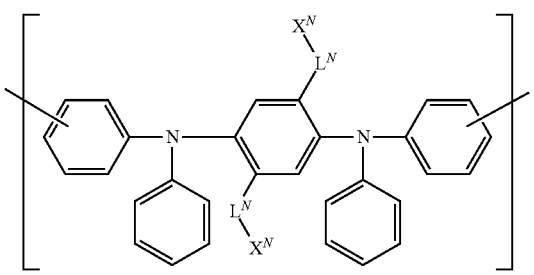

(2A-17)

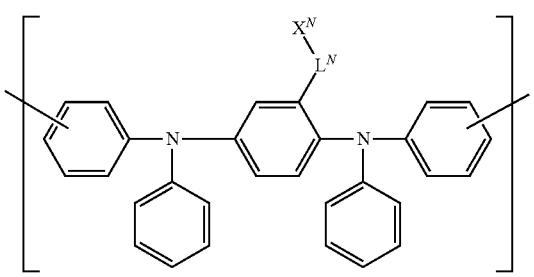

(2A-18)

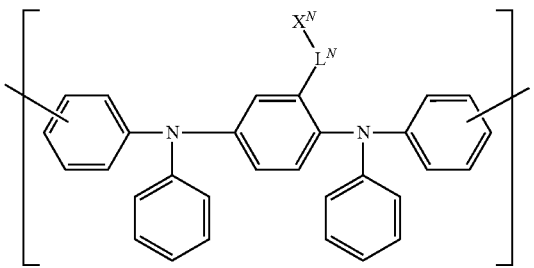

(Chemical Formula 65)

(2A-19)

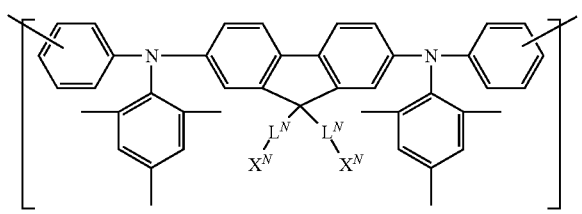

(2A-20)

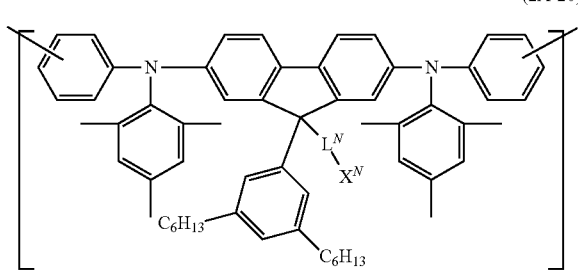

(2A-21)

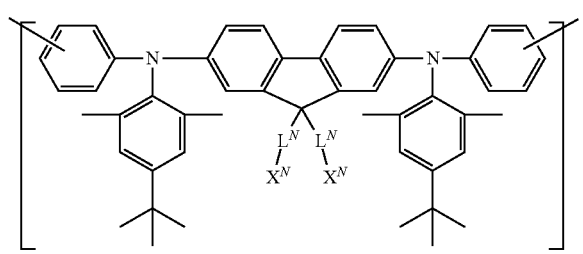

[wherein, $L^N$ and $X^N$ represent the same meaning as described above. When a plurality of $L^N$ and $X^N$ are present, they may be the same or different at each occurrence.]

The constitutional unit represented by the formula (2A) specifically includes, for example, constitutional units represented by the formula (2A-101) to the formula (2A-142), and these constitutional units each optionally have a substituent. Of them, preferable are constitutional units represented by the formula (2A-101) to the formula (2A-103), the formula (2A-117), the formula (2A-122) to the formula (2A-125), the formula (2A-128), the formula (2A-129), the formula (2A-131) or the formula (2A-132), more preferable are constitutional units represented by the formula (2A-101) to the formula (2A-103), the formula (2A-117) or the formula (2A-122) to the formula (2A-124), further preferable are constitutional units represented by the formula (2A-102), the formula (2A-103), the formula (2A-117), the formula (2A-123) or the formula (2A-124), particularly preferable are constitutional units represented by the formula (2A-102), the formula (2A-103) or the formula (2A-117), because the polymer compound of the present invention is more excellent in crosslinkability.

(Chemical Formula 66)

(2A-101)

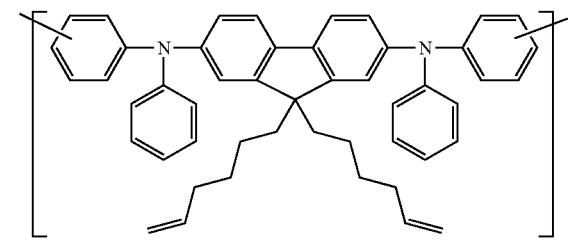

(2A-102)

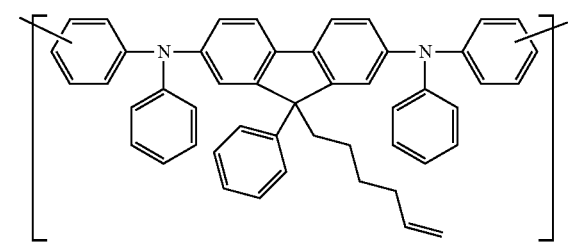

(2A-103)
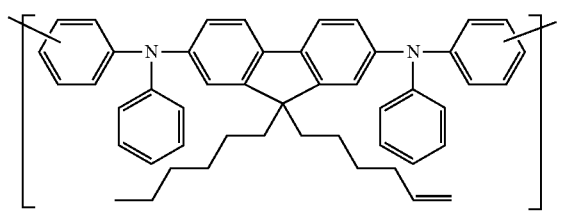
(Chemical Formula 67)
(2A-104)
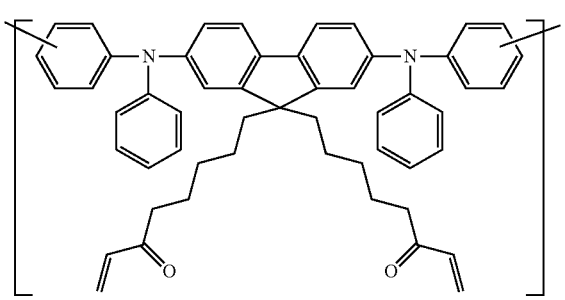
(2A-105)
(2A-106)
(Chemical Formula 68)
(2A-107)
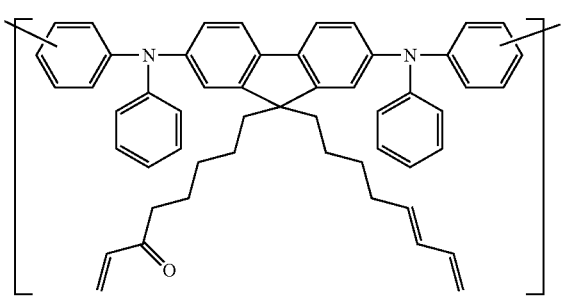
(2A-108)
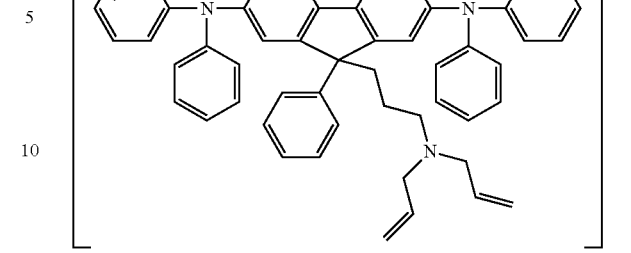
(2A-109)
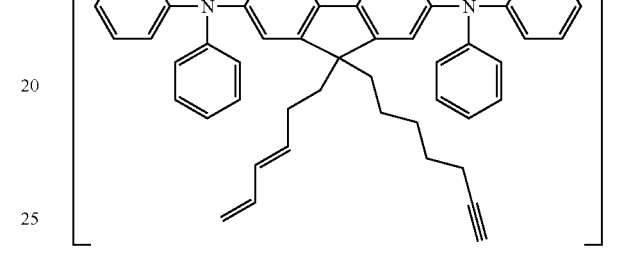
(Chemical Formula 69)
(2A-110)
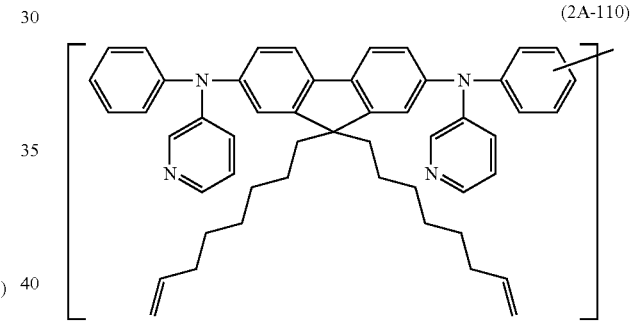
(2A-111)
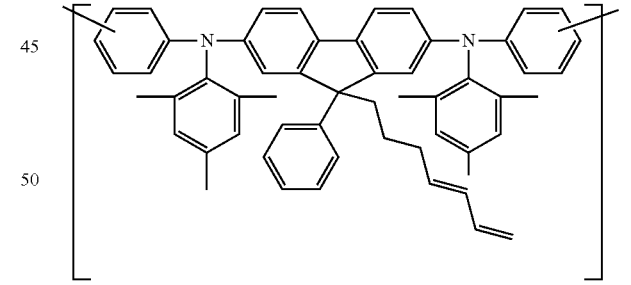
(2A-112)
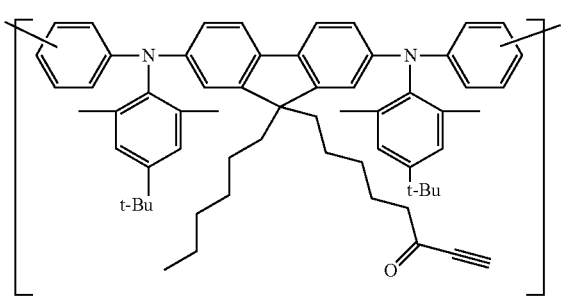

(Chemical Formula 70)
(2A-113)
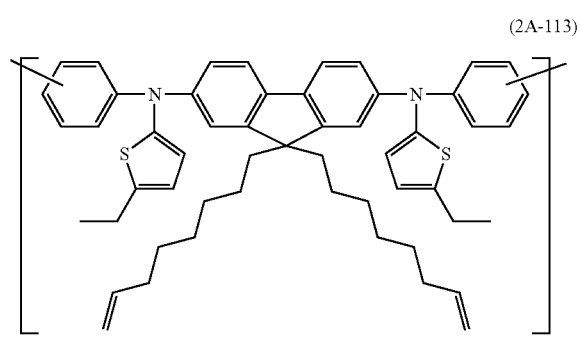
(2A-114)
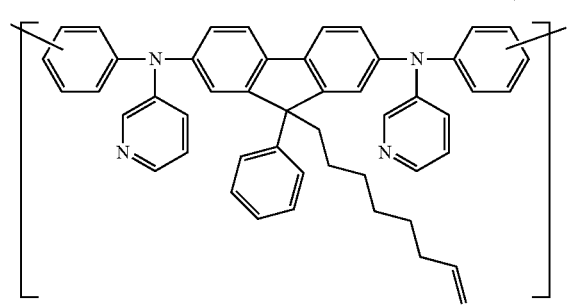
(2A-115)
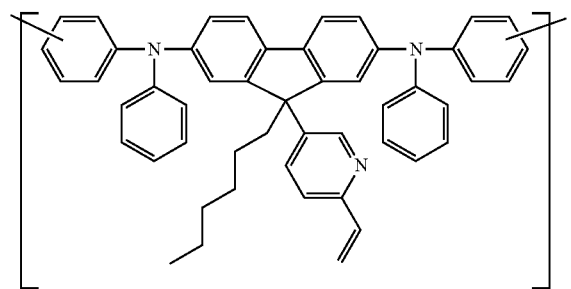
(Chemical Formula 71)
(2A-116)
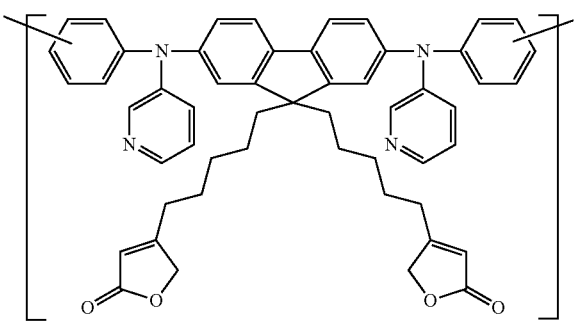
(2A-117)
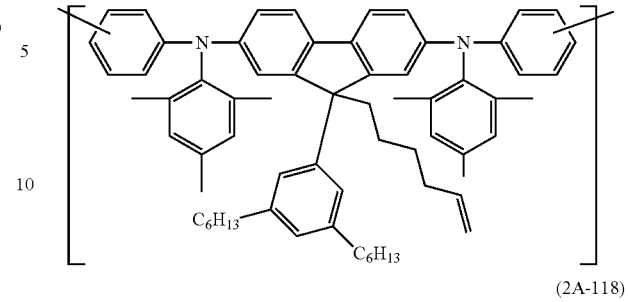
(2A-118)
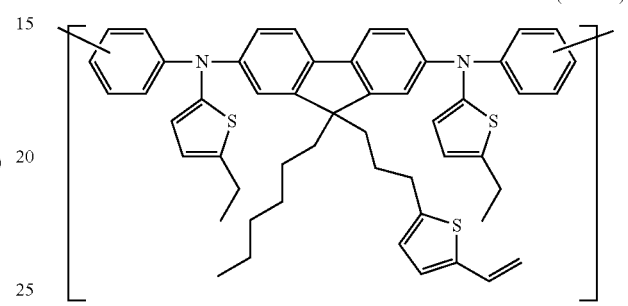
(Chemical Formula 72)
(2A-119)
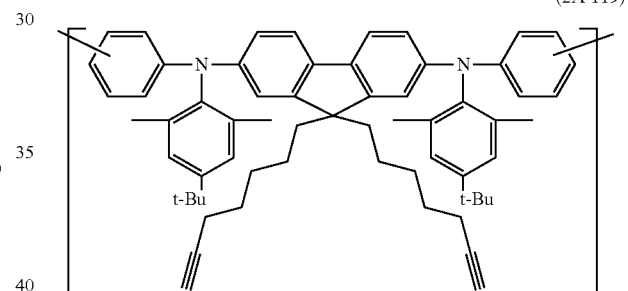
(2A-120)
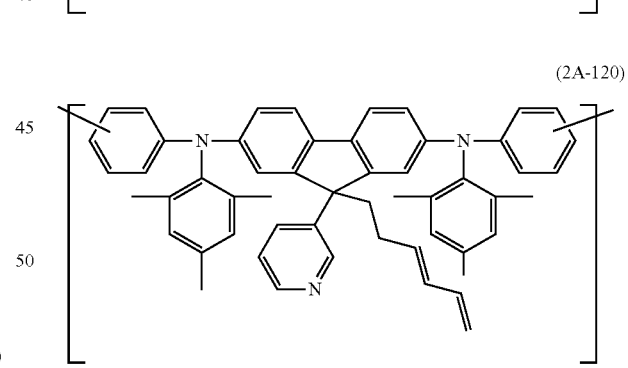
(2A-121)

(Chemical Formula 73)
(2A-122)
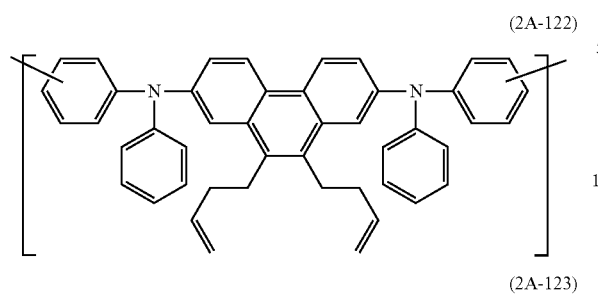
(2A-123)
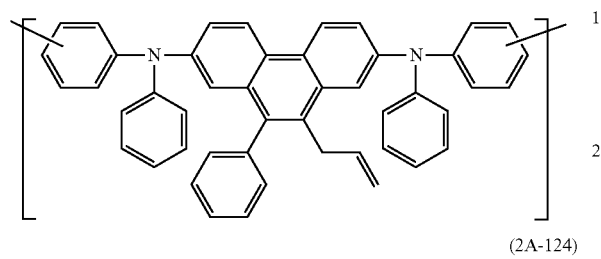
(2A-124)
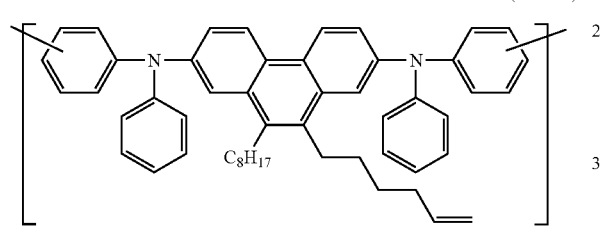
(2A-125)
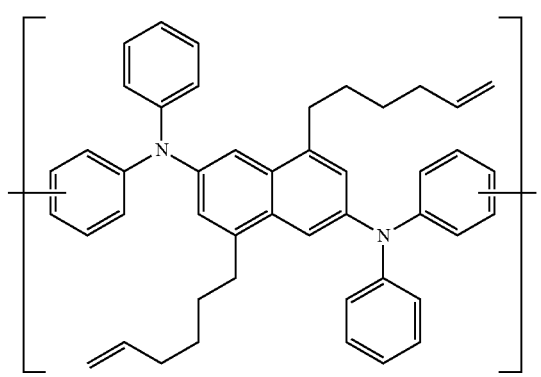
(2A-126)
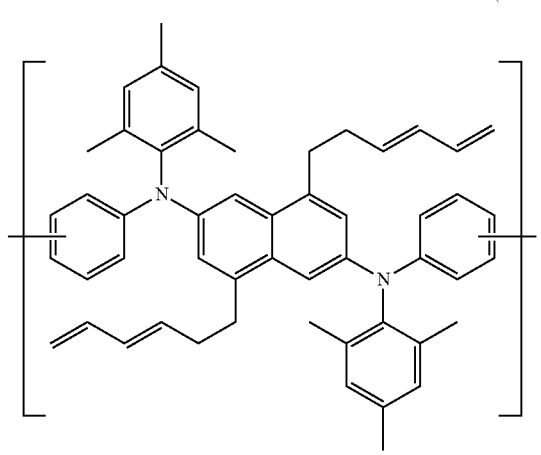
(2A-127)
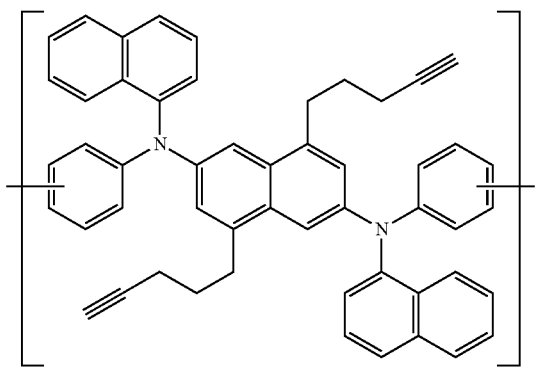
(Chemical Formula 74)
(2A-128)
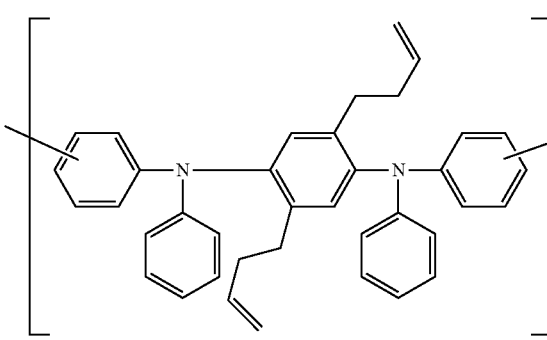
(2A-129)
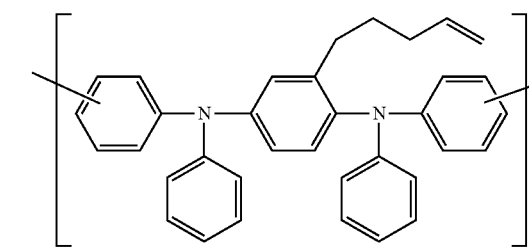
(2A-130)
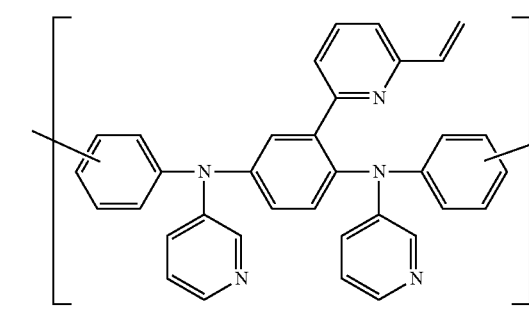
(Chemical Formula 75)
(2A-131)
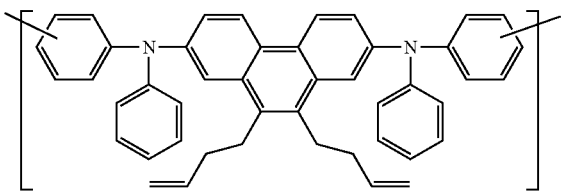

-continued
(2A-132)
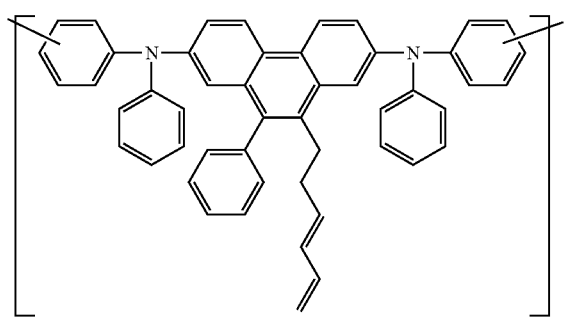
(2A-133)
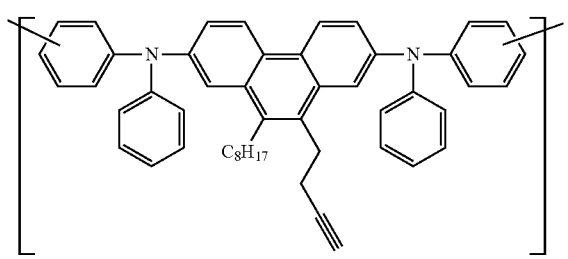
(Chemical Formula 76)
(2A-134)
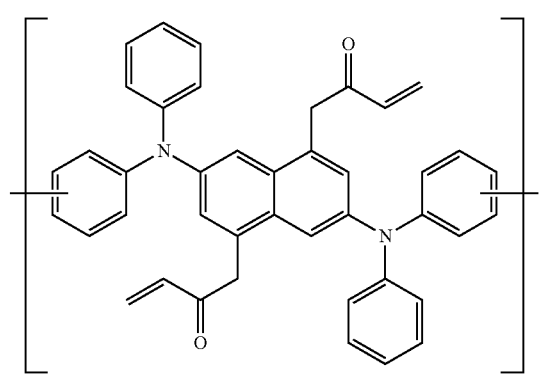
(2A-135)
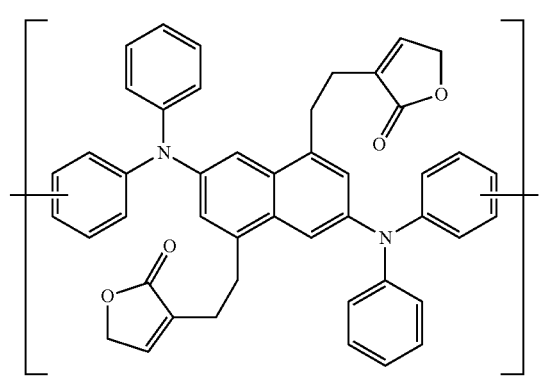
-continued
(2A-136)
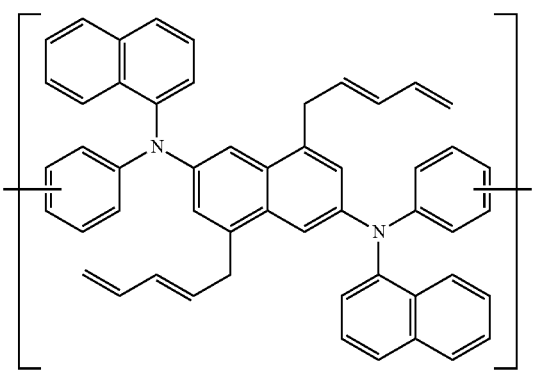
(Chemical Formula 77)
(2A-137)
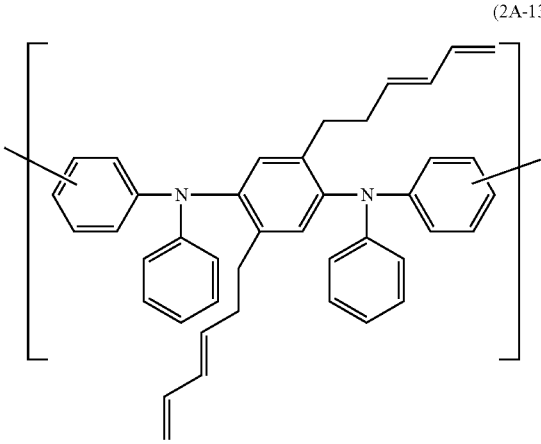
(2A-138)
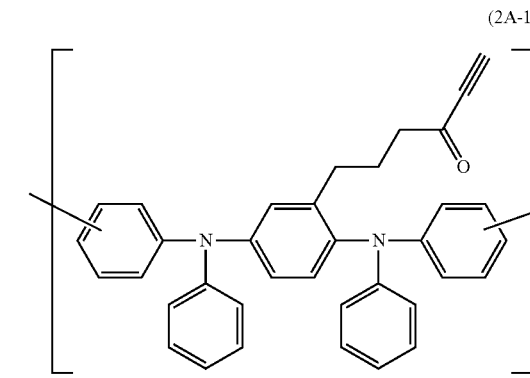
(2A-139)
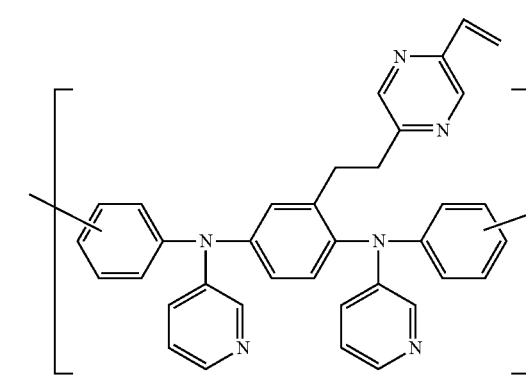

(Chemical Formula 78)

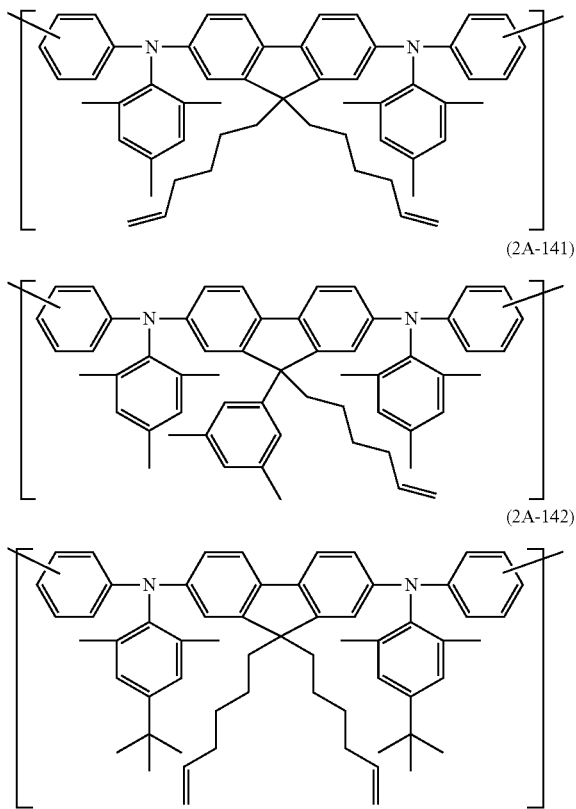

(2A-140)

(2A-141)

(2A-142)

In the polymer compound of the present invention, the constitutional units represented by the formula (2A) may be each contained singly or two or more of them may be contained.

[Constitutional Unit Represented by Formula (2B)]

(Chemical Formula 79)

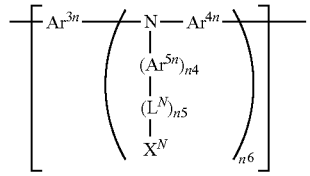

(2B)

$Ar^{3n}$, $Ar^{4n}$ and $Ar^{5n}$ are each preferably an arylene group.

The preferable range of the arylene group and the divalent heterocyclic group represented by $Ar^{3n}$, $Ar^{4r}$ and $Ar^{5n}$ is the same as the preferable range of the arylene group and the divalent heterocyclic group represented by $Ar^{3m}$, $Ar^{4m}$ and $Ar^{5m}$.

When a plurality of $Ar^{4n}$ and $Ar^{5n}$ are present, it is preferable that they are the same at each occurrence, because synthesis of the polymer compound of the present invention is easy.

$Ar^{3n}$ and $Ar^{4n}$ may be combined together to form a ring together with the nitrogen atom to which they are attached, but it is preferable that $Ar^{3n}$ and $Ar^{4n}$ are not combined together, because the polymer compound of the present invention is excellent in stability.

n4 is preferably an integer of 0 to 2, more preferably 0 or 1, because synthesis of the polymer compound of the present invention is easy.

n5 is preferably 1, because the polymer compound of the present invention is more excellent in crosslinkability.

n6 is preferably an integer of 1 to 3, more preferably 1 or 2, further preferably 1, because synthesis of the polymer compound of the present invention is easy.

The definition and the preferable range of $L^N$ and $X^N$ are as described above.

The content of the constitutional unit represented by the formula (2B) is preferably 1 to 50 mol %, more preferably 2 to 25 mol %, further preferably 3 to 15 mol % with respect to the total amount of constitutional units contained in the polymer compound, because the polymer compound of the present invention is excellent in stability.

The constitutional unit represented by the formula (2B) includes, for example, constitutional units represented by the formula (2B-1) to the formula (2B-20), and these constitutional units each optionally have a substituent. Of them, preferable are constitutional units represented by the formula (2B-1) to the formula (2B-3), the formula (2B-6) to the formula (2B-8) or the formula (2B-12) to the formula (2B-20), more preferable are constitutional units represented by the formula (2B-1) to the formula (2B-3) or the formula (2B-6) to the formula (28-8), further preferable are constitutional units represented by the formula (2B-1) to the formula (2B-3), the formula (2B-6) or the formula (2B-7), particularly preferable are constitutional units represented by the formula (2B-1), the formula (2B-2) or the formula (2B-6), because the polymer compound of the present invention is more excellent in crosslinkability.

(Chemical Formula 80)

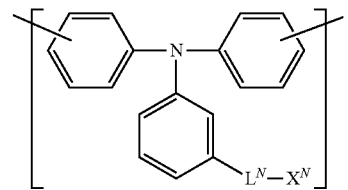

(2B-1)

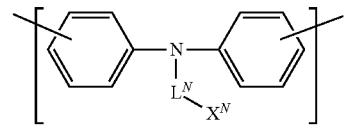

(2B-2)

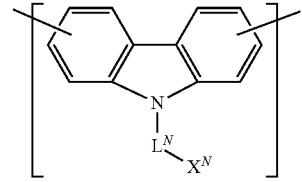

(2B-3)

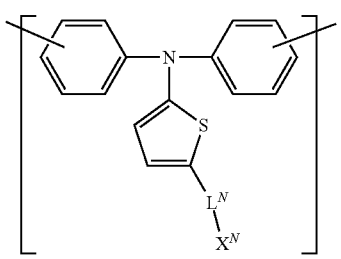
(2B-4)
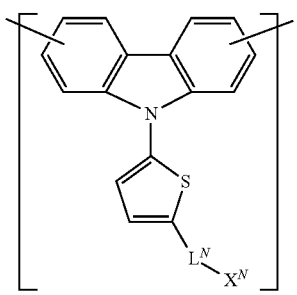
(2B-5)
(Chemical Formula 81)
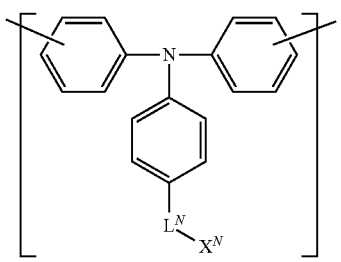
(2B-6)
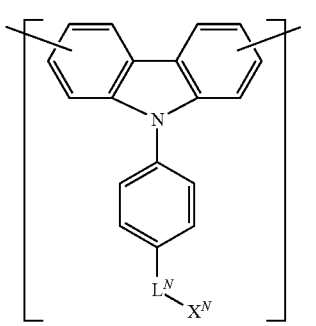
(2B-7)
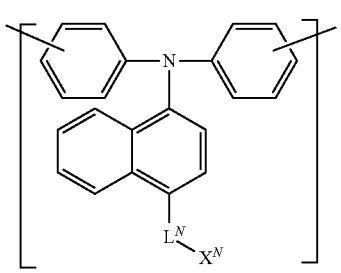
(2B-8)
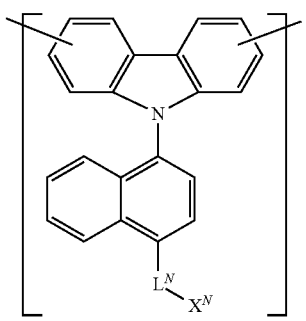
(2B-9)
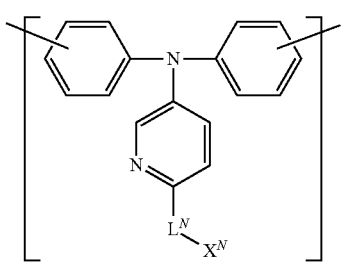
(2B-10)
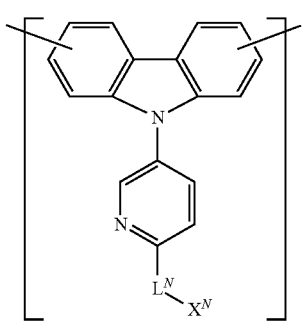
(2B-11)
(Chemical Formula 82)
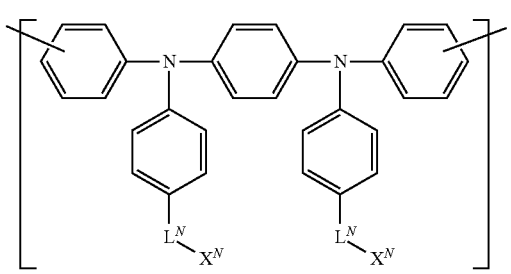
(2B-12)
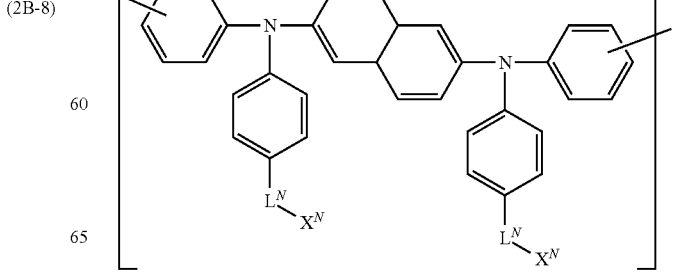
(2B-13)

(2B-14)

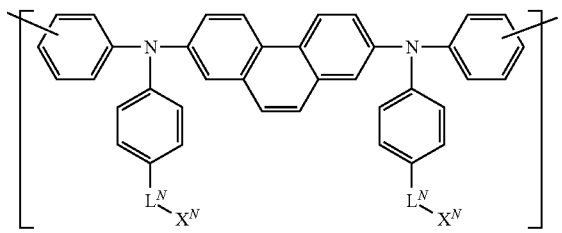

(Chemical Formula 83)

(2B-15)

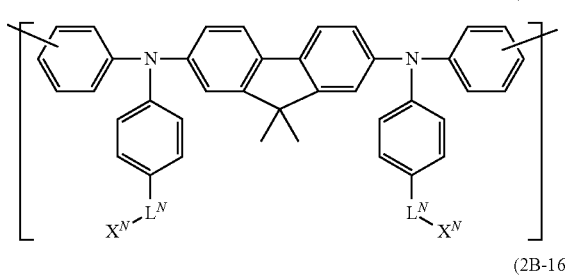

(2B-16)

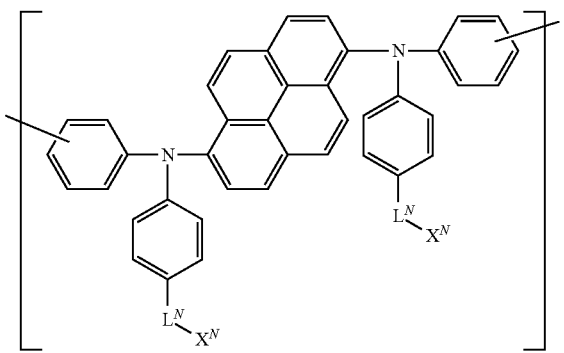

(2B-17)

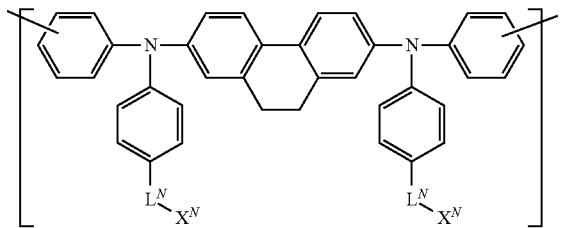

(Chemical Formula 84)

(2B-18)

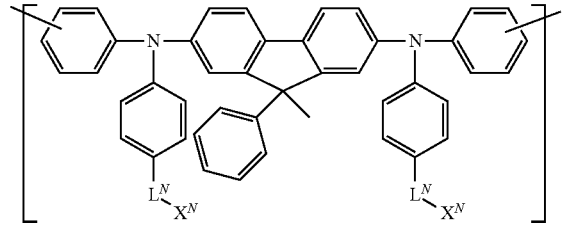

(2B-19)

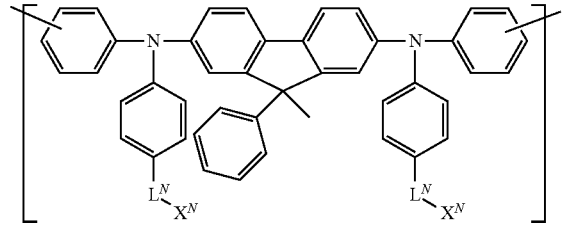

(2B-20)

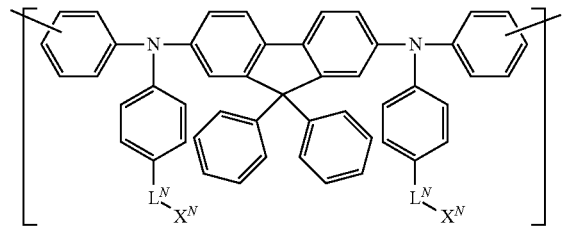

[wherein, $L^N$ and $X^N$ represent the same meaning as described above. When a plurality of $L^N$ and $X^N$ are present, they may be the same or different at each occurrence.]

The constitutional unit represented by the formula (2B) specifically includes, for example, constitutional units represented by the formula (2B-101) to the formula (2B-120), and these constitutional units each optionally have a substituent. Of them, preferable are constitutional units represented by the formula (2B-101), the formula (2B-102), the formula (2B-106), the formula (2B-108), the formula (2B-109), the formula (2B-110), the formula (2B-111), the formula (2B-112), the formula (2B-114) or the formula (2B-120), more preferable are constitutional units represented by the formula (2B-101), the formula (2B-102), the formula (2B-111) or the formula (2B-114), because the polymer compound of the present invention is more excellent in crosslinkability.

(Chemical Formula 85)

(2B-101)

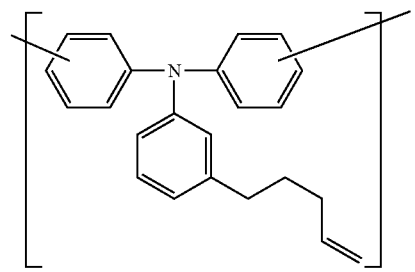

(2B-102)

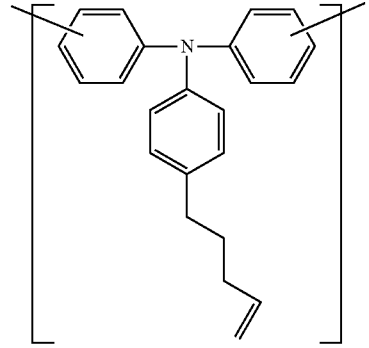

(2B-103)
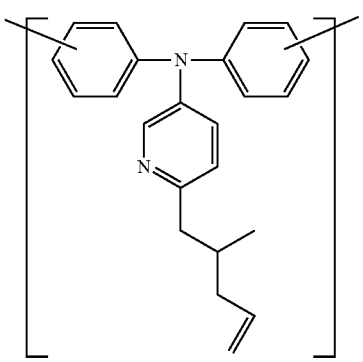
(2B-104)
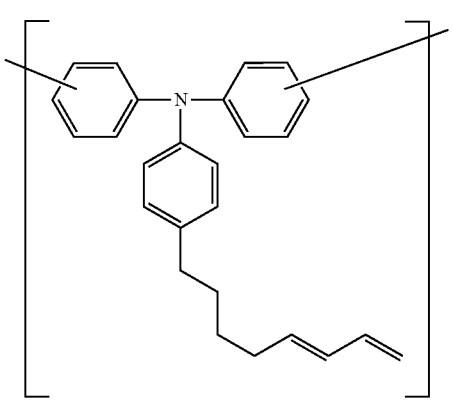
(2B-105)
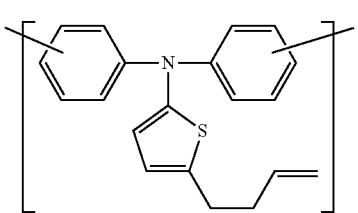
(Chemical Formula 86)
(2B-106)
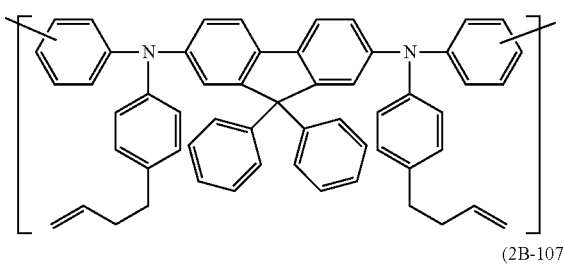
(2B-107)
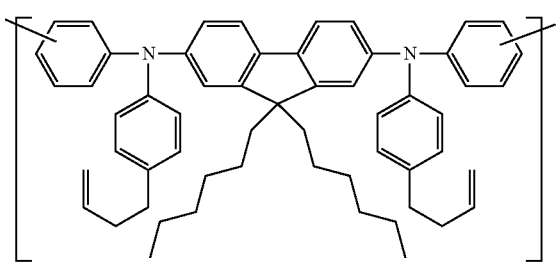
(2B-108)
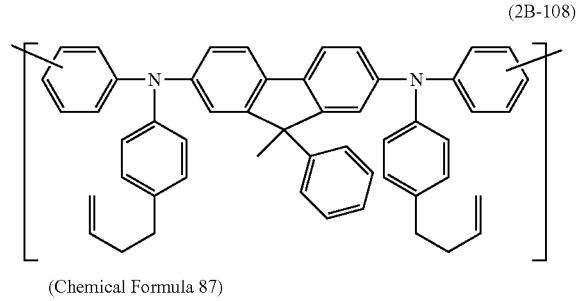
(Chemical Formula 87)
(2B-109)
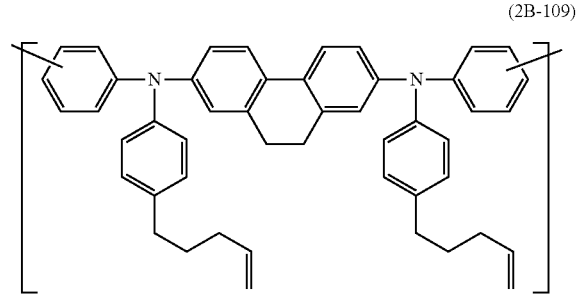
(2B-110)
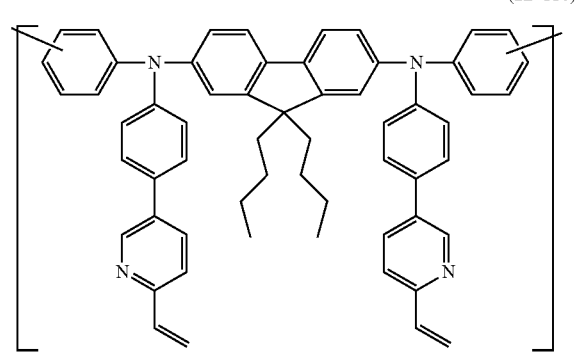
(2B-111)
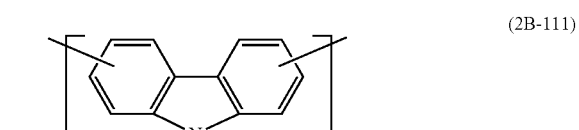
(Chemical Formula 88)
(2B-112)
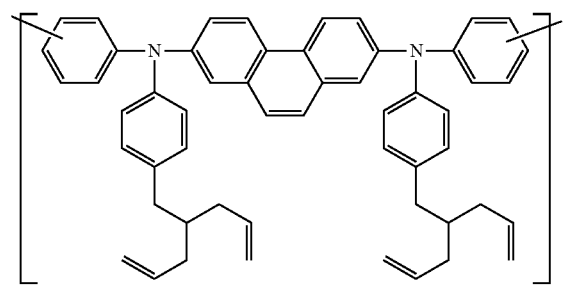

(2B-113)
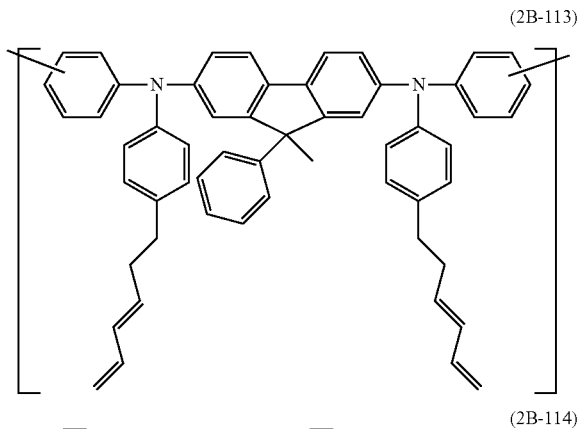

(2B-117)
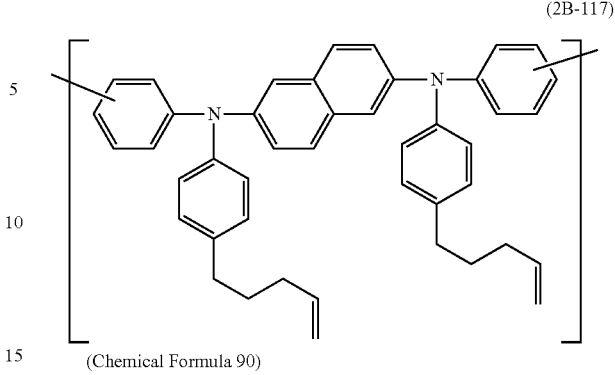

(Chemical Formula 90)

(2B-114)
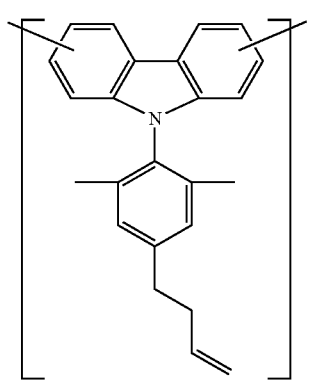

(Chemical Formula 89)

(2B-118)
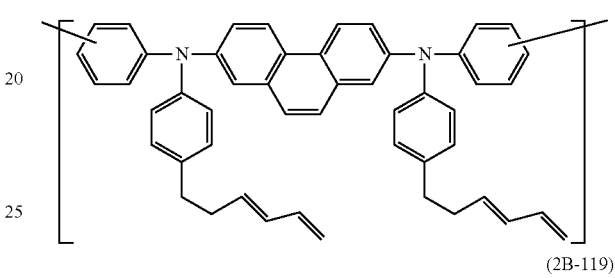

(2B-119)
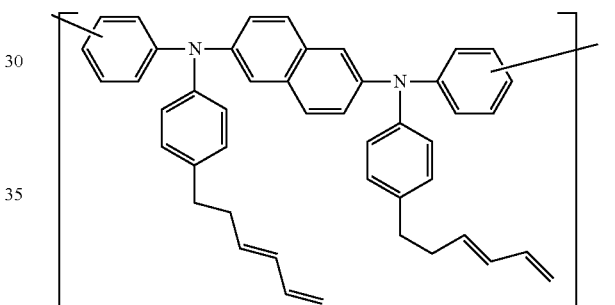

(2B-115)
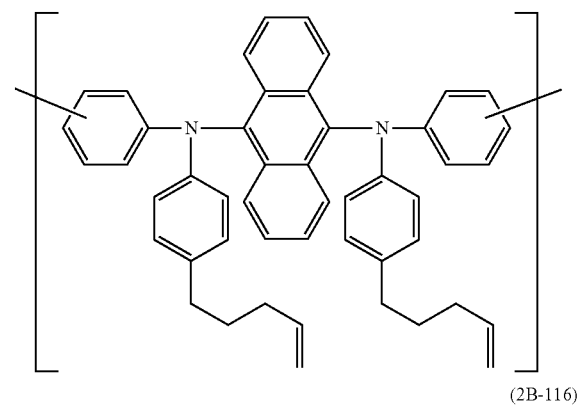

(2B-120)

(2B-116)
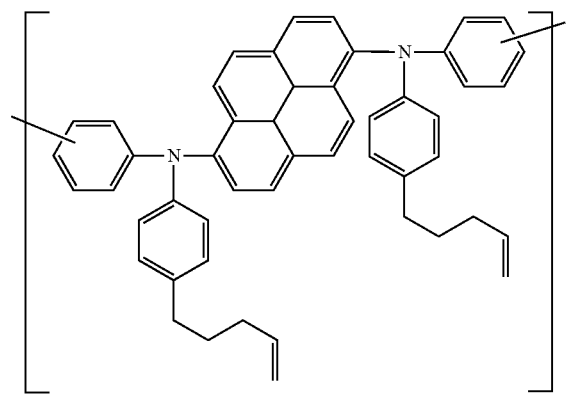

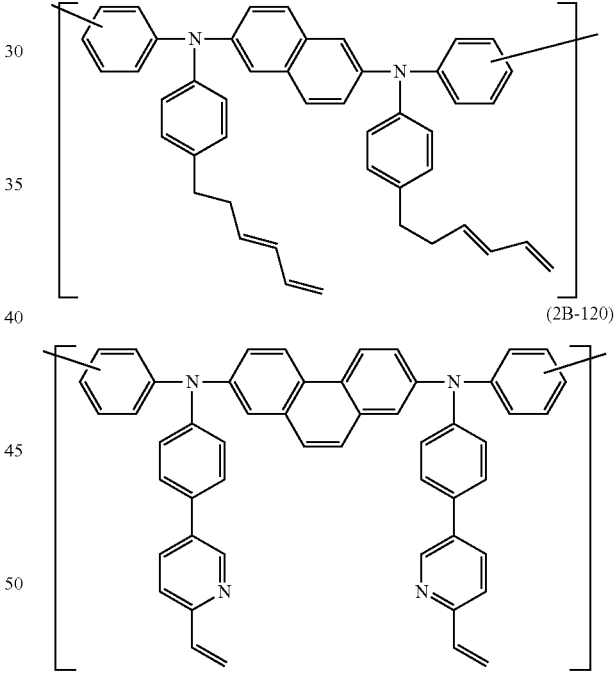

In the polymer compound of the present invention, the constitutional units represented by the formula (2B) may be each contained singly or two or more of them may be contained.

It is preferable that the polymer compound of the present invention comprises the constitutional unit represented by the formula (1A) out of the constitutional unit represented by the formula (1A) and the constitutional unit represented by the formula (1B), because hole transportability is more excellent.

It is preferable that the polymer compound of the present invention comprises the constitutional unit represented by the formula (2A) out of the constitutional unit represented by the formula (2A) and the constitutional unit represented by the formula (2B), because hole transportability is more excellent.

It is preferable that the polymer compound of the present invention comprises the constitutional unit represented by the formula (1A) and the constitutional unit represented by the formula (2A) in combination, because hole transportability is more excellent.

The total amount of $X^M$ and $X^N$ in the polymer compound of the present invention is usually 2 mol % to 50 mol %, preferably 5 mol % to 40 mol %, more preferably 10 mol % to 30 mol % with respect to the total amount of constitutional units contained in the polymer compound, because hole transportability is more excellent.

<Other Constitutional Unit>

It is preferable that the polymer compound of the present invention further comprises a constitutional unit represented by the formula (X), because hole transportability is excellent. The constitutional unit represented by the formula (X) is usually a non-crosslinkable constitutional unit unlike the constitutional unit represented by the formula (1A), the formula (1B), the formula (2A) or the formula (2B).

$a^1$ is preferably an integer of 2 or less, more preferably 1, because the luminance life of a light emitting device produced by using the polymer compound of the present invention is excellent.

$a^2$ is preferably an integer of 2 or less, more preferably 0, because the luminance life of a light emitting device produced by using the polymer compound of the present invention is excellent.

$R^{X1}$, $R^{X2}$ and $R^{X3}$ are each preferably an alkyl group, a cycloalkyl group, an aryl group or a monovalent heterocyclic group, more preferably an aryl group, and these groups each optionally have a substituent.

The arylene group represented by $Ar^{X1}$ and $Ar^{X3}$ is more preferably a group represented by the formula (A-1) or the formula (A-9), further preferably a group represented by the formula (A-1), and these groups each optionally have a substituent.

The divalent heterocyclic group represented by $Ar^{X1}$ and $Ar^{X3}$ is more preferably a group represented by the formula (AA-1), the formula (AA-2) or the formula (AA-7) to (AA-26), and these groups each optionally have a substituent.

$Ar^{X1}$ and $Ar^{X3}$ are each preferably an arylene group optionally having a substituent.

The arylene group represented by $Ar^{X2}$ and $Ar^{X4}$ is more preferably a group represented by the formula (A-1), the formula (A-6), the formula (A-7), the formulae (A-9) to (A-11) or the formula (A-19), further preferably a group represented by the formula (A-1) or the formula (A-9), particularly preferably a group represented by the formula (A-9), and these groups each optionally have a substituent.

The more preferable range of the divalent heterocyclic group represented by $Ar^{X2}$ and $Ar^{X4}$ is the same as the more preferable range of the divalent heterocyclic group represented by $Ar^{X1}$ and $Ar^{X3}$.

The more preferable range and the further preferable range of the arylene group and the divalent heterocyclic group in the divalent group in which at least one arylene group and at least one divalent heterocyclic group are bonded directly to each other represented by $Ar^{X2}$ and $Ar^{X4}$ are the same as the more preferable range and the further preferable range of the arylene group and the divalent heterocyclic group represented by $Ar^{X1}$ and $Ar^{X3}$, respectively.

The divalent group in which at least one arylene group and at least one divalent heterocyclic group are bonded directly to each other represented by $Ar^{X2}$ and $Ar^{X4}$ includes, for example, groups represented by the following formulae, and they each optionally have a substituent.

(Chemical Formula 91)

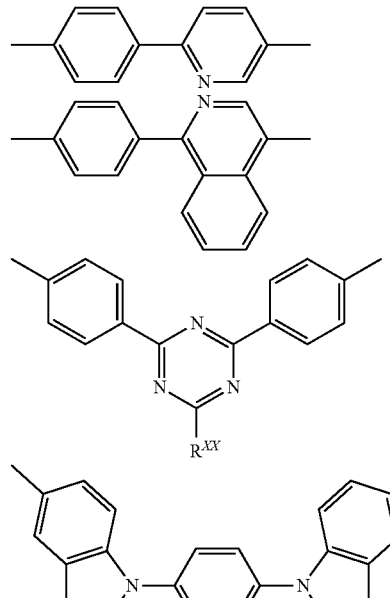

(Chemical Formula 92)

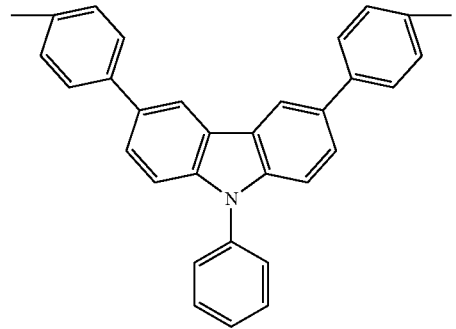

[wherein, $R^{XX}$ represents a hydrogen atom, an alkyl group, a cycloalkyl group, an aryl group or a monovalent heterocyclic group, and these groups each optionally have a substituent.]

$R^{XX}$ is preferably an alkyl group, a cycloalkyl group or an aryl group, and these groups each optionally have a substituent.

$Ar^{X2}$ and $Ar^{X4}$ are each preferably an arylene group optionally having a substituent.

The substituent which the group represented by $Ar^{X1}$ to $Ar^{X4}$ and $R^{X1}$ to $R^{X3}$ optionally has is preferably an alkyl group, a cycloalkyl group or an aryl group, and these groups each optionally further have a substituent.

The constitutional unit represented by the formula (X) is preferably a constitutional unit represented by the formula (X-1) to (X-7), more preferably a constitutional unit represented by the formula (X-3) to (X-7), further preferably a constitutional unit represented by the formula (X-3) to (X-6), particularly preferably a group represented by the formula (X-4).

(Chemical Formula 93)

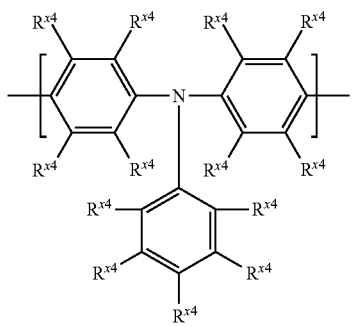
(X-1)

(Chemical Formula 94)

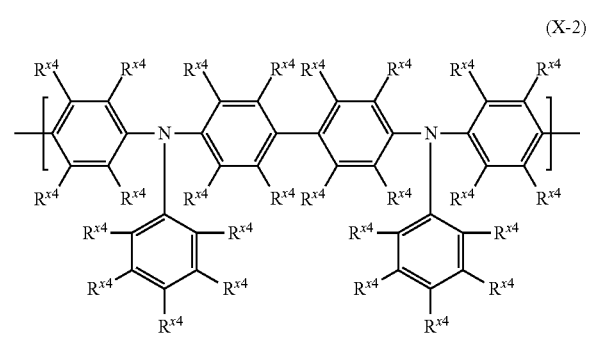
(X-2)

(Chemical Formula 95)

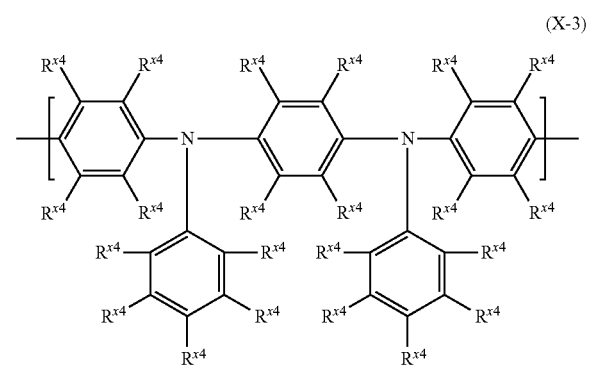
(X-3)

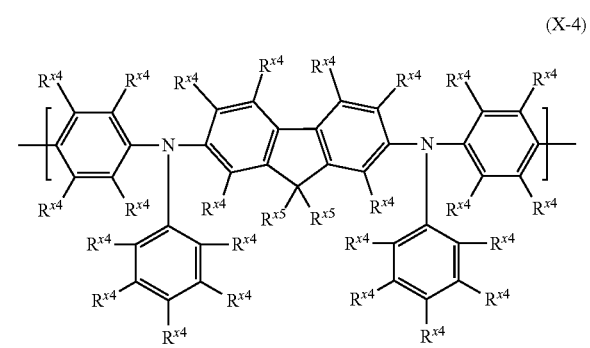
(X-4)

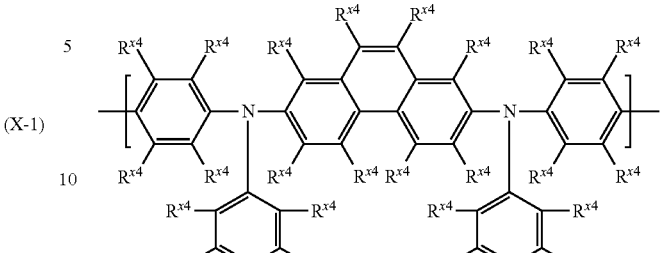
(X-5)

(Chemical Formula 96)

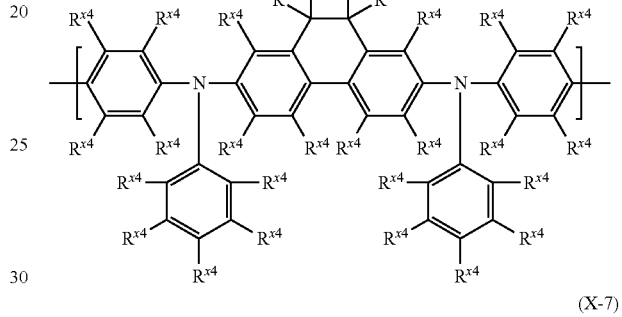
(X-6)

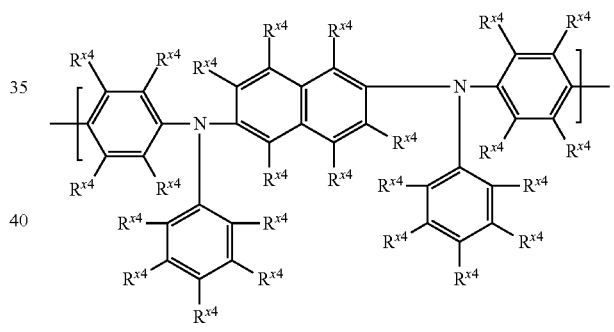
(X-7)

[wherein, $R^{X4}$ and $R^{X5}$ each independently represent a hydrogen atom, an alkyl group, a cycloalkyl group, an alkoxy group, a cycloalkoxy group, an aryl group, an aryloxy group, a halogen atom, a monovalent heterocyclic group or a cyano group and these groups each optionally have a substituent. The plurality of $R^{X4}$ may be the same or different. The plurality of $R^{X5}$ may be the same or different, and adjacent groups $R^{X5}$ may be combined together to form a ring together with the carbon atoms to which they are attached.]

The content of the constitutional unit represented by the formula (X) is preferably 0.1 to 50 mol %, more preferably 1 to 45 mol %, further preferably 5 to 40 mol % with respect to the total content of constitutional units contained in the polymer compound, because hole transportability is excellent.

The constitutional unit represented by the formula (X) includes, for example, constitutional units represented by the formulae (X1-1) to (X1-19), preferably constitutional units represented by the formulae (X1-6) to (X1-14).

(Chemical Formula 97)
(X1-1)
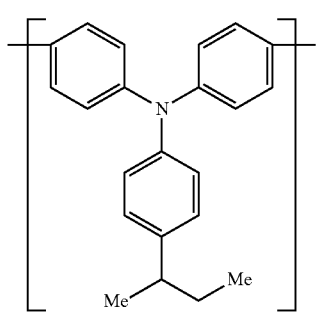
(X1-2)
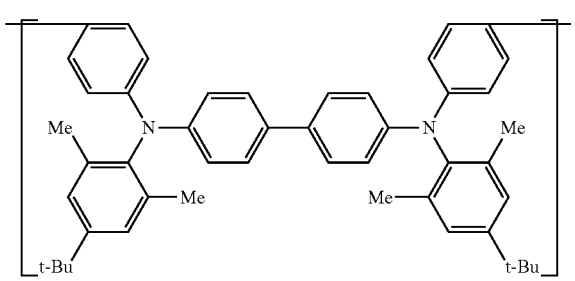
(X1-3)
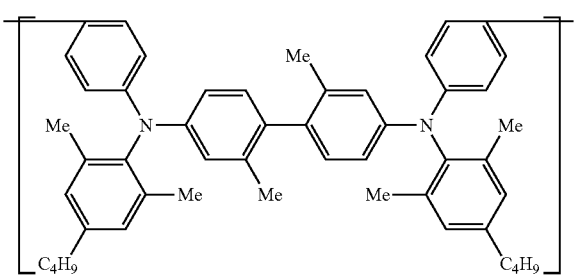
(Chemical Formula 98)
(X1-4)
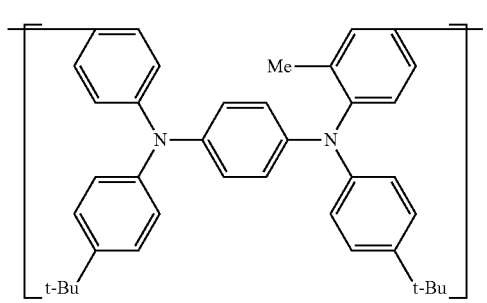
(X1-5)
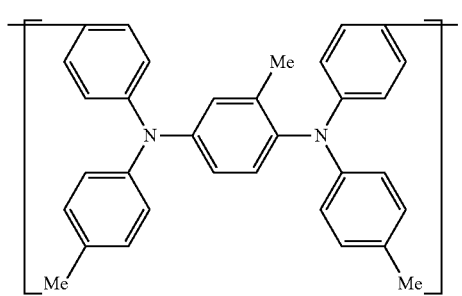
-continued
(X1-6)
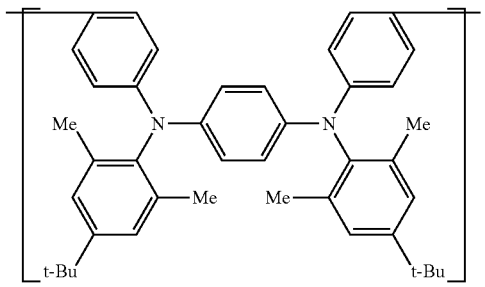
(Chemical Formula 99)
(X1-7)
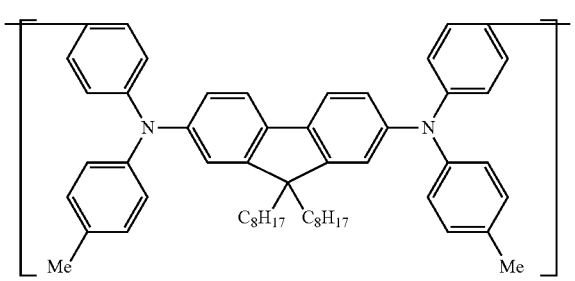
(X1-8)
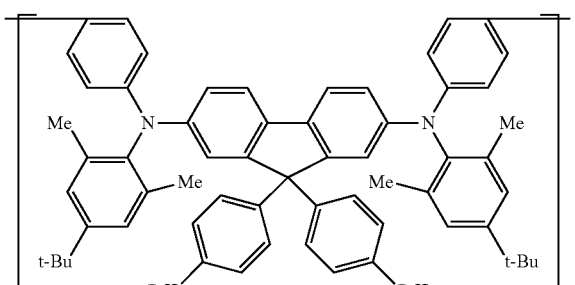
(Chemical Formula 100)
(X1-9)
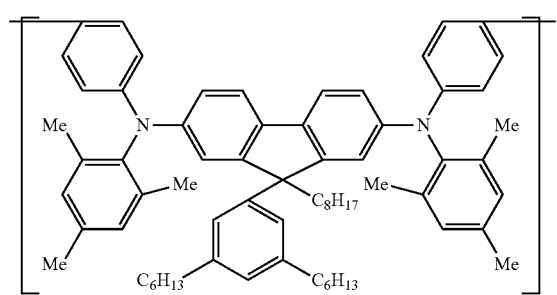
(X1-10)
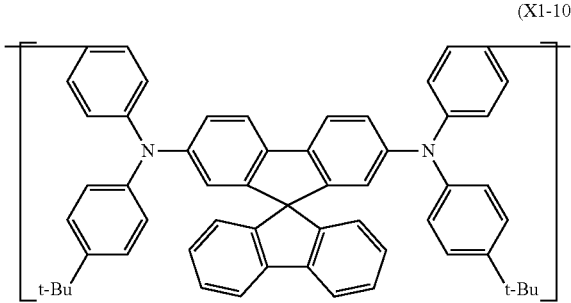

-continued
(Chemical Formula 101)
(X1-11)
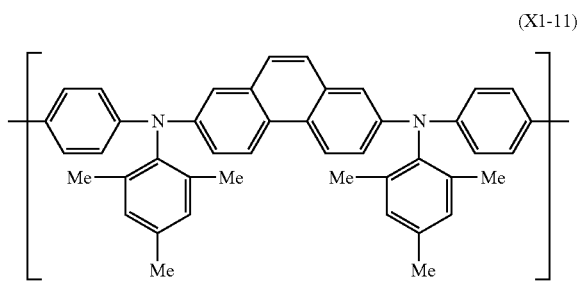
(X1-12)
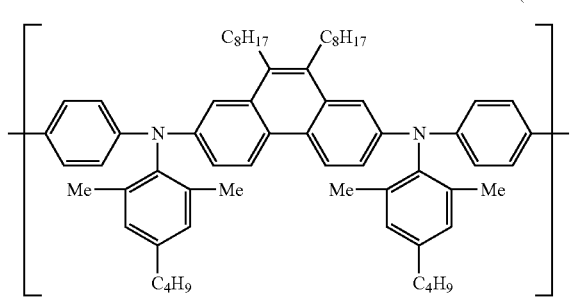
(Chemical Formula 102)
(X1-13)
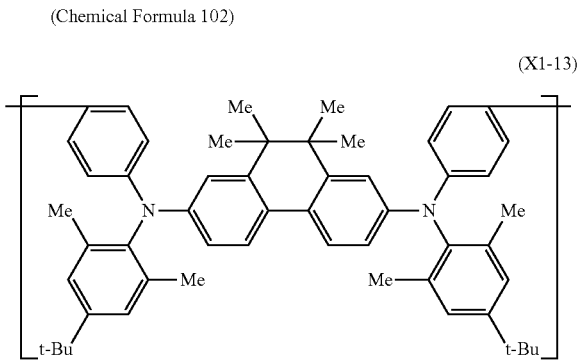
(X1-14)
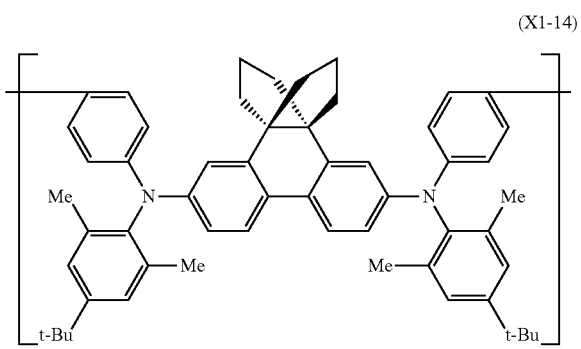
-continued
(Chemical Formula 103)
(X1-15)
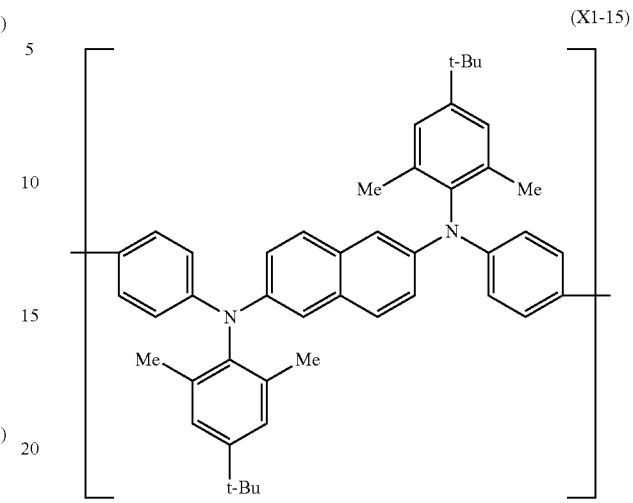
(X1-16)
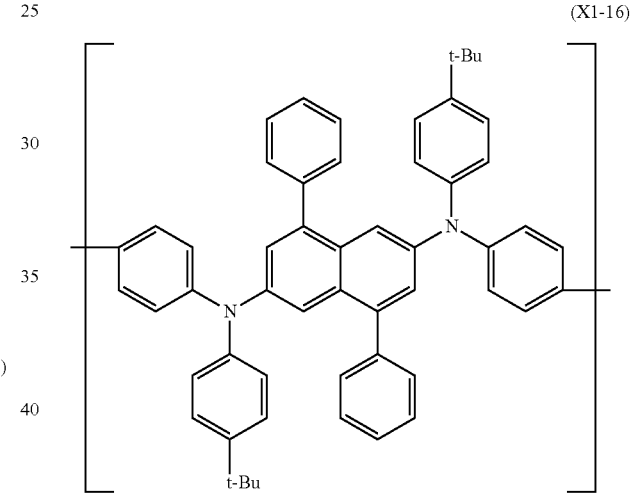
(Chemical Formula 104)
(X1-17)
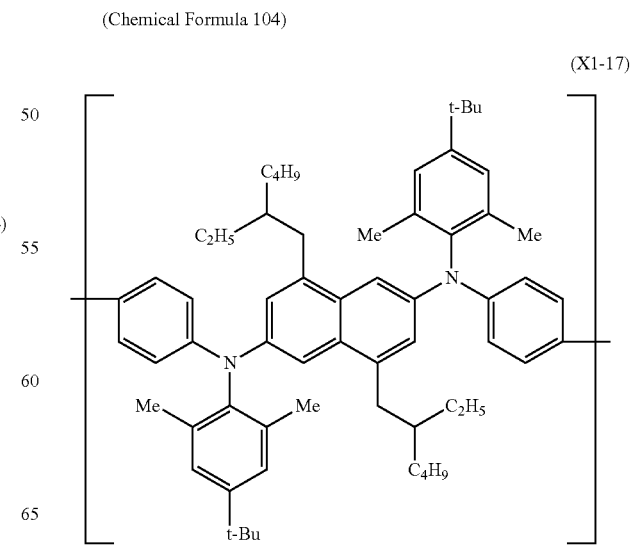

-continued

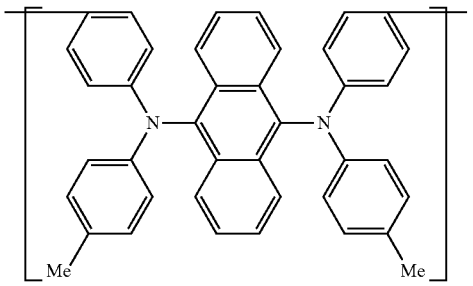

(X1-18)

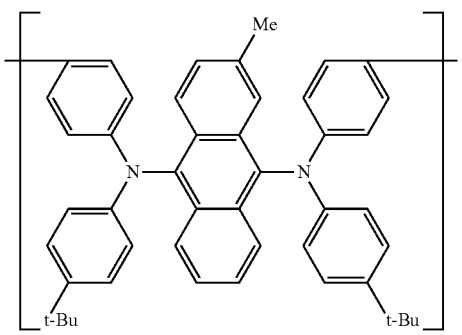

(X1-19)

The constitutional unit represented by the formula (X) may be contained only singly or two or more units thereof may be contained in the polymer compound of the present invention.

It is preferable that the polymer compound of the present invention further comprises a constitutional unit represented by the formula (Y), because the luminance life of a light emitting device produced by using the polymer compound of the present invention is excellent.

(Chemical Formula 105)

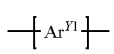

(Y)

It is preferable that the polymer compound of the present invention further comprises a constitutional unit represented by the formula (X) and a constitutional unit represented by the formula (Y), because the light emission efficiency of a light emitting device produced by using the polymer compound of the present invention is excellent.

The arylene group represented by $Ar^{Y1}$ is more preferably a group represented by the formula (A-1), the formula (A-6), the formula (A-7), the formula (A-9) to (A-11), the formula (A-13) or the formula (A-19), further preferably a group represented by the formula (A-1), the formula (A-7), the formula (A-9) or the formula (A-19), and these groups each optionally have a substituent.

The divalent heterocyclic group represented by $Ar^{Y1}$ is more preferably a group represented by the formula (AA-4), the formula (AA-10), the formula (AA-13), the formula (AA-15), the formula (AA-18) or the formula (AA-20), further preferably a group represented by the formula (AA-4), the formula (AA-10), the formula (AA-18) or the formula (AA-20), and these groups each optionally have a substituent.

The more preferable range and the further preferable range of the arylene group and the divalent heterocyclic group in the divalent group in which at least one arylene group and at least one divalent heterocyclic group are bonded directly to each other represented by $Ar^{Y1}$ are the same as the more preferable range and the further preferable range of the arylene group and the divalent heterocyclic group represented by $Ar^{Y1}$ described above, respectively.

The divalent group in which at least one arylene group and at least one divalent heterocyclic group are bonded directly to each other represented by $Ar^{Y1}$ includes the same groups as the divalent group in which at least one arylene group and at least one divalent heterocyclic group are bonded directly to each other represented by $Ar^{X2}$ and $Ar^{X4}$ in the formula (X).

The substituent which the group represented by $Ar^{Y1}$ optionally has is preferably an alkyl group, a cycloalkyl group or an aryl group, and these groups each optionally further have a substituent.

The constitutional unit represented by the formula (Y) includes, for example, constitutional units represented by the formulae (Y-1) to (Y-7), and from the standpoint of the luminance life of a light emitting device produced by using the polymer compound of the present invention preferable is a constitutional unit represented by the formula (Y-1) or (Y-2), from the standpoint of electron transportability preferable is a constitutional unit represented by the formula (Y-3) or (Y-4), and from the standpoint of hole transportability preferable are constitutional units represented by the formulae (Y-5) to (Y-7).

(Chemical Formula 106)

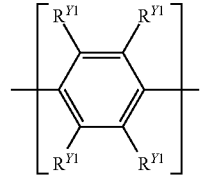

(Y-1)

[wherein, $R^{Y1}$ represents a hydrogen atom, an alkyl group, a cycloalkyl group, an alkoxy group, a cycloalkoxy group, an aryl group or a monovalent heterocyclic group, and these groups each optionally have a substituent. The plurality of $R^{Y1}$ may be the same or different, and adjacent groups $R^{Y1}$ may be combined together to form a ring together with the carbon atoms to which they are attached.]

$R^{Y1}$ is preferably a hydrogen atom, an alkyl group, a cycloalkyl group or an aryl group, and these groups each optionally have a substituent.

The constitutional unit represented by the formula (Y-1) is preferably a constitutional unit represented by the formula (Y-1').

(Chemical Formula 107)

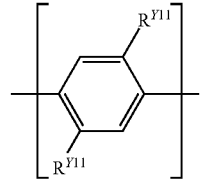

(Y-1')

[wherein, $R^{Y11}$ represents an alkyl group, a cycloalkyl gro6up, an alkoxy group, a cycloalkoxy group, an aryl group or a monovalent heterocyclic group, and these groups each optionally have a substituent. The plurality of $R^{Y1}$ may be the same or different.]

$R^{Y11}$ is preferably an alkyl group, a cycloalkyl group or an aryl group, more preferably an alkyl group or a cycloalkyl group, further preferably an alkyl group, and these groups each optionally have a substituent.

(Chemical Formula 108)

(Y-2)

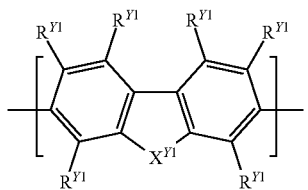

[wherein, $R^{Y1}$ represents the same meaning as describe above.

$X^{Y1}$ represents a group represented by —C(R$^{Y2}$)$_2$—, —C(R$^{Y2}$)=C(R$^{Y2}$)— or C(R$^{Y2}$)$_2$—C(R$^{Y2}$)$_2$—. $R^{Y2}$ represents a hydrogen atom, an alkyl group, a cycloalkyl group, an alkoxy group, a cycloalkoxy group, an aryl group or a monovalent heterocyclic group, and these groups each optionally have a substituent. The plurality of $R^{Y2}$ may be the same or different, and groups $R^{Y2}$ may be combined together to form a ring together with each carbon atom to which they are attached.]

$R^{Y2}$ is preferably an alkyl group, a cycloalkyl group, an aryl group or a monovalent heterocyclic group, more preferably an alkyl group a cycloalkyl group or an aryl group, and these groups each optionally have a substituent.

Regarding the combination of two $R^{Y2}$s in the group represented by —C(R$^{Y2}$)$_2$— in $X^{Y1}$, it is preferable that the both are an alkyl group or a cycloalkyl group, the both are an aryl group, the both are a monovalent heterocyclic group, or one is an alkyl group or a cycloalkyl group and the other is an aryl group or a monovalent heterocyclic group, it is more preferable that one is an alkyl group or cycloalkyl group and the other is an aryl group, and these groups each optionally have a substituent. The two groups $R^{Y2}$ may be combined together to form a ring together with the atoms to which they are attached, and when the groups $R^{Y2}$ form a ring, the group represented by —C(R$^{Y2}$)$_2$— is preferably a group represented by the formula (Y-A1) to (Y-A5), more preferably a group represented by the formula (Y-A4), and these groups each optionally have a substituent.

(Chemical Formula 109)

(Y-A1)

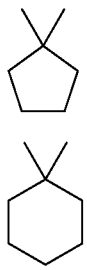

(Y-A2)

(Y-A3)

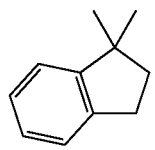

(Y-A4)

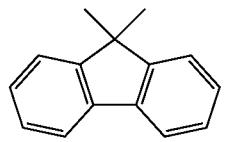

(Y-A5)

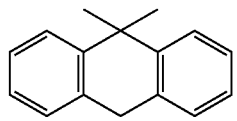

Regarding the combination of two $R^{Y2}$s in the group represented by —C(R$^{Y2}$)=C(R$^{Y2}$)— in $X^{Y1}$, it is preferable that the both are an alkyl group or cycloalkyl group, or one is an alkyl group or a cycloalkyl group and the other is an aryl group, and these groups each optionally have a substituent.

Four $R^{Y2}$s in the group represented by —C(R$^{Y2}$)$_2$—C(R$^{Y2}$)$_2$— in $X^{Y1}$ are each preferably an alkyl group or a cycloalkyl group optionally having a substituent. The plurality of $R^{Y2}$ may be combined together to form a ring together with the atoms to which they are attached, and when the groups $R^{Y2}$ form a ring, the group represented by —C(R$^{Y2}$)$_2$—C(R$^{Y2}$)$_2$— is preferably a group represented by the formula (Y-B1) to (Y-B5), more preferably a group represented by the formula (Y-B3), and these groups each optionally have a substituent.

(Chemical Formula 110)

(Y-B1)

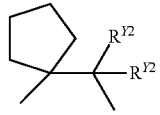

(Y-B2)

(Y-B3)

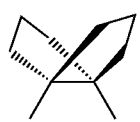

(Y-B4)

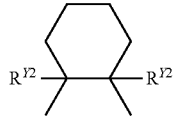

(Y-B5)

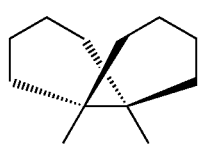

[wherein, $R^{Y2}$ represents the same meaning as described above.]

It is preferable that the constitutional unit represented by the formula (Y-2) is a constitutional unit represented by the formula (Y-2').

(Chemical Formula 111)

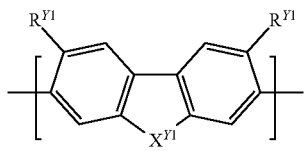

(Y-2')

[wherein, $R^{Y1}$ and $X^{Y1}$ represent the same meaning as described above.]

(Chemical Formula 112)

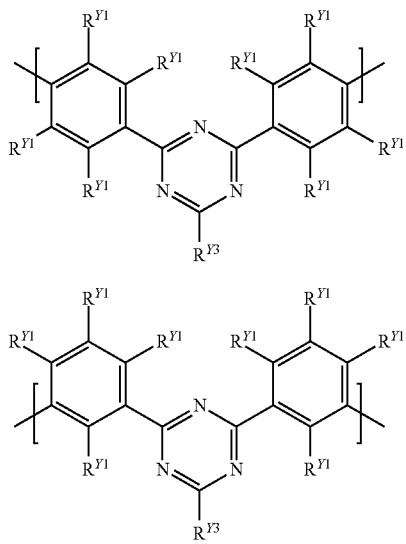

(Y-3)

(Y-4)

[wherein, $R^{Y1}$ represents the same meaning as described above.

$R^{Y3}$ represents a hydrogen atom, an alkyl group, a cycloalkyl group, an alkoxy group, a cycloalkoxy group, an aryl group or a monovalent heterocyclic group, and these groups each optionally have a substituent.]

$R^{Y3}$ is preferably an alkyl group, a cycloalkyl group, an alkoxy group, a cycloalkoxy group, an aryl group or a monovalent heterocyclic group, more preferably an aryl group, and these groups each optionally have a substituent.

(Chemical Formula 113)

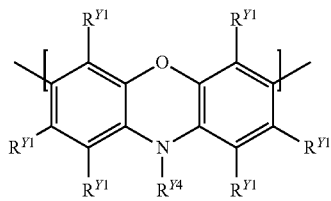

(Y-5)

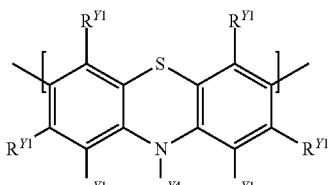

(Y-6)

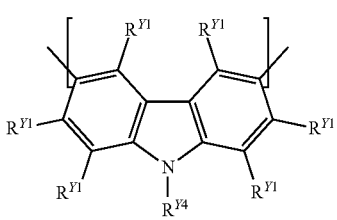

(Y-7)

[wherein, $R^{Y1}$ represents the same meaning as described above.

$R^{Y4}$ represents a hydrogen atom, an alkyl group, a cycloalkyl group, an alkoxy group, a cycloalkoxy group, an aryl group or a monovalent heterocyclic group, and these groups each optionally have a substituent.]

$R^{Y4}$ is preferably an alkyl group, a cycloalkyl group, an alkoxy group, a cycloalkoxy group, an aryl group or a monovalent heterocyclic group, more preferably an aryl group, and these groups each optionally have a substituent.

The constitutional unit represented by the formula (Y) includes, for example, constitutional units represented by the formulae (Y-11) to (Y-55).

(Chemical Formula 114)

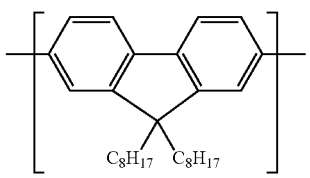

(Y-11)

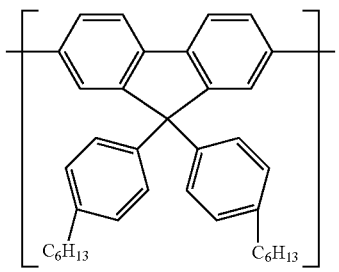

(Y-12)

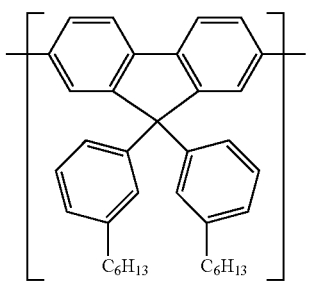

(Y-13)

-continued
(Chemical Formula 115)
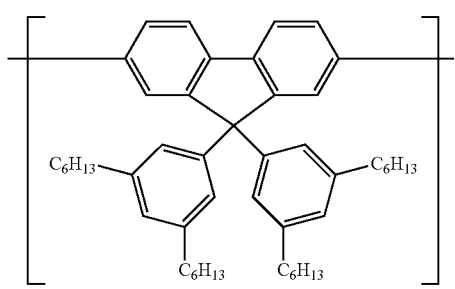 (Y-14)
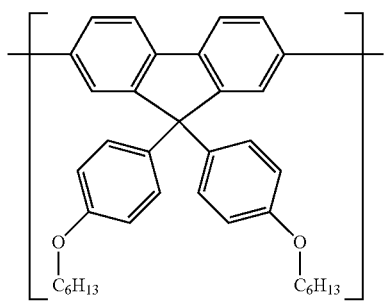 (Y-15)
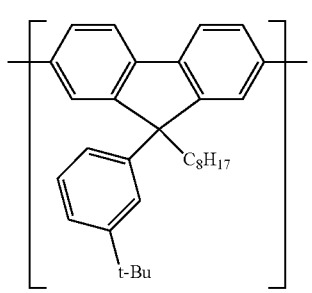 (Y-16)
(Chemical Formula 116)
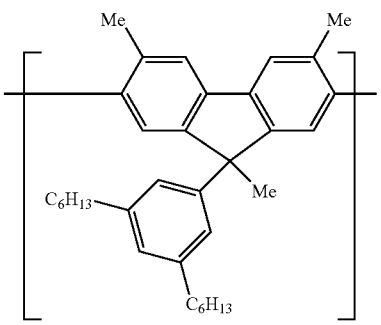 (Y-17)
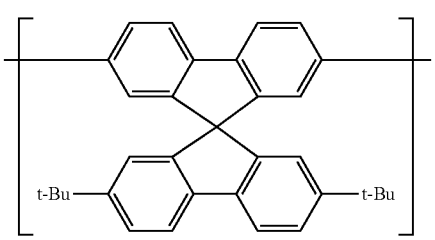 (Y-18)
-continued
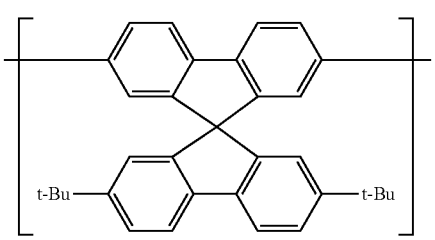 (Y-19)
(Chemical Formula 117)
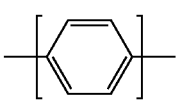 (Y-20)
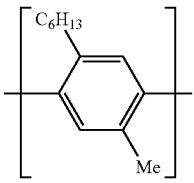 (Y-21)
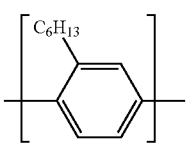 (Y-22)
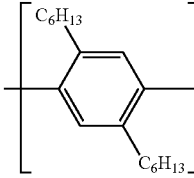 (Y-23)
(Chemical Formula 118)
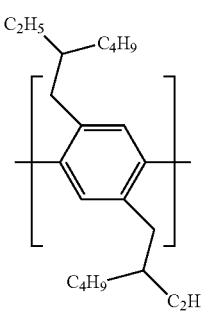 (Y-24)
(Y-25)

-continued
(Y-26) 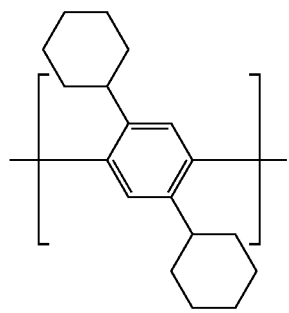
(Y-27) 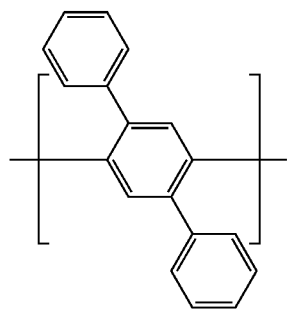
(Chemical Formula 119)
(Y-28) 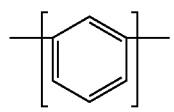
(Y-29) 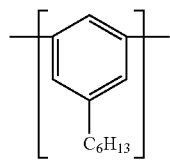
(Y-30) 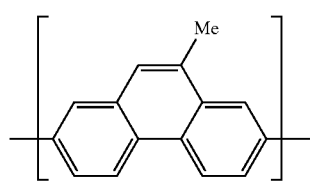
(Y-31) 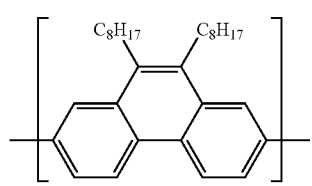
(Chemical Formula 120)
(Y-32) 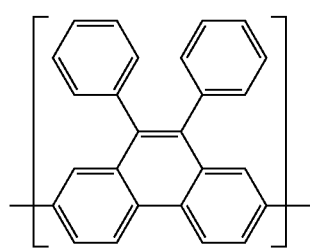
(Y-33) 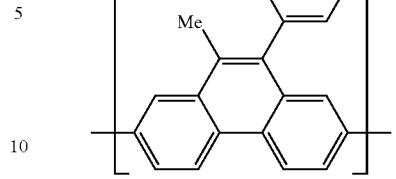
(Y-34) 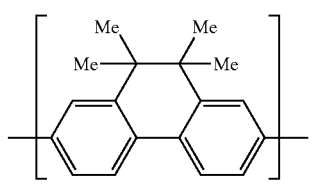
(Y-35) 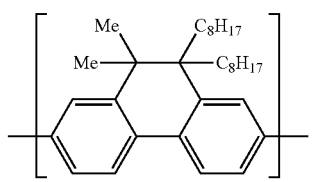
(Chemical Formula 121)
(Y-36) 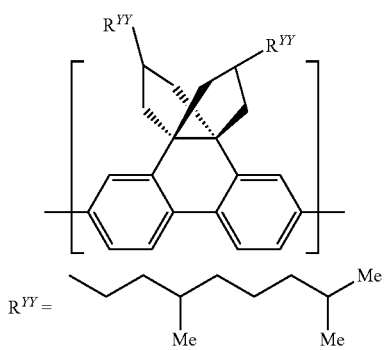
(Y-37) 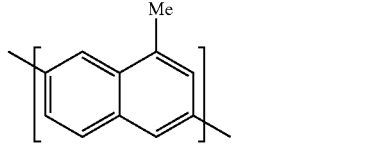
(Y-38) 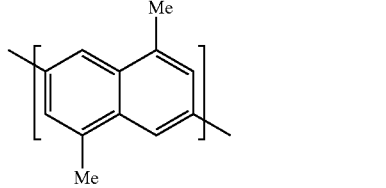
(Y-39) 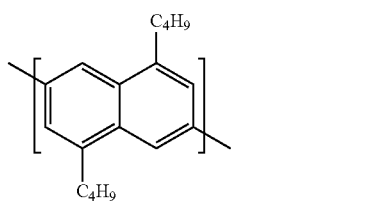

(Chemical Formula 122)
(Y-40)
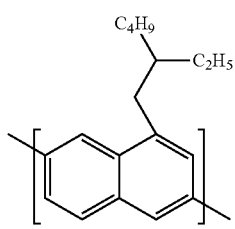
(Y-41)
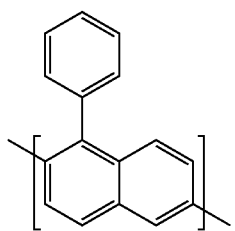
(Y-42)
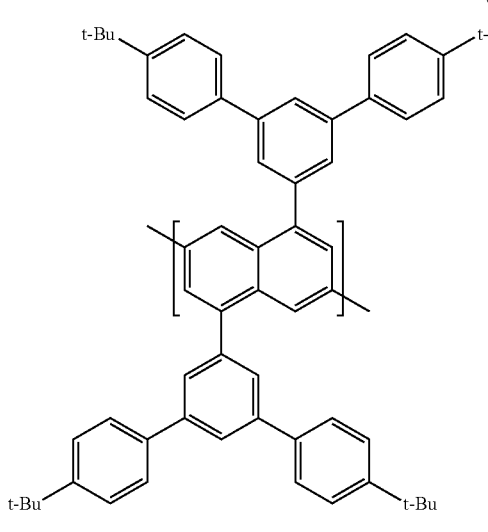
(Y-43)
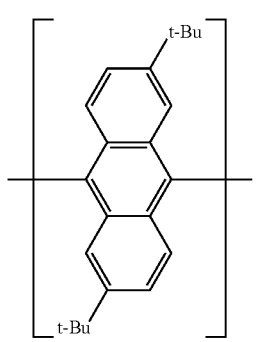
(Y-44)
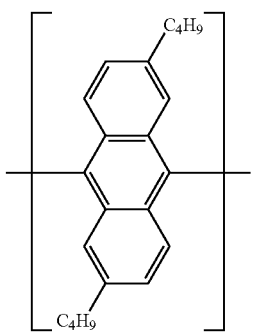
(Chemical Formula 123)
(Y-45)
(Y-46)
$R^{YY} =$
(Y-47)
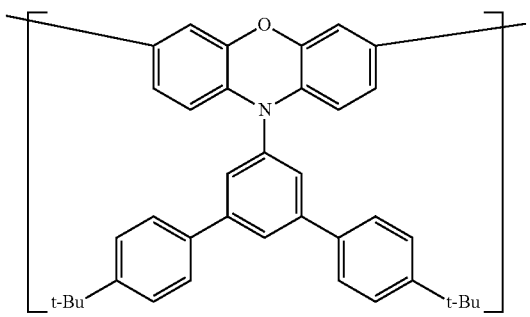

(Chemical Formula 124)
(Y-48)
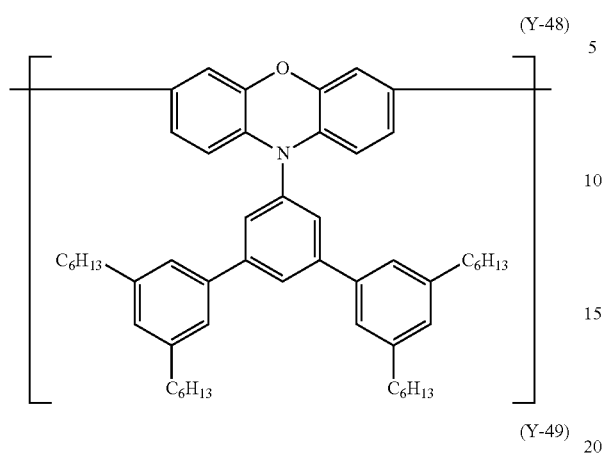
(Y-49)
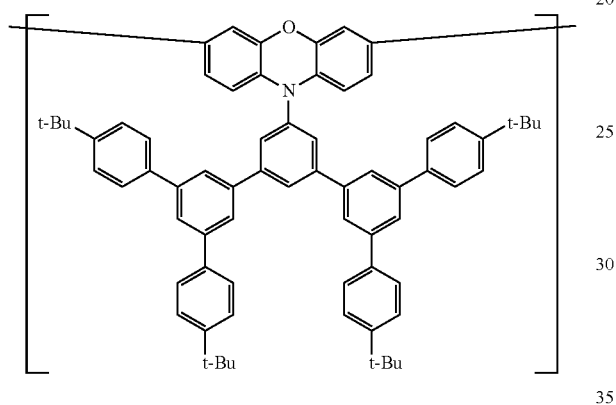
(Chemical Formula 125)
(Y-50)
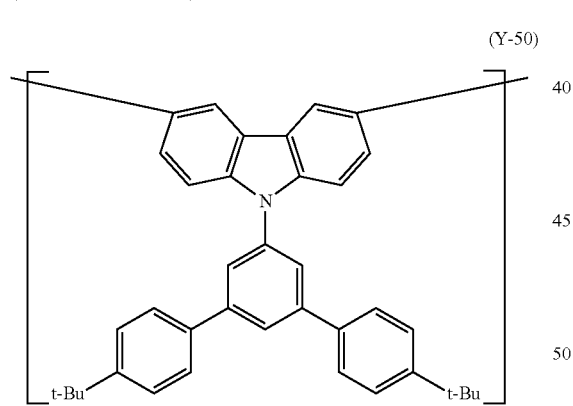
(Y-51)
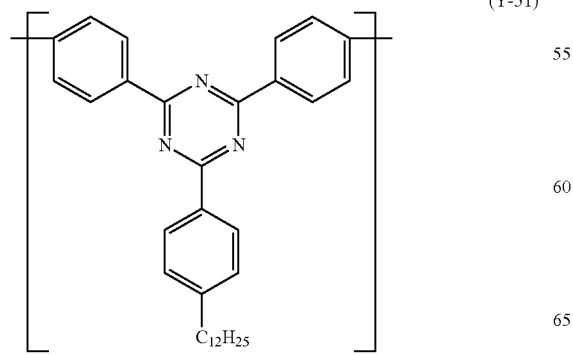
(Y-52)
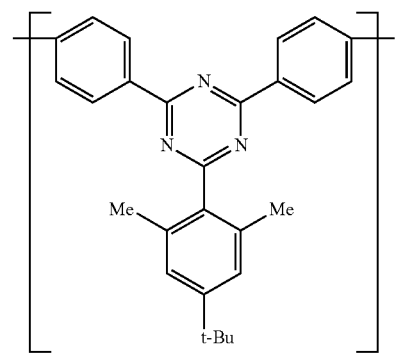
(Chemical Formula 126)
(Y-53)
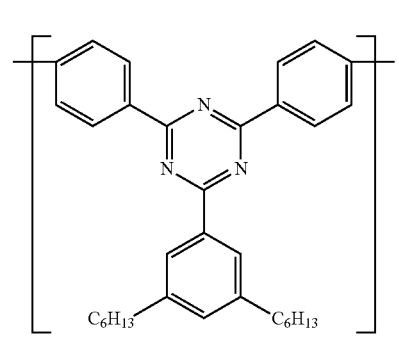
(Y-54)
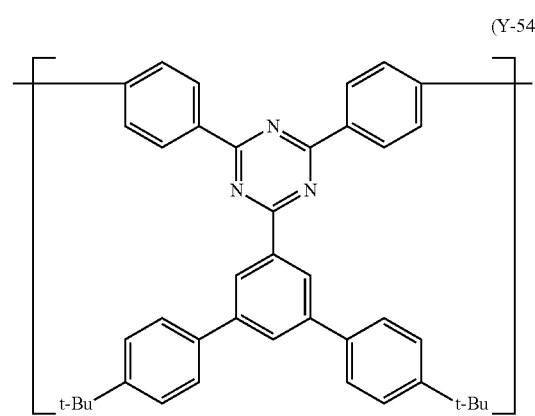
(Y-55)
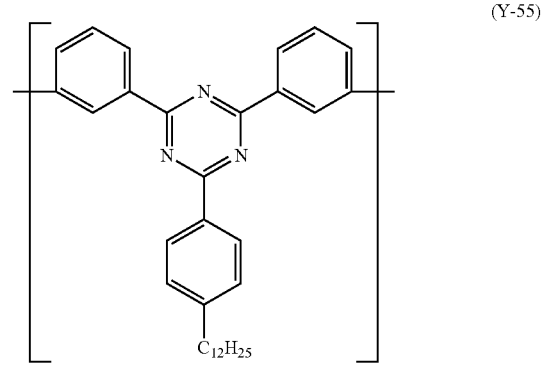

(Chemical Formula 127)

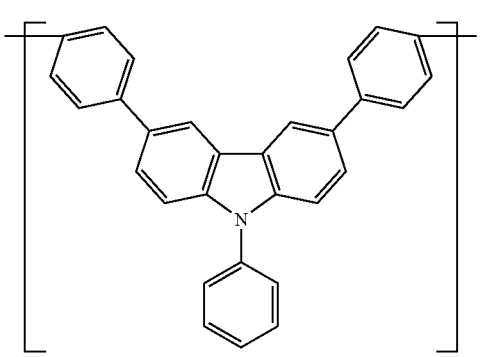

(Y-56)

The content of the constitutional unit represented by the formula (Y) in which $Ar^{Y1}$ is an arylene group is preferably 0.5 to 80 mol %, more preferably 30 to 60 mol % with respect to the total content of constitutional units contained in the polymer compound, because the luminance life of a light emitting device produced by using the polymer compound of the present invention is excellent.

The content of the constitutional unit represented by the formula (Y) in which $Ar^{Y1}$ is a divalent heterocyclic group or a divalent group in which at least one arylene group and at least one divalent heterocyclic group are bonded directly to each other is preferably 0.5 to 40 mol %, more preferably 3 to 30 mol % with respect to the total content of constitutional units contained in the polymer compound, because the charge transportability of a light emitting device produced by using the polymer compound of the present invention is excellent.

The constitutional unit represented by the formula (Y) may be contained only singly or two or more units thereof may be contained in the polymer compound.

The polymer compound of the present invention may further comprise a constitutional unit represented by any one of the following formulae.

(Chemical Formula 128)

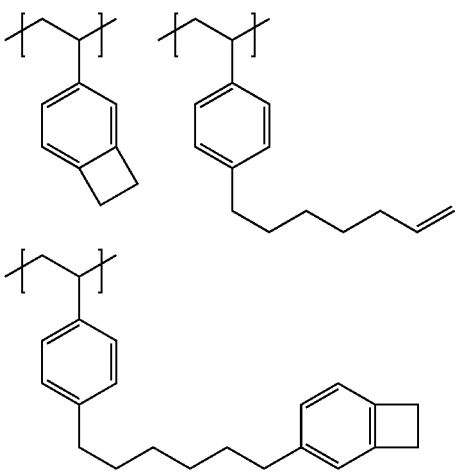

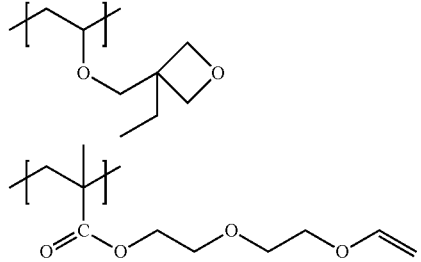

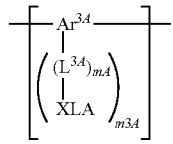

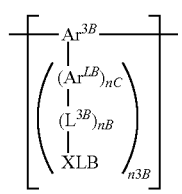

[Constitutional Unit Represented by Formula (3A) and Constitutional Unit Represented by Formula (3B)]

The polymer compound of the present invention may further comprise a constitutional unit represented by the formula (3A) or the formula (3B).

(Chemical Formula 129)

$$\left[\begin{array}{c} Ar^{3A} \\ \left(\begin{array}{c} (L^{3A})_{mA} \\ | \\ XLA \end{array}\right)_{m3A} \end{array}\right] \quad (3A)$$

$$\left[\begin{array}{c} Ar^{3B} \\ \left(\begin{array}{c} (Ar^{LB})_{nC} \\ | \\ (L^{3B})_{nB} \\ | \\ XLB \end{array}\right)_{n3B} \end{array}\right] \quad (3B)$$

[wherein, mA represents an integer of 0 to 5, nB represents an integer of 1 to 4, nC represents 0 to 4, and m3A and n3B each independently represent 1 or 2. When a plurality of mA, nB and nC are present, they may be the same or different at each occurrence.

$Ar^{3A}$ and $Ar^{3B}$ each independently represent, an aromatic hydrocarbon group or a heterocyclic group, and these groups each optionally have a substituent.

$Ar^{LB}$ represents, an arylene group or a divalent heterocyclic group, and these groups each optionally have a substituent. When a plurality of $Ar^{LB}$ are present, they may be the same or different.

$L^{3A}$ represents an alkylene group, a cycloalkylene group, an arylene group, a divalent heterocyclic group, a group represented by —N(R')—, an oxygen atom or a sulfur atom, and these groups each optionally have a substituent. R' represents the same meaning as described above. When a plurality of $L^{3A}$ are present, they may be the same or different.

$L^{3B}$ represents an alkylene group, a cycloalkylene group, a divalent heterocyclic group, a group represented by —N(R')—, an oxygen atom or a sulfur atom, and these groups each optionally have a substituent. R' represents the same meaning as described above. When a plurality of $L^{3B}$ are present, they may be the same or different.

XLA represents a monovalent group containing a crosslinkable group represented by the formula (XL-9), the formula (XL-10), the formula (XL-11), the formula (XL-12), the formula (XL-13) or the formula (XL-16), and these groups each optionally have a substituent. When a plurality of XLA are present, they may be the same or different.

XLB represents a monovalent group containing a crosslinkable group represented by the formula (XL-1), the formula (XL-2), the formula (XL-3), the formula (XL-4), the formula (XL-5), the formula (XL-6), the formula (XL-7), the formula (XL-8), the formula (XL-14) or the formula (XL-15), and these groups each optionally have a substituent. When a plurality of XLB are present, they may be the same or different.].

[Constitutional Unit Represented by Formula (3A)]

mA is preferably 0 or 1, more preferably 0, because a light emitting device using the polymer compound of the present invention is more excellent in luminance life.

m3A is preferably 2, because a light emitting device using the polymer compound of the present invention is more excellent in luminance life.

$Ar^{3A}$ is preferably an aromatic hydrocarbon group optionally having a substituent, because a light emitting device using the polymer compound of the present invention is more excellent in luminance life.

The definition and the preferable range of the aromatic hydrocarbon group and the heterocyclic group represented by $Ar^{3A}$ are the same as the definition and the preferable range of the aromatic hydrocarbon group and the heterocyclic group represented by $Ar^M$. The preferable range of the substituent which the aromatic hydrocarbon group and the heterocyclic group represented by $Ar^{3A}$ can have is the same as the preferable range of the substituent which the aromatic hydrocarbon group and the heterocyclic group represented by $Ar^M$ can have.

The definition and the preferable range of the alkylene group and the cycloalkylene group represented by $L^{3A}$ are the same as the definition and the preferable range of the alkylene group and the cycloalkylene group represented by $L^M$.

The preferable range of the arylene group and the divalent heterocyclic group represented by $L^{3A}$ is the same as the preferable range of the arylene group and the divalent heterocyclic group represented by $Ar^{1m}$.

$L^{3A}$ is preferably a phenylene group or an alkylene group, and these groups each optionally have a substituent, because production of the polymer compound of the present invention is easy.

The preferable range of the substituent which the group represented by $L^{3A}$ can have is the same as the preferable range of the substituent which the group represented by $L^M$ can have.

When a plurality of $L^{3A}$ are present, it is preferable that they are the same, because synthesis of the polymer compound of the present invention is easy.

The preferable range of the group represented by XLA is the same as the preferable range of the group represented by $X^M$.

When a plurality of XLA are present, it is preferable that they are the same, because synthesis of the polymer compound of the present invention is easy.

The content of the constitutional unit represented by the formula (3A) is preferably 3 to 20 mol % with respect to the total amount of constitutional units contained in the polymer compound, because the polymer compound of the present invention is excellent in stability and crosslinkability.

The constitutional units represented by the formula (3A) may be each contained singly or two or more of them may be contained in the polymer compound.

[Constitutional Unit Represented by Formula (3B)]

nB is preferably an integer of 1 to 3, more preferably 1 or 2, because a light emitting device using the polymer compound of the present invention is excellent in luminance life.

nC is preferably an integer of 0 to 2, more preferably 0 or 1, further preferably 0, because synthesis of the polymer compound of the present invention is easy.

n3B is preferably 2, because a light emitting device using the polymer compound of the present invention is excellent in luminance life.

$Ar^{3B}$ is preferably an aromatic hydrocarbon group optionally having a substituent, because a light emitting device using the polymer compound of the present invention is excellent in luminance life.

The definition and the preferable range of the aromatic hydrocarbon group and the heterocyclic group represented by $Ar^{3B}$ are the same as the definition and the preferable range of the aromatic hydrocarbon group and the heterocyclic group represented by $Ar^M$. The preferable range of the substituent which the aromatic hydrocarbon group and the heterocyclic group represented by $Ar^{3B}$ can have is the same as the preferable range of the substituent which the aromatic hydrocarbon group and the heterocyclic group represented by $Ar^M$ can have.

$Ar^{LB}$ is preferably an aromatic hydrocarbon group optionally having a substituent, because synthesis of the polymer compound of the present invention is easy.

The preferable range of the arylene group and the divalent heterocyclic group represented by $Ar^{LB}$ is the same as the preferable range of the arylene group and the divalent heterocyclic group represented by $Ar^{1m}$.

When a plurality of $Ar^{LB}$ are present, it is preferable that they are the same, because synthesis of the polymer compound of the present invention is easy.

The definition and the preferable range of the alkylene group and the cycloalkylene group represented by $L^{3B}$ are the same as the definition and the preferable range of the alkylene group and the cycloalkylene group represented by $L^M$.

$L^{3B}$ is preferably an alkylene group, and this group optionally has a substituent, because production of the polymer compound of the present invention is easy.

The preferable range of the substituent which the group represented by $L^{3B}$ can have is the same as the preferable range of the substituent which the group represented by $L^M$ can have.

When a plurality of $L^{3B}$ are present, it is preferable that they are the same, because synthesis of the polymer compound of the present invention is easy.

The preferable range of the group represented by XLB is the same as the preferable range of the group represented by $X^N$.

When a plurality of XLB are present, it is preferable that they are the same, because synthesis of the polymer compound of the present invention is easy.

The content of the constitutional unit represented by the formula (3B) is preferably 3 to 20 mol % with respect to the total amount of constitutional units contained in the polymer compound, because the polymer compound of the present invention is excellent in stability and crosslinkability.

The constitutional units represented by the formula (3B) may be each contained singly or two or more of them may be contained in the polymer compound.

The constitutional unit represented by the formula (3A) or the formula (3B) includes, for example, constitutional units represented by the formula (3-1) to the formula (3-30), and preferable are constitutional units represented by the formula (3-1) to the formula (3-15), the formula (3-19), the formula (3-20), the formula (3-23), the formula (3-25) or the formula (3-30), more preferable are constitutional units represented by the formula (3-1) to the formula (3-9) or the formula (3-30), because the polymer compound of the present invention is more excellent in crosslinkability.
(Chemical Formula 130)
(3-1)
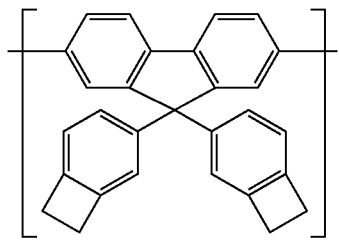
(3-2)
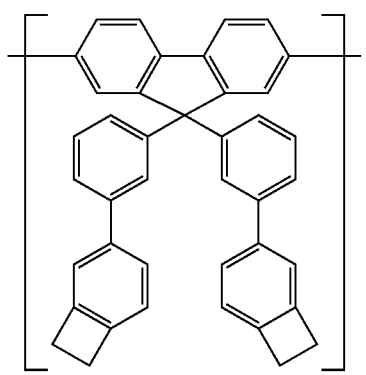
(3-3)
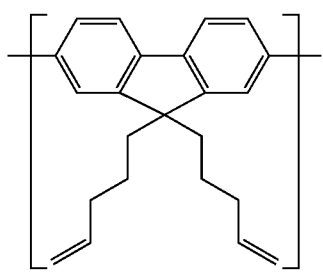
(3-4)
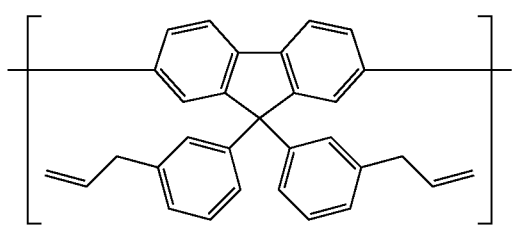
-continued
(3-5)
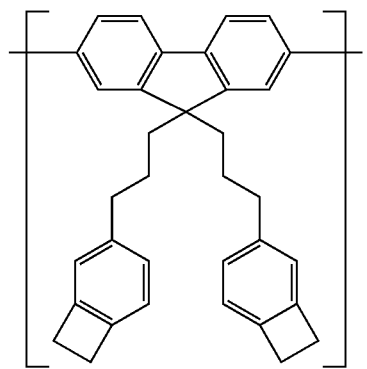
(3-6)
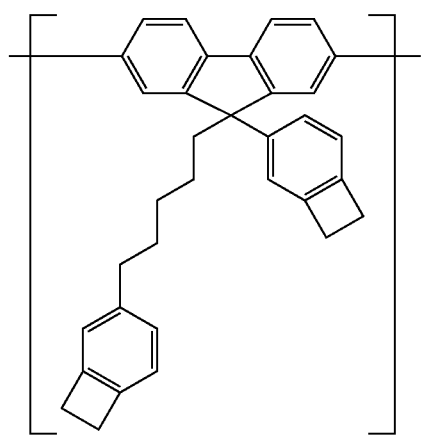
(3-7)
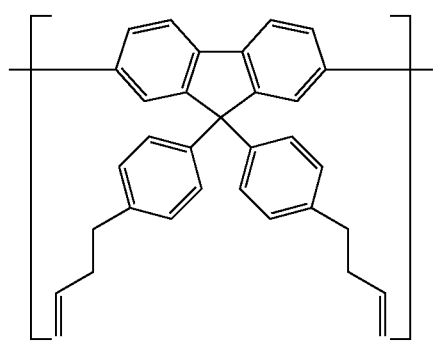
(3-8)
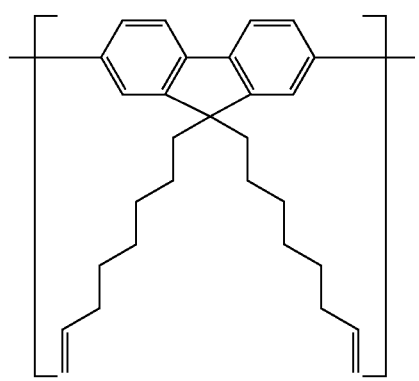

(3-9)
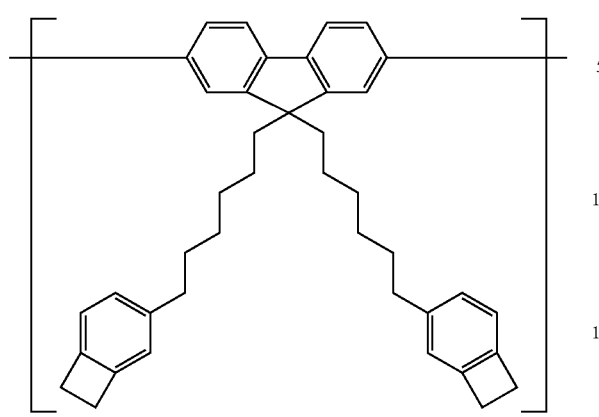
(3-10)
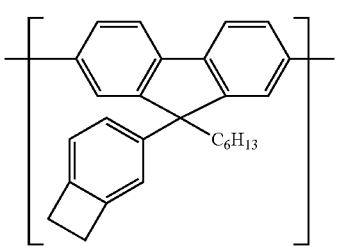
(3-11)
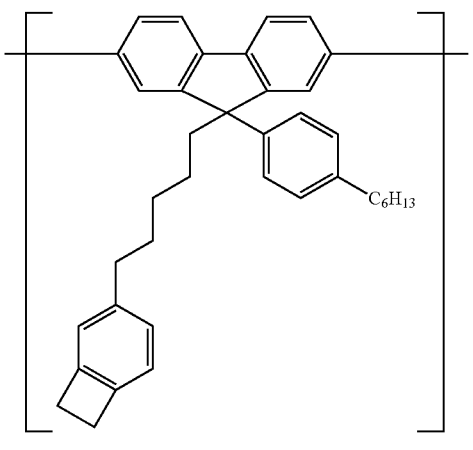
(3-12)
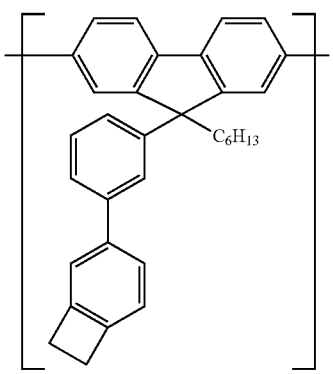
(3-13)
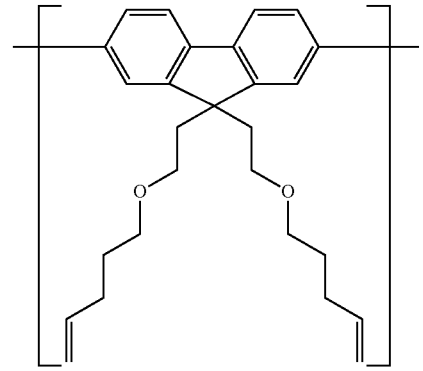
(3-14)
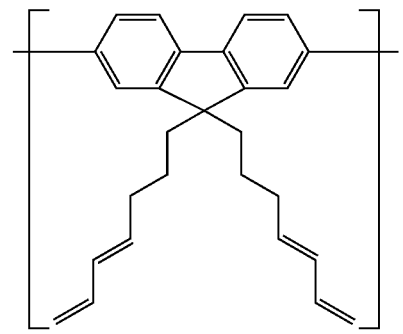
(3-15)
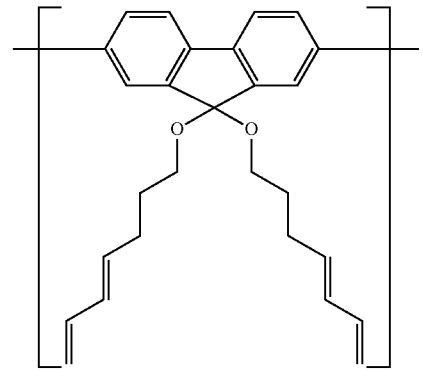
(Chemical Formula 131)
(3-16)
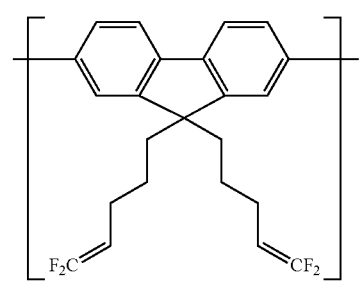

(3-17)
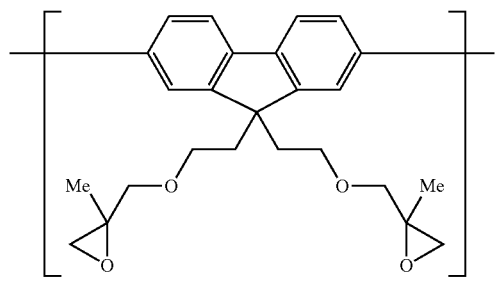
(3-18)
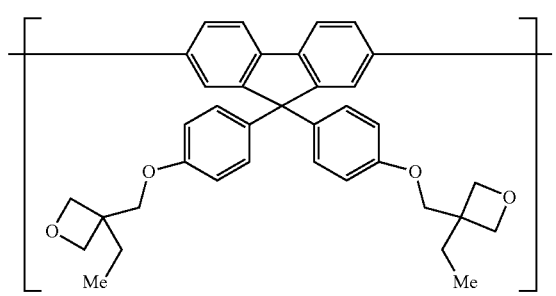
(3-19)
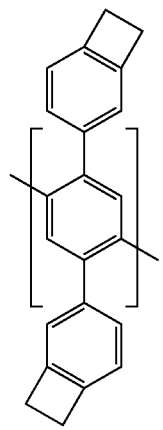
(3-20)
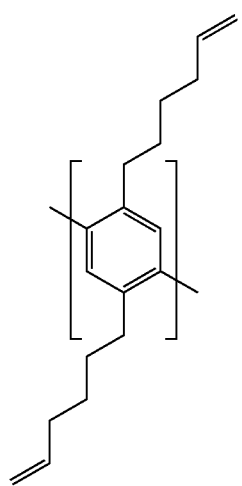
(3-21)
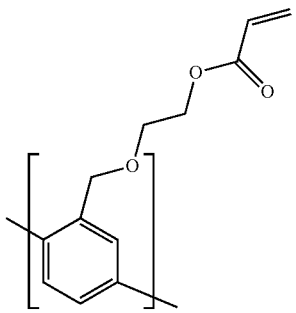
(3-22)
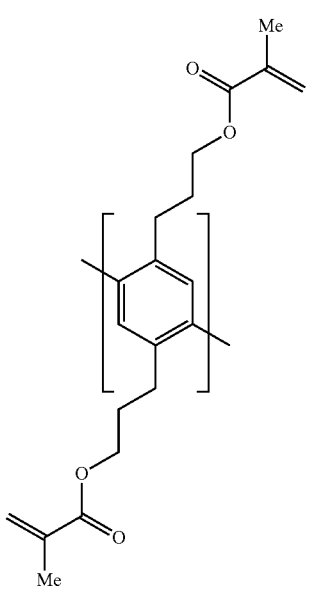
(3-23)
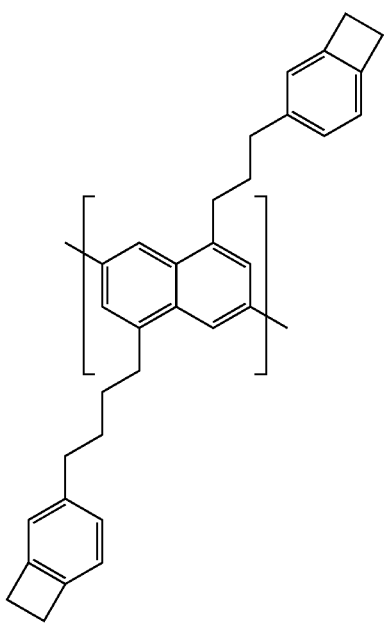

(3-24)
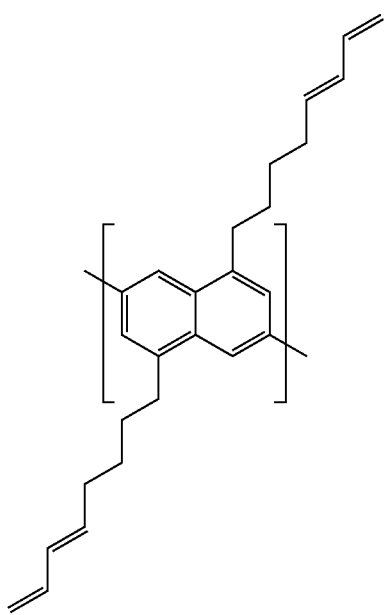
(3-25)
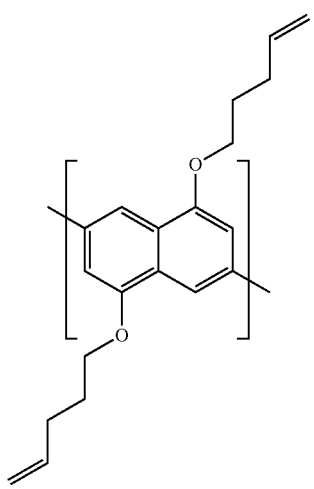
(3-26)
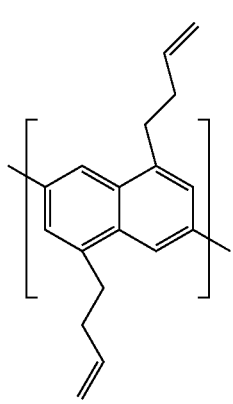
(3-27)
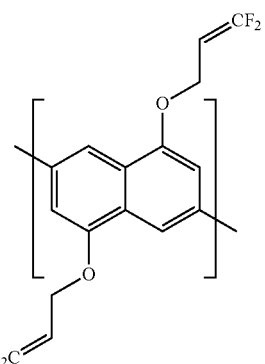
(3-28)
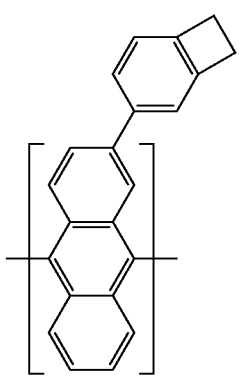
(3-29)
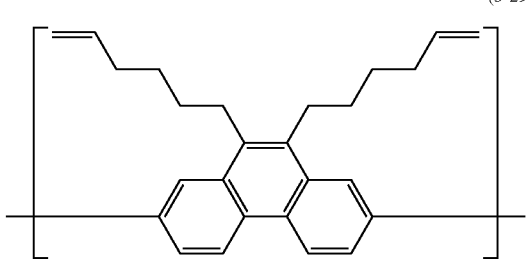
(3-30)
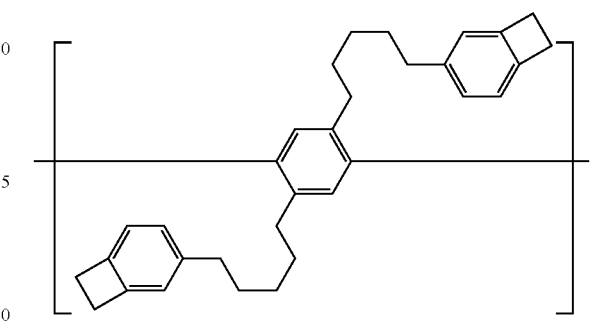
The polymer compound of the present invention includes, for example, polymer compounds P-1 to P-5. "Other" denotes a constitutional unit other than the constitutional units represented by the formula (1A), the formula (1B), the formula (2A), the formula (2B), the formula (X), the formula (Y), the formula (3A) and the formula (3B).

TABLE 3

| Polymer compound | Molar ratio to constitutional unit | | | | | |
|---|---|---|---|---|---|---|
| | formula (1A) or formula (1B) q | formula (2A) or formula (2B) r | formula (X) s | formula (Y) t | formula (3A) or formula (3B) u | other v |
| P-1 | 0.1 to 99.9 | 0.1 to 99.9 | 0 | 0 | 0 to 30 | 0 to 30 |
| P-2 | 0.1 to 99.8 | 0.1 to 99.8 | 0.1 to 99.8 | 0 | 0 to 30 | 0 to 30 |
| P-3 | 0.1 to 99.8 | 0.1 to 99.8 | 0 | 0.1 to 99.8 | 0 to 30 | 0 to 30 |
| P-4 | 0.1 to 99.7 | 0.1 to 99.7 | 0.1 to 99.7 | 0.1 to 99.7 | 0 to 30 | 0 to 30 |
| P-5 | 0.1 to 99.7 | 0.1 to 99.7 | 0.1 to 99.7 | 0.1 to 99.7 | 0 to 30 | 0 to 30 |

[in the table, q, r, s, t, u and v represent the mole fraction of each constitutional unit. q+r+s+t+u+v=100, and 70≤q+r+s+t+u≤100.]

Of them, polymer compounds P-6 to P-10 are preferable, since hole transportability is more excellent.

TABLE 4

| Polymer compound | Molar ratio to constitutional unit | | | | | |
|---|---|---|---|---|---|---|
| | formula (1A) q | formula (2A) r | formula (X) s | formula (Y) t | formula (3A) or formula (3B) u | other v |
| P-6 | 0.1 to 99.9 | 0.1 to 99.9 | 0 | 0 | 0 to 30 | 0 to 30 |
| P-7 | 0.1 to 99.8 | 0.1 to 99.8 | 0.1 to 99.8 | 0 | 0 to 30 | 0 to 30 |
| P-8 | 0.1 to 99.8 | 0.1 to 99.8 | 0 | 0.1 to 99.8 | 0 to 30 | 0 to 30 |
| P-9 | 0.1 to 99.7 | 0.1 to 99.7 | 0.1 to 99.7 | 0.1 to 99.7 | 0 to 30 | 0 to 30 |
| P-10 | 0.1 to 99.7 | 0.1 to 99.7 | 0.1 to 99.7 | 0.1 to 99.7 | 0 to 30 | 0 to 30 |

[in the table, q, r, s, t, u and v represent the mole fraction of each constitutional unit. q+r+s+t+u+v=100, and 70≤q+r+s+t+u≤100.]

An end group of the polymer compound of the present invention is preferably a stable group, because if a polymerization active group remains intact at the end, when the polymer compound is used for fabrication of a light emitting device, the light emitting property or luminance life possibly becomes lower. This end group is preferably a group having a conjugated bond to the main chain, and includes groups bonding to an aryl group or a monovalent heterocyclic group via a carbon-carbon bond.

The polymer compound of the present invention may be any of a block copolymer, a random copolymer, an alternative copolymer and a graft copolymer, and may also be other embodiment, and a copolymer produced by copolymerizing a several raw material monomers is preferable.

<Production Method of Polymer Compound>

Next, the production method of the polymer compound of the present invention will be illustrated.

The polymer compound of the present invention may be produced by any method, and for example, can be produced by a method including a step of condensation-polymerizing a compound represented by the formula (1AM) or the formula (1BM) and a compound represented by the formula (2AM) or the formula (2BM).

In the step of condensation polymerization, a compound other than theses compounds (for example, a compound represented by the formula (M-1), a compound represented by the formula (M-2), a compound represented by the formula (M-3A), a compound represented by the formula (M-3B)) may be condensation-polymerized. In the present specification, compounds used in production of the polymer compound of the present invention are generically called "raw material monomer" in some cases.

(Chemical Formula 132)

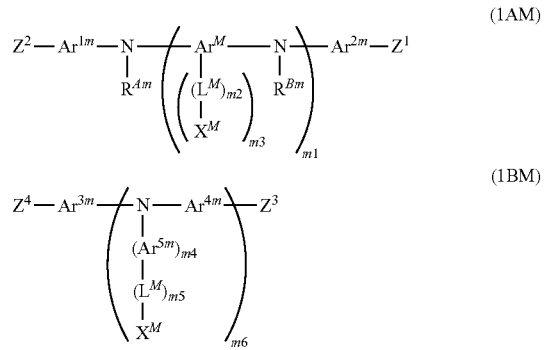

[wherein, $R^{Am}$, $R^{Bm}$, $Ar^{1m}$, $Ar^{2m}$, $Ar^{3m}$, $Ar^{4m}$, $Ar^{5m}$, $Ar^M$, m1, m2, m3, m4, m5, m6, $L^M$ and $X^M$ represent the same meaning as described above.

$Z^1$ to $Z^4$ each independently represent a group selected from Group A of substituent or a group selected from Group B of substituent.]

<Group A of Substituent>

A chlorine atom, a bromine atom, an iodine atom and a group represented by —O—S(=O)$_2$R$^{C1}$ (wherein, R$^{C1}$ represents an alkyl group, a cycloalkyl group or an aryl group, and these groups each optionally have a substituent.).

<Group B of Substituent>

A group represented by —B(OR$^{C2}$)$_2$ (wherein, R$^{C2}$ represents a hydrogen atom, an alkyl group, a cycloalkyl group or an aryl group, and these groups each optionally have a substituent. The plurality of $R^{C2}$ may be the same or different and may be combined together to form a cyclic structure together with the oxygen atoms to which they are attached.);

a group represented by —$BF_3Q'$ (wherein, $Q'$ represents Li, Na, K, Rb or Cs.);

a group represented by —MgY' (wherein, Y' represents a chlorine atom, a bromine atom or an iodine atom.);

a group represented by —ZnY'' (wherein, Y'' represents a chlorine atom, a bromine atom or an iodine atom.); and a group represented by —$Sn(R^{C3})_3$ (wherein, $R^{C3}$ represents a hydrogen atom, an alkyl group, a cycloalkyl group or an aryl group, and these groups each optionally have a substituent. The plurality of $R^{C3}$ may be the same or different and may be combined together to form a cyclic structure together with the tin atom to which they are attached.).

(Chemical Formula 133)

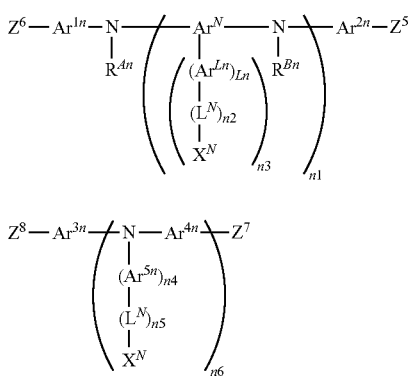

(2AM)

(2BM)

[wherein, $R^{An}$, $R^{Bn}$, $Ar^{1n}$, $Ar^{2n}$, $Ar^{3n}$, $Ar^{4n}$, $Ar^{5n}$, $Ar^{N}$, $Ar^{Ln}$, n1, n2, n3, n4, n5, n6, Ln, $L^N$ and $X^N$ represent the same meaning as described above.

$Z^5$ to $Z^8$ each independently represent a group selected from Group A of substituent or a group selected from Group B of substituent.]

(Chemical Formula 134)

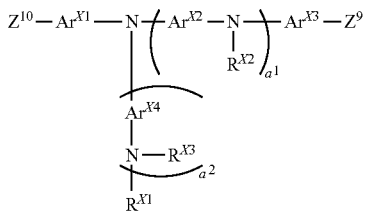

(M-1)

(M-2)

(Chemical Formula 135)

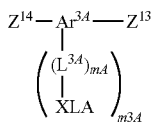

(M-3A)

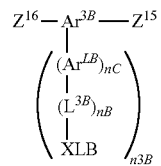

(M-3B)

[wherein, $a^1$, $a^2$, mA, nB, nC, m3A, n3B, $Ar^{X1}$ to $Ar^{X4}$, $R^{X1}$ to $R^{X3}$, $Ar^{Y1}$, $Ar^{3A}$, $Ar^{3B}$, $Ar^{LB}$, $L^{3A}$, $L^{3B}$, XLA and XLB represent the same meaning as described above.

$Z^9$ to $Z^{16}$ each independently represent a group selected from Group A of substituent or a group selected from Group B of substituent.]

For example, when $Z^9$ to $Z^{16}$ are a group selected from Group A of substituent, $Z^1$ to $Z^8$ are selected from Group B of substituent, and when $Z^9$ to $Z^{16}$ are a group selected from Group B of substituent, $Z^1$ to $Z^8$ are selected from Group A of substituent.

As the group represented by —$B(OR^{C2})_2$, groups represented by the following formulae are exemplified.

(Chemical Formula 136)

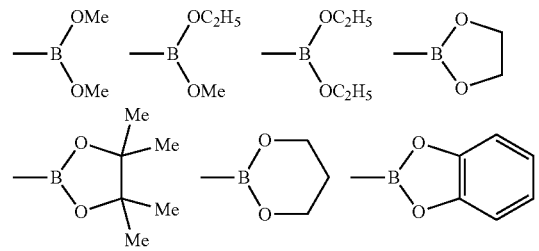

The compound having a group selected from Group A of substituent and the compound having a group selected from Group B of substituent undergo condensation polymerization by a known coupling reaction, thereby giving mutual bonding of carbon atoms linking the group selected from Group A of substituent and the group selected from Group B of substituent. Therefore, when a compound having two groups selected from Group A of substituent and a compound having two groups selected from Group B of substituent are subjected to a known coupling reaction, a condensed polymer of these compounds can be produced by condensation polymerization.

The condensation polymerization is carried out usually in the presence of a catalyst, a base and a solvent, and if necessary, a phase transfer catalyst may coexist.

The catalyst includes, for example, transition metal complexes such as palladium complexes such as bis(triphenylphosphine)palladium (II) dichloride, bis(tris-o-methoxyphenylphosphine)palladium (II) dichloride, tetrakis(triphenylphosphine)palladium (0), tris(dibenzylideneacetone)dipalladium (0) and palladium acetate, and nickel complexes such as tetrakis(triphenylphosphine)nickel(0): [1,3-bis(diphenylphosphino)propane)nickel(II) dichloride and bis(1,4-cyclooctadiene)nickel(0); and these transition metal complexes further having a ligand such as triphenylphosphine, tri(o-tolyl)phosphine, tri(tert-butyl)phosphine, tricyclohexylphosphine, 1,3-bis(diphenylphosphino)propane and bipyridyl. The catalysts may be each used singly or two or more of them may be used in combination.

The use amount of the catalyst is usually 0.00001 to 3 molar equivalents in terms of the amount of a transition metal with respect to the sum of the molar numbers of raw material monomers.

The base and the phase transfer catalyst include, for example, inorganic bases such as sodium carbonate, potassium carbonate, cesium carbonate, potassium fluoride, cesium fluoride and tripotassium phosphate; organic bases such as tetrabutylammonium fluoride, tetraethylammonium hydroxide and tetrabutylammonium hydroxide; and phase transfer catalysts such as tetrabutylammonium chloride and tetrabutylammonium bromide. The bases and the phase transfer catalysts each may be used singly or in combination.

The use amounts of the base and the phase transfer catalyst are each usually 0.001 to 100 molar equivalents with respect to the total molar number of raw material monomers.

The solvent includes, for example, organic solvents such as toluene, xylene, mesitylene, tetrahydrofuran, 1,4-dioxane, dimethoxyethane, N,N-dimethylacetamide and N,N-dimethylformamide; and water. The solvent may be used singly or two or more solvents may be used in combination.

The use amount of the solvent is usually 10 to 100000 parts by weight with respect to 100 parts by weight of the total amount of raw material monomers.

The reaction temperature of condensation polymerization is usually −100 to 200° C. The reaction time is usually 1 hour or longer.

The post treatment of the polymerization reaction is conducted by known methods, such as a method of removing water-soluble impurities by liquid separation and a method in which the reaction solution resulting from the polymerization reaction is added to a lower alcohol such as methanol and a precipitate deposited is collected by filtration and dried, that are applied individually or in combination. When the polymer compound has a low purity, the polymer host can be purified by a usual method, such as crystallization, reprecipitation, continuous extraction by a Soxhlet extractor and column chromatography.

[Production Method of Compound Represented by Formula (1AM)]

The compound represented by the formula (1AM) can be produced, for example, by synthesizing a compound represented by the formula (1AM-1-4) or a compound represented by the formula (1AM-2-4) by a method described in Scheme 1A or Scheme 2A, then, as needed, converting a group selected from Group A of substituent to a group selected from Group B of substituent by a known reaction such as boronic acid esterification using bispinacolatodiboron or 2-alkoxy-4,4,5,5-tetramethyl-1,3,2-dioxaborolane.

(Chemical Formula 137)

Scheme 1A

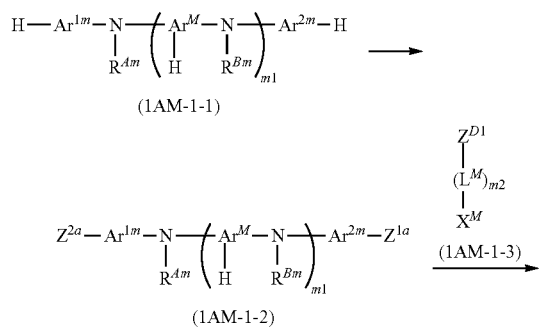

(1AM-1-2)

In Scheme 1A, $R^{Am}$, $R^{Bm}$, $Ar^{1m}$, $Ar^{2m}$, $Ar^M$, m1, m2, m3, $L^M$ and $X^M$ represent the same meaning as described above. $Z^{1a}$, $Z^{2a}$ and $Z^{D1}$ each independently represent a group selected from Group A of substituent.

In Scheme 1A, first, a compound represented by the formula (1AM-1-1) is converted to a compound represented by the formula (1AM-1-2) carrying $Z^{1a}$ and $Z^{2a}$ by converting a hydrogen atom to a group selected from Group A of substituent by a halogenation reaction such as a bromination reaction. Next, the compound represented by the formula (1AM-1-2) and a compound represented by the formula (1AM-1-3) can be subjected to a nucleophilic substitution reaction in the presence of a base, to synthesize a compound represented by the formula (1AM-1-4).

Scheme 2A (Chemical Formula 138)

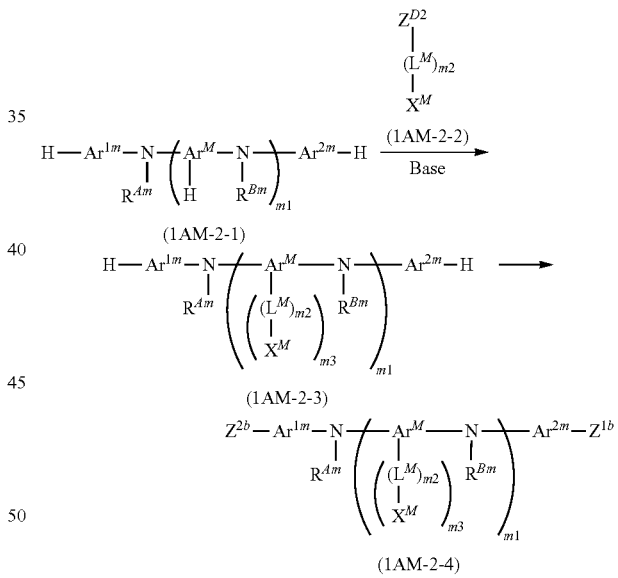

(1AM-2-4)

In Scheme 2A, $R^{Am}$, $R^{Bm}$, $Ar^{1m}$, $Ar^{2m}$, $Ar^M$, m1, m2, m3, $L^M$ and $X^M$ represent the same meaning as described above. $Z^{1b}$, $Z^{2b}$ and $Z^{D2}$ each independently represent a group selected from Group A of substituent.

In Scheme 2A, first, a compound represented by the formula (1AM-2-1) and a compound represented by the formula (1AM-2-2) are subjected to a nucleophilic substitution reaction in the presence of a base, to synthesize a compound represented by the formula (1AM-2-3). Next, it is converted to a compound represented by the formula (1AM-2-4) carrying $Z^{1b}$ and $Z^{2b}$ by converting a hydrogen atom to a group selected from Group A of substituent by a halogenation reaction such as a bromination reaction.

[Production Method of Compound Represented by Formula (1BM)]

A compound represented by the formula (1BM) can be produced, for example, by synthesizing a compound represented by the formula (1BM-1-4) or a compound represented by the formula (1BM-2-4) by a method described in Scheme 1B or Scheme 2B, then, as needed, converting a group selected from Group A of substituent to a group selected from Group B of substituent by a known reaction such as boronic acid esterification using bispinacolatodiboron or 2-alkoxy-4,4,5,5-tetramethyl-1,3,2-dioxaborolane.

Scheme 1B (Chemical Formula 139)

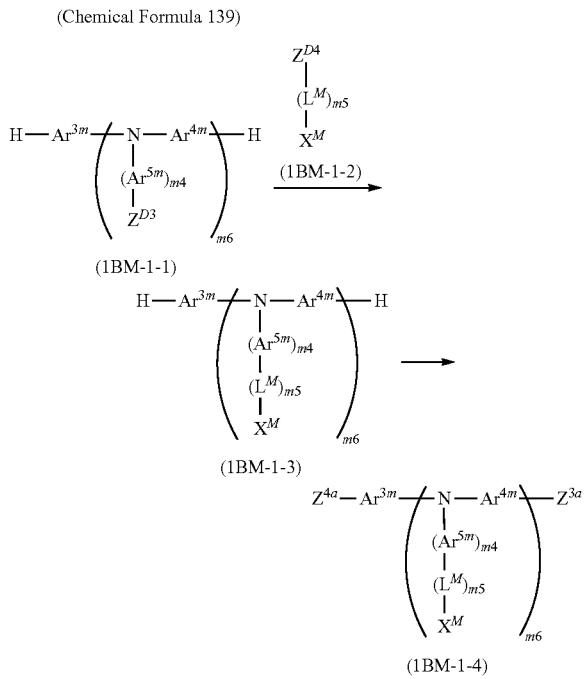

In Scheme 1B, $Ar^{3m}$, $Ar^{4m}$, $Ar^{5m}$, m4, m5, m6, $L^N$ and $X^N$ represent the same meaning as described above. $Z^{3a}$, $Z^{4a}$ and $Z^{D3}$ each independently represent a group selected from Group A of substituent. $Z^{D4}$ represents an alkali metal atom or a group represented by $-M^{10}Z^{1H}$. $M^{10}$ represents a magnesium atom or a zinc atom, and $Z^{1H}$ represents a halogen atom.

In Scheme 1B, first, a compound represented by the formula (1BM-1-1) is converted to a compound represented by the formula (1BM-1-3) by reacting the compound represented by the formula (1BM-1-1) with a compound represented by the formula (1BM-1-2) by a known coupling reaction. Next, a compound represented by the formula (1BM-1-4) carrying $Z^{3a}$ and $Z^{4a}$ can be synthesized by converting a hydrogen atom to a group selected from Group A of substituent by a halogenation reaction such as a bromination reaction.

Scheme 2B (Chemical Formula 140)

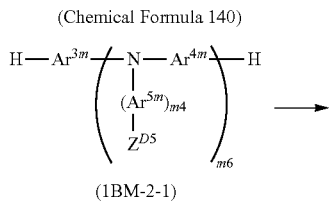

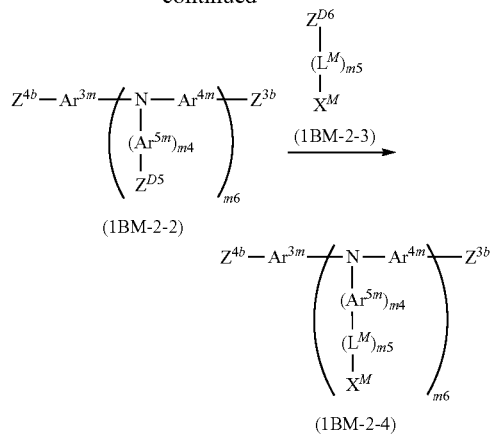

In Scheme 2B, $Ar^{3m}$, $Ar^{4m}$, $Ar^{5m}$, m4, m5, m6, $L^N$ and $X^N$ represent the same meaning as described above. $Z^{3b}$, $Z^{4b}$ and $Z^{D5}$ each independently represent a group selected from Group A of substituent. $Z^{D6}$ represents an alkali metal atom or a group represented by $-M^{10}Z^{1H}$. $M^{10}$ and $Z^{1H}$ represent the same meaning as described above.

In Scheme 2B, first, a compound represented by the formula (1BM-2-1) is converted to a compound represented by the formula (1BM-2-2) carrying $Z^{3b}$ and $Z^{4b}$ by converting a hydrogen atom to a group selected from Group A of substituent by a halogenation reaction such as a bromination reaction. Next, the compound represented by the formula (1BM-2-2) is reacted with a compound represented by the formula (1BM-2-3) using a known coupling reaction, to synthesize a compound represented by the formula (1BM-2-4).

[Production Method of Compound Represented by Formula (2AM)]

The compound represented by the formula (2AM) can be produced, for example, by synthesizing a compound represented by the formula (2AM-1-4) or a compound represented by the formula (2AM-2-4) by a method described in Scheme 1C or Scheme 2C, then, as needed, converting a group selected from Group A of substituent to a group selected from Group B of substituent by a known reaction such as boronic acid esterification using bispinacolatodiboron or 2-alkoxy-4,4,5,5-tetramethyl-1,3,2-dioxaborolane.

(Chemical Formula 141)

Scheme 1C

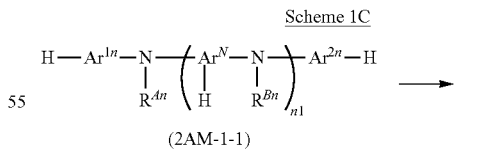

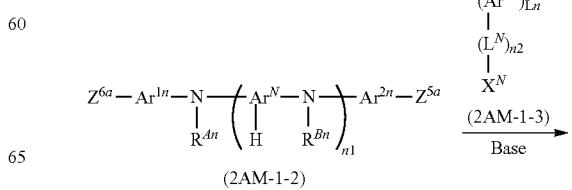

-continued

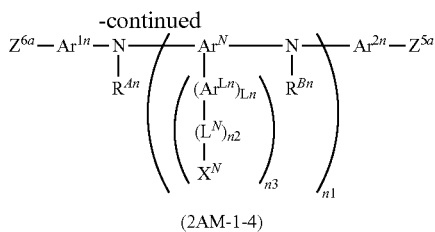

(2AM-1-4)

In Scheme 1C, $R^{An}$, $R^{Bn}$, $Ar^{1n}$, $Ar^{2n}$, $Ar^{N}$, $Ar^{Ln}$, n1, n2, n3, Ln, $L^{N}$ and $X^{N}$ represent the same meaning as described above. $Z^{5a}$, $Z^{6a}$ and $Z^{Da}$ each independently represent a group selected from Group A of substituent.

In Scheme 1C, first, a compound represented by the formula (2AM-1-1) is converted to a compound represented by the formula (2AM-1-2) carrying $Z^{5a}$ and $Z^{6a}$ by converting a hydrogen atom to a group selected from Group A of substituent by a halogenation reaction such as a bromination reaction. Next, the compound represented by the formula (2AM-1-2) and a compound represented by the formula (2AM-1-3) can be subjected to a nucleophilic substitution reaction in the presence of a base, to synthesize a compound represented by the formula (2AM-1-4).

Scheme 2C (Chemical Formula 142)

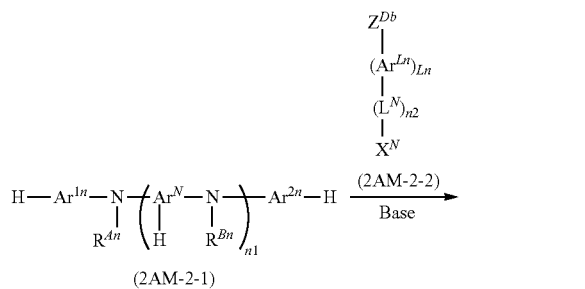

In Scheme 2C, $R^{An}$, $R^{Bn}$, $Ar^{1n}$, $Ar^{2n}$, $Ar^{N}$, $Ar^{Ln}$, n1, n2, n3, Ln, $L^{N}$ and $X^{N}$ represent the same meaning as described above. $Z^{5b}$, $Z^{6b}$ and $Z^{Db}$ each independently represent a group selected from Group A of substituent.

In Scheme 2C, first, a compound represented by the formula (2AM-2-1) and a compound represented by the formula (2AM-2-2) are subjected to a nucleophilic substitution reaction in the presence of a base, to synthesize a compound represented by the formula (2AM-2-3). Next, it is converted to a compound represented by the formula (2AM-2-4) carrying $Z^{5b}$ and $Z^{6b}$ by converting a hydrogen atom to a group selected from Group A of substituent by a halogenation reaction such as a bromination reaction.

[Production Method of Compound Represented by Formula (2BM)]

The compound represented by the formula (2BM) can be produced, for example, by synthesizing a compound represented by the formula (2BM-1-4) or a compound represented by the formula (2BM-2-4) by a method described in Scheme 1D or Scheme 2D, then, as needed, converting a group selected from Group A of substituent to a group selected from Group B of substituent by a known reaction such as boronic acid esterification using bispinacolatodiboron or 2-alkoxy-4,4,5,5-tetramethyl-1,3,2-dioxaborolane.

Scheme 1D (Chemical Formula 143)

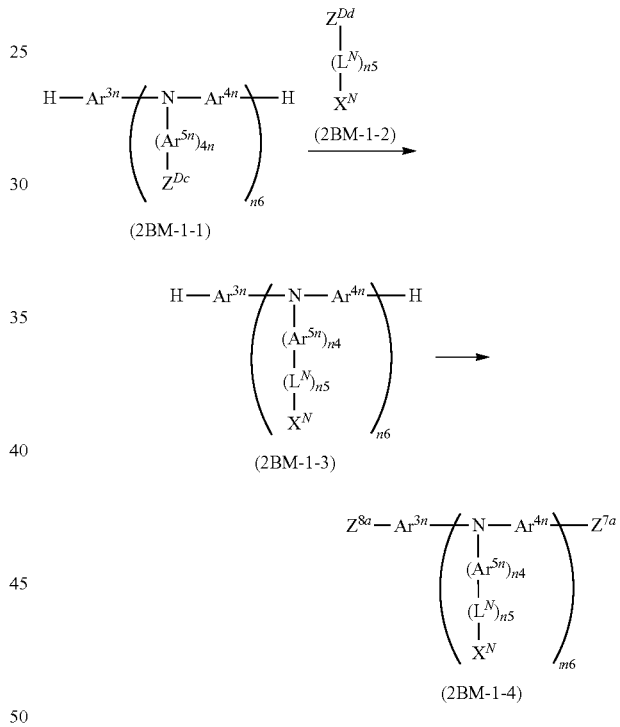

In Scheme 1D, $Ar^{3n}$, $Ar^{4n}$, $Ar^{5n}$, n4, n5, n6, $L^{N}$ and $X^{N}$ represent the same meaning as described above. $Z^{7a}$, $Z^{8a}$ and $Z^{Dc}$ each independently represent a group selected from Group A of substituent. $Z^{Dd}$ represents an alkali metal atom or a group represented by $-M^{10}Z^{1H}$. $M^{10}$ and $Z^{1H}$ represent the same meaning as described above.

In Scheme 1D, first, a compound represented by the formula (2BM-1-1) is converted to a compound represented by the formula (2BM-1-3) by reacting the compound represented by the formula (2BM-1-1) with a compound represented by the formula (2BM-1-2) by a known coupling reaction. Next, a compound represented by the formula (2BM-1-4) carrying $Z^{7a}$ and $Z^{8a}$ can be synthesized by converting a hydrogen atom to a group selected from Group A of substituent by a halogenation reaction such as a bromination reaction.

Scheme 2D (Chemical Formula 144)

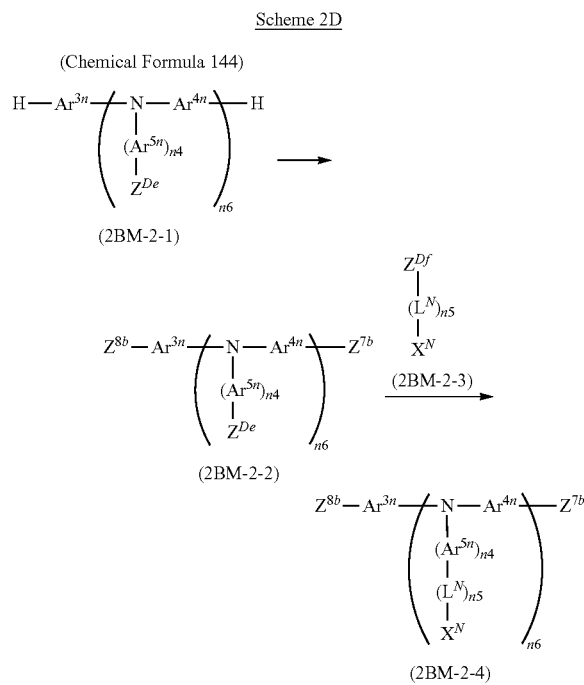

In Scheme 2D, $Ar^{3n}$, $Ar^{4n}$, $Ar^{5n}$, n4, n5, n6, $L^N$ and $X^N$ represent the same meaning as described above. $Z^{7b}$, $Z^{8b}$ and $Z^{De}$ each independently represent a group selected from Group A of substituent. $Z^{Df}$ represents an alkali metal atom or a group represented by $-M^{10}Z^{1H}$. $MM^{10}$ and $Z^{1H}$ represent the same meaning as described above.

In Scheme 2D, first, a compound represented by the formula (2BM-2-1) is converted to a compound represented by the formula (2BM-2-2) carrying $Z^{7b}$ and $Z^{8b}$ by converting a hydrogen atom to a group selected from Group A of substituent by a halogenation reaction such as a bromination reaction. Next, the compound represented by the formula (2BM-2-2) is reacted with a compound represented by the formula (2BM-2-3) using a known coupling reaction, to synthesize a compound represented by the formula (2BM-2-4).

[Production Method of Other Compounds]

The compound represented by the formula (M-1), the formula (M-2), the formula (M-3A) or the formula (M-3B) can be synthesized by methods described, for example, in JP-A No. 2010-189630, International Publication WO2013/146806, JP-A No. 2010-215886, JP-A No. 2008-106241, JP-A No. 2002-539292, JP-A No. 2011-174062, International Publication WO2012/086671, International Publication WO2002/045184, JP-A No. 2004-143419, JP-A No. 2012-144722, JP-A No. 2010-031259 and the like.

<Composition>

The composition of the present invention comprises at least one material selected from the group consisting of a hole transporting material, a hole injection material, an electron transporting material, an electron injection material, a light emitting material, an antioxidant and a solvent and the polymer compound of the present invention.

The composition comprising the polymer compound of the present invention and a solvent (hereinafter, referred to as "ink" in some cases) is suitable for fabrication of a light emitting device using a printing method such as an inkjet printing method and a nozzle printing method.

The viscosity of the ink may be adjusted depending on the kind of the printing method, and when a solution goes through a discharge apparatus such as in an inkjet printing method, the viscosity is preferably in the range of 1 to 20 mPa·s at 25° C. for preventing curved aviation and clogging in discharging.

As the solvent contained in the ink, those capable of dissolving or uniformly dispersing solid components in the ink are preferable. The solvent includes, for example, chlorine-based solvents such as 1,2-dichloroethane, 1,1,2-trichloroethane, chlorobenzene and o-dichlorobenzene; ether solvents such as tetrahydrofuran, dioxane, anisole and 4-methylanisole; aromatic hydrocarbon solvents such as toluene, xylene, mesitylene, ethylbenzene, n-hexylbenzene and cyclohexylbenzene; aliphatic hydrocarbon solvents such as cyclohexane, methylcyclohexane, n-pentane, n-hexane, n-heptane, n-octane, n-nonane, n-decane, n-dodecane and bicyclohexyl; ketone solvents such as acetone, methylethylketone, cyclohexanone and acetophenone; ester solvents such as ethyl acetate, butyl acetate, ethylcellosolve acetate, methyl benzoate and phenyl acetate; poly-hydric alcohols such as ethylene glycol, glycerin and 1,2-hexanediol and derivatives thereof; alcohol solvents such as isopropanol and cyclohexanol; sulfoxide solvents such as dimethyl sulfoxide; and amide solvents such as N-methyl-2-pyrrolidone and N,N-dimethylformamide. These solvents may be used singly or two or more of them may be used in combination.

In the ink, the compounding amount of the solvent is usually 1000 to 100000 parts by weight, preferably 2000 to 20000 parts by weight with respect to 100 parts by weight of the polymer compound of the present invention.

<Hole Transporting Material>

The hole transporting material is classified into low molecular weight compounds and polymer compounds, and polymer compounds are preferable, polymer compounds having a crosslinkable group are more preferable.

The polymer compound includes, for example, polyvinylcarbazole and derivatives thereof; polyarylene having an aromatic amine structure in the side chain or main chain and derivatives thereof. The polymer compound may also be a compound in which an electron accepting portion is linked. The electron accepting portion includes, for example, fullerene, tetrafluorotetracyanoquinodimethane, tetracyanoethylene and trinitrofluorenone, preferably fullerene.

In the composition of the present invention, the compounding amount of the hole transporting material is usually 1 to 400 parts by weight, preferably 5 to 150 parts by weight with respect to 100 parts by weight of the polymer compound of the present invention.

The hole transporting material may be used singly or two or more hole transporting materials may be used in combination.

<Electron Transporting Material>

The electron transporting material is classified into low molecular weight compounds and polymer compounds. The electron transporting material optionally has a crosslinkable group.

The low molecular weight compound includes, for example, a metal complex having 8-hydroxyquinoline as a ligand, oxadiazole, anthraquinodimethane, benzoquinone, naphthoquinone, anthraquinone, tetracyanoanthraquinodimethane, fluorenone, diphenyldicyanoethylene, diphenoquinone and derivatives thereof.

The polymer compound includes, for example, polyphenylene, polyfluorene and derivatives thereof. These polymer compounds may be doped with a metal.

In the composition of the present invention, the compounding amount of the electron transporting material is usually 1 to 400 parts by weight, preferably 5 to 150 parts by weight with respect to 100 parts by weight of the polymer compound of the present invention.

The electron transporting material may be used singly or two or more electron transporting materials may be used in combination.

<Hole Injection Material and Electron Injection Material>

The hole injection material and the electron injection material are each classified into low molecular weight compounds and polymer compounds. The hole injection material and the electron injection material each optionally has a crosslinkable group.

The low molecular weight compound includes, for example, metal phthalocyanines such as copper phthalocyanine; carbon; oxides of metals such as molybdenum and tungsten; metal fluorides such as lithium fluoride, sodium fluoride, cesium fluoride and potassium fluoride.

The polymer compound includes, for example, polyaniline, polythiophene, polypyrrole, polyphenylenevinylene, polythienylenevinylene, polyquinoline and polyquinoxaline, and derivatives thereof; electrically conductive polymers such as a polymer comprising an aromatic amine structure in the main chain or side chain.

In the composition of the present invention, the compounding amounts of the hole injection material and the electron injection material are each usually 1 to 400 parts by weight, preferably 5 to 150 parts by weight with respect to 100 parts by weight of the polymer compound of the present invention.

The hole injection material and the electron injection material may each be used singly or two or more of them may be used in combination.

<Ion Dope>

When the hole injection material or the electron injection material comprises an electrically conductive polymer, the electric conductivity of the electrically conductive polymer is preferably $1\times10^{-5}$ S/cm to $1\times10^{3}$ S/cm. For adjusting the electric conductivity of the electrically conductive polymer within such a range, the electrically conductive polymer can be doped with a suitable amount of ions.

The kind of the ion to be doped is an anion for a hole injection material and a cation for an electron injection material. The anion includes, for example, a polystyrenesulfonate ion, an alkylbenzenesulfonate ion and a camphorsulfonate ion. The cation includes, for example, a lithium ion, a sodium ion, a potassium ion and a tetrabutylammonium ion.

The ion to be doped may be used singly or two or more ions to be doped may be used.

<Light Emitting Material>

The light emitting material is classified into low molecular weight compounds and polymer compounds. The light emitting material optionally has a crosslinkable group.

The low molecular weight compound includes, for example, naphthalene and derivatives thereof, anthracene and derivatives thereof, perylene and derivatives thereof, and, triplet light emitting complexes having iridium, platinum or europium as the central metal.

The polymer compound includes, for example, polymer compounds comprising a phenylene group, a naphthalenediyl group, a fluorenediyl group, a phenanthrenediyl group, dihydrophenanthrenediyl group, a group represented by the formula (X), a carbazolediyl group, a phenoxazinediyl group, a phenothiazinediyl group, an anthracenediyl group, a pyrenediyl group and the like.

The light emitting material may comprise a low molecular weight compound and a polymer compound, and preferably, comprises a triplet light emitting complex and a polymer compound.

As the triplet light emitting complex, iridium complexes such as metal complexes represented by the formulae Ir-1 to Ir-5 are preferable.

(Chemical Formula 145)

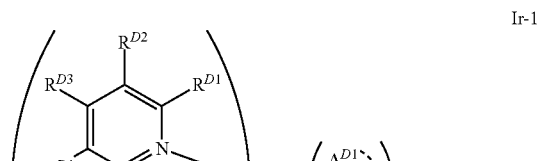

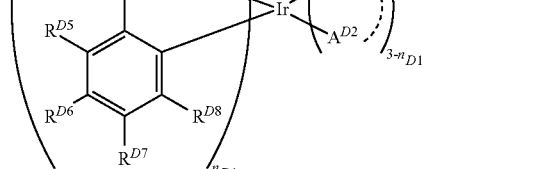

(Chemical Formula 146)

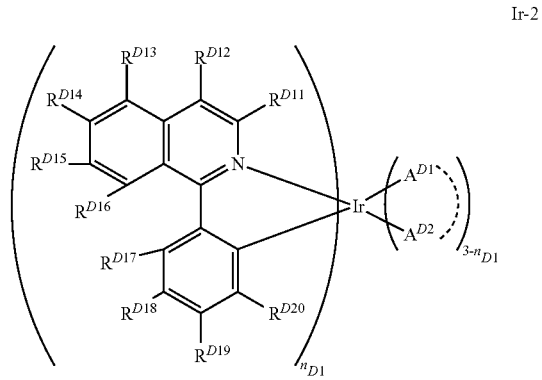

(Chemical Formula 147)

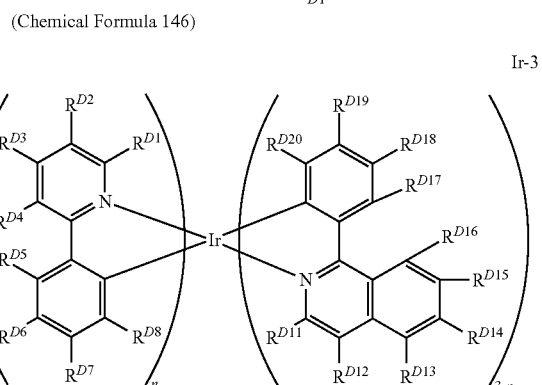

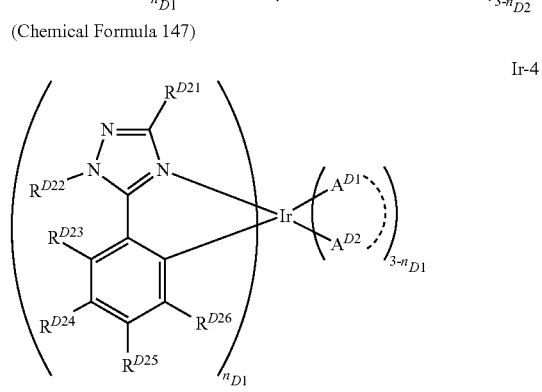

-continued

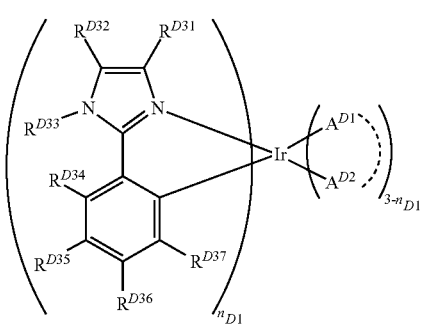

Ir-5

[wherein, $R^{D1}$ to $R^{D3}$, $R^{D11}$ to $R^{D20}$, $R^{D21}$ to $R^{D26}$ and $R^{D31}$ to $R^{D37}$ each independently represent a hydrogen atom, an alkyl group, a cycloalkyl group, an alkoxy group, a cycloalkoxy group, an aryl group, an aryloxy group, a monovalent heterocyclic group or a halogen atom, and these groups each optionally have a substituent. When a plurality of $R^{D1}$ to $R^{D8}$, $R^{D11}$ to $R^{D20}$, $R^{D21}$ to $R^{D26}$ and $R^{D31}$ to $R^{D37}$ are present, they may be the same or different at each occurrence.

-$A^{D1}$---$A^{D2}$- represents an anionic bidentate ligand, and $A^{D1}$ and $A^{D2}$ each independently represent a carbon atom, an oxygen atom or a nitrogen atom linking to an iridium atom, and these atoms each may be an atom consisting a ring. When a plurality of -$A^{D1}$---$A^{D2}$- are present, they may be the same or different.

$n_{D1}$ represents 1, 2 or 3, and $n_{D2}$ represents 1 or 2.]

In the metal complex represented by the formula Ir-1, at least one of $R^{D1}$ to $R^{D8}$ is preferably a group represented by the formula (D-A).

In the metal complex represented by the formula Ir-2, at least one of $R^{D11}$ to $R^{D20}$ is preferably a group represented by the formula (D-A).

In the metal complex represented by the formula Ir-3, at least one of $R^{D1}$ to $R^{D8}$ and $R^{D11}$ to $R^{D20}$ is preferably a group represented by the formula (D-A).

In the metal complex represented by the formula Ir-4, at least one of $R^{D21}$ to $R^{D26}$ is preferably a group represented by the formula (D-A).

In the metal complex represented by the formula Ir-5, at least one of $R^{D31}$ to $R^{D37}$ is preferably a group represented by the formula (D-A).

(Chemical Formula 148)

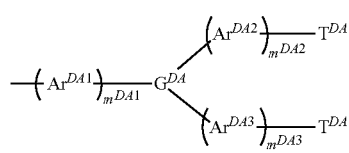

(D-A)

[wherein, $m^{DA1}$, $m^{DA2}$ and $m^{DA3}$ each independently represent an integer of 0 or more.

$G^{DA}$ represents a nitrogen atom, an aromatic hydrocarbon group or a heterocyclic group, and these groups each optionally have a substituent.

$Ar^{DA1}$, $Ar^{DA2}$ and $Ar^{DA3}$ each independently represent an arylene group or a divalent heterocyclic group, and these groups each optionally have a substituent. When a plurality of $Ar^{DA1}$, $Ar^{DA2}$ and $Ar^{DA3}$ are present, they may be the same or different at each occurrence.

$T^{DA}$ represents an aryl group or a monovalent heterocyclic group, and these groups each optionally have a substituent. The plurality of $T^{DA}$ may be the same or different.]

$m^{DA1}$, $m^{DA2}$ and $m^{DA3}$ are usually an integer of 10 or less, preferably an integer of 5 or less, more preferably 0 or 1. It is preferable that $m^{DA1}$, $m^{DA2}$ and $m^{DA3}$ are the same integer.

$G^{DA}$ is preferably a group represented by the formula (GDA-11) to (GDA-15), and these groups each optionally have a substituent.

(Chemical Formula 149)

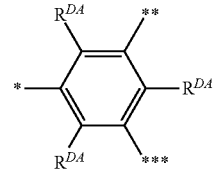

(GDA-11)

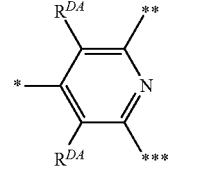

(GDA-12)

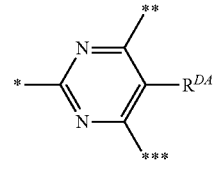

(GDA-13)

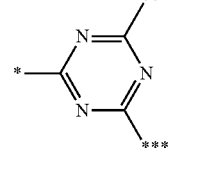

(GDA-14)

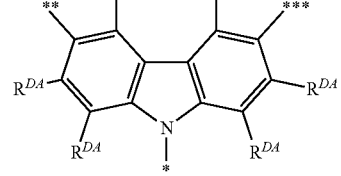

(GDA-15)

[wherein,

*,  and * each represent a linkage to $Ar^{DA1}$, $Ar^{DA2}$ and $Ar^{DA3}$.

$R^{DA}$ represents a hydrogen atom, an alkyl group, a cycloalkyl group, an alkoxy group, a cycloalkoxy group, an aryl group or a monovalent heterocyclic group, and these groups each optionally further have a substituent. When a plurality of $R^{DA}$ are present, they may be the same or different.]

$R^{DA}$ is preferably a hydrogen atom, an alkyl group, a cycloalkyl group, an alkoxy group or a cycloalkoxy group, more preferably a hydrogen atom, an alkyl group or cycloalkyl group, and these groups each optionally have a substituent.

$Ar^{DA1}$, $Ar^{DA2}$ and $Ar^{DA3}$ are each preferably groups represented by the formulae (ArDA-1) to (ArDA-3).

(Chemical Formula 150)

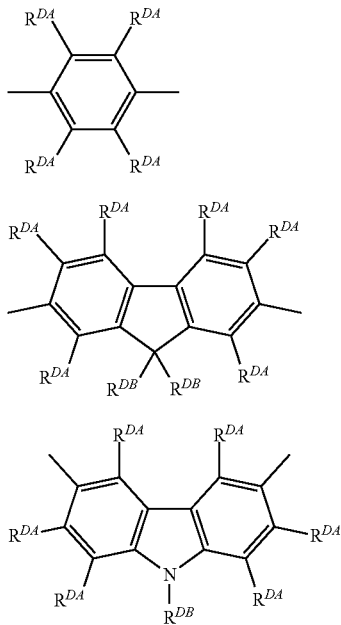

(ArDA-1)

(ArDA-2)

(ArDA-3)

[wherein, $R^{DA}$ represents the same meaning as described above.

$R^{DB}$ represents a hydrogen atom, an alkyl group, a cycloalkyl group, an aryl group or a monovalent heterocyclic group, and these groups each optionally have a substituent. When a plurality of $R^{DB}$ are present, they may be the same or different.]

$T^{DA}$ is preferably groups represented by the formulae (TDA-1) to (TDA-3).

(Chemical Formula 151)

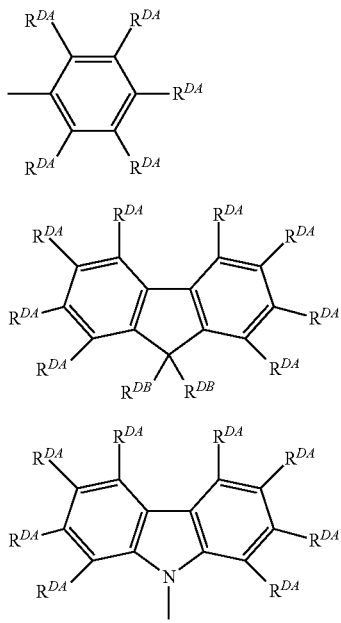

(TDA-1)

(TDA-2)

(TDA-3)

[wherein, $R^{DA}$ and $R^{DB}$ represent the same meaning described above.]

The group represented by the formula (D-A) is preferably a group represented by the formula (D-A1) to (D-A3).

(Chemical Formula 152)

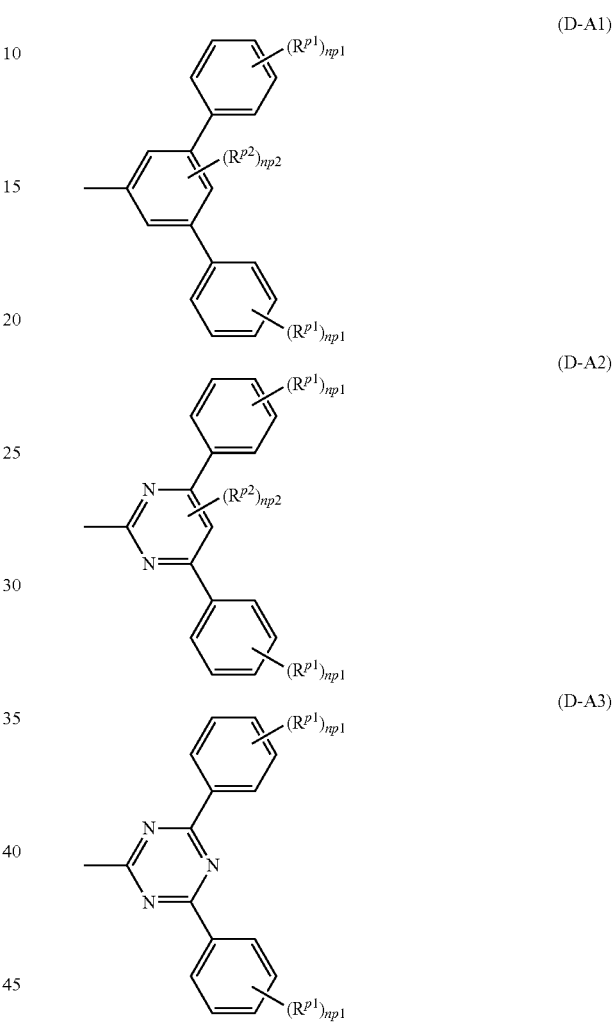

(D-A1)

(D-A2)

(D-A3)

[wherein, $R^{P1}$, $R^{P2}$ and $R^{P3}$ each independently represent an alkyl group, a cycloalkyl group, an alkoxy group, a cycloalkoxy group or a halogen atom. When a plurality of $R^{P1}$ and $R^{P2}$ are present, they may be the same or different at each occurrence.

np1 represents an integer of 0 to 5, np2 represents an integer of 0 to 3, and np3 represents 0 or 1. The plurality of np1 may be the same or different.]

np1 is preferably an integer of 0 to 3, more preferably an integer of 1 to 3, further preferably 1. np2 is preferably 0 or 1, more preferably 0. np3 is preferably 0.

$R^{P1}$, $R^{P2}$ and $R^{P3}$ are each preferably an alkyl group or a cycloalkyl group.

The anionic bidentate ligand represented by $-A^{D1}$---$A^{D2}$- includes, for example, ligands represented by the following formulae.

(Chemical Formula 153)

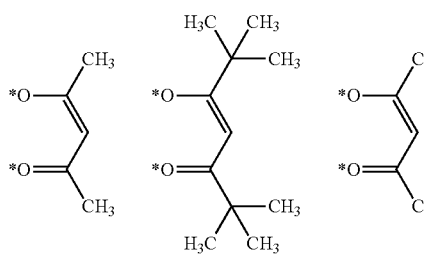
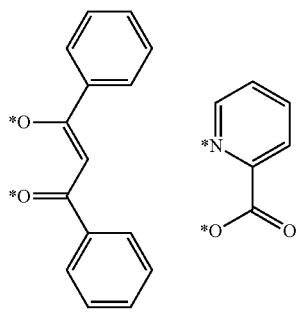

[wherein, * represents a position linking to Ir.]

The metal complex represented by the formula Ir-1 is preferably a metal complex represented by the formula Ir-11 to Ir-13. The metal complex represented by the formula Ir-2 is preferably a metal complex represented by the formula Ir-21. The metal complex represented by the formula Ir-3 is preferably a metal complex represented by the formula Ir-31 to Ir-33. The metal complex represented by the formula Ir-4 is preferably a metal complex represented by the formula Ir-41 to Ir-43. The metal complex represented by the formula Ir-5 is preferably a metal complex represented by the formula Ir-51 to Ir-53.

(Chemical Formula 154)

Ir-11

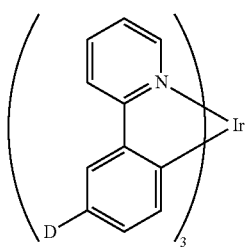

Ir-12

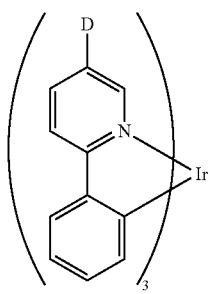

Ir-13

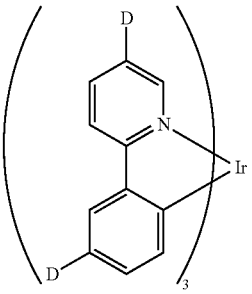

Ir-21

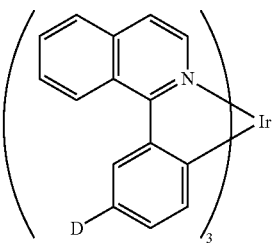

(Chemical Formula 155)

Ir-31

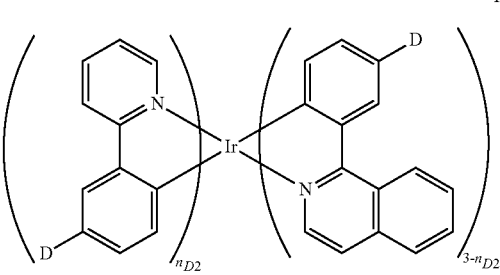

Ir-32

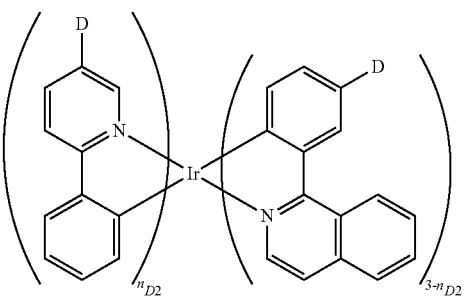

(Chemical Formula 156)

Ir-33

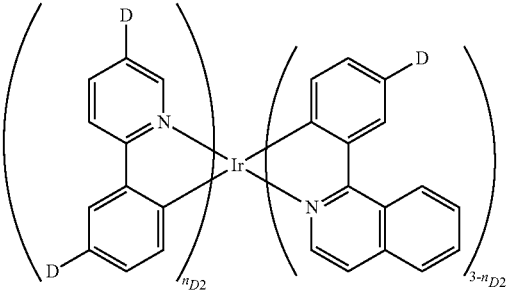

(Chemical Formula 157)

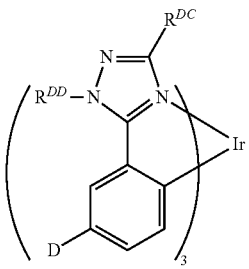
Ir-41

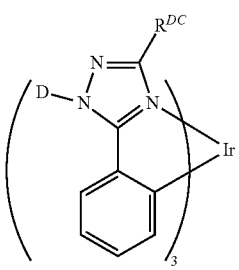
Ir-42

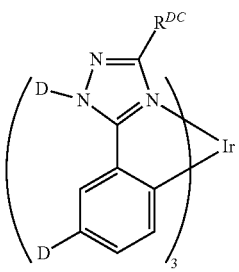
Ir-43

(Chemical Formula 158)

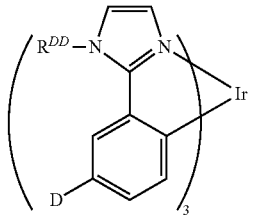
Ir-51

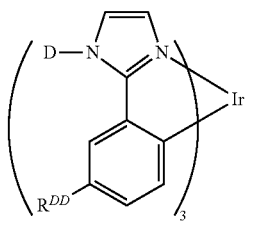
Ir-52

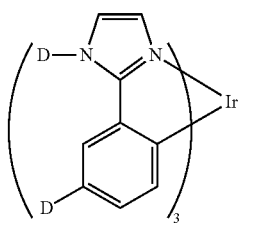
Ir-53

[wherein, $n_{D2}$ represents 1 or 2.

D represents a group represented by the formula (D-A). The plurality of D are the same or different.

$R^{DC}$ represents a hydrogen atom, an alkyl group, a cycloalkyl group, an aryl group or a monovalent heterocyclic group, and these groups each optionally have a substituent. The plurality of $R^{DC}$ are the same or different.

$R^{DD}$ represents an alkyl group, a cycloalkyl group, an aryl group or a monovalent heterocyclic group, and these groups each optionally have a substituent. The plurality of $R^{DD}$ are the same or different.]

The triplet light emitting complex includes, for example, metal complexes listed below.

(Chemical Formula 159)

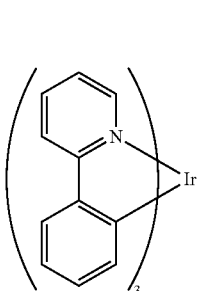
Ir(ppy)₃

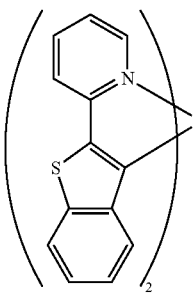
Btp₂Ir(acac)

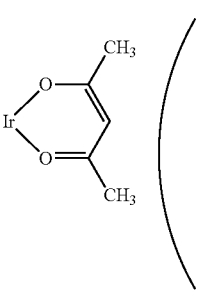
FIrpic

-continued
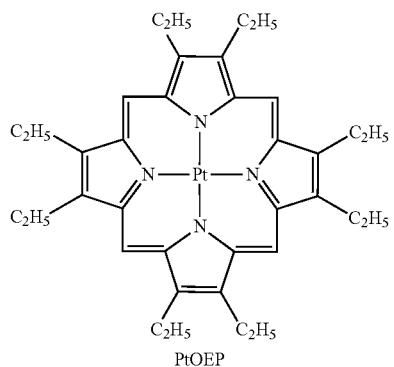
PtOEP
(Chemical Formula 160)
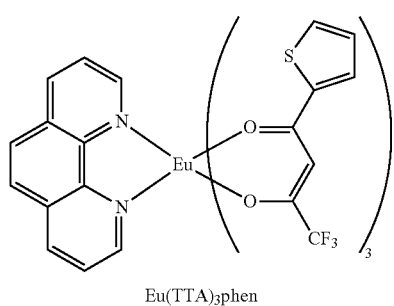
Eu(TTA)₃phen
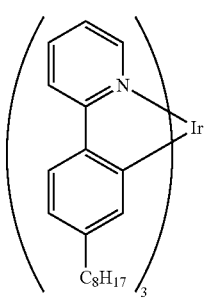
COM-1
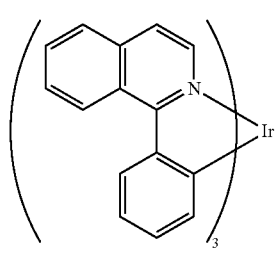
COM-2
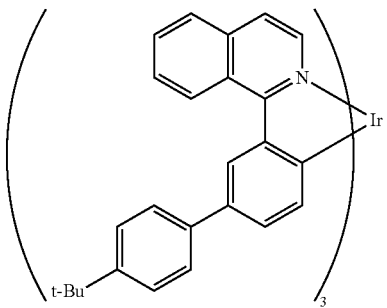
COM-3
(Chemical Formula 161)
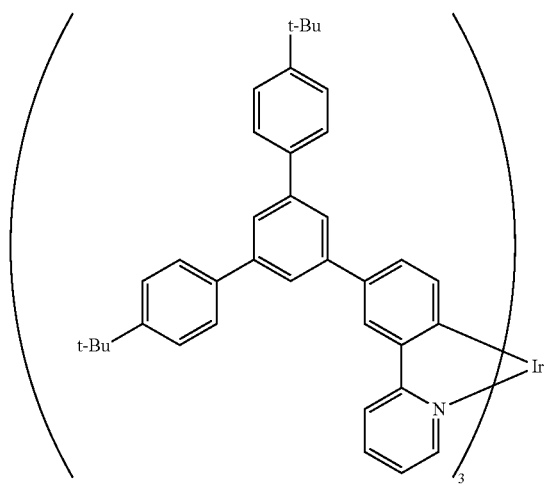
COM-4
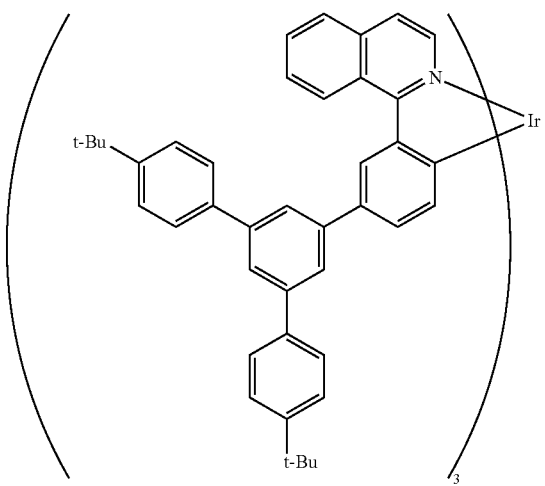
COM-5

-continued
COM-6
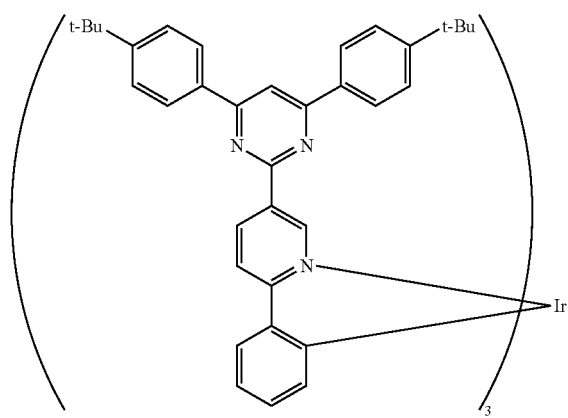
(Chemical Formula 162)
COM-7
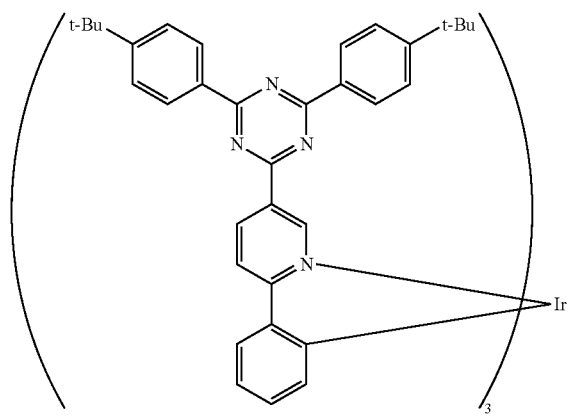
COM-8
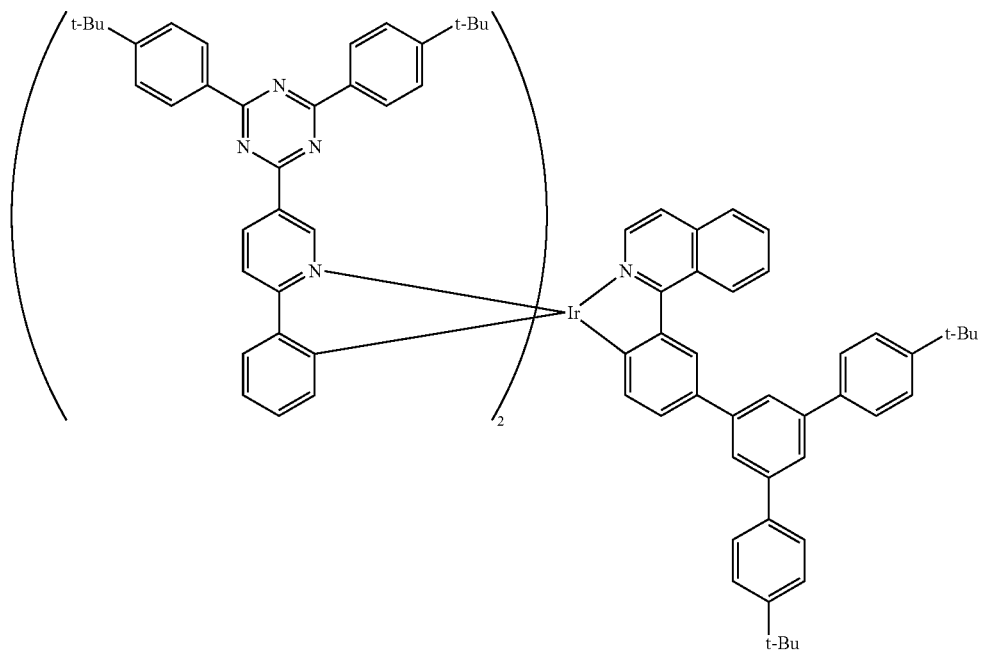

(Chemical Formula 163)
COM-9
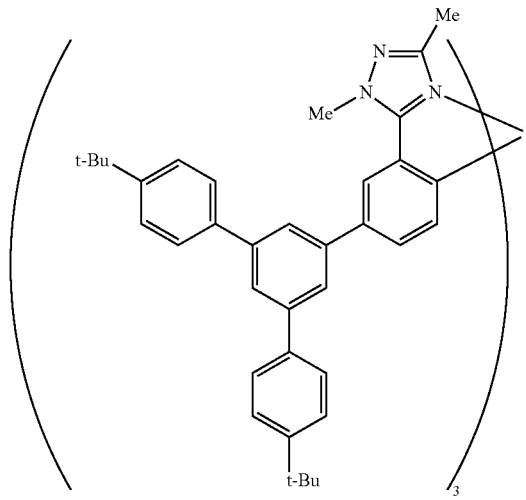
COM-10
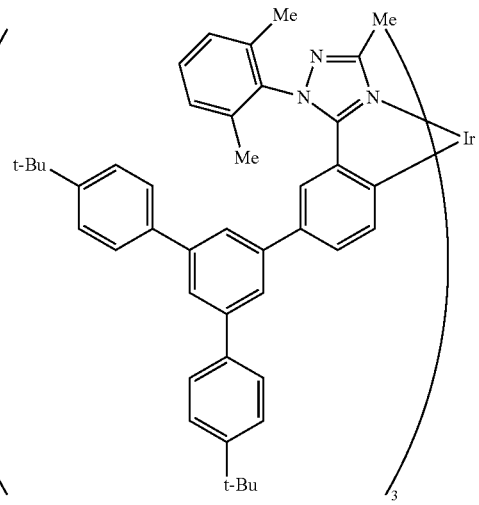
COM-11
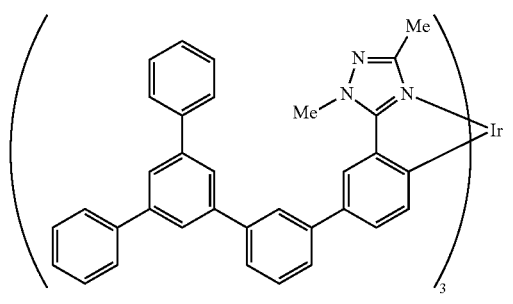
COM-12
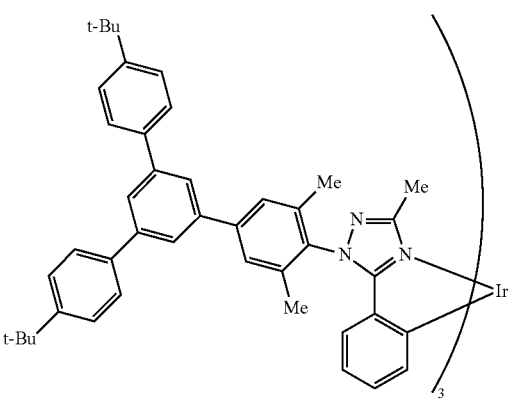
COM-13
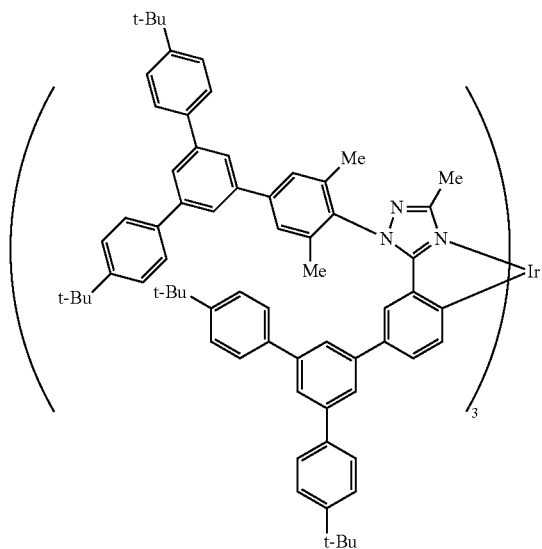

(Chemical Formula 164)
COM-14
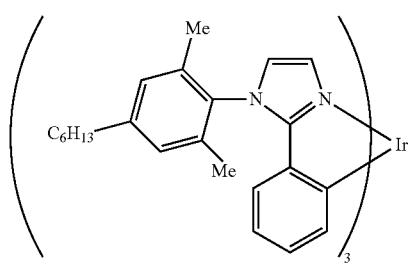
COM-15
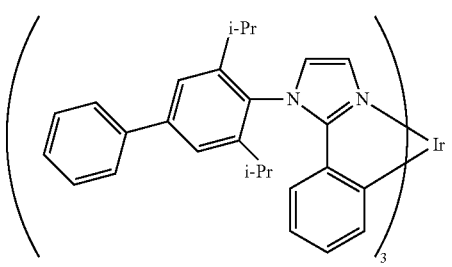
COM-16
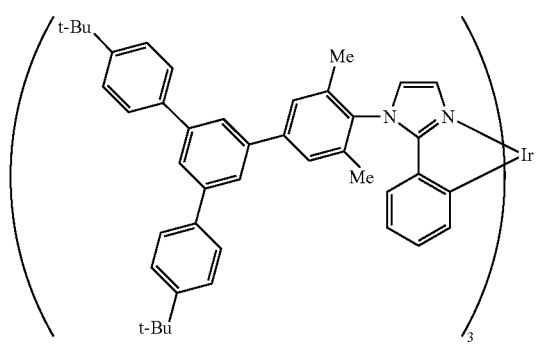
COM-17
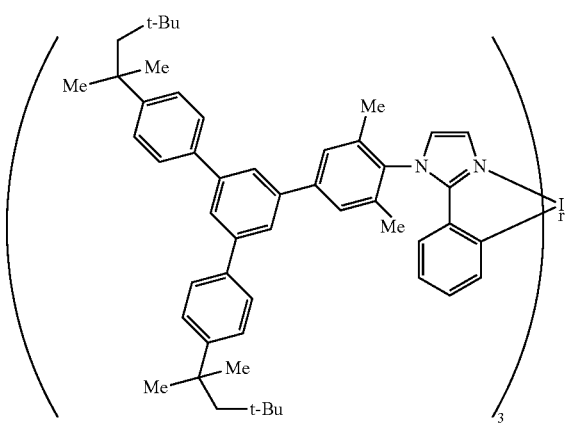
COM-18
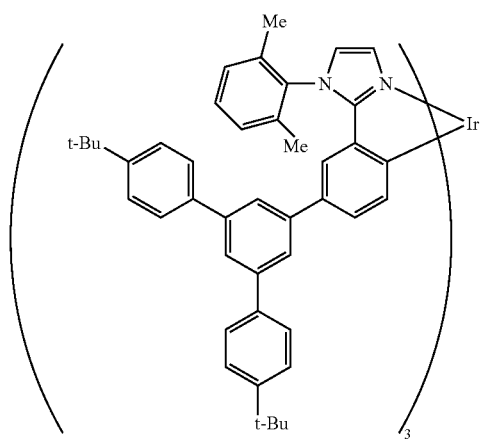
COM-19
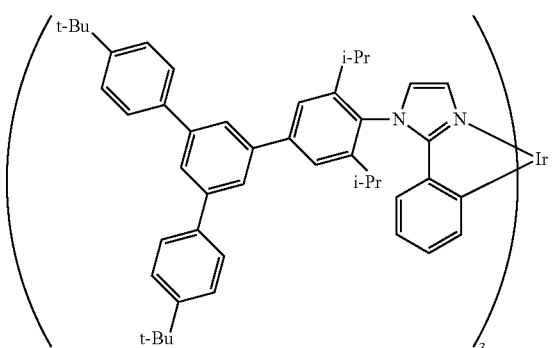

-continued

COM-20

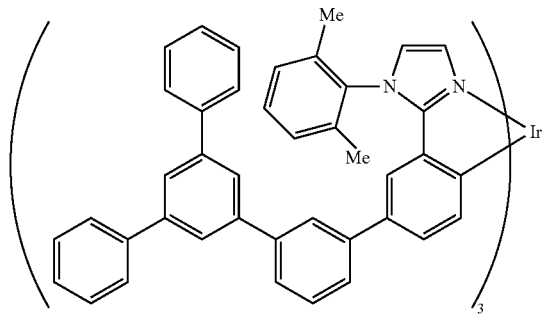

COM-21

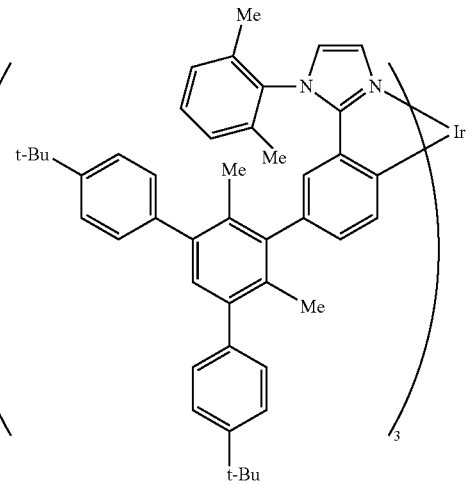

In the composition of the present invention, the compounding amount of the light emitting material is usually 0.1 to 400 parts by weight with respect to 100 parts by weight of the polymer compound of the present invention.

<Antioxidant>

The antioxidant may advantageously be one which is soluble in the same solvent as for the polymer compound of the present invention and does not disturb light emission and charge transportation, and the examples thereof include phenol antioxidants and phosphorus-based antioxidants.

In the composition of the present invention, the compounding amount of the antioxidant is usually 0.001 to 10 parts by weight with respect to 100 parts by weight of the polymer compound of the present invention.

The antioxidant may be used singly or two or more antioxidants may be used in combination.

<Film>

The film may comprise the polymer compound of the present invention as it is, alternatively the polymer compound of the present invention may be contained in intramolecularly crosslinked condition, intermolecularly crosslinked condition or in intramolecularly and intermolecularly crosslinked condition (crosslinked body). The crosslinked body of the polymer compound of the present invention may be a crosslinked body obtained by intermolecularly crosslinking the polymer compound of the present invention and another compound. The film comprising the crosslinked body of the polymer compound of the present invention is a film obtained by crosslinking a film comprising the polymer compound of the present invention by an external stimulus such as heating and light irradiation. The film comprising the crosslinked body of the polymer compound of the present invention is substantially insolubilized in a solvent, thus, the film can be suitably used for lamination of a light emitting device described later.

The heating temperature for crosslinking the film is usually 25 to 300° C., and because the light emission efficiency is improved, preferably 50 to 250° C., more preferably 150 to 200° C.

The kind of light used in light irradiation for crosslinking the film includes, for example, ultraviolet light, near-ultraviolet light and visible light.

The film is suitable as a hole transporting layer or a hole injection layer in a light emissing device.

The film can be fabricated, for example, by a spin coating method, a casting method, a micro gravure coating method, a gravure coating method, a bar coating method, a roll coating method, a wire bar coating method, a dip coating method, a spray coating method, a screen printing method, a flexo printing method, an offset printing method, an inkjet printing method, a capillary coating method or a nozzle coating method, using the ink.

The thickness of the film is usually 1 nm to 10 µm.

<Light Emitting Device>

The light emitting device of the present invention is a light emitting device comprising a crosslinked body of the polymer compound of the present invention.

The constitution of the light emitting device of the present invention comprises, for example, electrodes consisting of an anode and a cathode, and a layer comprising a crosslinked body of the polymer compound of the present invention disposed between the electrodes.

<Layer Constitution>

The layer produced by using the polymer compound of the present invention is usually at least one selected from a light emitting layer, a hole transporting layer, a hole injection layer, an electron transporting layer and an electron injection layer, preferably a hole transporting layer. These layers comprise a light emitting material, a hole transporting material, a hole injection material, an electron transporting material and an electron injection material, respectively. These layers can be formed by the same method as the above-described film fabrication using inks prepared by dissolving a light emitting material, a hole transporting material, a hole injection material, an electron transporting material and an electron injection material, respectively, in the solvent described above.

The light emitting device comprises a light emitting layer between an anode and a cathode. The light emitting device of the present invention preferably comprises at least one of a hole injection layer and a hole transporting layer between an anode and a light emitting layer from the standpoint of hole injectability and hole transportability, and preferably comprises at least one of an electron injection layer and an electron transporting layer between a cathode and a light emitting layer from the standpoint of electron injectability and electron transportability.

The material of a hole transporting layer, an electron transporting layer, a light emitting layer, a hole injection layer and an electron injection layer includes the above-described hole transporting materials, electron transporting materials, light emitting materials, hole injection materials and electron injection materials, respectively, in addition to the polymer compound of the present invention.

When the material of a hole transporting layer, the material of an electron transporting layer and the material of a light emitting layer are soluble in a solvent which is used in forming a layer adjacent to the hole transporting layer, the electron transporting layer and the light emitting layer, respectively, in fabrication of a light emitting device, it is preferable that the materials have a crosslinkable group to avoid dissolution of the materials in the solvent. After forming the layers using the materials having a crosslinkable group, the layers can be insolubilized by crosslinking the crosslinkable group.

Methods of forming respective layers such as a light emitting layer, a hole transporting layer, an electron transporting layer, a hole injection layer and an electron injection layer in the light emitting device of the present invention include, for example, a method of vacuum vapor deposition from a powder and a method of film formation from solution or melted state when a low molecular weight compound is used, and, for example, a method of film formation from solution or melted state when a polymer compound is used.

The order and the number of layers to be laminated and the thickness of each layer may be controlled in view of light emission efficiency and device life.

[Substrate/Electrode]

The substrate in the light emitting device may advantageously be a substrate on which an electrode can be formed and which does not chemically change in forming an organic layer, and is a substrate made of a material such as, for example, glass, plastic and silicon. In the case of an opaque substrate, it is preferable that an electrode most remote from the substrate is transparent or semi-transparent.

The material of the anode includes, for example, electrically conductive metal oxides and semi-transparent metals, preferably, indium oxide, zinc oxide and tin oxide; electrically conductive compounds such as indium.tin.oxide (ITO) and indium.zinc.oxide; a composite of silver, palladium and copper (APC); NESA, gold, platinum, silver and copper.

The material of the cathode includes, for example, metals such as lithium, sodium, potassium, rubidium, cesium, beryllium, magnesium, calcium, strontium, barium, aluminum, zinc and indium; alloys composed of two or more of them; alloys composed of one or more of them and at least one of silver, copper, manganese, titanium, cobalt, nickel, tungsten and tin; and graphite and graphite intercalation compounds. The alloy includes, for example, a magnesium-silver alloy, a magnesium-indium alloy, a magnesium-aluminum alloy, an indium-silver alloy, a lithium-aluminum alloy, a lithium-magnesium alloy, a lithium-indium alloy and a calcium-aluminum alloy.

The anode and the cathode may each take a lamination structure composed of two or more layers.

<Use>

For producing planar light emission by using a light emitting device, a planar anode and a planar cathode are disposed so as to overlap with each other. Patterned light emission can be produced by a method of placing a mask with a patterned window on the surface of a planer light emitting device, a method of forming extremely thick a layer intended to be a non-light emitting, thereby having the layer essentially no-light emitting or a method of forming an anode, a cathode or both electrodes in a patterned shape. By forming a pattern with any of these methods and disposing certain electrodes so as to switch ON/OFF independently, a segment type display capable of displaying numbers and letters and the like is provided. For producing a dot matrix display, both an anode and a cathode are formed in a stripe shape and disposed so as to cross with each other. Partial color display and multi-color display are made possible by a method of printing separately certain polymer compounds showing different emission or a method of using a color filter or a fluorescence conversion filter. The dot matrix display can be passively driven, or actively driven combined with TFT and the like. These displays can be used in computers, television sets, portable terminals and the like. The planar light emitting device can be suitably used as a planer light source for backlight of a liquid crystal display or as a planar light source for illumination. If a flexible substrate is used, it can be used also as a curved light source and a curved display.

EXAMPLES

The present invention will be illustrated further in detail by examples below, but the present invention is not limited to these examples.

In the present examples, the polystyrene-equivalent number average molecular weight (Mn) and the polystyrene-equivalent weight average molecular weight (Mw) of a polymer compound were measured by size exclusion chromatography (SEC) using tetrahydrofuran in the mobile phase thereof. SEC measurement conditions are as described below.

The polymer compound to be measured was dissolved in tetrahydrofuna at a concentration of about 0.05 wt %, and 10 µL of the solution was injected into SEC. The mobile phase was flowed at a flow rate of 2.0 mL/min. As the column, PLgel MIXED-B (manufactured by Polymer Laboratories) was used. As the detector, UV-VIS detector (manufactured by Shimadzu Corp., trade name: SPD-10Avp) was used.

Measurement of LC-MS was carried out according to the following method.

A measurement sample was dissolved in chloroform or tetrahydrofuran so as to give a concentration of about 2 mg/mL, and about 1 µL of the solution was injected into LC-MS (manufactured by Agilent, trade name: 1100LCMSD). As the mobile phase of LC-MS, acetonitrile and THF were used while changing the ratio thereof and allowed to flow at a flow rate of 0.2 mL/min. As the column, L-column 2 ODS (3 µm) (manufactured by Chemical Evaluation and Research Institute, internal diameter: 2.1 mm, length: 100 mm, particle size: 3 µm) was used.

Measurement of NMR was carried out according to the following method.

5 to 10 mg of a measurement sample was dissolved in about 0.5 mL of deuterated chloroform ($CDCl_3$), deuterated tetrahydrofuran, deuterated acetone, deuterated N,N-dimethylformamide, deuterated toluene, deuterated methanol, deuterated ethanol, deuterated 2-propanol or deuterated methylene chloride, and measurement was performed using an NMR apparatus (manufactured by Agilent, trade name: INOVA 300 or MERCURY 400VX, or manufactured by JEOL, trade name: ECZ400S).

As the index of the purity of a compound, a value of the high performance liquid chromatography (HPLC) area percentage was used. This value is a value in high performance liquid chromatography (HPLC, manufactured by Shimadzu Corp., trade name: LC-20A) at 254 nm, unless otherwise state. In this operation, the compound to be measured was dissolved in tetrahydrofuran or chloroform so as to give a concentration of 0.01 to 0.2 wt %, and depending on the concentration, 1 to 10 μL of the solution was injected into HPLC. As the mobile phase of HPLC, acetonitrile and tetrahydrofuran were used within acetonitrile/tetrahydrofuran=100/0 to 0/100 (volume ratio) and allowed to flow at a flow rate of 1 mL/min. As the column, Kaseisorb LC ODS 2000 (manufactured by Tokyo Chemical Industry Co., Ltd.) or an ODS column having an equivalent performance was used. As the detector, a photo diode array detector (manufactured by Shimadzu Corp., trade name: SPD-M20A) was used.

<Synthesis Example 1> Synthesis of Compound MM1-st2

(Chemical Formula 165)

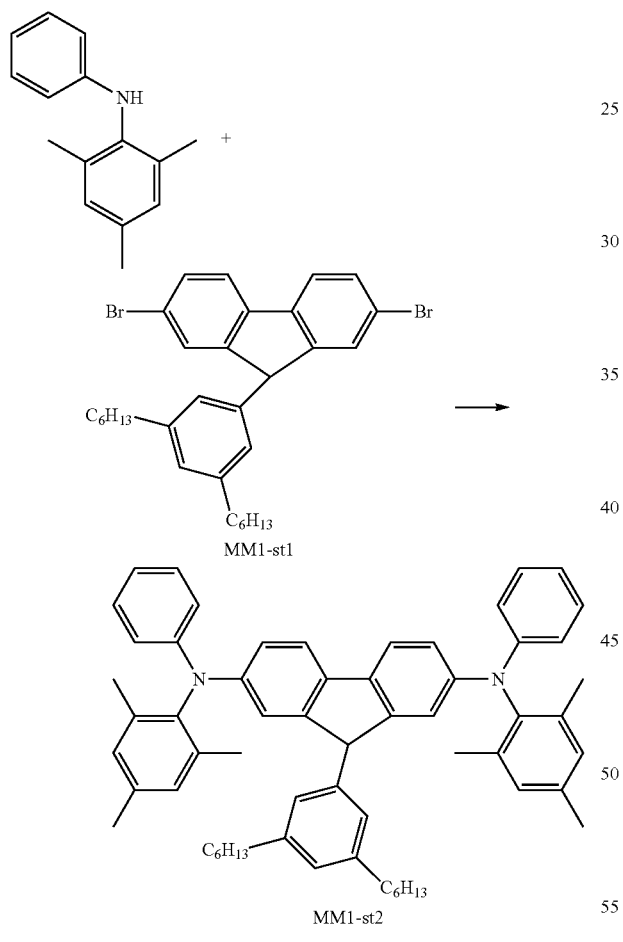

MM1-st1

MM1-st2

A nitrogen gas atmosphere was prepared in a reaction vessel, then, 2,4,6-trimethyl-N-phenylbenzeneamine (67.6 g), sodium tert-butoxide (49.2 g), tert-butanol (51 mL), toluene (1.16 L), tris(dibenzylideneacetone)dipalladium (0) (7.13 g) and di-tert-butylphenylphosphine (5.69 g) were added. The resultant mixture was heated up to 80° C., then, toluene (364 mL) and the compound MM1-st1 (72.8 g) synthesized by the method described in JP-A No. 2013-209630 were dropped into this, and the mixture was stirred at 80° C. for 3 hours. The resultant reaction liquid was cooled down to room temperature, then, water and toluene were added, and the mixture was filtrated, the aqueous layer of the resultant filtrate was separated, and the organic layer was washed with water. To the resultant organic layer was added magnesium sulfate, then, the layer was separated and concentrated. The resultant residue was dissolved in a mixed liquid of toluene and hexane, and activated carbon (53.1 g) was added and the mixture was stirred. The resultant mixture was filtrated through a filter pre-coated with Celite and silica gel, and the resultant filtrate was concentrated to obtain a crude product. The resultant crude product was purified using a silica gel column modified with an octadecylsilyl group (developing solvent: a mixed solvent of ethyl acetate and acetonitrile). The resultant residue was washed while crushing in isopropyl alcohol, to obtain a solid. The resultant solid was further washed with methanol, to obtain 51.0 g of a compound MM1-st2.

$^1$H-NMR (CDCl$_3$, 300 MHz) δ (ppm): 0.88 (6H, m), 1.20-1.62 (16H, m), 1.95 (12H, s), 2.31 (6H, s), 2.43 (4H, t), 4.85 (1H, brs), 6.64-7.60 (23H, m).

<Synthesis Example 2> Synthesis of Compound MM1-st3

(Chemical Formula 166)

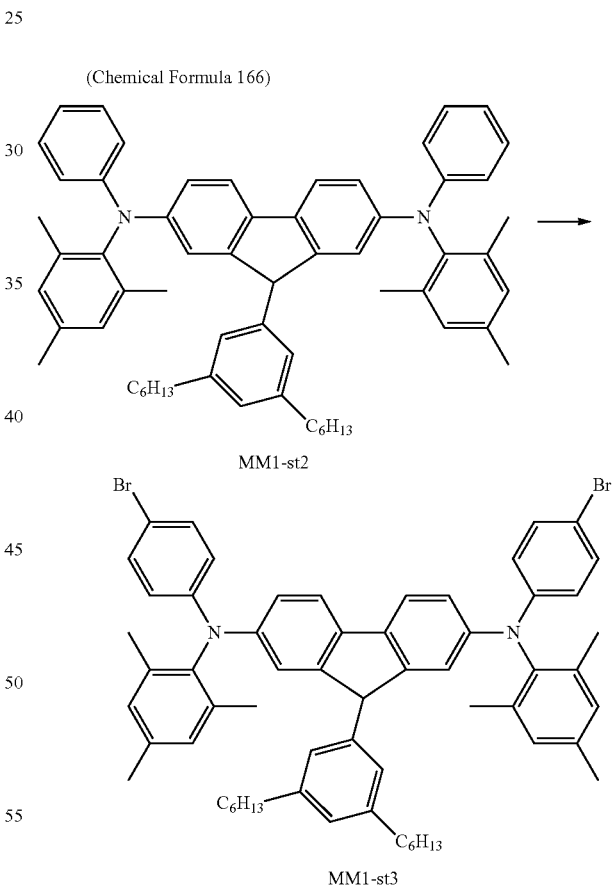

MM1-st2

MM1-st3

A nitrogen gas atmosphere was prepared in a reaction vessel, then, the whole reaction vessel was light-shielded, and the compound MM1-st2 (51.0 g) and N,N-dimethylformamide (765 mL) were added. The resultant mixture was cooled down to −20° C., then, N-bromosuccinimide (22.4 g) was added to this, and the mixture was stirred at room temperature for 8 hours. To the resultant reaction liquid was added water, then, a 10 wt % sodium sulfite aqueous solution was added until the color of bromine disappeared, then, the mixture was stirred at room temperature. The deposited solid was washed with water and methanol in this order. The resultant residue was dissolved in hexane, then, activated carbon (30.4 g) was added and the mixture was stirred. The resultant mixture was filtrated through a filter pre-coated with Celite, and the resultant filtrate was concentrated to obtain a crude product. The resultant crude product was purified using a silica gel column modified with an octadecylsilyl group (developing solvent: a mixed solvent of ethyl acetate and acetonitrile), to obtain 34.9 g of a compound MM1-st3.

LC-MS (APCI, positive): [M+H]$^+$ 985

<Synthesis Example 3> Synthesis of Compound Ma3

(Chemical Formula 167)

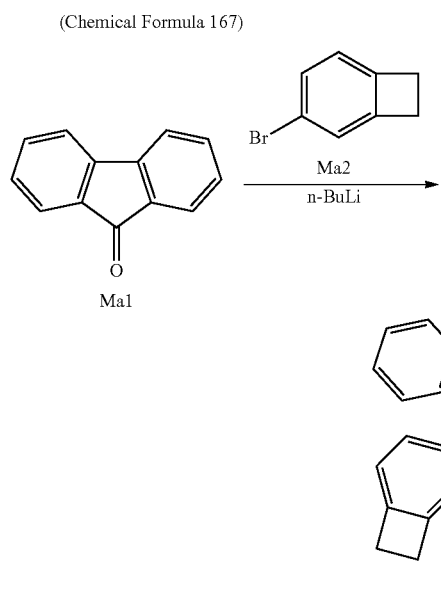

The gas in a flask equipped with a stirrer was purged with a nitrogen gas, then, a compound Ma2 (64.6 g) and tetrahydrofuran (615 mL) were added, and the mixture was cooled down to −70° C. A n-butyllithium hexane solution (1.6 M, 218 mL) was dropped into this over a period of 1 hour, then, the mixture was stirred at −70° C. for 2 hours. To this was added a compound Ma1 (42.1 g) in several portions, then, the mixture was stirred at −70° C. for 2 hours. Methanol (40 mL) was dropped into this over a period of 1 hour, then, the temperature was raised up to room temperature. The resultant mixture was concentrated under reduced pressure to distill off the solvent, then, toluene and water were added. The aqueous layer of the resultant mixture was separated, and the organic layer was washed with water. The resultant organic layer was concentrated under reduced pressure, then, the resultant residue was purified using a silica gel column (developing solvent: a mixed solvent of hexane and ethyl acetate), to obtain 71 g of a compound Ma3 as colorless oil. This operation was conducted repeatedly, to obtain a necessary amount of the compound Ma3.

$^1$H-NMR (CDCl$_3$, 300 MHz) δ (ppm): 2.43 (1H, s), 3.07-3.13 (4H, m), 6.95 (1H, d), 7.07 (1H, s), 7.18-7.28 (3H, m), 7.28-7.40 (4H, m), 7.66 (2H, s).

<Synthesis Example 4> Synthesis of Compound Ma4

(Chemical Formula 168)

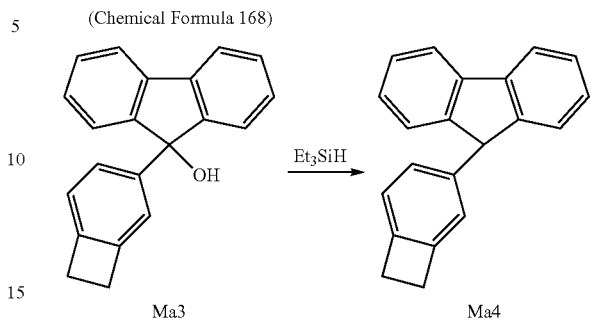

The gas in a flask equipped with a stirrer was purged with a nitrogen gas, then, the compound Ma3 (72.3 g), toluene (723 mL) and triethylsilane (118.0 g) were added, and the mixture was heated up to 70° C. Methanesulfonic acid (97.7 g) was dropped into this over a period of 1.5 hours, then, the mixture was stirred at 70° C. for 0.5 hours. The resultant mixture was cooled down to room temperature, then, toluene and water were added. The aqueous layer of the resultant mixture was separated, and the organic layer was washed with water, 5 wt % sodium hydrogen carbonate water and water in this order. The resultant organic layer was concentrated under reduced pressure, then, the resultant crude product was crystallized from a mixed solution of toluene and ethanol, to obtain 51.8 g of a compound Ma4 as a white solid. This operation was conducted repeatedly, to obtain a necessary amount of the compound Ma4.

$^1$H-NMR (CDCl$_3$, 300 MHz) δ (ppm): 3.03-3.14 (4H, m), 4.99 (1H, s), 6.68 (1H, s), 6.92-7.01 (2H, m), 7.20-7.28 (2H, m), 7.29-7.38 (4H, m), 7.78 (2H, d).

<Synthesis Example 5> Synthesis of Compound Ma4-Cl (Chemical Formula 169)

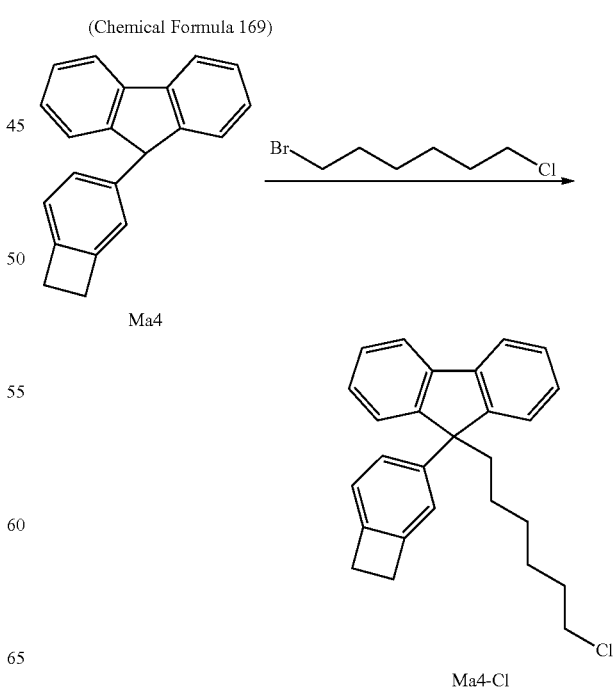

The gas in a flask equipped with a stirrer was purged with a nitrogen gas, then, 60 wt % sodium hydride (10.9 g) dispersed in liquid paraffin, tetrahydrofuran (268 mL) and 1-bromo-6-chloro-hexane (198 g) were added, the whole flask was light-shielded, then, the mixture was cooled to 0 to 5° C. A mixture of the compound Ma4 (67.0 g) and tetrahydrofuran (268 mL) was dropped into this, and the mixture was heated up to 50° C., then, stirred at 50° C. for 6 hours. The resultant reaction mixture was cooled down to room temperature, then, heptane and water were added. The aqueous layer of the resultant mixture was separated, then, the organic layer was washed with water, dehydrated over magnesium sulfate added, then, magnesium sulfate was separated, and the resultant filtrate was concentrated. The resultant residue was crystallized from isopropyl alcohol, then, the resultant solid was dissolved in a mixed liquid of toluene and heptane, and activated carbon (9.6 g) was added. The resultant mixed liquid was filtrated, and the resultant filtrate was concentrated under reduced pressure. The resultant residue was crystallized from a mixed liquid of toluene and heptane, and the resultant solid was washed with methanol, to obtain 81.0 g of a compound Ma4-Cl as a white solid. This operation was conducted repeatedly, to obtain a necessary amount of the compound Ma4-Cl.

$^1$H-NMR (CD$_2$Cl$_2$, 300 MHz) δ (ppm): 0.71-0.83 (2H, m), 1.27 (4H, t), 1.58-1.68 (2H, m), 2.49-2.54 (2H, m), 3.08-3.19 (4H, m), 3.49 (2H, t), 6.89 (1H, s), 6.94 (1H, d), 7.07 (1H, d), 7.25-7.44 (6H, m), 7.83 (2H, d)

<Synthesis Example 6> Synthesis of Compound Ma4-I (Chemical Formula 170)

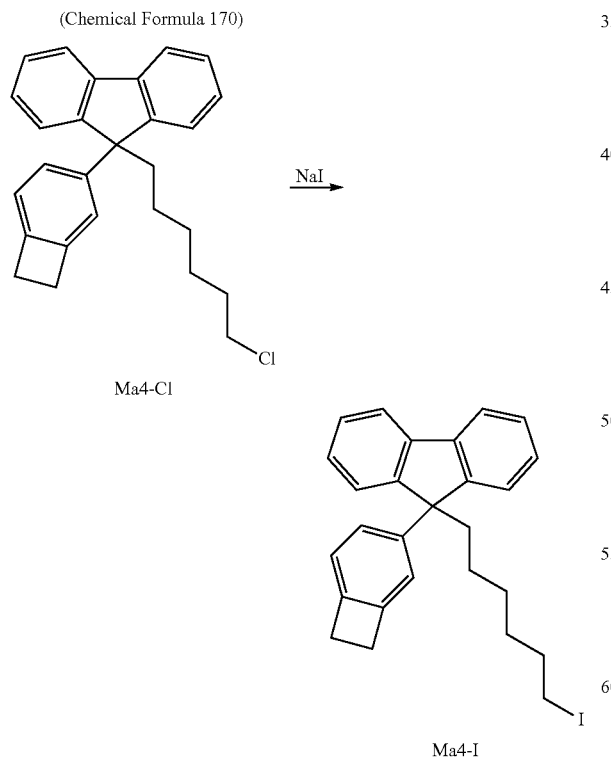

The gas in a flask equipped with a stirrer was purged with a nitrogen gas, then, the compound Ma4-Cl (124 g), sodium iodide (386 g) and acetone (786 mL) were added, and the mixture was heated up to reflux temperature, then, stirred at reflux temperature for 34 hours. The resultant reaction mixture was cooled down to room temperature, then, heptane and water were added. The aqueous layer of the resultant mixture was separated, then, the organic layer was washed with water, dehydrated over magnesium sulfate added, then, magnesium sulfate was separated, and the resultant filtrate was concentrated to obtain a crude product. The resultant crude product was crystallized from a mixed liquid of isopropyl alcohol and heptane, and the resultant solid was washed with methanol, to obtain 143 g of a compound Ma4-I as a white solid.

$^1$H-NMR (CD$_2$Cl$_2$, 300 MHz) δ (ppm): 0.71-0.83 (2H, m), 1.20-1.36 (4H, m), 1.60-1.70 (2H, m), 2.48-2.54 (2H, m), 3.13-3.18 (6H, m), 6.89 (1H, s), 6.94 (1H, d), 7.07 (1H, d), 7.25-7.44 (6H, m), 7.83 (2H, d)

<Synthesis Example 7> Synthesis of Compound MM1

(Chemical Formula 171)

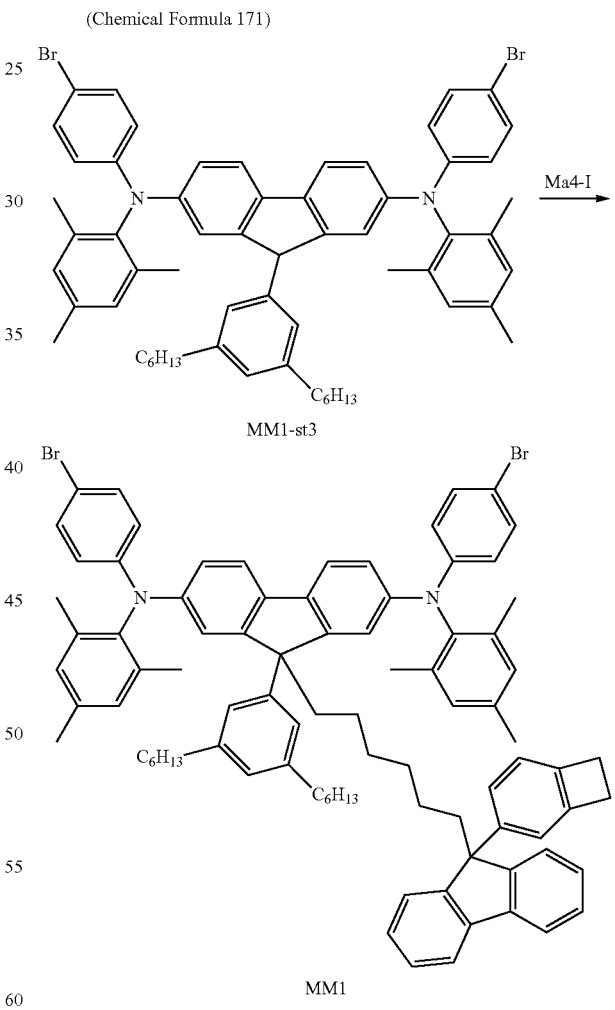

The gas in a flask equipped with a stirrer was purged with a nitrogen gas, then, the whole reaction vessel was light-shielded, 60 wt % sodium hydride (1.05 g) dispersed in liquid paraffin, N,N-dimethylformamide (86 mL) and tetrahydrofuran (86 mL) were added, and the mixture was cooled to 0° C. To this was added the compound MM1-st3 (13.0 g), then, a mixture of the compound Ma4-I (21.5 g) and tetrahydrofuran (86 mL) was dropped, and the mixture was heated up to room temperature, then, stirred at room temperature for 5 hours. To the resultant reaction mixture was added water, then, toluene and water were added. The aqueous layer of the resultant mixture was separated, then, and the organic layer was washed with water, dehydrated over magnesium sulfate added, then, magnesium sulfate was separated, and the resultant filtrate was concentrated. The resultant residue was purified using a silica gel column (developing solvent: a mixed solvent of toluene and hexane). The resultant residue was dissolved in hexane, then, activated carbon (11.8 g) was added and the mixture was stirred. The resultant mixture was filtrated through a filter pre-coated with Celite, and the resultant filtrate was concentrated to obtain a crude product. The resultant crude product was washed while crushing in isopropyl alcohol, to obtain 20.4 g of a compound MM1 as a white solid. The compound MM1 had an HPLC area percentage value of 99.4%.

LC-MS (APCI, positive): [M+H]$^+$ 1336

$^1$H-NMR (THF-d8, 300 MHz) δ (ppm): 0.63 (4H, m), 0.79-1.03 (10H, m), 1.19-1.40 (12H, m), 1.49 (4H, m), 1.92 (12H, m), 2.09-2.21 (2H, m), 2.27 (6H, s), 2.33-2.52 (6H, m), 3.02 (4H, m), 6.67-6.84 (11H, m), 6.91 (4H, d), 6.96-7.02 (1H, m), 7.06 (2H, d), 7.10-7.31 (10H, m), 7.43 (2H, d), 7.74 (2H, d).

<Synthesis Example 8> Synthesis of Compound MM2

(Chemical Formula 172)

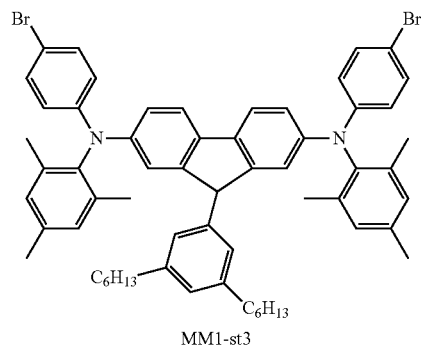

MM1-st3

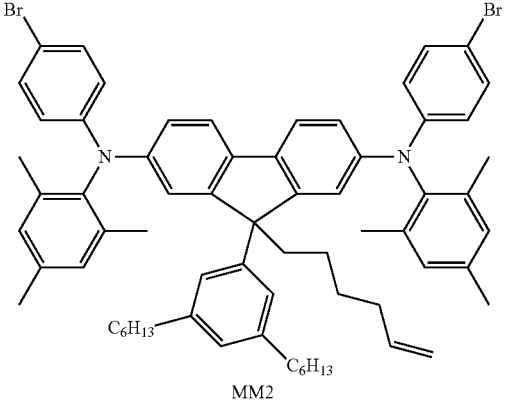

MM2

The gas in a flask equipped with a stirrer was purged with a nitrogen gas, then, 60 wt % sodium hydride (1.07 g) dispersed in liquid paraffin, N,N-dimethylformamide (88 mL) and tetrahydrofuran (88 mL) were added, and the mixture was cooled to 0° C. To this was added 1-bromohexene (5.45 g), then, a mixture of the compound MM1-st3 (22.0 g) and tetrahydrofuran (88 mL) was dropped, and the mixture was heated up to room temperature, then, stirred at room temperature for 5 hours. To the resultant reaction mixture were added heptane and water. The aqueous layer of the resultant mixture was separated, then, the organic layer was washed with water, dehydrated over magnesium sulfate added, then, magnesium sulfate was separated, and the resultant filtrate was concentrated. The resultant residue was purified using a silica gel column (developing solvent: a mixed solvent of hexane and ethyl acetate), to obtain a crude product. The resultant crude product was crystallized from a mixed solution of isopropyl alcohol and methanol, and the resultant solid was washed with methanol, to obtain 9.36 g of a compound MM2 as a white solid. The compound MM2 had an HPLC area percentage value of 98.5%.

LC-MS (APCI, positive): [M+H]$^+$1067

$^1$H-NMR (THF-d8, 300 MHz) δ (ppm): 0.73-0.97 (8H, m), 1.15-1.41 (14H, m), 1.51 (4H, m), 1.86 (2H, q), 1.96 (12H, s), 2.22-2.34 (8H, m), 2.45 (4H, t, overlapping peak of water), 4.80-4.94 (2H, m), 5.68 (1H, m), 6.70-6.79 (6H, m), 6.79-6.85 (3H, m), 6.94 (4H, s), 7.14 (2H, d), 7.20 (4H, m), 7.46 (2H, d).

<Synthesis Example 9> Synthesis of Compound MM3

(Chemical Formula 173)

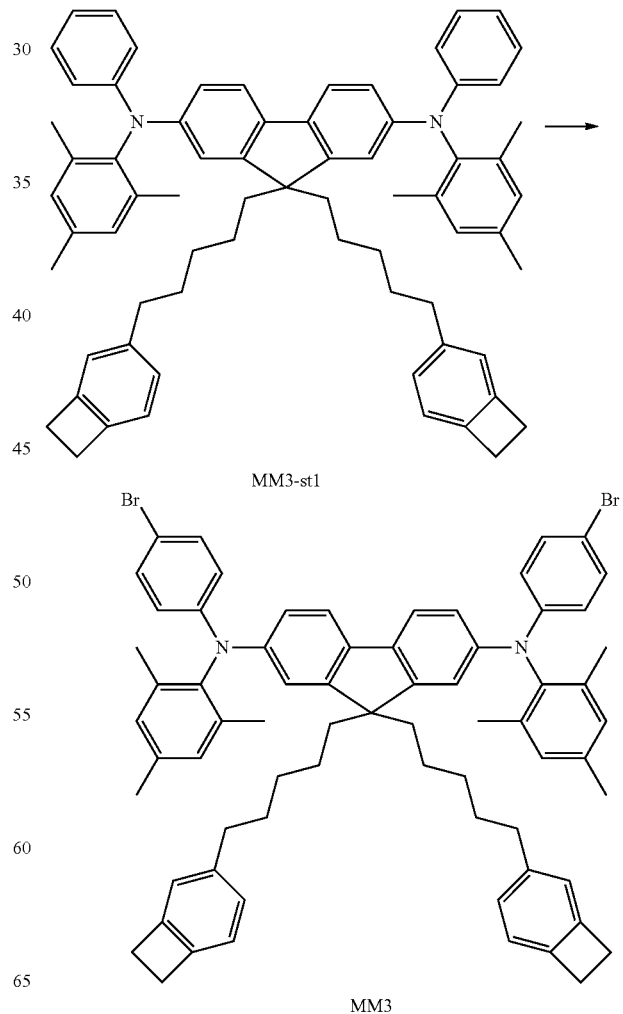

A nitrogen gas atmosphere was prepared in a reaction vessel, then, the compound MM3-st1 (19.0 g) synthesized based on to the method described in National Publication of translated version No. 2013-536570 and N,N-dimethylformamide (170 mL) were added. The resultant mixture was cooled down to −45° C., then, to this were added N-bromosuccinimide (7.10 g) and N,N-dimethylformamide (34 mL), and the mixture was stirred at −45° C. for 4 hours, then, stirred at room temperature overnight. To the resultant reaction mixture were added water and chloroform, then, the aqueous layer was separated. The resultant organic layer was washed with water, then, dehydrated over magnesium sulfate added, magnesium sulfate was separated, and the resultant filtrate was concentrated. The resultant residue was dissolved in a mixed solvent of hexane and dichloromethane, then, the solution was filtered through a filter pre-coated with Celite, and the resultant filtrate was concentrated. The resultant residue was dissolved in a mixed solvent of hexane and dichloromethane, then, activated carbon (10 g) was added and the mixture was stirred. The resultant mixture was filtered and concentrated to obtain a crude product. The resultant crude product was crystallized from a mixed solution of dichloromethane and ethanol, and the resultant gray solid was crystallized repeatedly, to obtain 5.30 g of a compound MM3 as a white compound. The compound MM3 had an HPLC area percentage value of 99.5% or more.

LC-MS (APCI, positive): $[M+H]^+$ 1085

$^1$H-NMR (THF-d8, 400 MHz) δ (ppm): 0.71 (4H, quin), 1.08 (4H, quin), 1.38 (4H, quin), 1.64-1.84 (4H, m), 1.96 (12H, s), 2.28 (6H, s), 2.37-2.44 (4H, m), 3.08 (8H, s), 6.68-6.98 (16H, m), 7.04-7.25 (6H, m), 7.34-7.46 (2H, m).

<Synthesis Example 10> Synthesis of Compound MM4

(Chemical Formula 174)

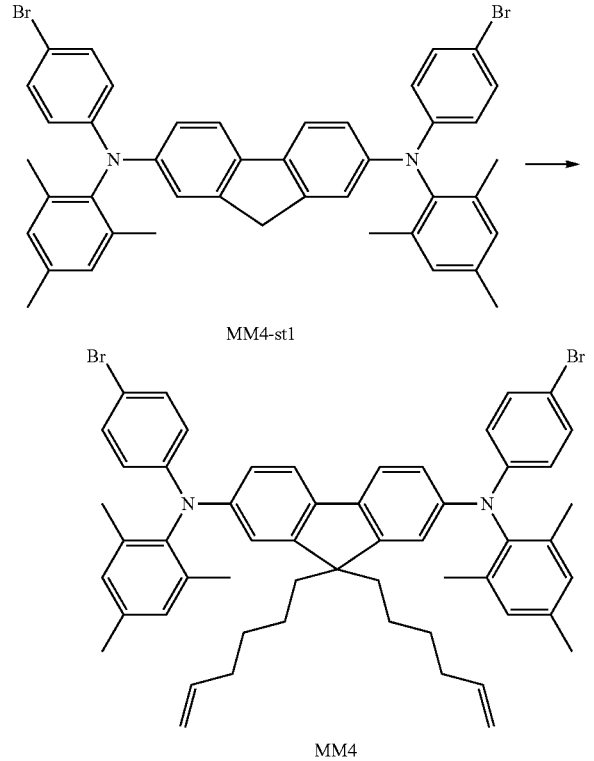

The gas in a flask equipped with a stirrer was purged with a nitrogen gas, then, the compound MM4-st1 (20.0 g) synthesized based on the methods described in National Publication of translated version No. 2011-105852 and described in International Publication WO2013-146806 and tetrahydrofuran (200 mL) were added, and the mixture was cooled to 0° C. To this was added potassium tert-butoxide (9.10 g), then, 1-bromohexene (9.60 g) was dropped. The resultant mixture was heated up to room temperature, then, stirred at room temperature overnight. The resultant reaction mixture was filtrated through a filter pre-coated with alumina column, and the resultant filtrate was concentrated to obtain a crude product. The resultant crude product was crystallized from a mixed solution of toluene and acetonitrile, then, purified using a silica gel column modified with an octadecylsilyl group (developing solvent: a mixed solvent of tetrahydrofuran and acetonitrile). The resultant solid was crystallized repeatedly, to obtain 9.39 g of a compound MM4 as a white compound. The compound MM4 had an HPLC area percentage value of 99.4%.

LC-MS (APCI, positive): $[M+H]^+$ 905

$^1$H-NMR (THF-d8, 400 MHz) δ (ppm): 0.71 (4H, m), 1.14 (4H, quin), 1.62-1.92 (4H, m), 1.97 (12H, s), 2.30 (6H, s), 2.38-2.51 (4H, m, overlapping peak of water), 4.74-4.96 (4H, m), 5.54-5.72 (2H, m), 6.68-6.87 (6H, m), 6.90-7.04 (4H, m), 7.06-7.16 (2H, m), 7.20-7.33 (4H, m), 7.36-7.46 (2H, m).

<Synthesis Example 11> Synthesis of Compounds MM10 to MM13

A compound MM10 was synthesized according to the synthesis method described in JP-A No. 2010-189630.

A compound MM11 was synthesized according to the synthesis method described in International Publication WO2013/146806.

A compound MM12 was synthesized according to the synthesis method described in JP-A No. 2010-215886.

A compound MM13 was synthesized according to the synthesis method described in JP-A No. 2008-106241.

(Chemical Formula 175)

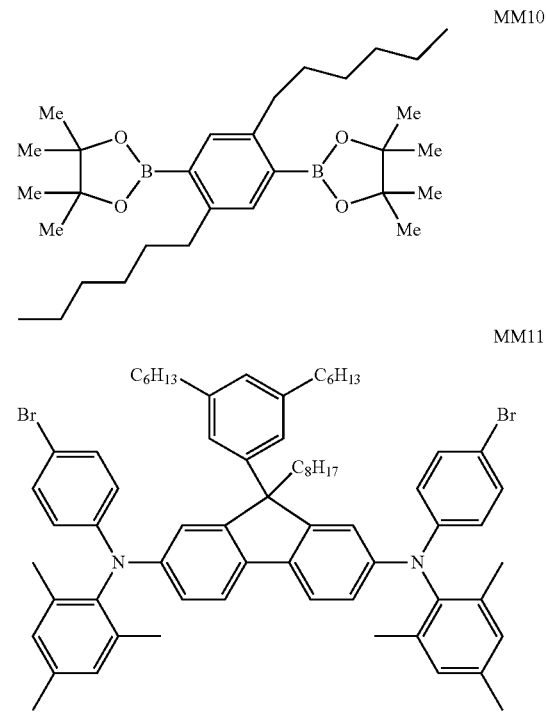

-continued

MM12

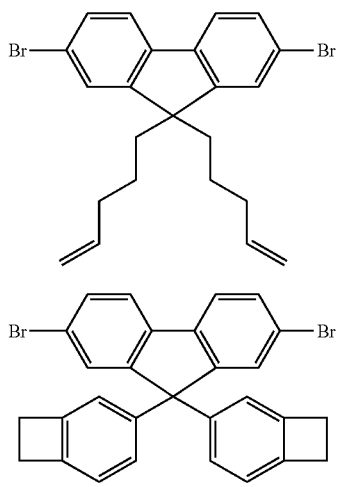

MM13

MM14

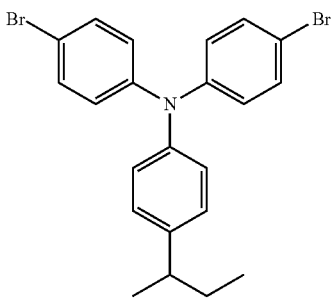

MM15

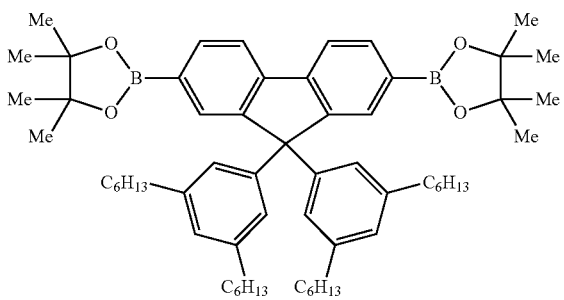

<Synthesis Example 12> Synthesis of Compounds MM5, MM6, MM14 and MM15

A compound MM5 was synthesized according to the synthesis method described in International Publication WO2013/146806.

A compound MM6 was synthesized according to the synthesis method described in National Publication of translated version No. 2007-511636.

A compound MM14 was synthesized according to the synthesis method described in JP-A No. 2002-539292.

A compound MM15 was synthesized according to the synthesis method described in JP-A No. 2011-174062.

<Synthesis Example 13> Synthesis of Compounds MM16 to MM20

A compound MM16 was synthesized according to the synthesis method described in JP-A No. 2011-174062.

A compound MM17 was synthesized according to the synthesis method described in International Publication WO2002/045184.

A compound MM18 was synthesized according to the synthesis method described in JP-A No. 2004-143419.

A compound MM19 was synthesized according to the synthesis method described in JP-A No. 2012-144722.

A compound MM20 was synthesized according to the synthesis method described in JP-A No. 2010-031259.

(Chemical Formula 176)

MM5

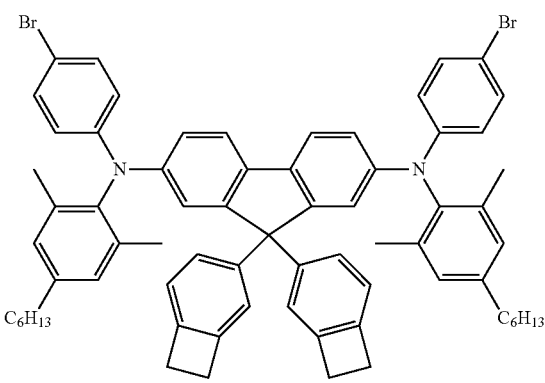

MM6

(Chemical Formula 177)

MM16

MM17

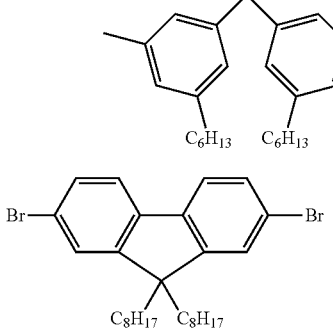

-continued

MM18
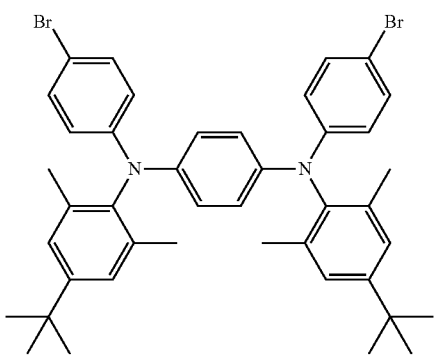
(Chemical Formula 178)

MM19
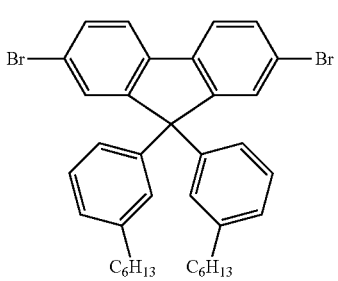

MM20
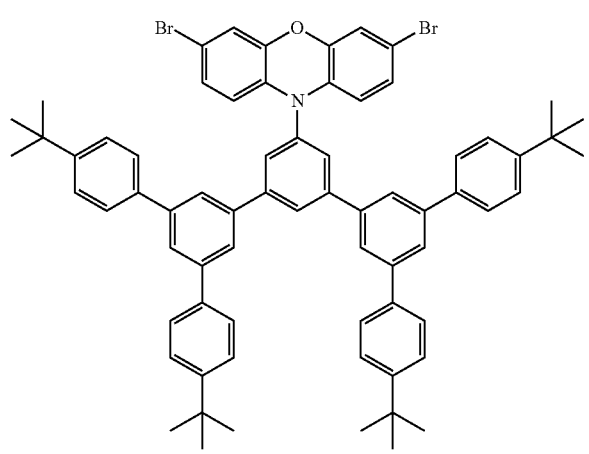

<Synthesis Example 14> Synthesis of Polymer Compound E1

An inert gas atmosphere was prepared in a reaction vessel, then, the compound MM16 (2.2749 g), the compound MM17 (0.3290 g), the compound MM19 (1.2375 g), the compound MM18 (0.1330 g), the compound MM20 (0.3295 g), dichlorobis(triphenylphosphine)palladium (2.1 mg) and toluene (76 mL) were added, and the mixture was heated at 105° C. Into the resultant mixture was dropped a 20 wt % tetraethylammonium hydroxide aqueous solution (10 mL), and the mixture was refluxed for 2 hours. To the resultant reaction mixture were added phenylboronic acid (37 mg), dichlorobis(triphenylphosphine)palladium (2.1 mg), toluene (6 mL) and a 20 wt % tetraethylammonium hydroxide aqueous solution (10 mL), and the mixture was refluxed for 14.5 hours. To the resultant reaction mixture was added a sodium diethyldithiacarbamate aqueous solution, and the mixture was stirred at 80° C. for 2 hours. The resultant mixture was cooled, then, the resultant organic layer was washed with water twice, with a 3 wt % acetic acid aqueous solution twice and with water twice, and the resultant solution was dropped into methanol, to observe generation of a precipitate. The precipitate was dissolved in toluene, and purified by passing through an alumina column and a silica gel column in series. The resultant solution was dropped into methanol, stirred, then, the resultant precipitate was isolated by filtration, and dried, to obtain a polymer compound E1 (2.42 g). The polymer compound E1 had an Mn of $1.0 \times 10^5$ and an Mw of $2.9 \times 10^5$.

The polymer compound E1 is a copolymer constituted of a constitutional unit derived from the compound MM16, a constitutional unit derived from the compound MM17, a constitutional unit derived from the compound MM18, a constitutional unit derived from the compound MM19 and a constitutional unit derived from the compound MM20 at a molar ratio of 50:10:3:32:5 according the theoretical values calculated from the amounts of the charged raw materials.

<Comparative Example 1> Synthesis and Evaluation of Polymer Compound 1c (Step 1) An inert gas atmosphere was prepared in a reaction vessel, then, the compound MM10 (0.99 g), the compound MM11 (1.8 g), the compound MM12 (92 mg), the compound MM13 (0.11 g), toluene (55 mL) and a 20 wt % tetrabutylammonium hydroxide aqueous solution (12 mL) were added, and the mixture was heated at 105° C.

(Step 2) To the reaction liquid was added dichlorobis(tris-o-methoxyphenylphosphine)palladium (1.8 mg), and the mixture was refluxed for 7 hours. After the reaction, to this were added phenylboronic acid (24 mg), dichlorobis(tris-o-methoxyphenylphosphine)palladium (1.8 mg) and a 20 wt % tetrabutylammonium hydroxide aqueous solution (12 mL), and the mixture was refluxed overnight. Thereafter, to this was added a sodium diethyldithiacarbamate aqueous solution, and the mixture was stirred at 80° C. for 2 hours. The reaction liquid was cooled, then, washed with water twice, with a 3 wt % acetic acid aqueous solution twice and with water twice, and the resultant solution was dropped into methanol, to observe generation of a precipitate. The precipitate was dissolved in toluene, and purified by passing through an alumina column and a silica gel column in series. The resultant solution was dropped into methanol, stirred, then, the resultant precipitate was isolated by filtration, and dried, to obtain 1.4 g of a polymer compound 1c. The polymer compound 1c had an Mn of $3.9 \times 10^4$ and an Mw of $3.3 \times 10^5$.

The polymer compound 1c is a copolymer constituted of a constitutional unit derived from the compound MM10, a constitutional unit derived from the compound MM11, a constitutional unit derived from the compound MM12 and a constitutional unit derived from the compound MM13 at a molar ratio of 50:40:5:5 according the theoretical values calculated from the amounts of the charged raw materials.
(Film Remaining Ratio)

The polymer compound 1c was dissolved in xylene, to prepare a 0.7 wt % xylene solution. This xylene solution was spin-coated on a glass substrate to form a film with a thickness of 20 nm, then, the film was heated on a hot plate at 180° C. for 60 minutes in a nitrogen gas atmosphere. Thereafter, the film was cooled down to room temperature to fabricate a measurement sample 1c-1. The light transmittance of the measurement sample 1c-1 was measured, and the minimum transmittance ($T_1$: 0.701) of the measurement sample 1c-1 was obtained. For measurement, a light transmittance measuring apparatus (manufactured by Varian, Inc., trade name: Cary 5E ultraviolet-visible spectral photometer) was used, and the wavelength sweeping in measuring the light transmittance was adjusted to 300 to 600 nm.

The measurement sample 1c-1 was immersed in xylene, stirred for 60 minutes, then, taken out from xylene. Thereafter, the sample was placed on a spin coater, and dried by rotating at 1000 rpm for 10 seconds, to fabricate a measurement sample 1c-2. In the same manner as for the measurement sample 1c-1, the light transmittance of the measurement sample 1c-2 was measured, and the minimum transmittance ($T_2$: 0.721) of the measurement sample 1c-2 was obtained.

The film remaining ratio of the film using the polymer compound 1c was calculated using the following formula, to find a value of 91.8%.

Film remaining ratio (%)=($\log_e T_2/\log_e T_1$)×100

(Hole Only Device)

An HOD (Hole Only Device) device capable of flowing only holes was fabricated.

UV ozone washing was performed on the glass on which an ITO film had been formed as an anode, then, a hole injection material (manufactured by Nissan Chemical Industries, Ltd., ND3202) was spin-coated on the substrate to form a film with a thickness of 35 nm. This was heated on a hot plate at 50° C. for 3 minutes in an air atmosphere to volatilize the solvent, and subsequently, heated on a hot plate at 230° C. for 15 minutes, then, left to naturally cool to room temperature.

Next, the polymer compound 1c was dissolved in xylene, to prepare a 2.1 wt % xylene solution. This xylene solution was spin-coated to form a film with a thickness of 100 nm, and this was heated on a hot plate at 180° C. for 60 minutes in a nitrogen gas atmosphere, then, left to naturally cool to room temperature.

Thereafter, as a cathode, aluminum was vapor-deposited with a thickness of about 120 nm, to fabricate an HOD device C1. After the degree of vacuum reached 1×10$^{-4}$ Pa or less, vapor deposition of a metal was initiated.

Voltage was applied to the HOD device C1 from −5 V to +12 V using a DC voltage current generator, and the density of current flowing in the device when the field intensity was 0.4 MV/cm was measured. As a result, the current density was 73 mA/cm$^2$. In this evaluation, when a field intensity of 0.4 MV/cm was applied to the device, light emission by current excitation was not observed, thus, it was confirmed that the electronic current flowing in the device was extremely small with respect to the hole current.

<Comparative Example 2> Synthesis and Evaluation of Polymer Compound 2c

A polymer compound 2c (1.6 g) was obtained in the same manner as in Comparative Example 1 except that "the compound MM10 (0.99 g), the compound MM11 (1.8 g) and the compound MM13 (0.21 g)" were used instead of "the compound MM10 (0.99 g), the compound MM11 (1.8 g), the compound MM12 (92 mg) and the compound MM13 (0.11 g)" in (Step 1) of Synthesis of polymer compound 1c of Comparative Example 1. The polymer compound 2c had an Mn of 4.0×10$^4$ and an Mw of 2.5×10$^5$.

The polymer compound 2c is a copolymer constituted of a constitutional unit derived from the compound MM10, a constitutional unit derived from the compound MM11 and a constitutional unit derived from the compound MM13 at a molar ratio of 50:40:10 according the theoretical values calculated from the amounts of the charged raw materials.

(Film Remaining Ratio)

The measurement sample 2c-1 before xylene immersion was fabricated and the minimum transmittance ($T_1$: 0.707) of the measurement sample 2c-1 was obtained in the same manner as in Comparative Example 1 except that the polymer compound 2c was used instead of the polymer compound 1c in (Film remaining ratio) of Comparative Example 1c. Next, the measurement sample 2c-2 after xylene immersion was fabricated and the minimum transmittance ($T_2$: 0.760) of the measurement sample 2c-2 was obtained. Using the above-described formula, the film remaining ratio of the film using the polymer compound 2c was calculated, to find a value of 79.2%.

(Hole Only Device)

An HOD device C2 was fabricated and evaluated in the same manner as in Comparative Example 1 except that the polymer compound 2c was used instead of the polymer compound 1c in (Hole only device) of Comparative Example 1. As a result, the density of current flowing in the device when the field intensity was 0.4 MV/cm was 22 mA/cm$^2$. In this evaluation, when a field intensity of 0.4 MV/cm was applied to the device, light emission by current excitation was not observed, thus, it was confirmed that the electronic current flowing in the device was extremely small with respect to the hole current.

<Example 1> Synthesis and Evaluation of Polymer Compound 1

A polymer compound 1 (1.2 g) was obtained based on Comparative Example 1 except that "the compound MM10 (0.62 g), the compound MM11 (0.83 g), the compound MM1 (0.34 g) and the compound MM2 (0.27 g)" were used instead of "the compound MM10 (0.99 g), the compound MM11 (1.8 g), the compound MM12 (92 mg) and the compound MM13 (0.11 g)" in (Step 1) of Synthesis of polymer compound 1c of Comparative Example 1. The polymer compound 1 had an Mn of 3.8×10$^4$ and an Mw of 3.8×10$^5$.

The polymer compound 1 is a copolymer constituted of a constitutional unit derived from the compound MM10, a constitutional unit derived from the compound MM11, a constitutional unit derived from the compound MM1 and a constitutional unit derived from the compound MM2 at a molar ratio of 50:30:10:10 according the theoretical values calculated from the amounts of the charged raw materials.

(Film Remaining Ratio)

The measurement sample 1-1 before xylene immersion was fabricated and the minimum transmittance ($T_1$: 0.669) of the measurement sample 1-1 was obtained in the same manner as in Comparative Example 1 except that the polymer compound 1 was used instead of the polymer compound 1c in (Film remaining ratio) of Comparative Example 1. Next, the measurement sample 1-2 after xylene immersion was fabricated and the minimum transmittance ($T_2$: 0.679) of the measurement sample 1-2 was obtained. Using the above-described formula, the film remaining ratio of the film using the polymer compound 1 was calculated, to find a value of 96.6%.

(Hole Only Device)

An HOD device 1 was fabricated and evaluated in the same manner as in Comparative Example 1 except that the polymer compound 1 was used instead of the polymer compound 1c in (Hole only device) of Comparative Example 1. As a result, the density of current flowing in the device when the field intensity was 0.4 MV/cm was 102 mA/cm². In this evaluation, when a field intensity of 0.4 MV/cm was applied to the device, light emission by current excitation was not observed, thus, it was confirmed that the electronic current flowing in the device was extremely small with respect to the hole current.

<Comparative Example 3> Synthesis and Evaluation of Polymer Compound 3c (Step 1) An inert gas atmosphere was prepared in a reaction vessel, then, the compound MM15 (1.8 g), the compound MM11 (1.8 g), the compound MM12 (93 mg), the compound MM13 (110 mg), dichlorobis(tris-o-methoxyphenylphosphine)palladium (3.5 mg) and toluene (76 mL) were added, and the mixture was heated at 105° C.

(Step 2) Into the reaction liquid was dropped a 20 wt % tetraethylammonium hydroxide aqueous solution (7.6 mL), and the mixture was refluxed for 6 hours.

(Step 3) After the reaction, to this were added phenylboronic acid (26 mg), a 20 wt % tetraethylammonium hydroxide aqueous solution (7.5 mL) and dichlorobis(tris-o-methoxyphenylphosphine)palladium (1.8 mg), and the mixture was refluxed for 15 hours.

(Step 4) Thereafter, to this was added a sodium diethyldithiacarbamate aqueous solution, and the mixture was stirred at 80° C. for 2 hours. The resultant reaction liquid was cooled, then, washed with water twice, with a 3 wt % acetic acid aqueous solution twice and with water twice, and the resultant solution was dropped into methanol, to observe generation of a precipitate. The precipitate was dissolved in toluene, and purified by passing through an alumina column and a silica gel column in series. The resultant solution was dropped into methanol, stirred, then, the resultant precipitate was isolated by filtration, and dried, to obtain 2.3 g of a polymer compound 3c. The polymer compound 3c had an Mn of $5.4 \times 10^4$ and an Mw of $2.6 \times 10^5$.

The polymer compound 3c is a copolymer constituted of a constitutional unit derived from the compound MM15, a constitutional unit derived from the compound MM11, a constitutional unit derived from the compound MM12 and a constitutional unit derived from the compound MM13 at a molar ratio of 50:40:5:5 according the theoretical values calculated from the amounts of the charged raw materials.

(Film Remaining Ratio)

The polymer compound 3c was dissolved in xylene, to prepare a 0.7 wt % xylene solution. This xylene solution was spin-coated on a glass substrate to form a film with a thickness of 20 nm, then, the film was heated on a hot plate at 180° C. for 60 minutes in a nitrogen gas atmosphere. Thereafter, it was cooled down to room temperature, to fabricate a measurement sample 3c-1. The light transmittance of the measurement sample 3c-1 was measured and the minimum transmittance ($T_1$: 0.697) of the measurement sample 3c-1 was obtained. For measurement, a light transmittance measuring apparatus (manufactured by Varian, Inc., trade name: Cary 5E ultraviolet-visible spectral photometer) was used, and the wavelength sweeping in measuring the light transmittance was adjusted to 300 to 600 nm.

The measurement sample 3c-1 was immersed in xylene, stirred for 60 minutes, then, taken out from xylene. Thereafter, the sample was placed on a spin coater, and dried by rotating at 1000 rpm for 10 seconds, to fabricate a measurement sample 3c-2. In the same manner as for the measurement sample 3c-1, the light transmittance of the measurement sample 3c-2 was measured and the minimum transmittance ($T_2$: 0.732) of the measurement sample 3c-2 was obtained.

Using the following formula, the film remaining ratio of the film using the polymer compound 3c was calculated, to find a value of 86.4%.

Film remaining ratio (%)=($\log_e T_2/\log_e T_1$)×100

(Hole Only Device)

An HOD device capable of flowing only holes was fabricated.

UV ozone washing was performed on the glass on which an ITO film had been formed as an anode, then, a hole injection material (manufactured by Nissan Chemical Industries, Ltd., ND3202) was spin-coated on the substrate to form a film with a thickness of 35 nm. This was heated on a hot plate at 50° C. for 3 minutes in an air atmosphere to volatilize the solvent, and subsequently, heated on a hot plate at 230° C. for 15 minutes, then, left to naturally cool to room temperature.

Next, the polymer compound 3c was dissolved in xylene, to prepare a 2.1 wt % xylene solution. This xylene solution was spin-coated to form a film with a thickness of 100 nm, and this was heated on a hot plate at 180° C. for 60 minutes in a nitrogen gas atmosphere, then, left to naturally cool to room temperature.

Thereafter, as a cathode, aluminum was vapor-deposited with a thickness of about 120 nm, to fabricate an HOD device C3. After the degree of vacuum reached $1 \times 10^{-4}$ Pa or less, vapor deposition of a metal was initiated.

Voltage was applied to the HOD device C3 from −5 V to +12 V using a DC voltage current generator, and the density of current flowing in the device when the field intensity was 0.4 MV/cm was measured. As a result, the current density was 145 mA/cm². In this evaluation, when a field intensity of 0.4 MV/cm was applied to the device, light emission by current excitation was not observed, thus, it was confirmed that the electronic current flowing in the device was extremely small with respect to the hole current.

<Comparative Example 4> Synthesis and Evaluation of Polymer Compound 4c (Step 1) An inert gas atmosphere was prepared in a reaction vessel, then, the compound MM10 (1.0 g), the compound MM14 (740 mg), the compound MM12 (92 mg), the compound MM13 (110 mg), dichlorobis(tris-o-methoxyphenylphosphine)palladium (1.8 mg) and toluene (50 mL) were added, and the mixture was heated at 105° C.

(Step 2) Into the reaction liquid was dropped a 20 wt % tetraethylammonium hydroxide aqueous solution (6.6 mL), and the mixture was refluxed for 5.5 hours.

(Step 3) After the reaction, to this were added phenylboronic acid (24 mg), a 20 wt % tetraethylammonium hydroxide aqueous solution (6.6 mL) and dichlorobis(tris-o-methoxyphenylphosphine)palladium (1.8 mg), and the mixture was refluxed for 14 hours.

(Step 4) Thereafter, to this was added a sodium diethyldithiacarbamate aqueous solution, and the mixture was stirred at 80° C. for 2 hours. The resultant reaction liquid was cooled, then, washed with water twice, with a 3 wt % acetic acid aqueous solution twice and with water twice, and the resultant solution was dropped into methanol, to observe generation of a precipitate. The precipitate was dissolved in toluene, and purified by passing through an alumina column and a silica gel column in series. The resultant solution was dropped into methanol, stirred, then, the resultant precipitate was isolated by filtration, and dried, to obtain 910 mg of a polymer compound 4c. The polymer compound 4c had an Mn of $5.2 \times 10^4$ and an Mw of $2.5 \times 10^5$.

The polymer compound 4c is a copolymer constituted of a constitutional unit derived from the compound MM10, a constitutional unit derived from the compound MM14, a constitutional unit derived from the compound MM12 and a constitutional unit derived from the compound MM13 at a molar ratio of 50:40:5:5 according the theoretical values calculated from the amounts of the charged raw materials.
(Film Remaining Ratio)

A measurement sample 4c-1 before xylene immersion was fabricated and the minimum transmittance ($T_1$: 0.702) of the measurement sample 4c-1 was obtained in the same manner as in Comparative Example 3 except that the polymer compound 4c was used instead of the polymer compound 3c in (Film remaining ratio) of Comparative Example 3. Next, a measurement sample 4c-2 after xylene immersion was fabricated and the minimum transmittance ($T_2$: 0.710) of the measurement sample 4c-2 was obtained. Using the above-described formula, the film remaining ratio of the film using the polymer compound 4c was calculated, to find a value of 96.8%.
(Hole Only Device)

An HOD device C4 was fabricated and evaluated in the same manner as in Comparative Example 3 except that the polymer compound 4c was used instead of the polymer compound 3c in (Hole only device) of Comparative Example 3. As a result, the density of current flowing in the device when the field intensity was 0.4 MV/cm was 0.001 mA/cm². In this evaluation, when a field intensity of 0.4 MV/cm was applied to the device, light emission by current excitation was not observed, thus, it was confirmed that the electronic current flowing in the device was extremely small with respect to the hole current.

<Example 2> Synthesis and Evaluation of Polymer Compound 2

(Step 1) An inert gas atmosphere was prepared in a reaction vessel, then, the compound MM10 (0.87 g), the compound MM11 (1.4 g), the compound MM5 (190 mg), the compound MM2 (380 mg), dichlorobis(tris-o-methoxyphenylphosphine)palladium (3.1 mg) and toluene (35 mL) were added, and the mixture was heated at 105° C.

(Step 2) Into the reaction liquid was dropped a 20 wt % tetraethylammonium hydroxide aqueous solution (18 mL), and the mixture was refluxed for 7.5 hours.

(Step 3) After the reaction, to this were added phenylboronic acid (85 mg) and dichlorobis(tris-o-methoxyphenylphosphine)palladium (1.5 mg), and the mixture was refluxed for 15 hours.

(Step 4) The reaction liquid was cooled, then, washed with water once, with 10 wt % dilute hydrochloric acid water twice, with a 3 wt % ammonia aqueous solution twice and with water twice, and the resultant solution was dropped into methanol, to observe generation of a precipitate. The precipitate was dissolved in toluene, and purified by passing through an alumina column and a silica gel column in series. The resultant solution was dropped into methanol, stirred, then, the resultant precipitate was isolated by filtration, and dried, to obtain 1.5 g of a polymer compound 2. The polymer compound 2 had an Mn of $4.2 \times 10^4$ and an Mw of $2.3 \times 10^5$.

The polymer compound 2 is a copolymer constituted of a constitutional unit derived from the compound MM10, a constitutional unit derived from the compound MM11, a constitutional unit derived from the compound MM5 and a constitutional unit derived from the compound MM2 at a molar ratio of 50:35:5:10 according the theoretical values calculated from the amounts of the charged raw materials.
(Film Remaining Ratio)

A measurement sample 2-1 before xylene immersion was fabricated and the minimum transmittance ($T_1$: 0.671) of the measurement sample 2-1 was obtained in the same manner as in Comparative Example 3 except that the polymer compound 2 was used instead of the polymer compound 3c in (Film remaining ratio) of Comparative Example 3. Next, a measurement sample 2-2 after xylene immersion was fabricated and the minimum transmittance ($T_2$: 0.675) of the measurement sample 2-2 was obtained. Using the above-described formula, the film remaining ratio of the film using the polymer compound 2 was calculated, to find a value of 98.5%.
(Hole Only Device)

An HOD device 2 was fabricated and evaluated in the same manner as in Comparative Example 3 except that the polymer compound 2 was used instead of the polymer compound 3c in (Hole only device) of Comparative Example 3. As a result, the density of current flowing in the device when the field intensity was 0.4 MV/cm was 122 mA/cm². In this evaluation, when a field intensity of 0.4 MV/cm was applied to the device, light emission by current excitation was not observed, thus, it was confirmed that the electronic current flowing in the device was extremely small with respect to the hole current.

<Example 3> Synthesis and Evaluation of Polymer Compound 3

(Step 1) An inert gas atmosphere was prepared in a reaction vessel, then, the compound MM10 (1.1 g), the compound MM14 (620 mg), the compound MM6 (190 mg), the compound MM2 (480 mg), dichlorobis(tris-o-methoxyphenylphosphine)palladium (3.9 mg) and toluene (37 mL) were added, and the mixture was heated at 105° C.

(Step 2) Into the reaction liquid was dropped a 20 wt % tetraethylammonium hydroxide aqueous solution (22 mL), and the mixture was refluxed for 7 hours.

(Step 3) After the reaction, to this were added phenylboronic acid (110 mg) and dichlorobis(tris-o-methoxyphenylphosphine)palladium (2.0 mg), and the mixture was refluxed for 16 hours.

(Step 4) The reaction liquid was cooled, then, washed with water once, with 10 wt % dilute hydrochloric acid water twice, with a 3 wt % ammonia aqueous solution twice and with water twice, and the resultant solution was dropped into methanol, to observe generation of a precipitate. The precipitate was dissolved in toluene, and purified by passing through an alumina column and a silica gel column in series. The resultant solution was dropped into methanol, stirred, then, the resultant precipitate was isolated by filtration, and dried, to obtain 1.1 g of a polymer compound 3. The polymer compound 3 had an Mn of $5.0 \times 10^4$ and an Mw of $2.5 \times 10^5$.

The polymer compound 3 is a copolymer constituted of a constitutional unit derived from the compound MM10, a constitutional unit derived from the compound MM14, a constitutional unit derived from the compound MM6 and a constitutional unit derived from the compound MM2 at a molar ratio of 50:30:10:10 according the theoretical values calculated from the amounts of the charged raw materials.
(Film Remaining Ratio)

A measurement sample 3-1 before xylene immersion was fabricated and the minimum transmittance ($T_1$: 0.847) of the measurement sample 3-1 was obtained in the same manner as in Comparative Example 3 except that the polymer compound 3 was used instead of the polymer compound 3c in (Film remaining ratio) of Comparative Example 3. Next, a measurement sample 2-2 after xylene immersion was fabricated and the minimum transmittance ($T_2$: 0.847) of the measurement sample 3-2 was obtained. Using the above-described formula, the film remaining ratio of the film using the polymer compound 3 was calculated, to find a value of 100%.

(Hole Only Device)

An HOD device 3 was fabricated and evaluated in the same manner as in Comparative Example 3 except that the polymer compound 3 was used instead of the polymer compound 3c in (Hole only device) of Comparative Example 3. As a result, the density of current flowing in the device when the field intensity was 0.4 MV/cm was 0.395 mA/cm². In this evaluation, when a field intensity of 0.4 MV/cm was applied to the device, light emission by current excitation was not observed, thus, it was confirmed that the electronic current flowing in the device was extremely small with respect to the hole current.

<Example 4> Synthesis and Evaluation of Polymer Compound 4

(Step 1) An inert gas atmosphere was prepared in a reaction vessel, then, the compound MM15 (1.1 g), the compound MM11 (830 mg), the compound MM1 (340 mg), the compound MM2 (270 mg), dichlorobis(tris-o-methoxy-phenylphosphine)palladium (2.3 mg) and toluene (42 mL) were added, and the mixture was heated at 105° C.

(Step 2) Into the reaction liquid was dropped a 20 wt % tetraethylammonium hydroxide aqueous solution (12 mL), and the mixture was refluxed for 8 hours.

(Step 3) After the reaction, to this were added phenylboronic acid (60 mg) and dichlorobis(tris-o-methoxyphenyl-phosphine)palladium (1.1 mg), and the mixture was refluxed for 15 hours.

(Step 4) The reaction liquid was cooled, then, washed with water once, with 10 wt % dilute hydrochloric acid water twice, with a 3 wt % ammonia aqueous solution twice and with water twice, and the resultant solution was dropped into methanol, to observe generation of a precipitate. The precipitate was dissolved in toluene, and purified by passing through an alumina column and a silica gel column in series. The resultant solution was dropped into methanol, stirred, then, the resultant precipitate was isolated by filtration, and dried, to obtain 520 mg of a polymer compound 4. The polymer compound 4 had an Mn of $2.0 \times 10^5$ and an Mw of $2.7 \times 10^5$.

The polymer compound 4 is a copolymer constituted of a constitutional unit derived from the compound MM15, a constitutional unit derived from the compound MM11, a constitutional unit derived from the compound MM1 and a constitutional unit derived from the compound MM2 at a molar ratio of 50:30:10:10 according the theoretical values calculated from the amounts of the charged raw materials.

(Film Remaining Ratio)

A measurement sample 4-1 before xylene immersion was fabricated and the minimum transmittance ($T_1$: 0.707) of the measurement sample 4-1 was obtained in the same manner as in Comparative Example 3 except that the polymer compound 4 was used instead of the polymer compound 3c in (Film remaining ratio) of Comparative Example 3. Next, a measurement sample 4-2 after xylene immersion was fabricated and the minimum transmittance ($T_2$: 0.707) of the measurement sample 4-2 was obtained. Using the above-described formula, the film remaining ratio of the film using the polymer compound 4 was calculated, to find a value of 100%.

(Hole Only Device)

An HOD device 4 was fabricated and evaluated in the same manner as in Comparative Example 3 except that the polymer compound 4 was used instead of the polymer compound 3c in (Hole only device) of Comparative Example 3. As a result, the density of current flowing in the device when the field intensity was 0.4 MV/cm was 154 mA/cm². In this evaluation, when a field intensity of 0.4 MV/cm was applied to the device, light emission by current excitation was not observed, thus, it was confirmed that the electronic current flowing in the device was extremely small with respect to the hole current.

<Example 5> Synthesis and Evaluation of Polymer Compound 5

(Step 1) An inert gas atmosphere was prepared in a reaction vessel, then, the compound MM10 (750 mg), the compound MM11 (1.3 g), the compound MM3 (160 mg), the compound MM4 (140 mg), dichlorobis(tris-o-methoxy-phenylphosphine)palladium (5.4 mg) and toluene (42 mL) were added, and the mixture was heated at 105° C.

(Step 2) Into the reaction liquid was dropped a 20 wt % tetraethylammonium hydroxide aqueous solution (14 mL), and the mixture was refluxed for 8 hours.

(Step 3) After the reaction, to this were added phenylboronic acid (73 mg) and dichlorobis(tris-o-methoxyphenyl-phosphine)palladium (1.4 mg), and the mixture was refluxed for 15 hours.

(Step 4) The reaction liquid was cooled, then, washed with water once, with 10 wt % dilute hydrochloric acid water twice, with a 3 wt, ammonia aqueous solution twice and with water twice, and the resultant solution was dropped into methanol, to observe generation of a precipitate. The precipitate was dissolved in toluene, and purified by passing through an alumina column and a silica gel column in series. The resultant solution was dropped into methanol, stirred, then, the resultant precipitate was isolated by filtration, and dried, to obtain 101 mg of a polymer compound 5. The polymer compound 5 had an Mn of $3.5 \times 10^5$ and an Mw of $4.3 \times 10^5$.

The polymer compound 5 is a copolymer constituted of a constitutional unit derived from the compound MM10, a constitutional unit derived from the compound MM11, a constitutional unit derived from the compound MM3 and a constitutional unit derived from the compound MM4 at a molar ratio of 50:40:5:5 according the theoretical values calculated from the amounts of the charged raw materials.

(Film Remaining Ratio)

A measurement sample 5-1 before xylene immersion was fabricated and the minimum transmittance ($T_1$: 0.659) of the measurement sample 5-1 was obtained in the same manner as in Comparative Example 3 except that the polymer compound 5 was used instead of the polymer compound 3c in (Film remaining ratio) of Comparative Example 3. Next, a measurement sample 5-2 after xylene immersion was fabricated and the minimum transmittance ($T_2$: 0.659) of the measurement sample 5-2 was obtained. Using the above-described formula, the film remaining ratio of the film using the polymer compound 5 was calculated, to find a value of 100%.

(Hole Only Device)

An HOD device 5 was fabricated and evaluated in the same manner as in Comparative Example 3 except that the polymer compound 5 was used instead of the polymer compound 3c in (Hole only device) of Comparative Example 3. As a result, the density of current flowing in the device when the field intensity was 0.4 MV/cm was 116 mA/cm$^2$. In this evaluation, when a field intensity of 0.4 MV/cm was applied to the device, light emission by current excitation was not observed, thus, it was confirmed that the electronic current flowing in the device was extremely small with respect to the hole current.

For a polymer compound containing a constitutional unit derived from the compound MM10 and a constitutional unit derived from the compound MM11, the film remaining ratio and the current density in an HOD device are shown in Table 5.

TABLE 5

| | Polymer compound | film remaining ratio (%) | HOD device | current density (mA/cm$^2$) |
|---|---|---|---|---|
| Example 1 | 1 | 96.6 | 1 | 102 |
| Example 2 | 2 | 98.5 | 2 | 122 |
| Example 5 | 5 | 100 | 5 | 116 |
| Comparative Example 1 | 1c | 91.8 | C1 | 73 |
| Comparative Example 2 | 2c | 79.2 | C2 | 22 |

For a polymer compound containing a constitutional unit derived from the compound MM10 and a constitutional unit derived from the compound MM14, the film remaining ratio and the current density in an HOD device are shown in Table 6.

TABLE 6

| | Polymer compound | film remaining ratio (%) | HOD device | current density (mA/cm$^2$) |
|---|---|---|---|---|
| Example 3 | 3 | 100 | 3 | 0.395 |
| Comparative Example 4c | 4c | 96.8 | C4 | 0.001 |

For a polymer compound containing a constitutional unit derived from the compound MM15 and a constitutional unit derived from the compound MM11, the film remaining ratio and the current density in an HOD device are shown in Table 7.

TABLE 7

| | Polymer compound | film remaining ratio (%) | HOD device | current density (mA/cm$^2$) |
|---|---|---|---|---|
| Example 4 | 4 | 100 | 4 | 154 |
| Comparative Example 3c | 3c | 86.4 | C3 | 145 |

<Evaluation>

It is understood from Tables 5 to 7 that the film remaining ratio of a film containing a crosslinked body of the polymer compounds 1 to 5 as the polymer compound of the present invention is more excellent than the film remaining ratio of a film containing a crosslinked body of the existing polymer compounds 1c to 4c. Further, it is understood from the results of Tables 5 to 7 that a crosslinked body of the polymer compound of the present invention is excellent also in hole transportability since the value of the current density of an HOD device containing a crosslinked body of the polymer compounds 1 to 5 as the polymer compound of the present invention is higher than the value of the current density of an HOD device containing a crosslinked body of the conventional polymer compounds 1c to 4c.

<Example D1> Fabrication and Evaluation of Light Emitting Device D1

(Formation of Anode and Hole Injection Layer)

An ITO film was attached with a thickness of 45 nm to a glass substrate by a sputtering method, to form an anode. On the anode, a hole injection material (manufactured by Nissan Chemical Industries, Ltd., ND3202) was spin-coated, to form a film with a thickness of 35 nm. This was heated on a hot plate at 50° C. for 3 minutes in an air atmosphere to volatilize the solvent, and subsequently, heated on a hot plate at 230° C. for 15 minutes, then, allowed to cool naturally to room temperature.

(Formation of Hole Transporting Layer)

The polymer compound 1 was dissolved at a concentration of 0.6 wt % in xylene. The resultant xylene solution was used and spin-coated on the hole injection layer to form a film with a thickness of 20 nm, and the film was heated on a hot plate at 180° C. for 60 minutes under a nitrogen gas atmosphere, to form a hole transporting layer.

(Formation of Light Emitting Layer)

The polymer compound E1 was dissolved at a concentration of 1.2 wt % in xylene. The resultant xylene solution was used and spin-coated on the hole transporting layer to form a film with a thickness of 60 nm, and the film was heated on a hot plate at 150° C. for 10 minutes under a nitrogen gas atmosphere, to form a light emitting layer.

(Formation of Cathode)

The substrate carrying the light emitting layer formed thereon was placed in a vapor deposition machine and the inner pressure was reduced to $1\times10^{-4}$ Pa or less, then, as a cathode, sodium fluoride was vapor-deposited with a thickness of about 7 nm on the light emitting layer, then, aluminum was vapor-deposited with a thickness of about 120 nm thereon. After vapor deposition, sealing with a glass substrate was performed, to fabricate a light emitting device D1.

(Evaluation of Light Emitting Device)

When voltage was applied to the light emitting device D1, EL emission having a peak at 460 nm was observed. The external quantum efficiency at 1000 cd/m$^2$ of the light emitting device D1 was 8.5%. The current value was set so that the initial luminance was 8000 cd/m$^2$, then, the device was driven at constant current and the time change of luminance was measured. As a result, the time until the luminance reaches 50% of the initial luminance was 15.0 hours.

Comparative Example Dc1: Fabrication and Evaluation of Light Emitting Device Dc1

A light emitting device Dc1 was fabricated in the same manner as in Example D1 except that the polymer compound 1c was used instead of the polymer compound 1 in Example D1.

When voltage was applied to the light emitting device Dc1, EL emission having a peak at 460 nm was observed. The external quantum efficiency at 1000 cd/m$^2$ of the light emitting device Dc1 was 8.1%. The current value was set so that the initial luminance was 8000 cd/m$^2$, then, the device was driven at constant current and the time change of luminance was measured. As a result, the time until the luminance reaches 50% of the initial luminance was 10.2 hours.

Comparative Example Dc2: Fabrication and Evaluation of Light Emitting Device Dc2

A light emitting device Dc2 was fabricated in the same manner as in Example D1 except that the polymer compound 2c was used instead of the polymer compound 1 in Example D1.

When voltage was applied to the light emitting device Dc2, EL emission having a peak at 460 nm was observed. The external quantum efficiency at 1000 cd/m² of the light emitting device Dc2 was 6.7%. The current value was set so that the initial luminance was 8000 cd/m², then, the device was driven at constant current and the time change of luminance was measured. As a result, the time until the luminance reaches 50% of the initial luminance was 5.0 hours.

It is understood from these results that the external quantum efficiency and the luminance life of a light emitting device using the polymer compound 1 are more excellent than the external quantum efficiency and the luminance life of a light emitting device using the polymer compound 1c or the polymer compound 2c.

INDUSTRIAL APPLICABILITY

According to the present invention, a polymer compound excellent in crosslinkability and hole transportability can be provided. Further, the present invention can provide a composition containing the polymer compound and a light emitting device containing a crosslinked body of the polymer compound.

The invention claimed is:

1. A polymer compound comprising a constitutional unit represented by the formula (1A) and a constitutional unit represented by the formula (2A):

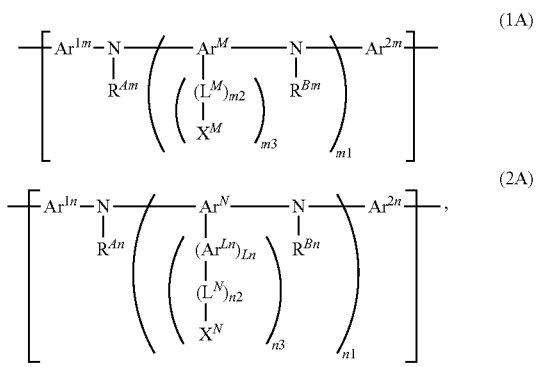

wherein
$R^{Am}$ and $R^{Bm}$ each independently represent a hydrogen atom, an alkyl group, a cycloalkyl group, an aryl group or a monovalent heterocyclic group, and these groups each optionally have a substituent, and when a plurality of $R^{Bm}$ are present, they may be the same or different, $Ar^{1m}$ and $Ar^{2m}$ each independently represent an arylene group or a divalent heterocyclic group, and these groups each optionally have a substituent, and $A^{1m}$ and $R^{Am}$ may be combined together to form a ring together with the nitrogen atom to which they are attached, and $Ar^{2m}$ and $R^{Bm}$ may be combined together to form a ring together with the nitrogen atom to which they are attached, $Ar^{M}$ represents an aromatic hydrocarbon group or a heterocyclic group, and these groups each optionally have a substituent, and when a plurality of $Ar^{M}$ are present, they may be the same or different, m1, and m3 each independently represent an integer of 1 to 4, m2 represents an integer of 0 to 5, when a plurality of m2 and m3 are present, they may be the same or different at each occurrence, $L^{M}$ represents an alkylene group, a cycloalkylene group, an arylene group, a divalent heterocyclic group, a group represented by —N(R')—, an oxygen atom or a sulfur atom, and these groups each optionally have a substituent, and R' represents a hydrogen atom, an alkyl group, a cycloalkyl group, an aryl group or a monovalent heterocyclic group, and these groups each optionally have a substituent, and when a plurality of $L^{M}$ are present, they may be the same or different, and $X^{M}$ represents a monovalent group containing a crosslinkable group represented by the formula (XL-9), the formula (XL-10), the formula (XL-11), the formula (XL-12), the formula (XL-13) or the formula (XL-16), and these groups each optionally have a substituent, and when a plurality of $X^{M}$ are present, they may be the same or different:

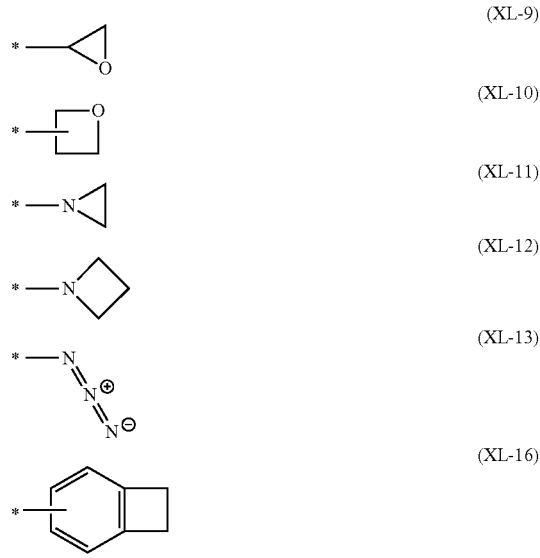

wherein * represents a binding site; and $R^{An}$ and $R^{Bn}$ each independently represent a hydrogen atom, an alkyl group, a cycloalkyl group, an aryl group or a monovalent heterocyclic group, and these groups each optionally have a substituent, and when a plurality of $R^{Bn}$ are present, they may be the same or different, $Ar^{1n}$, $Ar^{2n}$ and $Ar^{Ln}$ each independently represent an arylene group or a divalent heterocyclic group, and these groups each optionally have a substituent, and $Ar^{1n}$ and $R^{An}$ may be combined together to form a ring together with the nitrogen atom to which they are attached, $Ar^{2n}$ and $R^{Bn}$ may be combined together to form a ring together with the nitrogen atom to which they are attached, and when a plurality $Ar^{Ln}$ is present, they may be the same or different at each occurrence, $Ar^N$ represents an aromatic hydrocarbon group or a heterocyclic group, and these groups each optionally have a substituent, and when a plurality of $Ar^N$ are present, they may be the same or different, n1 and n3 each independently represent an integer of 1 to 4, n2 represents 1 or 2, Ln represents an integer of 0 to 4, $L^N$ represents an alkylene group, a cycloalkylene group, a divalent heterocyclic group, a group represented by —N(R')—, an oxygen atom or a sulfur atom, and these groups each optionally have a substituent, and R' represents the same meaning as described above, and when a plurality of $L^N$ are present, they may be the same or different, and $X^N$ represents a monovalent group containing a crosslinkable group represented by the formula (XL-1), the formula (XL-2), the formula (XL-3), the formula (XL-4), the formula (XL-5), the formula (XL-6), the formula (XL-7), the formula (XL-8), the formula (XL-14) or the formula (XL-15), and these groups each optionally have a substituent, and when a plurality of $X^N$ are present, they may be the same or different:

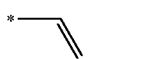
(XL-1)

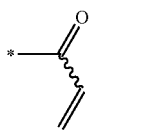
(XL-2)

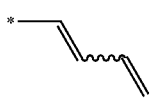
(XL-3)

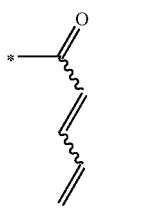
(XL-4)

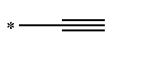
(XL-5)

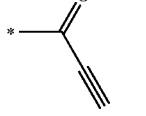
(XL-6)

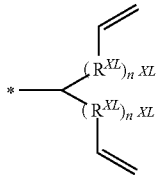
(XL-7)

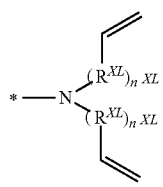
(XL-8)

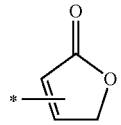
(XL-14)

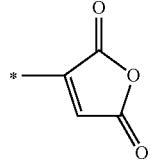
(XL-15)

wherein
$n^{XL}$ represents an integer of 0 to 5, and when a plurality of $n^{XL}$ are present, they may be the same or different, $R^{XL}$ represents a methylene group, an oxygen atom or a sulfur atom, and when a plurality of $R^{XL}$ are present, they may be the same or different, and

* represents the same meaning as described above.

2. The polymer compound according to claim 1, wherein $X^M$ is a monovalent group containing a crosslinkable group represented by the formula (XL-16) optionally having a substituent.

3. The polymer compound according to claim 1, wherein $-(L^M)_{m2}-X^M$ is a group represented by the formula (A):

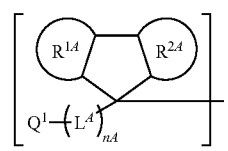
(A)

wherein
the ring $R^{1A}$ and the ring $R^{2A}$ each independently represent an aromatic hydrocarbon ring or a heterocyclic ring and these rings each optionally have a substituent, nA represents an integer of 0 to 3, $L^A$ represents an alkylene group, a cycloalkylene group, an arylene group, a divalent heterocyclic group, a group represented by —N(R")—, an oxygen atom or a sulfur atom and these groups each optionally have a substituent, and R" represents a hydrogen atom, an alkyl group, a cycloalkyl group, an aryl group or a monovalent heterocyclic group and these groups each optionally have a substituent, and when a plurality of $L^A$ are present, they may be the same or different, and $Q^1$ represents a crosslinkable group represented by the formula (XL-16) optionally having a substituent.

4. The polymer compound according to claim 1, wherein $X^N$ is a monovalent group containing a crosslinkable group represented by the formula (XL-1) optionally having a substituent.

5. The polymer compound according to claim 1, further comprising a constitutional unit represented by the formula (X):

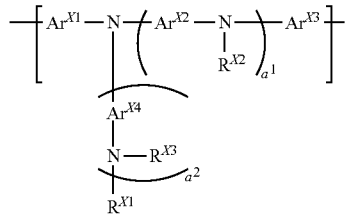

(X)

wherein
$a^1$ and $a^2$ each independently represent an integer of 0 or more,
$Ar^{X1}$ and $Ar^{X3}$ each independently represent an arylene group or a divalent heterocyclic group and these groups each optionally have a substituent,
$Ar^{X2}$ and $Ar^{X4}$ each independently represent an arylene group, a divalent heterocyclic group or a divalent group in which at least one arylene group and at least one divalent heterocyclic group are bonded directly to each other, and these groups each optionally have a substituent, and when a plurality of $Ar^{X2}$ and $Ar^{X4}$ are present, they may be the same or different at each occurrence, and
$R^{X1}$, $R^{X2}$ and $R^{X3}$ each independently represent a hydrogen atom, an alkyl group, a cycloalkyl group, an aryl group or a monovalent heterocyclic group, and these groups each optionally have a substituent, and when a plurality of $R^{X2}$ and $R^{X3}$ are present, they may be the same or different at each occurrence.

6. The polymer compound according to claim 1, further comprising a constitutional unit represented by the formula (Y):

(Y)

wherein $Ar^{Y1}$ represents an arylene group, a divalent heterocyclic group or a divalent group in which at least one arylene group and at least one divalent heterocyclic group are bonded directly to each other, and these groups each optionally have a substituent.

7. The polymer compound according to claim 6, wherein the constitutional unit represented by the formula (Y) is a constitutional unit represented by the formula (Y-1) or a constitutional unit represented by the formula (Y-2):

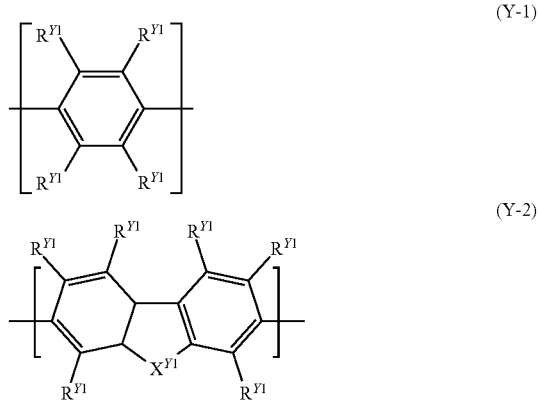

wherein,
$R^{Y1}$ represents a hydrogen atom, an alkyl group, a cycloalkyl group, an alkoxy group, a cycloalkoxy group, an aryl group or a monovalent heterocyclic group, and these groups each optionally have a substituent, and the plurality of $R^{Y1}$ may be the same or different, and adjacent groups $R^{Y1}$ may be combined together to form a ring together with the carbon atoms to which they are attached, and
$X^{Y1}$ represents a group represented by —$C(R^{Y2})_2$—, —$C(R^{Y2})=C(R^{Y2})$— or $C(R^{Y2})_2$—$C(R^{Y2})_2$—, and $R^{Y2}$ represents a hydrogen atom, an alkyl group, a cycloalkyl group, an alkoxy group, a cycloalkoxy group, an aryl group or a monovalent heterocyclic group, and these groups each optionally have a substituent, and the plurality of $R^{Y2}$ may be the same or different, and groups $R^{Y2}$ may be combined together to form a ring together with each carbon atom to which they are attached.

8. The polymer compound according to claim 1, wherein the total amount of $X^M$ and $X^N$ is 10 mol % or more with respect to the total amount of constitutional units contained in the polymer compound.

9. A composition comprising
the polymer compound according to claim 1,
and at least one material selected from the group consisting of a hole transporting material, a hole injection material, an electron transporting material, an electron injection material, a light emitting material, an antioxidant and a solvent.

10. A light emitting device comprising a crosslinked body of the polymer compound according to claim 1.

* * * * *